(12) United States Patent
Brandl et al.

(10) Patent No.: US 12,388,058 B2
(45) Date of Patent: Aug. 12, 2025

(54) OPTOELECTRONIC DEVICE

(71) Applicant: OSRAM Opto Semiconductors GmbH, Regensburg (DE)

(72) Inventors: Michael Brandl, Mintraching (DE); Andreas Dobner, Wenzenbach (DE); Matthias Goldbach, Pentling (DE); Sebastian Wittmann, Regenstauf (DE); Uli Hiller, Bad Abbach (DE); Markus Klein, Tegernheim (DE); Thomas Schwarz, Regensburg (DE); Andreas Waldschik, Wolmirstedt OT Elbeu (DE); Michael Wittmann, Alteglofsheim (DE); Matthias Bruckschloegl, Regensburg (DE); Stefan Groetsch, Bad Abbach (DE); Rainer Huber, Bad Abbach (DE); Peter Brick, Regensburg (DE); Ludwig Hofbauer, Regenstauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 336 days.

(21) Appl. No.: 17/541,798

(22) Filed: Dec. 3, 2021

(65) Prior Publication Data
US 2022/0149019 A1   May 12, 2022

Related U.S. Application Data

(63) Continuation of application No. 17/615,446, filed as application No. PCT/EP2020/080474 on Oct. 29, 2020.

(51) Int. Cl.
*H01L 25/075* (2006.01)
*H04W 72/20* (2023.01)
(Continued)

(52) U.S. Cl.
CPC ......... *H01L 25/0756* (2013.01); *H04W 72/20* (2023.01); *H04W 72/51* (2023.01);
(Continued)

(58) Field of Classification Search
CPC ..... H01L 25/0756; H01L 33/46; H01L 33/62; H01L 33/641; H04W 72/51; H04W 72/20;
(Continued)

(56) References Cited

U.S. PATENT DOCUMENTS 8,474,860 B2   7/2013   Ohoka et al.
8,924,076 B2   12/2014  Boote et al.
(Continued)

FOREIGN PATENT DOCUMENTS

CN   1675446 A    9/2005
CN   108877521 A  11/2018
(Continued)

OTHER PUBLICATIONS

International Search Report and Written Opinion issued in International Patent Application No. PCT/EP2020/080474 on Apr. 13, 2021.
(Continued)

*Primary Examiner* — Bao Q Truong
(74) *Attorney, Agent, or Firm* — ArentFox Schiff LLP

(57) ABSTRACT

An optoelectronic device comprises a layer stack, which includes a carrier layer, a cover layer, and a first layer. The first layer is in particular an intermediate layer, arranged between the cover layer and the carrier layer. At least one electronic or optoelectronic element, in particular an optoelectronic light source, is arranged on the first layer and at least one layer of the layer stack and preferably all layers of the layer stack are at least partially transparent. The layer stack comprises at least one layer which comprises particles
(Continued)

US 12,388,058 B2

Page 2 with a high thermal conductivity and/or at least one thermally conductive layer which is arranged between two adjacent layers of the layer stack.

43 Claims, 69 Drawing Sheets

(51) Int. Cl.
| | |
|---|---|
| H04W 72/51 | (2023.01) |
| H10H 20/841 | (2025.01) |
| H10H 20/857 | (2025.01) |
| H10H 20/858 | (2025.01) |
| B60J 3/00 | (2006.01) |
| B60K 35/00 | (2006.01) |
| B60K 35/60 | (2024.01) |
| B62J 50/22 | (2020.01) |

(52) U.S. Cl.
CPC ........ *H10H 20/841* (2025.01); *H10H 20/857* (2025.01); *H10H 20/8581* (2025.01); *B60J 3/00* (2013.01); *B60K 35/00* (2013.01); *B60K 35/60* (2024.01); *B60K 2360/785* (2024.01); *B62J 50/22* (2020.02)

(58) Field of Classification Search
CPC .... B62J 50/22; B60K 2360/785; B60K 35/60; B60K 35/00; B60J 3/00
See application file for complete search history.

(56) References Cited

U.S. PATENT DOCUMENTS

| | | |
|---|---|---|
| 9,806,281 B2 | 10/2017 | Domercq et al. |
| 10,395,589 B1 | 8/2019 | Vahid Far et al. |
| 11,179,032 B2 | 11/2021 | Chen et al. |
| 11,479,023 B2 | 10/2022 | Berard et al. |
| 11,538,852 B2 | 12/2022 | Varghese et al. |
| 11,569,411 B2 | 1/2023 | Volpert |
| 11,682,607 B2 | 6/2023 | We et al. |
| 12,040,317 B2 | 7/2024 | Brandl et al. |
| 2002/0118321 A1 | 8/2002 | Ge |
| 2002/0140629 A1 | 10/2002 | Sundahl |
| 2002/0149312 A1 | 10/2002 | Roberts et al. |
| 2004/0185195 A1 | 9/2004 | Anderson et al. |
| 2005/0238857 A1 | 10/2005 | Day |
| 2005/0253244 A1 | 11/2005 | Chang |
| 2006/0116046 A1 | 6/2006 | Morley et al. |
| 2006/0275599 A1 | 12/2006 | Lefevre |
| 2007/0014469 A1 | 1/2007 | Paillet et al. |
| 2009/0021181 A1 | 1/2009 | Brune et al. |
| 2009/0103298 A1 | 4/2009 | Boonekamp et al. |
| 2009/0114928 A1 | 5/2009 | Messere et al. |
| 2009/0231882 A1 | 9/2009 | Lin et al. |
| 2009/0279295 A1 | 11/2009 | Van Der Poel |
| 2010/0060821 A1 | 3/2010 | Petersen et al. |
| 2010/0140655 A1 | 6/2010 | Shi |
| 2010/0176705 A1* | 7/2010 | Van Herpen ...... B32B 17/10541 313/46 |
| 2011/0006316 A1 | 1/2011 | Ing et al. |
| 2011/0127552 A1* | 6/2011 | Van Herpen ...... B32B 17/10706 257/E33.074 |
| 2011/0317417 A1 | 12/2011 | Gourlay |
| 2013/0016494 A1 | 1/2013 | Speier et al. |
| 2013/0154498 A1 | 6/2013 | Missbach |
| 2013/0256708 A1 | 10/2013 | Jin et al. |
| 2014/0091326 A1 | 4/2014 | Tran et al. |
| 2014/0096893 A1 | 4/2014 | Veerasamy |
| 2014/0234578 A1 | 8/2014 | Decraye et al. |
| 2015/0239399 A1 | 8/2015 | Tonar et al. |
| 2015/0253486 A1 | 9/2015 | Verger et al. |
| 2015/0301175 A1 | 10/2015 | Rao et al. |
| 2015/0308639 A1 | 10/2015 | Keranen et al. |
| 2016/0154170 A1 | 6/2016 | Thompson et al. |
| 2016/0313587 A1* | 10/2016 | Linthout ........... B32B 17/10541 |
| 2017/0005077 A1 | 1/2017 | Kim et al. |
| 2017/0179097 A1 | 6/2017 | Zhang et al. |
| 2017/0179192 A1 | 6/2017 | Zhang et al. |
| 2017/0212633 A1 | 7/2017 | You et al. |
| 2017/0301282 A1 | 10/2017 | Rotzoll et al. |
| 2017/0309698 A1 | 10/2017 | Bower et al. |
| 2017/0373268 A1 | 12/2017 | Takahashi et al. |
| 2018/0084614 A1 | 3/2018 | Bower et al. |
| 2018/0114878 A1 | 4/2018 | Danesh et al. |
| 2018/0141487 A1 | 5/2018 | Osumi et al. |
| 2018/0211945 A1 | 7/2018 | Cok et al. |
| 2018/0226386 A1 | 8/2018 | Cok |
| 2018/0301594 A1 | 10/2018 | Bouvier et al. |
| 2018/0311935 A1 | 11/2018 | Sahyoun et al. |
| 2018/0323180 A1 | 11/2018 | Cok |
| 2018/0343741 A1 | 11/2018 | Williams et al. |
| 2018/0345631 A1 | 12/2018 | Klein et al. |
| 2018/0358339 A1 | 12/2018 | Iguchi |
| 2018/0370195 A1 | 12/2018 | Laluet et al. |
| 2018/0374834 A1 | 12/2018 | Tada et al. |
| 2019/0001629 A1 | 1/2019 | Laluet |
| 2019/0012957 A1 | 1/2019 | Liu et al. |
| 2019/0016095 A1 | 1/2019 | Labrot et al. |
| 2019/0019968 A1 | 1/2019 | He et al. |
| 2019/0096864 A1 | 3/2019 | Huitema et al. |
| 2019/0134952 A1 | 5/2019 | Varanasi et al. |
| 2019/0140154 A1 | 5/2019 | Ohmae et al. |
| 2019/0160792 A1 | 5/2019 | Weber |
| 2019/0172970 A1* | 6/2019 | Dupont ............... H01L 31/1856 |
| 2019/0179458 A1 | 6/2019 | Weber et al. |
| 2019/0193376 A1 | 6/2019 | Bauerle |
| 2019/0195466 A1 | 6/2019 | Shimizu et al. |
| 2019/0229097 A1 | 7/2019 | Takeya et al. |
| 2019/0235677 A1 | 8/2019 | Liu et al. |
| 2019/0248122 A1 | 8/2019 | Gillessen et al. |
| 2019/0255813 A1 | 8/2019 | Bauerle et al. |
| 2019/0279558 A1 | 9/2019 | Monestier et al. |
| 2019/0299852 A1 | 10/2019 | Bauerle et al. |
| 2019/0302917 A1 | 10/2019 | Pan |
| 2019/0305036 A1 | 10/2019 | Ahn et al. |
| 2019/0335553 A1 | 10/2019 | Ahmed et al. |
| 2019/0377125 A1 | 12/2019 | Liu et al. |
| 2019/0393198 A1 | 12/2019 | Takeya |
| 2020/0006456 A1 | 1/2020 | Zhang et al. |
| 2020/0012848 A1 | 1/2020 | Goto |
| 2020/0052033 A1 | 2/2020 | Iguchi |
| 2020/0144228 A1 | 5/2020 | Brick et al. |
| 2020/0203580 A1 | 6/2020 | Marutani |
| 2020/0251638 A1 | 8/2020 | Morris et al. |
| 2020/0269815 A1 | 8/2020 | Day |
| 2020/0342194 A1 | 10/2020 | Bhat et al. |
| 2020/0343230 A1 | 10/2020 | Sizov et al. |
| 2020/0350361 A1 | 11/2020 | Tao et al. |
| 2021/0043617 A1 | 2/2021 | Onuma et al. |
| 2021/0375833 A1 | 12/2021 | Lee et al. |
| 2022/0123046 A1 | 4/2022 | Behringer et al. |
| 2022/0231193 A1 | 7/2022 | Boss et al. |
| 2022/0238497 A1 | 7/2022 | Brandl et al. |
| 2022/0262850 A1 | 8/2022 | Behringer et al. |
| 2022/0262851 A1 | 8/2022 | Behringer et al. |
| 2022/0262852 A1 | 8/2022 | Behringer et al. |
| 2022/0271084 A1 | 8/2022 | Behringer et al. |
| 2022/0271085 A1 | 8/2022 | Behringer et al. |
| 2022/0285430 A1 | 9/2022 | Behringer et al. |
| 2022/0375991 A1 | 11/2022 | Behringer et al. |

FOREIGN PATENT DOCUMENTS

| | | |
|---|---|---|
| CN | 109801568 A | 5/2019 |
| DE | 102007039416 A1 | 2/2009 |
| DE | 102012213343 A1 | 1/2014 |
| DE | 102013102003 A1 | 8/2014 |
| DE | 202015009229 U1 | 1/2017 |
| DE | 102017122852 A | 4/2019 |
| DE | 102018119376 A1 | 2/2020 |
| DE | 112018003398 T5 | 3/2020 |
| EP | 1760784 A2 | 3/2007 |
| EP | 1886804 A1 | 2/2008 |

(56) References Cited

FOREIGN PATENT DOCUMENTS

| | | |
|---|---|---|
| EP | 2412521 A1 | 2/2012 |
| EP | 2760108 A1 | 7/2014 |
| EP | 3264241 A1 | 1/2018 |
| EP | 3264242 A1 | 1/2018 |
| FR | 3044972 A1 | 6/2017 |
| JP | 64-002386 A | 1/1989 |
| JP | 08-130330 A | 5/1996 |
| JP | 10-240172 A | 9/1998 |
| JP | 11-145519 A | 5/1999 |
| JP | 2001-022300 A | 1/2001 |
| JP | 2002-246647 A | 8/2002 |
| JP | 2003-337556 A | 11/2003 |
| JP | 2004-327955 A | 11/2004 |
| JP | 2005-310751 A | 11/2005 |
| JP | 2005-534612 A | 11/2005 |
| JP | 2006-263932 A | 10/2006 |
| JP | 2007-073734 A | 3/2007 |
| JP | 2009-512977 A | 3/2009 |
| JP | 2009-535798 A | 10/2009 |
| JP | 2010-520627 A | 6/2010 |
| JP | 2010-521353 A | 6/2010 |
| JP | 2010-170969 A | 8/2010 |
| JP | 2012-510716 A | 5/2012 |
| JP | 2012-195404 A | 10/2012 |
| JP | 2014-060320 A | 4/2014 |
| JP | 2014-110333 A | 6/2014 |
| JP | 2015-084374 A | 4/2015 |
| JP | 2016-167451 A | 9/2016 |
| JP | 2016-174179 A | 9/2016 |
| JP | 2017-212384 A | 11/2017 |
| JP | 2018-050082 A | 3/2018 |
| JP | 2019-009192 A | 1/2019 |
| JP | 2019-134025 A | 8/2019 |
| JP | 2020-017730 A | 1/2020 |
| KR | 10-2014-0071796 A | 6/2014 |
| WO | 2007093823 A1 | 8/2007 |
| WO | 2008058881 A1 | 5/2008 |
| WO | 2009087584 A1 | 7/2009 |
| WO | 2009125918 A2 | 10/2009 |
| WO | 2011158185 A1 | 12/2011 |
| WO | 2012/036081 A1 | 3/2012 |
| WO | 2014141019 A1 | 9/2014 |
| WO | 201478942 A1 | 11/2014 |
| WO | 2016095117 A1 | 6/2016 |
| WO | 2018025051 A1 | 2/2018 |
| WO | 2019008493 A1 | 1/2019 |
| WO | 2019146634 A1 | 1/2019 |
| WO | 2019/026858 A1 | 2/2019 |
| WO | 2019/048893 A1 | 3/2019 |
| WO | 2019/079383 A1 | 4/2019 |
| WO | 2019091728 A1 | 5/2019 |
| WO | 2019160199 A1 | 8/2019 |
| WO | 2019186513 A1 | 10/2019 |
| WO | 2020050062 A1 | 3/2020 |
| WO | 2020071815 A1 | 4/2020 |

OTHER PUBLICATIONS

Ron Mertens, "More details emerge on Samsung's QD-OLED TV Plans", available online at <https://www.oled-info.com/more-details-emerge-samsungs-qd-oled-tv-plans>, Dec. 8, 2018, 4 pages.

* cited by examiner

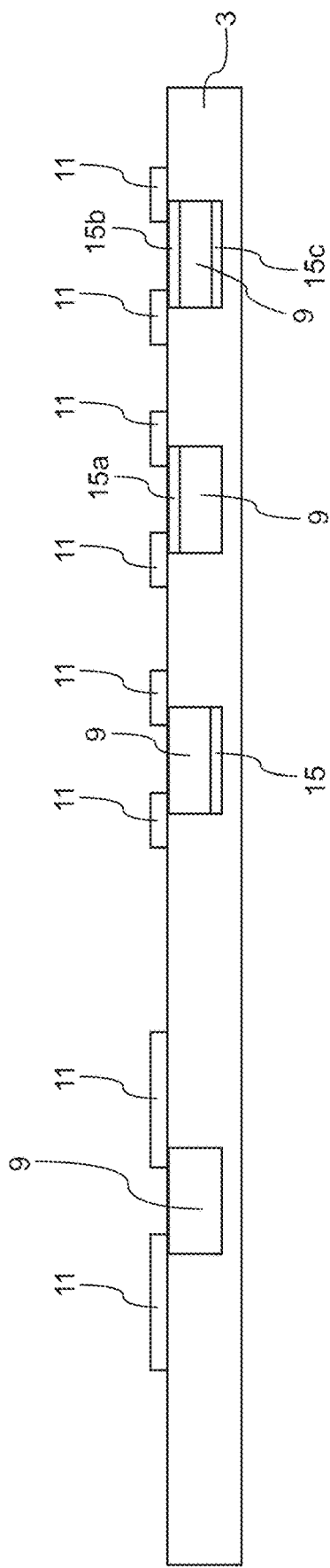
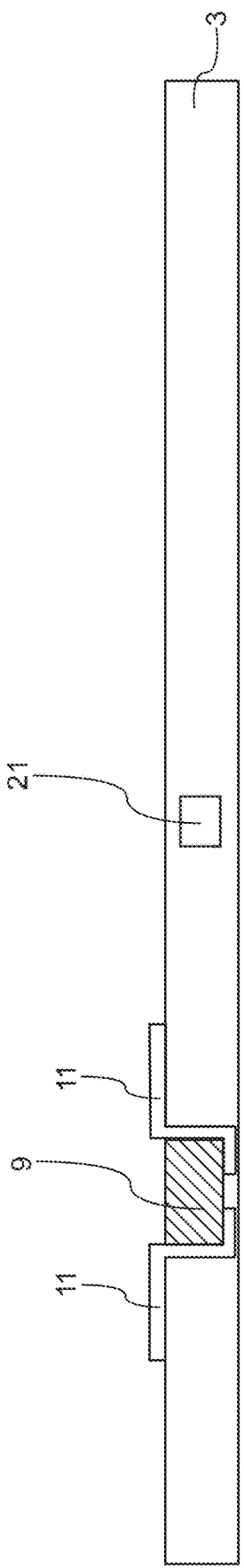
FIG. 4
FIG. 5

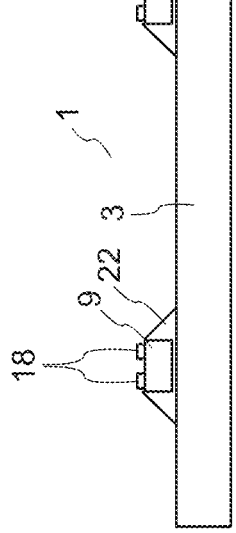 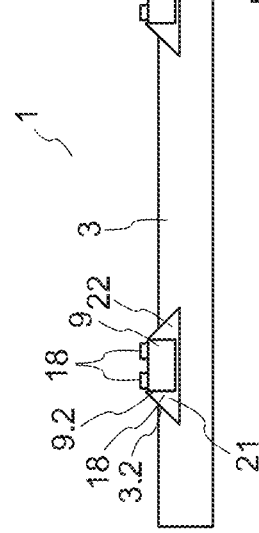 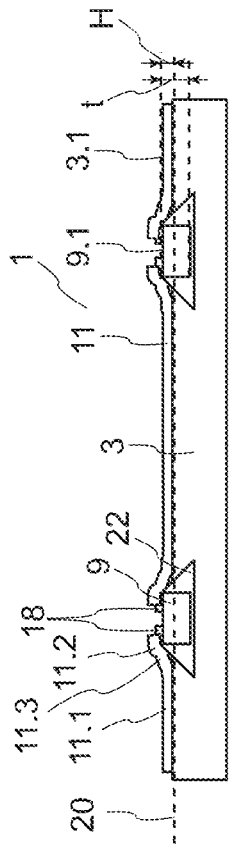
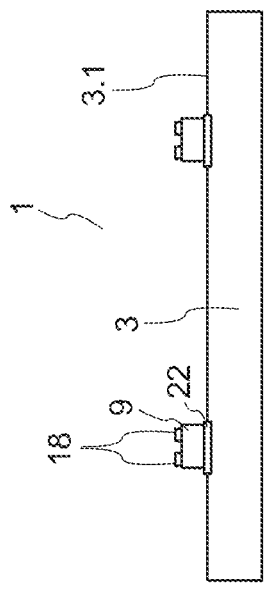 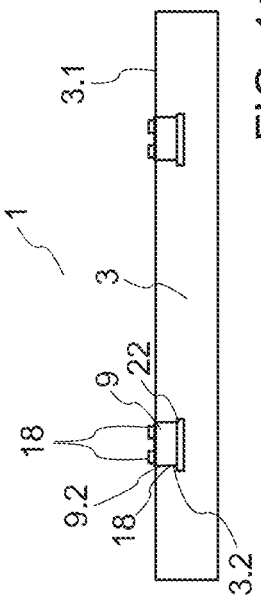 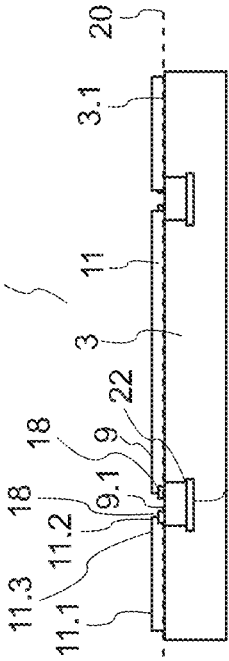

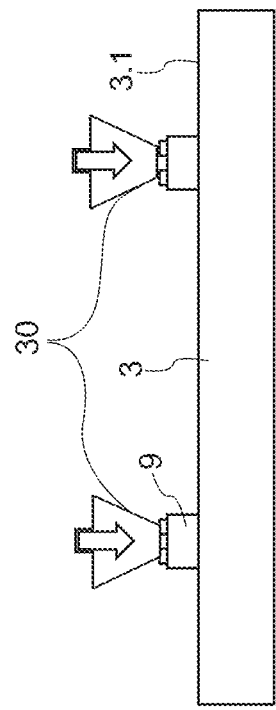
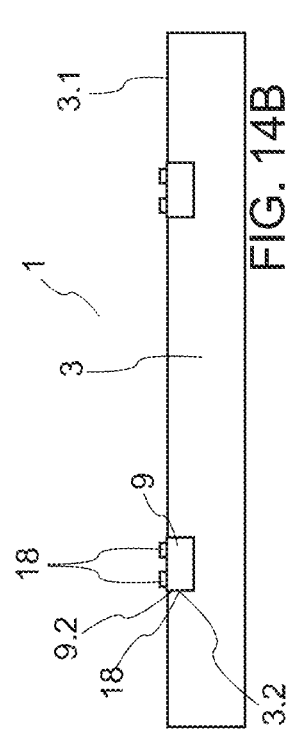
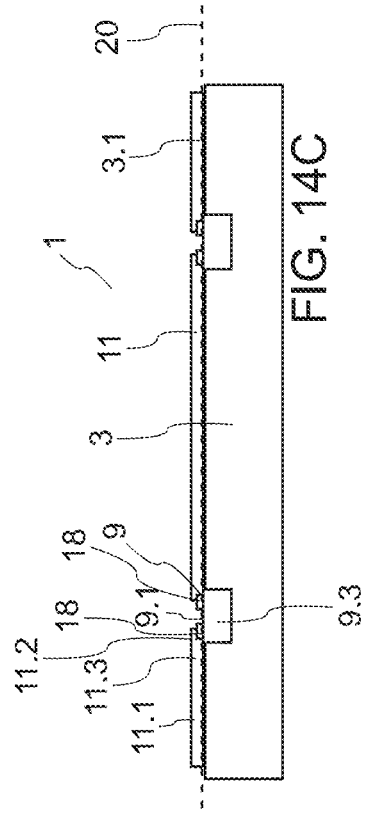
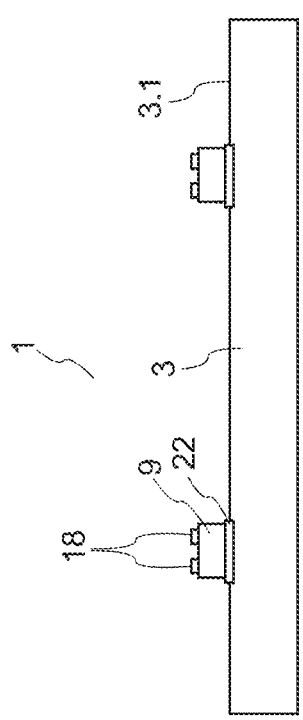
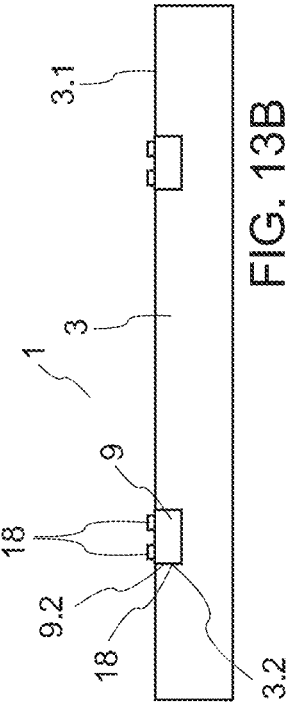
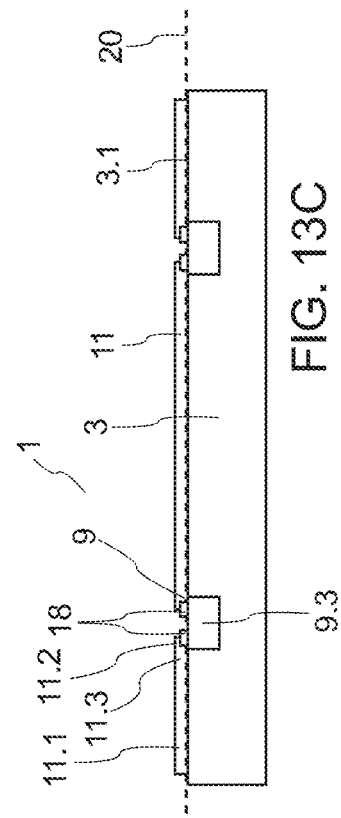

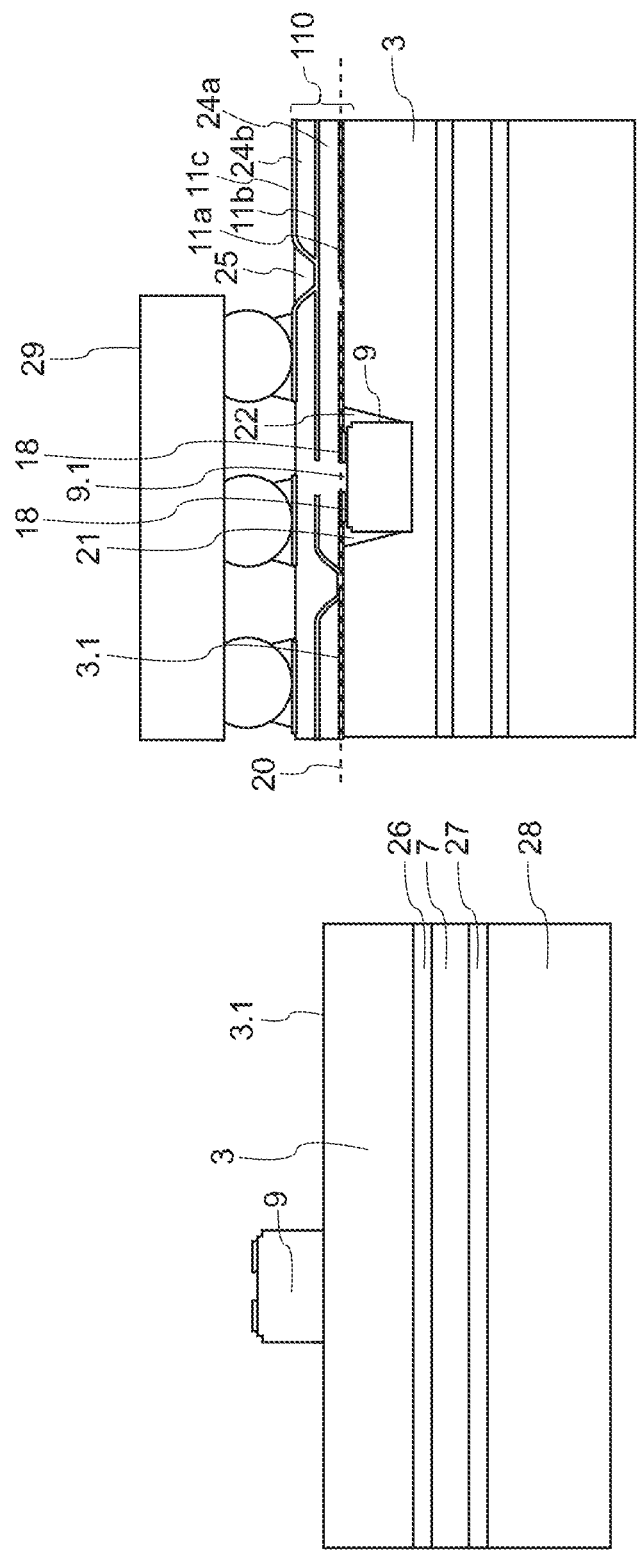

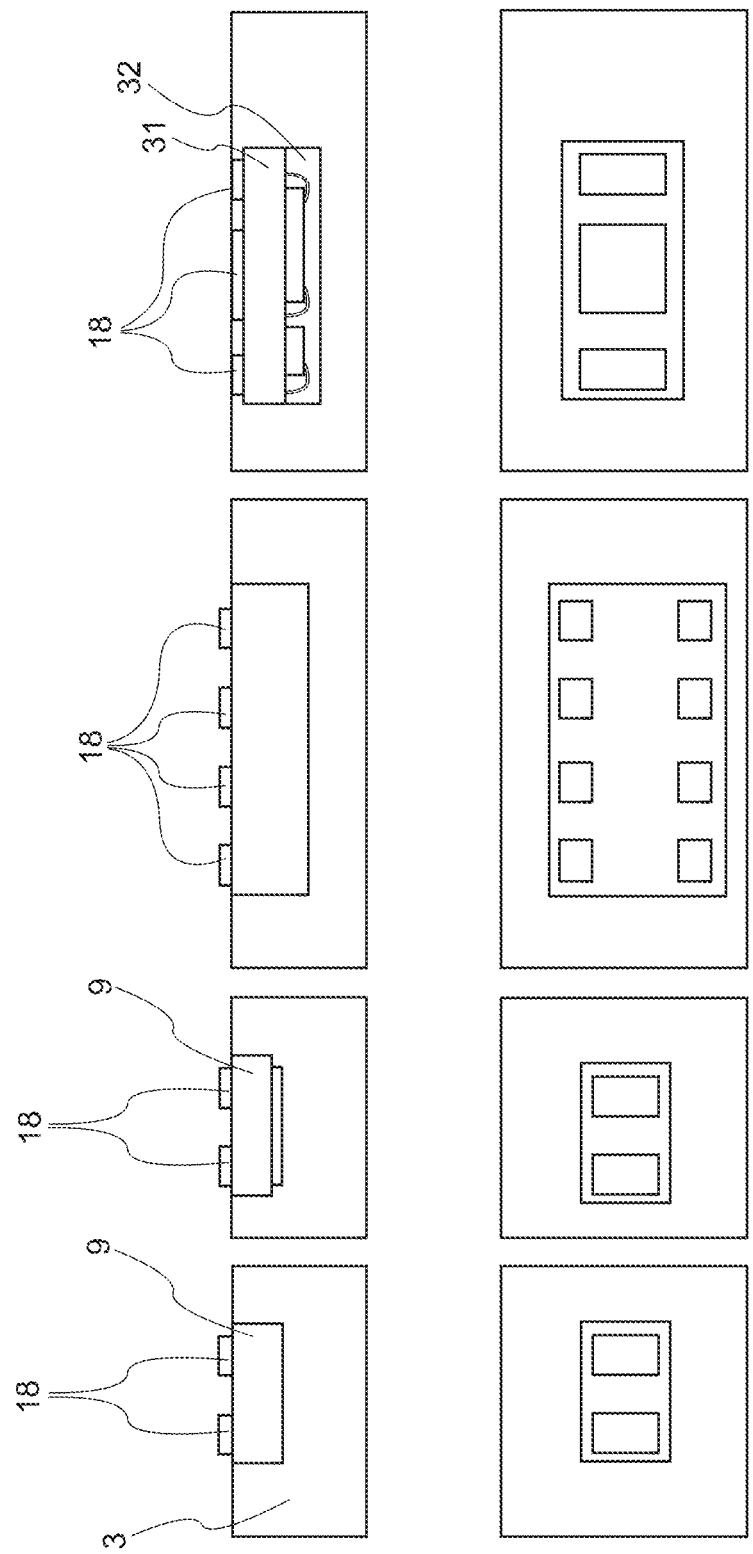

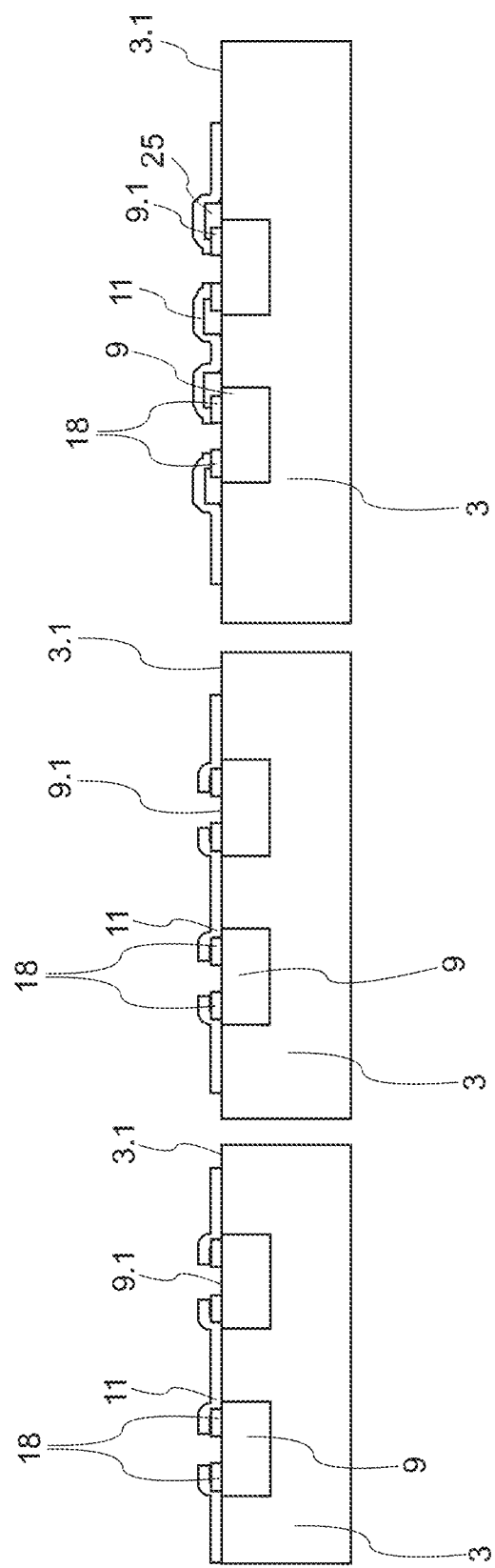

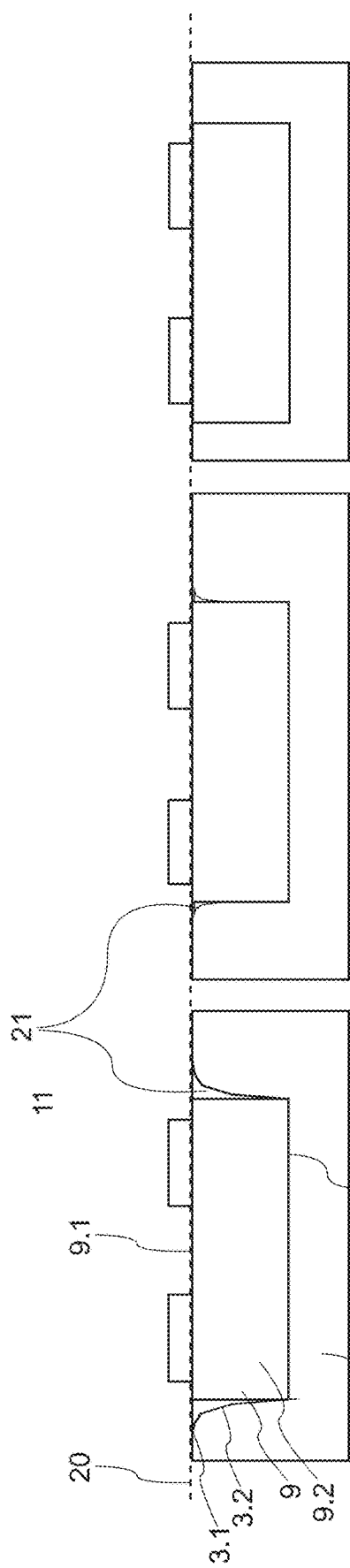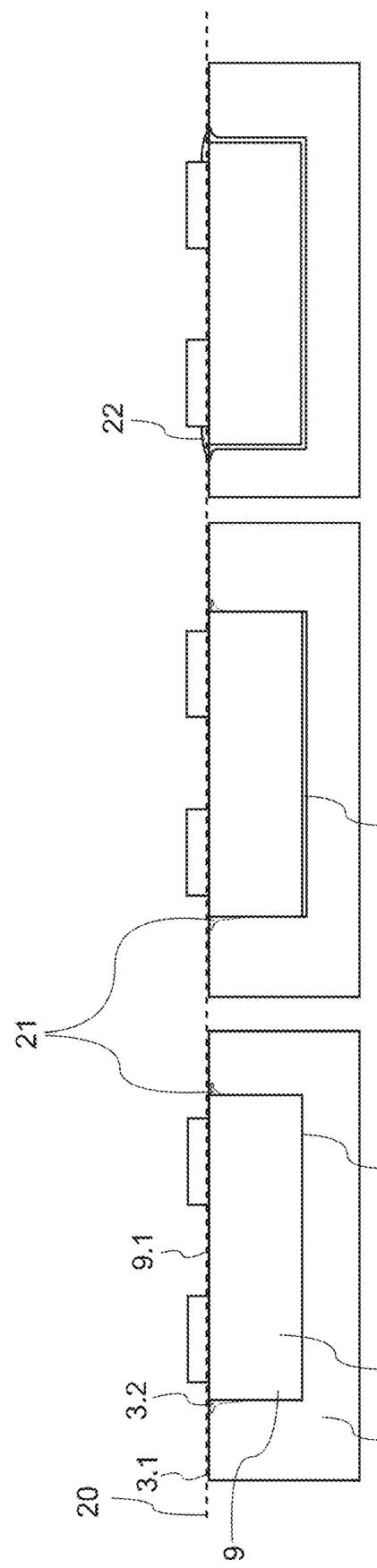

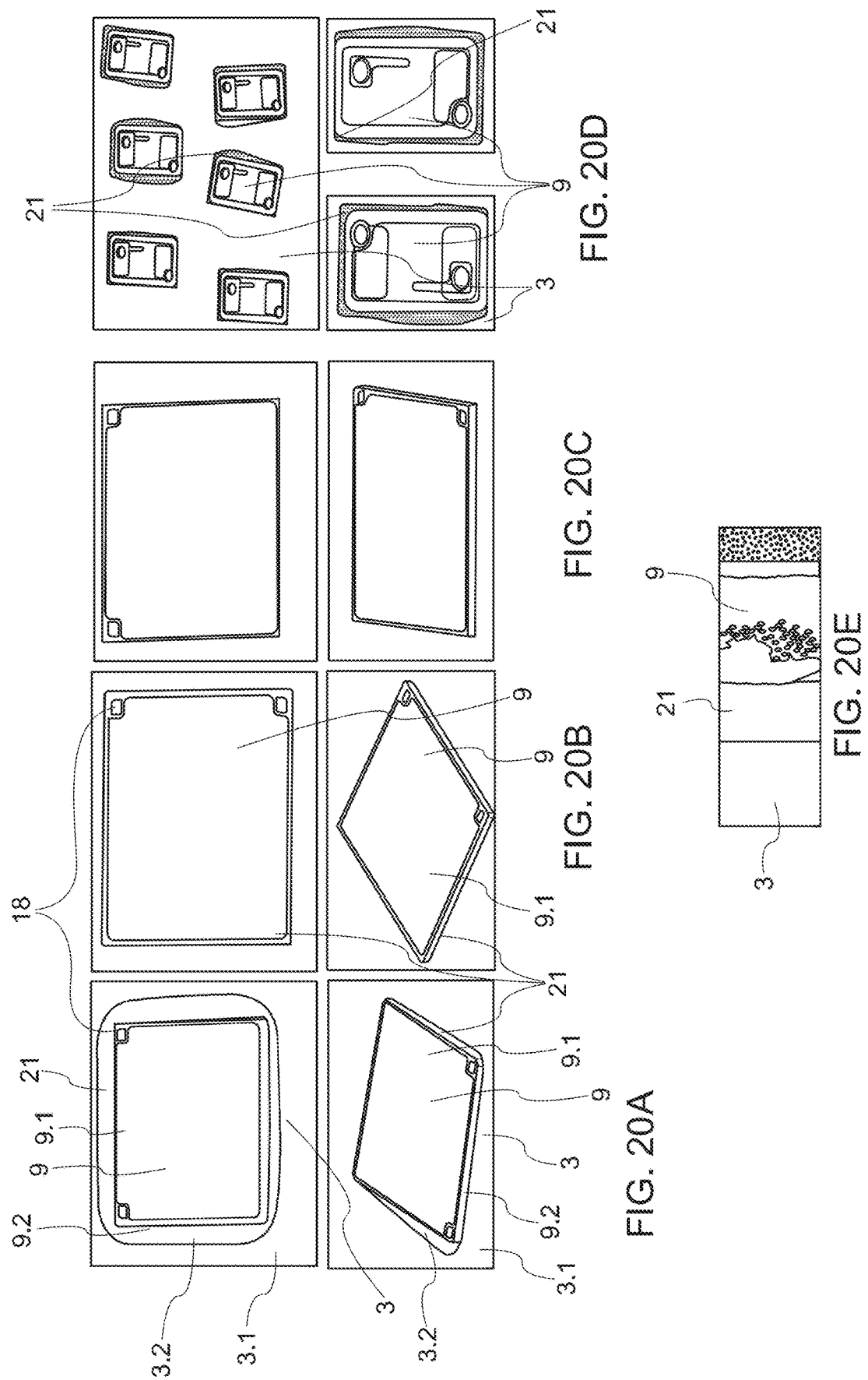

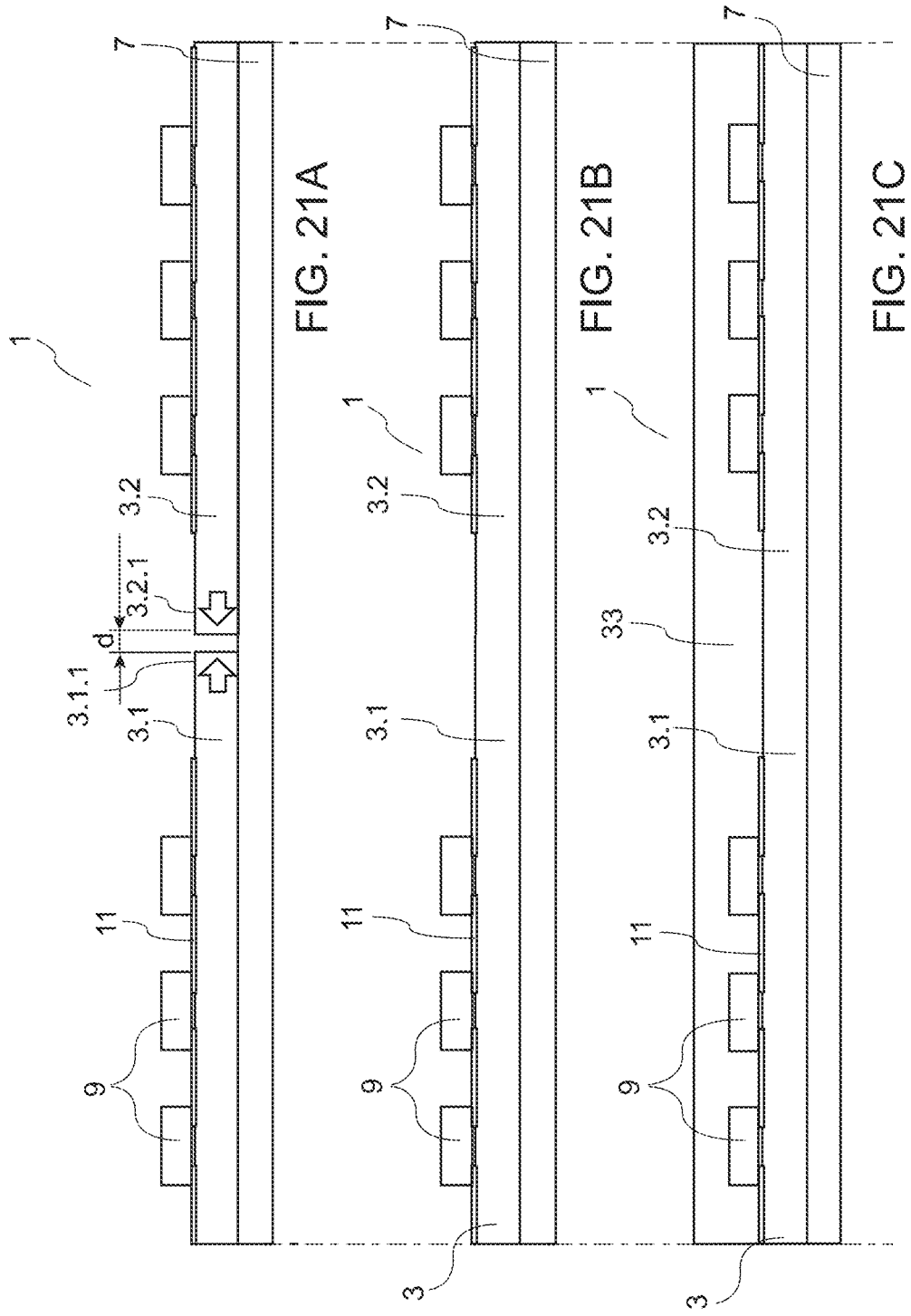

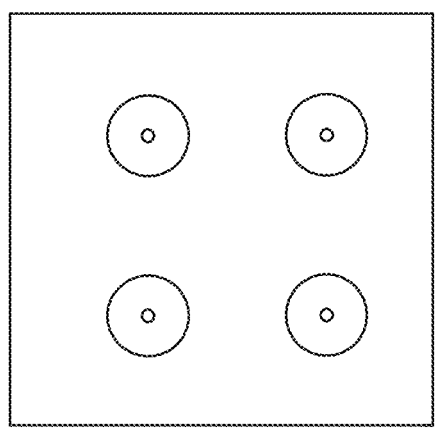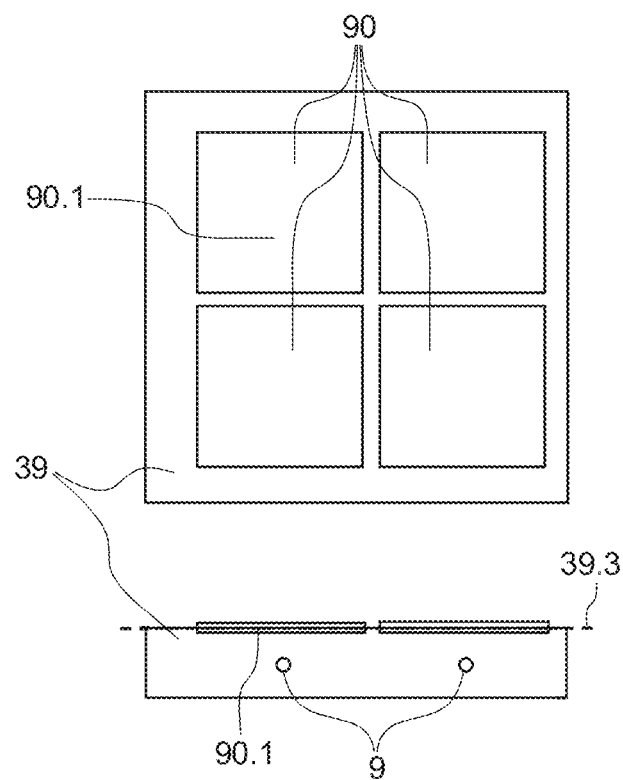
FIG. 38A          FIG. 38B

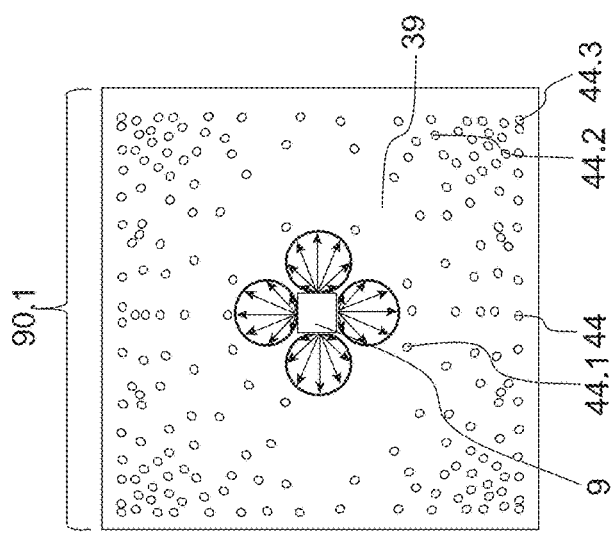
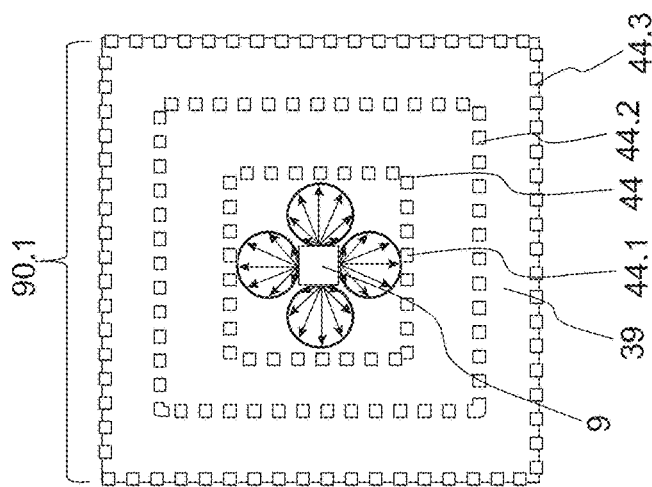
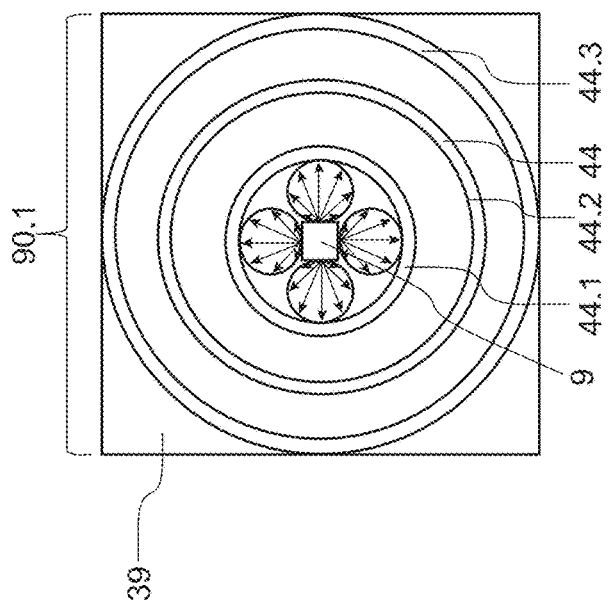

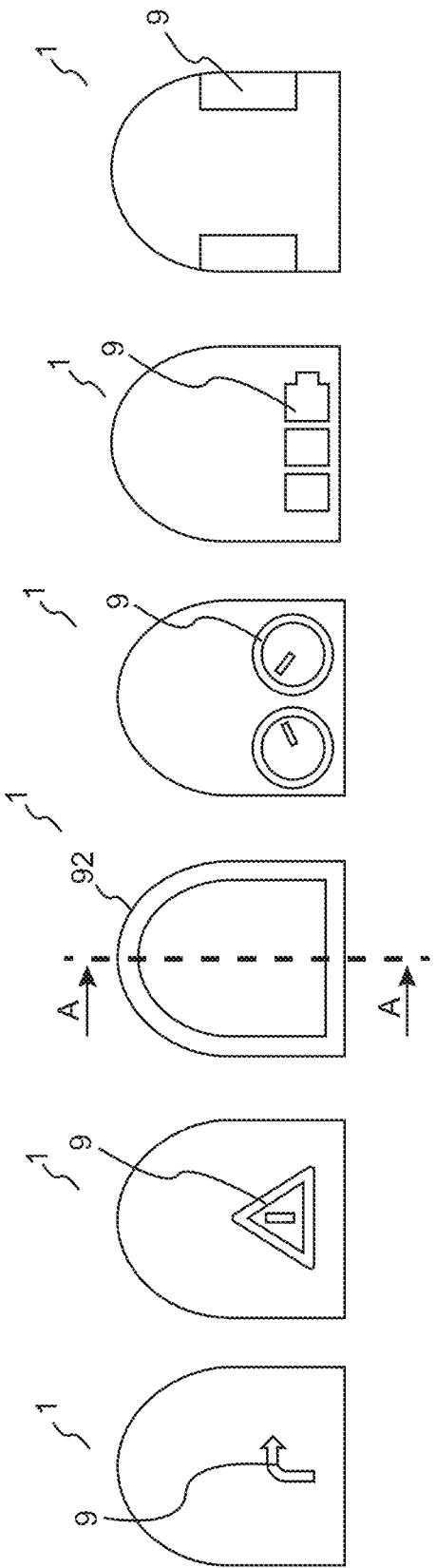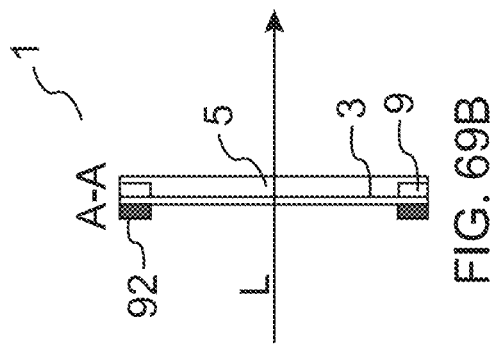

OPTOELECTRONIC DEVICE

The present application is a Continuation of U.S. patent application Ser. No. 17/615,446 filed Nov. 30, 2021, which is a U.S.C. 371 National Stage entry of PCT Application No. PCT/EP2020/080474 filed Oct. 29, 2020, which claims priority from DE application No. 10 2019 133 451.9 dated Dec. 6, 2019, DK application No. PA202070103 dated Feb. 21, 2020, DE application No. 10 2020 114 478.4 dated May 29, 2020, DE application No. 10 2020 114 482.2 dated May 29, 2020, DE application No. 10 2020 114 483.0 dated May 29, 2020, DE application No. 10 2020 114 670.1 dated Jun. 2, 2020, DE application No. 10 2020 116 479.3 dated Jun. 23, 2020, DE application No. 10 2020 117 104.8 dated Jun. 29, 2020, DE application No. 10 2020 125 429.6 dated Sep. 29, 2020, DE application No. 10 2020 125 433.4 dated Sep. 29, 2020, DE application No. 10 2020 127 194.8 dated Oct. 15, 2020, and DE application No. 10 2020 127 204.9 dated Oct. 15, 2020, the disclosures of which are incorporated herein in their entirety.

BACKGROUND

The present disclosure relates to an optoelectronic device, such as an at least partially transparent pane or window of a vehicle.

There is a need for displaying information on certain areas of for example a vehicle. For example, a dashboard shows important information for a driver.

DE 10 2017 122 852 A1 discloses a cover for a motor vehicle roof, comprising a layer stack. The layer stack comprises a pane, which extends in a planar manner, a film, which extends in a planar manner, and an adhesive layer arranged between the pane and the film for fastening the film to the pane. A plurality of micro light emitting diodes is arranged in the adhesive layer. DE 10 2017 122 852 A1 also discloses a motor vehicle, comprising a motor vehicle roof having such a cover.

US 2019/0248122 A1 discloses a method for producing a composite pane for a motor vehicle. The method comprises providing a first pane and a second pane. The method further includes arranging a plastic film between the first pane and the second pane, and arranging a light emitting diode (LED) on a surface of the plastic film. Moreover, the method comprises locally heating the plastic film at least in a region of the LED into a fluid state by means of a heating source positioned on an outer surface of the first pane or the second pane or arranged at a distance from the outer surface of the first pane or the second pane. Additionally, the method comprises introducing the LED into the plastic film heated into the fluid state with displacement of a predefined volume of the plastic film, and the method includes after introducing the LED into the plastic film, laminating the first pane and the second pane with the interposed plastic film.

WO 2019/186513 A1 discloses a laminated automotive glazing, which comprises an outer glass layer, an inner glass layer, at least one plastic interlayer between the outer and inner glass layers, and at least one camera system, wherein the camera system is laminated between the glass layers as an integral permanent part of the laminate.

WO 2019/008493 A1 discloses a vehicle laminate comprising an exterior glass layer, at least an inner glass layer, at least one plastic bonding layer located between the exterior glass layer and the inner glass layer, at least one LED embedded into the plastic bonding layer. A wire is substantially embedded in the plastic bonding layer forming a circuit to power the LED.

It is an object of the present invention to provide an improved optoelectronic device, in particular an at least partially transparent optoelectronic device, which provides an improved emission of light. At least in some aspects, the present invention also seeks to integrate light sources and/or sensors into at least partially transparent windows and panes, in particular for vehicles.

SUMMARY

In some embodiments of the present invention, an optoelectronic device, for example an at least partially transparent pane for example of a vehicle, comprises:
a cover layer,
a carrier layer,
an intermediate layer between the cover layer and the carrier layer,
wherein at least one and preferably a plurality of optoelectronic light sources is arranged on at least one surface of the intermediate layer and/or is at least partially embedded in the intermediate layer,
wherein the intermediate layer is adapted such that light emitted by the optoelectronic light sources at least partially spreads in and along the intermediate layer and exits the intermediate layer within and/or at a pre-set distance to the respective optoelectronic light source in a direction through the cover layer and/or through the carrier layer.

Preferably, a LED (light emitting diode) or a micro LED, also called μLED, or a LED-chip or a μLED-chip is used as light source. Preferably, each layer of the optoelectronic device is made of or at least comprises an at least partially transparent material. The optoelectronic device can therefore also be at least partially transparent.

A μLED is a small LED, for example, with edge lengths of less than 70 μm, in particular down to less than 20 μm, in particular in the range from 1 μm to 10 μm. Another range is between 10-30 μm. This can result in a surface area from a few hundred μm$^2$ to a few tens of μm$^2$. For example, a μ-LED can have a surface area of approximately 60 μm$^2$ with an edge length of approximately 8 μm. In some cases, a μ-LED has an edge length of 5 μm or less, which results in a surface area size of less than 30 μm$^2$. Typical heights of such μ-LEDs are, for example, in the range of 1.5 μm to 10 μm.

Advantageously a micro light emitting diode chip, also called μLED-chip, is used as light source. A micro light emitting diode can form a pixel or a subpixel and emit light of a selected colour.

In some embodiments, a point light source is converted into a two-dimensional light source in particular by use of the intermediate layer.

In some embodiments, the optoelectronic device is an at least partially transparent pane, in particular a pane of a vehicle.

In some embodiments, the light provided by a light source can spread in and along the intermediate layer and can exit the intermediate layer within a pre-set angle of view, in particular almost perpendicular to the intermediate layer. Thus, the light can be seen from a larger distance, for example at a distance of 0.5 m or more.

In some embodiments, the intermediate layer can be a foil. The foil can be laminated or fixed by an adhesive to the cover layer and/or the carrier layer. A foil is elastic and can adapt to non-planar contours or shapes.

In some embodiments, the refractive index of the intermediate layer can be larger than the refractive index of material surrounding the intermediate layer. By this the intermediate layer can function as a light guide.

In some embodiments, the refractive index of the intermediate layer can be larger than the refractive index of the cover layer and/or of the carrier layer or of an adhesive covering the intermediate layer on the side that is facing the carrier layer and/or on the side that is facing the cover layer.

In some embodiments, dispersive or scattering structures and/or reflective structures can be formed on at least one surface of the intermediate layer and/or can be at least partially be embedded in the intermediate layer. By use of these elements the spreading and/or exiting of emitted light can be achieved.

In some embodiments, the dispersive or scattering structures can be diffusion centers. Diffusion centers are easy to provide. They can also be arranged at selected positions, areas or volumes to cause the exiting of light at the respective positions, areas or volumes.

In some embodiments, a diffusion concentration of the diffusion centers can be pre-set such that the mean free path length of light is larger than the thickness of the intermediate layer. This is an example of a parameter which is easy to pre-set.

In some embodiments, the dispersive or scattering structures can be formed in the intermediate layer by use of transparent particles, white particles, holes, density modifications, air bubbles, in particular comprising sizes smaller than the emitted light wavelengths, in particular around 2 µm. These centers of scatter can be integrated into the intermediate layer.

In some embodiments, the dispersive or scattering structures can be arranged on the intermediate layer as structured areas, in particularly structured by stamping, printing and/or by applying of laser light. These are suitable methods for implementing diffusion centers.

In some embodiments, the reflective structures can be formed close to a respective optoelectronic component. The closer these structures are arranged to the light emitter the more light can be guided and spread into and along the intermediate layer.

In some embodiments, the reflective structures can be formed at an outer surface of the cover layer and/or at an outer surface of the carrier layer. The outer surface is facing away from the intermediate layer, whereas an inner surface is facing toward the intermediate layer.

In some embodiments, the reflective structures can be formed outside of the cover layer and/or outside of the carrier layer. In particular, the reflective structures can be formed at an outer surface of the cover layer and/or at an outer surface of the carrier layer. Thus, the reflective structures can be formed at a later stage of a manufacturing process and even independently from a manufacturing of the optoelectronic device.

In some embodiments, the reflective structures can be mirrors and/or metal coatings and/or dielectric coatings.

In some embodiments, the reflective structures can directly cover at least one of the main surfaces of an optoelectronic light source. Therewith a pre-setting can already be performed at the manufacturing of the light sources.

In some embodiments, one, two or more additional cover layers and intermediate layer combinations can be formed, whereby each intermediate layer comprises one or more optoelectronic light sources. Each intermediate layer can include light sources that can emit light at a selected colour, in particular either red, green or blue. An optoelectronic device emitting RGB (for red, green and blue) can thus be obtained by using three intermediate layers, one with light sources that emit red light, one with light sources that emit green light, and one with light sources that emit blue light.

In some embodiments, light emitted by each optoelectronic light source can at least partially be distributed in and along the intermediate layer and can exit the intermediate layer at a preset distance to the respective optoelectronic light source, where a dispersive or scattering structure, in particular comprising structured scattering particles, is formed inside each intermediate layer. A precise guiding of light can therefore be performed.

In some embodiments, the dispersive or scattering structures can form different two-dimensional indicator areas, in particular uniform symbols, colours or animations.

In some embodiments, the dispersive or scattering structures of each intermediate layer are offset from one another along the intermediate layers. Thus, light extraction of each dispersive or scattering structure can be performed with little or no disturbances from the neighbouring dispersive or scattering structures.

In some embodiments, a converter material can be at least partially integrated into the intermediate layer(s). The locations of the converter material can define areas of visible light. The spreading and exiting of light can precisely be pre-set.

In some embodiments, the optoelectronic light sources can be LEDs that are volume emitters or surface emitters. The light sources can be controlled individually. Thus, a light distribution can be controlled in the optoelectronic device. The individual control of the light sources can for example be achieved by individually controlling the electric current that is provided to each optoelectronic light source.

In some embodiments, the optoelectronic light sources, in particular LEDS, can be smaller than 300 µm, in particular smaller than 150 µm. With these spatial extensions the optoelectronic light sources are invisible for the human eye.

In some embodiments, the optoelectronic light sources can be chips or packaged chips. Pure chips can be integrated into the intermediate layer. Packaged chips can be handled in a manufacturing process.

In some embodiments, electrical conductor paths, for example used to provide electricity to the light sources, can be of a transparent material and/or can comprise widths smaller than 300 µm, in particular smaller than 150 µm. With these spatial extensions the conductor paths are invisible for the human eye. Thus, a view through the optoelectronic device is not disturbed by the conductor paths.

In some embodiments, the optoelectronic device can be configured to be used as a vehicle window, a cover of a vehicle lamp, a cover of a vehicle signal light, a mirror glass or an element of car body lighting. There can be various application fields for the optoelectronic device. In a "switched on" mode the device can for example illuminate and change the appearance and/or the colour of an original lacquer.

In some embodiments, the intermediate layer, the cover layer, and/or the carrier layer can comprise or consist of glass or another at least partially transparent material, for example, methacrylate (PMMA) and/or polycarbonate (PC).

In some embodiments, the dispersive structures can comprise titanium dioxide ($TiO_2$) and/or zirconium dioxide ($ZrO_2$). These materials provide efficient diffusion characteristics.

In some embodiments, a material of the reflective structures can comprise aluminium and/or silver or dielectric material and/or a distributed Bragg reflector.

In some embodiments, a material of the conductor paths can comprise indium tin oxide and/or silver.

In some embodiments, the intermediate layer can comprise transparent plastic material, in particular polyethylene.

In some embodiments, an optoelectronic device, for example an at least partially transparent pane for example of a vehicle, comprises a first layer, particularly a thermoplastic substrate, with at least one electronic or optoelectronic component being partially or completely embedded in the first layer.

By embedding the at least one optoelectronic component partially or completely in the first layer, a topography of the optoelectronic device can be reduced and a subsequent process with the optoelectronic device can be simplified, as it can be technically difficult to balance optoelectronic components which are placed on—but not embedded in—a surface of the first layer.

In some embodiments of the present invention, an optoelectronic device, for example an at least partially transparent pane for example of a vehicle, comprises:
- a first layer, in particular an intermediate layer arranged between a cover layer and a carrier layer,
- at least one electronic or optoelectronic component, which is at least partially or completely embedded in the first layer, at least one structured conductor layer,
- wherein a first portion of the conductor layer is arranged on an upper surface of the first layer, and a second portion of the conductor layer is arranged on a top surface of the electronic or optoelectronic component and is in contact with an electric contact of the electronic or optoelectronic component,
- wherein the electric contact, in particular a contact pad, is arranged on the top surface,
- wherein a boundary region is located between the top surface of the electronic or optoelectronic component and the adjacent upper surface of the first layer, and
- wherein an intermediate portion of the conductor layer extends across the boundary region and interconnects the first portion of the conductor layer and the second portion of the conductor layer.

Preferably, at least one electronic or optoelectronic component is embedded at least partially or completely in a first layer, which is particularly an intermediate layer arranged between a cover layer and a carrier layer. A conductor layer is arranged on an upper surface of the first layer, on a top surface of the electronic or optoelectronic component and is in contact with an electric contact of the electronic or optoelectronic component. Furthermore, the conductor layer extends across a boundary region, particularly a gap between a shell surface of the electronic or optoelectronic component and the first layer and thus bridges the gap. The boundary region, particularly the gap, is preferably small as a distance to be bridged by the conductor layer may be limited by a process to arrange the conductor layer on the upper surface of the first layer, on the top surface of the electronic or optoelectronic component and on the electric contact of the electronic or optoelectronic component.

The formulation, that something is arranged on something, has not necessarily to be understood as something is directly arranged on something but may also comprise another element arranged between. Thus, the formulation, that something is arranged on something, can also be understood as something is indirectly arranged above something. In particular, the formulation, that the conductor layer is arranged on an upper surface of the first layer can be understood as the conductor layer is arranged directly on an upper surface of the first layer or can be understood as the conductor layer is arranged above an upper surface of the first layer, but another element may be arranged between the conductor layer and the upper surface of the first layer.

The first layer, in particular the intermediate layer, is preferably at least partially transparent, and is preferably arranged between a cover layer and a carrier layer, wherein at least one of the cover layer and the carrier layer is at least partially transparent. Preferably, each layer of the optoelectronic device is made of or at least comprises an at least partially transparent material. The optoelectronic device can therefore also be at least partially transparent.

In some embodiments, the intermediate layer can be a foil. The foil can be laminated or fixed by an adhesive to a cover layer and/or a carrier layer. The foil can be elastic and can therefore adapt to non-planar contours or shapes.

In some embodiments, the optoelectronic device is an at least partially transparent pane, in particular a pane of a vehicle.

In some embodiments, the at least one electronic or optoelectronic component is completely embedded into the first layer such that the top surface of the electronic or optoelectronic component is arranged in a reference plane that extends through the upper surface of the first layer. In other words, the top surface of the electronic or optoelectronic component and the upper surface of the first layer are arranged within the same plane and form a flat upper surface.

In some embodiments, the at least one electric or optoelectronic component is partially embedded into the first layer such that the top surface of the electronic or optoelectronic component protrudes the upper surface of the first layer. In particular, by a height H. The height H is preferably equal to or smaller than a third of the thickness of the electronic or optoelectronic component. Thus, the electric or optoelectronic component can be partially embedded into the first layer such that a third or less of the thickness of the electronic or optoelectronic component protrudes the upper surface of the first layer.

In some embodiments, the boundary region comprises a gap between a shell surface of the electronic or optoelectronic component and a side surface of the first layer. The side surface faces the shell surface and the gap preferably extends in a circumferential direction around the electronic or optoelectronic component around the shell surface. The shell surface is preferably formed by the outer surfaces of the electronic or optoelectronic component excluding the top surface and a bottom surface of the electronic or optoelectronic component opposing the top surface.

In some embodiments, the first layer comprises at least one recess, wherein the side surface of the first layer facing the shell surface of the electronic or optoelectronic component is preferably formed by the recess in the first layer. The electronic or optoelectronic component is preferably arranged in the recess of the first layer and thus, the boundary region and respectively the gap can be formed by the distance between the electronic or optoelectronic component arranged in the recess of the first layer and the side surfaces of the recess of the first layer.

In some embodiments, the gap has a conical cross section. Particularly the distance between the shell surface and the side surface of the first layer facing the shell surface of the electronic or optoelectronic component is in a plane that extends through the upper surface of the first layer greater than in a plane below the plane that extends through the upper surface of the first layer being parallel to the plane that extends through the upper surface of the first layer.

In some embodiments, the gap has a width of less than 10-15 μm. In particular, the gap has a width of less than 10-15 μm within the plane that extends through the upper surface of the first layer. Hence, an intermediate portion of the conductor layer, which extends across the boundary region can extend over a distance of 10-15 μm or less. This can be advantageous, as a process to arrange the structured conductor layer such that a first portion of the conductor layer is arranged on the upper surface of the first layer, a second portion of the conductor layer is arranged on a top surface of the electronic or optoelectronic component, and an intermediate portion of the conductor layer extends across a boundary region, particularly the gap, and interconnects the first portion of the conductor layer and the second portion of the conductor layer, may be limited to a maximum distance that can be bridged by the intermediate portion of the conductor layer.

In some embodiments, the gap is filled with a filler material, in particular with an adhesive. Optionally, an accumulation of the filler material is arranged on the filled gap and particularly on the plane that extends through the upper surface of the first layer. This can be advantageous, as for the case, that the electronic or optoelectronic component is protruding the upper surface, a process of arranging the structured conductor layer such that, a first portion of the conductor layer is arranged on the upper surface of the first layer, a second portion of the conductor layer is arranged on a top surface of the electronic or optoelectronic component, and an intermediate portion of the conductor layer extends across a boundary region, particularly a gap, and interconnects the first portion of the conductor layer and the second portion of the conductor layer, may be improved.

The filler material can comprise a planarization layer, to provide a planar surface of the filler material in the plane that extends through the upper surface of the first layer. If the top surface of the electronic or optoelectronic component is in the same plane as the upper surface, a process of arranging the structured conductor layer—such that a first portion of the conductor layer is arranged on the upper surface of the first layer, a second portion of the conductor layer is arranged on a top surface of the electronic or optoelectronic component, and an intermediate portion of the conductor layer extends across a boundary region, particularly a gap, and interconnects the first portion of the conductor layer and the second portion of the conductor layer—can be further improved.

In some embodiments, the filler material is arranged between the first layer and a bottom surface of the electronic or optoelectronic component, wherein the bottom surface of the electronic or optoelectronic component is opposite to the top surface of the electronic or optoelectronic component. The filler material can particularly comprise or consist of an adhesive, which fixes the electronic or optoelectronic component to the first layer. The filler material can also comprise or consist of a temporary adhesive, which evaporates at least partially or completely in a process of embedding the electronic or optoelectronic component at least partially or completely into the first layer.

In some embodiments, the filler material can form a fillet weld between the upper surface and a shell surface of the electronic or optoelectronic component. Particularly the filler material in form of the fillet weld can partially be arranged in the gap and partially form the fillet weld between the upper surface and the shell surface.

In some embodiments, a dielectric layer, in particular a dielectric intermediate layer, is arranged between the structured conductor layer and the first layer and/or between the structured conductor layer and the top surface of the electronic or optoelectronic component. Such dielectric layer help to prevent a short between the structured conductor layer and at least one of the first layer and the top surface of the electronic or optoelectronic component.

In some embodiments, the first layer comprises a plastic and in particular at least one of the following materials: Polyethylene (PE), Polystyrene (PS), Polyvinyl chloride (PVC), Polypropylene (PP), Polymethyl methacrylate (PMMA), Polyethylene terephthalate (PET), Thermoplastic Polyurethane (TPU), Thermoplastic Polyimide (TPI), Acrylonitrile butadiene styrene (ABS), Polyphthalamide (PPA), Polycarbonate (PC), Polyamide (PA), Polyphenylene sulfide (PPS), Polyether ether ketone (PEEK).

In some embodiments, the at least one structured conductor layer, which is for example used to provide electricity to the at least one electronic or optoelectronic component, can be of a transparent material and/or can comprise electric lines with widths smaller than 300 μm, in particular smaller than 150 μm.

With these spatial extensions, the structured conductor layer is invisible for the human eye. Thus, a view through the optoelectronic device may not be disturbed by the structured conductor layer.

In some embodiments, a material of the at least one structured conductor layer can comprise indium tin oxide and/or silver. In some embodiments, the structured conductor layer comprises or consists of a metal and in particular comprises or consists of one of copper, silver and gold.

In some embodiments, the first layer is a light guiding layer, wherein the refractive index of the first layer can be larger than the refractive index of material surrounding the first layer.

In some embodiments, the refractive index of the first layer can be larger than the refractive index of a cover layer and/or of a carrier layer and/or of an adhesive covering the first layer on the side that is facing the carrier layer and/or on the side that is facing the cover layer. Thus, total internal refection and associated light guiding within the first layer can be achieved.

In some embodiments, the at least one structured conductor layer comprises two or more structured conductor layers arranged on top of each other, wherein adjacent conductor layers are separated from each other by at least one isolation layer, such as a Polyimide layer. Optionally, each conductor layer includes one or more conductive vias, which are filled with a dielectric material and include conductor paths, which interconnect different conductor layers. Thus, a multilayer of redistribution layers (RDL) and polyimide layers (PI) can be provided.

In some embodiments, a second layer, in particular a first thermal release film or a lamination layer, is arranged on a surface of the first layer opposite to the upper surface. A carrier layer, in particular a PET carrier layer, can be arranged on the second layer opposite to the first layer and optionally a third layer, in particular a second thermal release film or a photoresist layer, can be arranged on the carrier layer opposite to the second layer as well as a temporary carrier layer can be optionally arranged on the third layer opposite to the carrier layer.

In some embodiments, an electronic chip, such as an integrated circuit (IC), is arranged on the structured conductor layer or particularly on the stack of multilayer of redistribution layers (RDL) and polyimide layers (PI).

In some embodiments, the electronic or optoelectronic component comprises at least one of the following components:

a LED, a μLED, a flipchip LED, a thinfilm flipchip LED, an IC chip, an optical sensor, a thermal sensor, a mechanical sensor, resistor, coil, capacitor and a subassembly comprising a selection of the aforementioned components.

Preferably, a LED (light emitting diode) or a micro LED, also called μLED, or a LED-chip or a μLED-chip, or a flipchip LED or a thinfilm flipchip LED is used as optoelectronic component. Preferably, each layer of the optoelectronic device is made of or at least comprises an at least partially transparent material. The optoelectronic component can therefore also be at least partially transparent.

Advantageously a micro light emitting diode chip, also called μLED-chip, is used as optoelectronic component. A micro light emitting diode can form a pixel or a subpixel and emit light of a selected colour.

A μLED is a small LED, for example, with edge lengths of less than 70 μm, in particular down to less than 20 μm, in particular in the range from 1 μm to 10 μm. Another range is between 10-30 μm. This can result in a surface area of a few hundred $μm^2$ to a few tens of $μm^2$. For example, a μ-LED can have a surface area of approximately 60 $μm^2$ with an edge length of approximately 8 μm. In some cases, a μ-LED has an edge length of 5 μm or less, which results in a surface area size of less than 30 $μm^2$. Typical heights of such μ-LEDs are, for example, in the range of 1.5 μm to 10 μm.

In some embodiments, an electronic chip, such as an integrated circuit (IC), an optical sensor, a thermal sensor, a mechanical sensor, or a subassembly comprising a selection of the aforementioned electronic and optoelectronic components can be at least partially or completely embedded in the first layer.

In some embodiments, a method of manufacturing an optoelectronic device, in particular an at least partially transparent pane, for example of a vehicle, comprises the steps: Providing at least one electronic or optoelectronic component on an upper surface of a first layer, in particular an intermediate layer arranged between a cover layer and a carrier layer;

Embedding the at least one electronic or optoelectronic component at least partially or completely into the first layer; Providing a structured conductor layer such that a first portion of the conductor layer is arranged on the upper surface of the first layer, a second portion of the conductor layer is arranged on a top surface of the electronic or optoelectronic component, and an intermediate portion of the conductor layer extends across a boundary region and interconnects the first portion of the conductor layer and the second portion of the conductor layer.

The second portion of the conductor layer can be in contact with an electric contact of the electronic or optoelectronic component which is located on the top surface and the boundary region can be located between the top surface of the electronic or optoelectronic component and the adjacent upper surface of the first layer.

In some embodiments, a step of embedding the at least one electronic or optoelectronic component at least partially or completely into the first layer further comprises locally heating the first layer and, particularly simultaneously, pressing the electronic or optoelectronic component into the upper surface of the first layer in preferably a same region, where at least the first layer is locally heated.

In some embodiments, a step of embedding the at least one electronic or optoelectronic component at least partially or completely into the first layer comprises heating the electronic or optoelectronic component and, particularly simultaneously, pressing the electronic or optoelectronic component into the upper surface of the first layer. This step may for example be performed by use of a heated stamp, which is adapted to pick up an electronic or optoelectronic component, heat the component, arrange the component on a respective position on the upper surface of the first layer and press the component into the first layer at the respective position.

In some embodiments, a step of embedding the at least one electronic or optoelectronic component at least partially or completely into the first layer comprises heating the first layer to a temperature which is just below a softening temperature of the material of the first layer as well as heating the electronic or optoelectronic component and, particularly simultaneously, pressing the electronic or optoelectronic component into the upper surface of the first layer.

In some embodiments, a step of embedding the at least one electronic or optoelectronic component at least partially or completely into the first layer comprises deep drawing of at least a portion of the first layer, thereby generating a recess portion, and pressing the electronic or optoelectronic component into the recess portion. In particular, a deep drawing tool can be arranged on the surface of the first layer opposite to the upper surface and at least portions of the first layer can be deep drawn in the direction of the deep drawing tool. Thereby at least one recess portion is generated in the first layer and an electronic or optoelectronic component is pressed into the recess portion.

In some embodiments, a step of arranging the first, second and intermediate portion of the structured conductor layer comprises a so-called PICOS (Planar Interconnect On Substrate) process. Such a PICOS process can comprise for example the following steps: A seed layer, in particular a titanium-copper alloy is applied to the top surface of the at least one electronic or optoelectronic component and/or the upper surface of the first layer and/or the boundary region and/or the dielectric layer. A photoresist layer is then applied to the seed layer and is structured so that regions of the seed layer are exposed. The exposed areas of the seed layer are galvanized and copper-titanium is electrodeposited onto the exposed areas of the seed layer. The areas of the photoresist layer left by the structuring and the underlying seed layer are removed. The steps of the galvanization of the seed layer and the applying of a photoresist layer, which is then structured, can also be switched. Thus, the galvanization can be performed on a bigger surface and the structuring can be performed afterwards.

Through this procedure, the electronic or optoelectronic component can be "framed" by a structured conductor layer, so that it can be possible to use the PICOS process to ensure both a mechanical stability and an electrical interconnect of the at least one electronic or optoelectronic component.

In some embodiments, a step of arranging the first, second and intermediate portion of the structured conductor layer comprises a jetting process. For example, a silver- or copper-nanotube ink is serially or in parallel and locally applied to the top surface of the at least one electronic or optoelectronic component and/or the upper surface of the first layer and/or the boundary region and/or the dielectric layer to electrically interconnect the at least one electronic or optoelectronic component.

In some embodiments, the step of arranging at least one electronic or optoelectronic component on an upper surface of a first layer comprises gluing the at least one electronic or optoelectronic component on the upper surface, in particular using an adhesive. The adhesive can be arranged between the electronic or optoelectronic component and the upper surface or can form a fillet weld between the upper surface and a shell surface of the electronic or optoelectronic component. In some embodiments, the adhesive can be of a temporary adhesive, that evaporates at least partially or completely during the step of embedding the at least one electronic or optoelectronic component at least partially or completely into the first layer.

In some embodiments, the method of manufacturing an optoelectronic device, in particular an at least partially transparent pane, for example of a vehicle, further comprises a step of arranging a dielectric layer between the structured conductor layer and the first layer and/or between the structured conductor layer and the top surface of the electronic or optoelectronic component. Such dielectric layer can prevent a short between the structured conductor layer and at least one of the first layer and the top surface of the electronic or optoelectronic component.

In some embodiments, the method of manufacturing an optoelectronic device, in particular an at least partially transparent pane, for example of a vehicle, further comprises a step of arranging an integrated circuit (IC) on the structured conductor layer.

In some embodiments of the present invention, an optoelectronic device, for example an at least partially transparent pane for example of a vehicle, comprises a carrier layer and two or more layer segments, in particular intermediate layer segments arranged between a cover layer and the carrier layer. At least one optoelectronic component is arranged on at least one of the layer segments and the layer segments are arranged adjacent to each other on the carrier layer, wherein adjacent layer segments are mechanically connected with each other.

In some embodiments, the layer segments are connected with each other such that a joint region between the layer segments is at least approximately invisible. Thus, the single layer segments are at least approximately invisible in the finalized optoelectronic device.

The mechanical connection between adjacent layer segments can relate to adjacent layer segments that are thermally melted with each other at their adjacent boundary regions and thereby mechanically connected to each other. Thus, a step of mechanically connecting adjacent layer segments can include a melting of adjacent boundary regions of the layer segments.

The layer segments allow forming a larger layer, for example a so-called intermediate layer, on the carrier layer. Thus, a large surface area that corresponds to the larger layer can be formed by use of the layer segments that are arranged adjacent to each other on the carrier layer.

The layer segments can be rather thin and flexible. Thus, they can consist of a more sensitive material, such as a foil material. Using smaller layer segments and building up a larger layer on the carrier layer from the layer segments allows simplifying the production process, since smaller size layers segments are easier to handle than a larger layer. Furthermore, it can be easier to arrange the layer segments on a curved surface of a carrier layer than a larger single layer.

In some embodiments, the optoelectronic device comprises a carrier layer and a plurality of layer segments, wherein at least one optoelectronic component is arranged on at least one of the layer segments. The layer segments are arranged adjacent to each other on the carrier layer, wherein adjacent layer segments are mechanically connected with each other.

At least one optoelectronic component can be arranged on at least one of the layer segments. In some embodiments at least one optoelectronic component is arranged on each layer segment, on a number of layer segments, or on only one layer segment. Hence, there may be layer segments with no optoelectronic component arranged on it and/or layer segments with one or more optoelectronic components arranged on it.

In some embodiments, the optoelectronic device forms an at least partially transparent pane of a vehicle, particularly a windshield or a window of a vehicle. Accordingly, the pane and particularly the windshield or window comprises at least one optoelectronic component to enlighten the pane at least partially and/or to display information on at least parts of the pane.

The optoelectronic device can be part of any other surface, as for example the headliner or the outer surface of for example a vehicle. Accordingly, the optoelectronic device can have a 3-dimensional shape and/or it can be arranged on a surface that is curved. The headliner or the outer surface thus comprises at least one optoelectronic component to enlighten the headliner or the outer surface at least partially and/or to display information on at least parts of the headliner or the outer surface.

The manufacturing of small layer segments, in particular compared to complete layers of the size of for example the size of a windshield of a vehicle can be easier and more cost effective. Thus, by arranging two or more layer segments adjacent to each other on the carrier layer it is possible to provide a simpler and cost-effective method to manufacture an optoelectronic device with particularly large dimensions. Further, it can be easier to arrange layer segments adjacent to each other on the carrier layer, which has for example a 3-dimensional shape, as if the layer segments would be of the same size as the carrier layer.

In some embodiments, the optoelectronic device comprises at least one electric bridging element, which at least extends between two adjacent layer segments, wherein each of the two layer segments comprises a conductor layer segment and the electric bridging element interconnects at least the conductor layer segments of the two layer segments. In other words, an electric bridging element can extend between a first layer segment and a second layer segment, which is adjacent to the first layer segment. The first layer segment comprises a first conductor layer segment and the second layer segment comprises a second conductor layer segment. The electric bridging element interconnects the first conductor layer segment with the second conductor layer segment.

The at least one bridging element can electrically interconnect at least two adjacent layer segments. Each of the at least two layer segments can comprise a conductor layer segment and the electric bridging element can interconnect the conductor layer segments of the at least two layer segments.

In some embodiments, each layer segment is electrically connected by at least an electric bridging element to an adjacent layer segment. Accordingly, the conductor layer segments on the layer segments can be connected with the conductor layer segments on the other layer segments by use of electric bridging elements.

In some embodiments, the layer segments are flexible and/or bendable. In case of a 3-dimensional shaped carrier layer surface, the layer segments can thus be arranged on the carrier layer surface and follow the 3-dimensional shape of the carrier layer surface. If the optoelectronic device is being 3-dimensional shaped after arranging the layer segments on the carrier layer, there is only a low risk of breakage of the layer segments as they are bendable.

In some embodiments, the layer segments have a quadratic or rectangular form, and preferably have a length of at least approximately 125 mm and a width of at least approximately 70 mm.

In some embodiments, the layer segments can have the form of stripes, in particular of rectangular stripes, with preferably a length in the range of 1 cm and 100 cm, preferably in the range of 10 cm to 40 cm, and a width in the range of 1 cm and 100 cm, preferably in the range of 10 cm to 40 cm.

However, the layer segments can be of any other appropriate form. For example these can have the form of a regular polygon such as a triangle, a hexagon, or an octagon.

In some embodiments, the layer segments are at least partially transparent, wherein optionally, the layer segments are arranged between a cover layer and the carrier layer. At least one of the cover layer and the carrier layer can also be at least partially transparent. The optoelectronic device can therefore be at least partially transparent.

In some embodiments, the layer segments comprise or consist of a material such as polyvinyl butyral (PVB) or ethylene-vinyl acetate (EVA). Particularly, the layer segments can be a foil of a foil material, such as polyvinyl butyral (PVB) or ethylenevinyl acetate (EVA). A foil is elastic and can adapt to nonplanar contours or shapes.

The layer segments can comprise or consist of any other plastic, particularly any other resin, that has preferably a strong binding, optical clarity, adhesion to many surfaces, toughness and flexibility.

In some embodiments, the layer segments can be laminated or fixed by an adhesive to the carrier layer. Thus, a mechanical connection between the layer segments can for example be provided by the fixation of the layer segments on the carrier layer.

In some embodiments, the carrier layer is at least partially transparent. Particularly the carrier layer can comprise or consist of glass or another at least partially transparent material, for example, methacrylate (PMMA) and/or polycarbonate (PC).

In some embodiments, the at least one optoelectronic component can be an LED that is a volume emitter or surface emitter. The at least one optoelectronic component can be controlled individually. Thus, a light distribution can be controlled in the optoelectronic device. The individual control of the at least one optoelectronic component can for example be achieved by individually controlling the electric current that is provided to each optoelectronic component.

In some embodiments, the at least one optoelectronic component, in particular LED, can be smaller than 300 µm, in particular smaller than 150 µm. With these spatial extensions, at least one optoelectronic component is invisible for the human eye.

In some embodiments, a micro LED, also called µLED, or a µLED-chip is used as optoelectronic component. A µLED is a small LED, for example, with edge lengths of less than 70 µm, in particular down to less than 20 µm, in particular in the range from 1 µm to 10 µm. Another range is between 10-30 µm. This can result in a surface area from a few hundred µm$^2$ to a few tens of µm$^2$. For example, a µ-LED can have a surface area of approximately 60 µm$^2$ with an edge length of approximately 8 µm. In some cases, a µ-LED has an edge length of 5 µm or less, which results in a surface area size of less than 30 µm$^2$. Typical heights of such µ-LEDs are, for example, in the range of 1.5 µm to 10 µm.

A micro light emitting diode chip, also called µLED-chip, can be used as optoelectronic component. A micro light emitting diode can form a pixel or a subpixel and emit light of a selected colour.

The optoelectronic component such as an LED or µLED can be unpackaged. Thus, it can be a bare die.

In some embodiments, the electric bridging element comprises an at least partially transparent and/or flexible tape. Optionally, the tape comprises at least one conductor path to interconnect the conductor layer segments of two adjacent layer segments. Such a transparent and/or flexible tape, comprising at least one conductor path, can for example be provided by help of an ink-jetting process.

In some embodiments, the electric bridging elements are provided on a cover layer. An electric bridging element can have the form of a conductor path. The cover layer is arranged on the layer segments after they have been placed on the carrier layer. The electric bridging elements on the cover layer then interconnect the conductor layer segments of two adjacent layer segments.

In some embodiments, a planarization layer is arranged on the layer segments or on a cover layer. The planarization layer can comprise or consist of a material such as polyvinyl butyral (PVB) or ethylene-vinyl acetate (EVA). Particularly, the planarization layer can be a foil of a material such as polyvinyl butyral (PVB) or ethylene-vinyl acetate (EVA). Alternatively, the planarization layer can comprise or consist of any other plastic, particularly any other resin, that has preferably a strong binding, optical clarity, adhesion to many surfaces, toughness and flexibility.

In some embodiments, a method of manufacturing an optoelectronic device, in particular an at least partially transparent pane, for example of a vehicle, comprises arranging two or more layer segments adjacent to each other on a carrier layer. At least one optoelectronic component can be arranged on at least one of the layer segments and the method further comprises at least one of the following steps:
mechanically connecting the adjacent layer segments with each other, and
arranging at least one electric bridging element such that the bridging element extends between two of the adjacent layer segments, each of the two layer segments comprises a conductor layer segment, and the electric bridging element interconnects the conductor layer segments of the two layer segments.

In some embodiments, the step of mechanically connecting the adjacent layer segments with each other is performed before arranging at least one electric bridging element such that the bridging element extends between two of the adjacent layer segments. Thus, a mechanically connection between adjacent layer segments is made before an electrically interconnection is made between two of the adjacent layer segments.

In some embodiments, the step of arranging at least one electric bridging element such that the bridging element extends between two of the adjacent layer segments is performed before the step of mechanically connecting the adjacent layer segments with each other. Thus, an electrically connection between adjacent layer segments is made before a mechanically connection is made between adjacent layer segments. By arranging at least one electric bridging element such that the bridging element extends between two of the adjacent layer segments an at least slight mechanically connection can already be provided and the mechanically connection can be strengthened by a subsequent step of mechanically connecting the adjacent layer segments with each other.

In some embodiments, only the step of mechanically connecting the adjacent layer segments with each other is performed, as well as in some embodiments only the step of arranging at least one electric bridging element, such that the bridging element extends between two of the adjacent layer segments, is performed.

In some embodiments, the step of mechanically connecting the adjacent layer segments with each other comprises the step of at least partially melting opposing edge regions of the adjacent layer segments, in particular with a laser or a heating device such as an autoclav or a hotplate. Particularly, the step of mechanically connecting the adjacent layer segments with each other is performed by laser welding. In some embodiments, the step of mechanically connecting the adjacent layer segments with each other comprises the step of homogeneously melting the complete adjacent layer segments. This is preferably done by use of a heating device, such as an autoclav or a hotplate.

In some embodiments, the layer segments, particularly before the step of mechanically connecting the adjacent layer segments with each other is performed, are arranged adjacent to each other on the carrier layer, such that the adjacent layer segments are spaced apart from each other by a predefined distance, wherein, optionally, the predefined distance is in a range from 0-1500 μm. Particularly the predefined distance is dependent on the flow behavior of the material of the adjacent layer segments.

In some embodiments, the layer segments, particularly after the step of mechanically connecting the adjacent layer segments with each other is performed, form a homogeneous and planar layer.

In some embodiments, the step of arranging the at least one electric bridging element comprises an ink-jetting process. Therefore, an ink, for example a silver- or copper-nanotube ink is serially or in parallel and locally applied to a top surface of the conductor layer segments of the adjacent layer segments.

In some embodiments of the present invention, a method of manufacturing an optoelectronic device, for example an at least partially transparent pane for example of a vehicle, comprises the steps:
- arranging at least one optoelectronic component on an upper surface of a first layer, in particular an intermediate layer arranged on or arranged between a cover layer and a carrier layer,
- providing a conductor layer on the upper surface and on the at least one optoelectronic component,
- structuring the conductor layer such that a resulting structured conductor layer comprises electrical conductor paths for providing electricity to the at least one optoelectronic component by use of the structured conductor layer.

By providing a conductor layer on for example a large area of the upper surface of the first layer and then structuring the conductor layer, a cost-efficient production process with relatively few process steps can be provided for large formats of an optoelectronic device. The production costs may therefore scale with the number of chips arranged on the first layer and less with the size of the first layer. This can particularly be advantageous for larger areas with only a partial coverage of the first layer with optoelectronic components and thus so-called large "dead areas".

In some embodiments, the step of structuring the conductor layer can comprise a lithographic structuring of the conductor layer, particularly a photolithographic structuring of the conductor layer. By use of a photomask (also called an optical mask), a geometric pattern of light can be transferred to a photosensitive, in particular light-sensitive, chemical photoresist on the conductor layer. Exposure to light chemically changes the photoresist. Some of the photoresist can be removed by a solution called developer. Positive photoresist, a common type, becomes soluble in the developer after light exposure. Using a negative photoresist, unexposed regions become soluble in the developer. With a series of chemical treatments, the exposure pattern can then be etched into the conductor layer and the desired structured conductor layer can be obtained.

In some embodiments, the step of structuring the conductor layer can comprise an additive printing of the conductor layer on a top surface of the optoelectronic component and the upper surface of the first layer.

In some embodiments, the method can comprise detecting the position of the at least one optoelectronic component, in particular using an automated optical inspection (AOI). It can thereby be ensured that the optoelectronic component, particularly at least one electric contact arranged on a top surface of the optoelectronic component, is aligned with the structured conductor layer in a later step. Alternatively, a placement process can be used which provides a sufficient accuracy such that the optoelectronic component, particularly at least one electric contact arranged on a top surface of the optoelectronic component, can be aligned with the structured conductor layer. An AOI can therefore be avoided.

In some embodiments, the step of providing a conductor layer comprises arranging the conductor layer on the upper surface and/or on the at least one optoelectronic component. Optionally, a lamination device can be used for laminating the conductor layer on the upper surface and/or on the at least one optoelectronic component. In some embodiments, a heated roll laminator can be used for laminating the conductor layer on the upper surface and/or on the at least one optoelectronic component, in particular in a roll-to-roll process.

In some embodiments, the step of providing the conductor layer on the upper surface and/or on the at least one optoelectronic component comprises embedding the at least one optoelectronic component at least partially into the first layer. The at least one optoelectronic component can thereby be pressed at least partly into the first layer and the conductor layer can simultaneously be arranged on the upper surface of the first layer and/or on the at least one optoelectronic component. Hence, the steps of embedding the at least one optoelectronic component into the first layer and arranging, particularly laminating, the conductor layer on the upper surface of the first layer and/or on the at least one optoelectronic component can be performed simultaneously. In particular, the at least one optoelectronic component and or the first layer can be heated to a suitable temperature and the at least one optoelectronic component can be pressed simultaneously and after the temperature is reached into the first layer.

In some embodiments, the at least one optoelectronic component can be embedded into the first layer such that a top surface of the optoelectronic component is arranged in the plane which is defined by the upper surface of the first layer. Thus, the conductor layer can be arranged on a largely flat surface, which is formed by the upper surface of the first layer and the top surface of the at least one optoelectronic component.

In some embodiments, the step of arranging the conductor layer on the upper surface and/or on the at least one optoelectronic component comprises:

providing a flat conductor layer on a top surface of the at least one optoelectronic component, and deep drawing the conductor layer to cover the at least one optoelectronic component and the upper surface of the first layer.

In some embodiments, the at least one optoelectronic component can be arranged on the upper surface of the first layer, such that it is not embedded into the first layer. The conductor layer can be arranged on the upper surface and/or on the at least one optoelectronic component such that a first portion of the conductor layer is arranged on an upper surface of the first layer, a second portion of the conductor layer is arranged on a top surface of the optoelectronic component, and an intermediate portion of the conductor layer is arranged on a side surface of the optoelectronic component and interconnects the first and the second portion of the conductor layer.

In some embodiments, the first layer comprises or consists of an elastic material, such as polyvinyl butyral (PVB), ethylenevinyl acetate (EVA) or thermoplastic polyurethane (TPU). Optionally, the first layer can be a foil of the elastic material. The elastic first layer can adapt to non-planar contours or shapes. The first layer can comprise or consist of any other plastic than PVB, particularly any other resin, that has preferably a strong binding, optical clarity, adhesion to many surfaces, toughness and flexibility, as for example ethylene-vinyl acetate (EVA).

In some embodiments, the first layer can be an intermediate layer arranged between a cover layer and a carrier layer. At least one of the cover layer and the carrier layer can be at least partially transparent and can comprise or consist of glass or another at least partially transparent material, for example, methacrylate (PMMA) and/or polycarbonate (PC).

Using a PVB or EVA foil as the first layer, a smooth lamination between the cover layer and the carrier layer, particularly two glasses can be obtained.

In some embodiments, the step of arranging at least one optoelectronic component on the upper surface of the first layer comprises gluing the at least one optoelectronic component on the upper surface of the first layer by use of an adhesive. The inherent stickiness of a PVB film at eleanted temperatures can be used to hold the at least one optoelectronic component in position on the upper surface of the first layer.

In some embodiments, the at least one optoelectronic component can be an LED that is a volume emitter or surface emitter. The at least one optoelectronic component can be controlled individually. Thus, at least in some embodiments, a desired light distribution can be obtained from the optoelectronic device. The individual control of the at least one optoelectronic component can for example be achieved by individually controlling an electric current that is provided to each optoelectronic component.

In some embodiments, the at least one optoelectronic component, in particular LED, can be smaller than 300 µm, in particular smaller than 150 µm. With these spatial extensions, at least one optoelectronic component is invisible for the human eye at reading distance.

In some embodiments, a micro LED, also called µLED, or a µLED-chip can be used as optoelectronic component. A µLED is a small LED, for example, with edge lengths of less than 70 µm, in particular down to less than 20 µm, in particular in the range from 1 µm to 10 µm. Another range is between 10-60 µm. This can result in a surface area from a few hundred µm² to a few tens of µm². For example, a µ-LED can have a surface area of approximately 2500 µm² with an edge length of approximately 50 µm. In some cases, a µ-LED has an edge length of 5 µm or less, which results in a surface area size of less than 30 µm². Typical heights of such µ-LEDs are, for example, in the range of 1.5 µm to 10 µm.

A micro light emitting diode chip, also called µLED-chip, can be used as optoelectronic component. A micro light emitting diode can form a pixel or a subpixel and emit light of a selected colour.

In some embodiments, particularly all electric contacts of the at least one optoelectronic component, in particular contact pads, are arranged on a top surface of the optoelectronic component. The optoelectronic component can be arranged on the upper surface of the first layer such that the electric contacts are facing away from the upper surface of the first layer. Thus, the at least one optoelectronic component can be formed as a flipchip LED, a thinfilm flipchip LED, or a flipchip µLED.

In some embodiments, the conductor layer comprises or consists of an electrically conductive material layer, such as copper, gold, or silver. Optionally, the electrically conductive material layer includes electrically conductive nanoparticles, such as silver and/or gold and/or copper nanoparticles.

In some embodiments, the conductor layer comprises or consists of a photostructurable nanoparticle paste, which includes electrically conductive nanoparticles, such as silver and/or gold and/or copper nanoparticles.

In some embodiments, the conductor layer comprises in addition to the electrically conductive material layer a second electrically conductive material layer that comprises or consist of an electrically conductive adhesive or a solder. The second electrically conductive material layer can particularly comprise or consist of an adhesive, a solder or a solder glue. The second electrically conductive material layer can be of isotropic or anisotropic electric conductivity. The second electrically conductive material layer can be arranged on the electrically conductive material layer before providing the conductor layer on the upper surface and/or on the at least one optoelectronic component. Alternatively, the second electrically conductive material layer can be arranged on the upper surface and on the at least one optoelectronic component and the first electrically conductive material layer can be provided on the second electrically conductive material layer.

In some embodiments, the method comprises providing electrical contact elements, which are particularly made of a conductive adhesive or a solder. The electrical contact elements are provided on at least an electric contact of the optoelectronic component. The electric contacts, in particular a contact pads, can be arranged on a top surface of the optoelectronic component. Particularly, the electrical contact elements can be arranged only on the electric contacts but not on the upper surface of the first layer and/or on an exposed area of top surface of the at least one optoelectronic component.

In some embodiments, the method comprises mechanically and electrically interconnecting the conductor layer with an electric contact of the optoelectronic component, wherein the electric contact, in particular a contact pad, can be arranged on a top surface of the optoelectronic component. The step of mechanically and electrically interconnecting the conductor layer with an electric contact of the optoelectronic component can in some embodiments be performed before the step of structuring the conductor layer. Alternatively, the step of mechanically and electrically interconnecting the conductor layer with an electric contact of the optoelectronic component can in some embodiments be performed after the step of structuring the conductor layer.

In some embodiments, the step of mechanically and electrically interconnecting the conductor layer with an electric contact of the optoelectronic component can comprise a step of punctual laser welding the conductor layer in a region above the electric contact. Particularly, the punctual laser welding of the conductor layer with the electric contact can be performed only in regions above an electric contact such that a mechanical and electrical interconnection of the conductor layer with an electric contact of the optoelectronic component can be provided.

In some embodiments, the step of mechanically and electrically interconnecting the conductor layer with an electric contact of the optoelectronic component can comprises heating the conductor layer above a melting/reaction temperature of the conductive adhesive or solder, which may be arranged on at least an electric contact of the optoelectronic component or as a second electrically conductive material layer on the upper surface and on the at least one optoelectronic component. Particularly, after cooling down the conductive adhesive or solder, a mechanical and electrical interconnection of the conductor layer with an electric contact of the optoelectronic component can be provided.

In some embodiments, the step of structuring the conductor layer can be followed by a step of sintering the electrically conductive material layer, in particular the photostructurable nanoparticle paste, which includes electrically conductive nanoparticles, such as silver and/or gold and/or copper nanoparticles. The step of sintering can comprise an oven process if the first layer and the at least one optoelectronic component tolerates temperatures of at least approximately 140° C. Alternatively, the step of sintering can comprise a photonic curing process.

In some embodiments, the method further comprises a step of arranging a planarization layer on the first layer and/or the conductor layer. The planarization layer can comprise or consist of an elastic material, such as polyvinyl butyral (PVB). Optionally, the planarization layer can be a foil of the elastic material. A foil can be elastic and can adapt to non-planar contours or shapes. Thus, a foil can for example be arranged on a curved carrier surface. Alternatively, the planarization layer can comprise or consist of any other plastic, particularly any other resin, that has preferably a strong binding, optical clarity, adhesion to many surfaces, toughness and flexibility, as for example ethylene-vinyl acetate (EVA). In some embodiments, the at least one optoelectronic component and/or the structured conductor layer can be embedded in the planarization layer.

In some embodiments, the conductor layer can be provided on the upper surface of the first layer, particularly on the whole upper surface of the first layer or on the upper surface of a temporary carrier layer. The conductor layer can then be structured such that a resulting structured conductor layer comprises electrical conductor paths. The at least one optoelectronic component can then be arranged on the structured conductor layer such that the electrical conductor paths are connected with electric contacts of the at least one optoelectronic component. Such method may be called "chips last" as the at least one optoelectronic component is arranged on the structured conductor layer after the conductor layer has been structured.

In some embodiments, a method of manufacturing an optoelectronic device, in particular an at least partially transparent pane, for example of a vehicle comprises the following steps:

providing a conductor layer on an upper surface of a first layer, in particular an intermediate layer arranged between a cover layer and a carrier layer, structuring the conductor layer such that a resulting structured conductor layer comprises electrical conductor paths suitable for providing electricity to at least one optoelectronic component, and arranging the at least one optoelectronic component on the structured conductor layer.

In some embodiments, electrical contact elements are provided on the structured conductor layer for electrically connecting contacts of the at least one optoelectronic component with the structured conductor layer. The contact elements are provided on the structured conductor layer such that the contact elements are aligned with the contacts of the at least one optoelectronic component.

In some embodiments the contact elements are provided on defined positions on the structured conductor layer. The positions are defined such that the contact elements are aligned with the electric contacts of the optoelectronic components. Each optoelectronic component can for example be a flipchip which has two electric contacts at defined locations on its bottom surface. The contact elements for such a flipchip are arranged on the structured conductor layer such that each contact of the flipchip gets into contact with one contact element.

In some embodiments, the contact elements are provided by an application of for example solder paste on the structured conductor layer. Particularly, in some embodiments, the method comprises the application of a solder material which comprises a mixture of tin, silver and copper (SnAgCu) as for example SAC.

In some embodiments, the method further comprises a step of heating the contact elements by use of photonic pulses. For generating the photonic light pulses, a broadband emitter such as for example a high pressure xenon lamp can be used. Particularly, in some embodiments, the method further comprises a step of soldering the contact elements by use of photonic soldering. A melting temperature of the solder can preferably be higher than a maximum service temperature (Tmax) of the first layer. The maximum service temperature (Tmax) can be the highest temperature being applied to the material of the first layer, for prolonged periods, without significant change in properties. An increase in temperature above the maximum service temperature could cause degradation, chemical change, and excessive creep.

By heating the contact elements by use of particularly short photonic pulses of at least approximately 3 milliseconds to 3 seconds, the contact elements can be at least partially melted while the material properties of the first layer and/or the structured conductor layer, arranged below the contact elements, are not significantly changed.

In some embodiments, the contact elements can absorb the energy of the photonic pulses, while the preferably transparent material of the first layer does not, or to a less extend, absorb the energy of the photonic pulses.

Thus, if the first layer is at least partially transparent and the contact elements are at least less transparent, the contact elements can absorb more of the energy of the photonic pulses than the first layer. The contact elements can thus get heated and/or melted while the material properties of the first layer and/or the structured conductor layer, arranged below the contact elements, are not significantly changed.

In some embodiments, an optoelectronic device, in particular an at least partially transparent pane, for example of a vehicle, comprises a first layer, in particular an intermediate layer arranged between a cover layer and a carrier layer, at least one optoelectronic component, which is at least partially or completely embedded in the first layer, and at least one structured conductor layer arranged on an upper surface of the first layer and on the at least one optoelectronic component. The conductor layer comprises electrical conductor paths for providing electricity to the at least one optoelectronic component.

In some embodiments, the at least one optoelectronic component can be embedded into the first layer such that a top surface of the optoelectronic component is arranged in the plane which is defined by the upper surface of the first layer. Thus, the conductor layer can be arranged on a largely flat surface, which is formed by the upper surface of the first layer and the top surface of the at least one optoelectronic component.

In some embodiments, a first portion of the conductor layer is arranged on an upper surface of the first layer, and a second portion of the conductor layer is arranged on a top surface of the optoelectronic component and is in contact with an electric contact of the optoelectronic component, wherein the electric contact, in particular a contact pad, is arranged on the top surface. Particularly, the second portion of the conductor layer is mechanically and electrically interconnected with an electric contact of the optoelectronic component.

In some embodiments, the conductor layer comprises residues from sintering a photostructurable nanoparticle paste, particularly residues of a photostructurable nanoparticle paste, which includes electrically conductive nanoparticles, such as silver and/or gold and/or copper nanoparticles.

In some embodiments, an optoelectronic device, in particular an at least partially transparent pane for example of a vehicle, comprises a first layer, in particular an intermediate layer arranged between a cover layer and a carrier layer, at least one optoelectronic component, arranged on the first layer, and at least one structured conductor layer arranged on an upper surface of the first layer and on the at least one optoelectronic component. The conductor layer comprises electrical conductor paths for providing electricity to the at least one optoelectronic component, and the conductor layer comprises residues from sintering a photostructurable nanoparticle paste, particularly residues of a photostructurable nanoparticle paste which includes electrically conductive nanoparticles, such as silver and/or gold and/or copper nanoparticles.

In some embodiments, the at least one optoelectronic component can be arranged on the upper surface of the first layer, such that is is not embedded into the first layer.

In some embodiments, a first portion of the conductor layer can be arranged on an upper surface of the first layer, and a second portion of the conductor layer can be arranged on a top surface of the optoelectronic component and be in contact with an electric contact of the optoelectronic component. The electric contact, in particular a contact pad, can be arranged on the top surface. In some embodiments, an intermediate portion of the conductor layer can be arranged on a side surface of the optoelectronic component and it can interconnect the first and the second portion of the conductor layer. Thus, the at least one optoelectronic component and the upper surface of the first layer can be covered by the conductor layer.

In some embodiments, an optoelectronic device, in particular an at least partially transparent pane for example of a vehicle, comprises a first layer, in particular an intermediate layer arranged between a cover layer and a carrier layer, a structured conductor layer, arranged on an upper surface of the first layer and at least one optoelectronic component arranged on the structured conductor layer. The structured conductor layer comprises electrical conductor paths for providing electricity to the at least one optoelectronic component. In addition, electrical contact elements are arranged on the structured conductor layer, particularly between the structured conductor layer and electric contacts of the at least one optoelectronic component, for electrically connecting the electric contacts of the at least one optoelectronic component with the structured conductor layer. The contact elements are particularly aligned with the electric contacts of the at least one optoelectronic component and comprise or consist of a material with a higher melting or curing temperature than a maximum service temperature of the first layer.

In some embodiments, a planarization layer is arranged on the first layer and/or the conductor layer, wherein the planarization layer can comprise or consist of a material similar to the first layer, as for example PVB. Optionally, the at least one optoelectronic component can be embedded into the planarization layer.

In some embodiments of the present invention, a at least partially flexible optoelectronic device comprises a stiffener, to stabilize at least a connection area of the optoelectronic device to allow a secured electrical interconnection of the optoelectronic device with the environment.

In some embodiments of the present invention, a method of manufacturing an optoelectronic device, for example an at least partially transparent pane for example of a vehicle comprises the following steps:

providing a carrier substrate, particularly a temporary carrier substrate, and a release layer, particularly a temporary release layer, arranged on the carrier substrate, providing a structured conductor layer on the release layer which is opposite to the carrier substrate, arranging at least one optoelectronic component on the structured conductor layer, wherein the structured conductor layer comprises electrical conductor paths for providing electricity to the at least one optoelectronic component, providing a first layer on the release layer, wherein the first layer covers the conductor layer and the at least one optoelectronic component such that the at least one optoelectronic component is at least partially embedded in the first layer, and removing the carrier substrate and the release layer.

By providing a carrier substrate, particularly a rigid carrier substrate, being used as a basis for building up the optoelectronic device on top of it, a cost-efficient production process with relatively few process steps can be provided for large formats of an optoelectronic device. The release layer can function as for example a thermal, a chemical or a laser release layer, which allows an easy and non-destructive removal of the optoelectronic device from the carrier substrate.

In some embodiments, the carrier substrate can comprise or consist of a preferably transparent and rigid material, such as for example glass.

In some embodiments, the carrier substrate can comprise or consist of a deformable material such as for example a mold compound or resin. This can be advantageous, since the optoelectronic device can be brought into a desired form.

The release layer can in some embodiments comprise or consist of a dissolvable material such as for example silicon nitride (SiN). The release layer can thus be removed easily.

In some embodiments the method further comprises, after removing the carrier substrate and the release layer, a step of providing a planarization layer on the first layer and/or the structured conductor layer and/or the at least one optoelectronic component. Accordingly, the structured conductor layer and/or the at least one optoelectronic component is arranged between the first layer and the planarization layer. Furthermore, the structured conductor layer can be arranged in the neutral fiber of a laminate of the first layer, the structured conductor layer and the planarization layer.

In some embodiments, the first layer comprises or consists of an elastic material, such as polyvinyl butyral (PVB). Optionally, the first layer can be a foil of the elastic material. The elastic first layer can adapt to non-planar contours or shapes. The first layer can comprise or consist of any other plastic than PVB, particularly any other resin, that has preferably a strong binding, optical clarity, adhesion to many surfaces, toughness and flexibility, as for example ethylene-vinyl acetate (EVA), silicone or thermoplastic urethane (TPU).

In some embodiments, the at least one optoelectronic component can be embedded in the first layer such that a top surface of the optoelectronic component is arranged in the plane which is defined by an upper surface of the first layer.

In some embodiments, the first layer can be an intermediate layer arranged between a cover layer and a carrier layer, particularly a permanent carrier layer. The carrier layer and the cover layer are preferably permanent layers in the final optoelectronic device. At least one of the cover layer and the carrier layer can be at least partially transparent and can comprise or consist of glass or another at least partially transparent material, for example, methacrylate (PMMA), silicone and/or polycarbonate (PC).

Using a PVB or EVA foil as the first layer, a smooth lamination between the cover layer and the carrier layer, particularly two glasses can be obtained. The lamination can in some embodiments be performed by use of temperature and pressure.

In some embodiments, the at least one optoelectronic component can be an LED that is a volume emitter or surface emitter. The at least one optoelectronic component can be controlled individually. Thus, at least in some embodiments, a desired light distribution can be obtained from the optoelectronic device. The individual control of the at least one optoelectronic component can for example be achieved by individually controlling an electric current that is provided to each optoelectronic component.

In some embodiments, the at least one optoelectronic component, in particular LED, can be smaller than 300 µm, in particular smaller than 150 µm. With these spatial extensions, at least one optoelectronic component is invisible for the human eye at reading distance.

In some embodiments, a micro LED, also called µLED, or a µLED-chip can be used as optoelectronic component. A µLED is a small LED, for example, with edge lengths of less than 70 µm, in particular down to less than 20 µm, in particular in the range from 1 µm to 10 µm. Another range is between 10-60 µm. This can result in a surface area from a few hundred µm² to a few tens of µm². For example, a µ-LED can have a surface area of approximately 2500 µm² with an edge length of approximately 50 µm. In some cases, a µ-LED has an edge length of 5 µm or less, which results in a surface area size of less than 30 µm². Typical heights of such µ-LEDs are, for example, in the range of 1.5 µm to 10 µm.

A micro light emitting diode chip, also called µLED-chip, can be used as optoelectronic component. A micro light emitting diode can form a pixel or a subpixel and emit light of a selected colour.

In some embodiments, the conductor layer comprises or consists of an electrically conductive material layer, such as copper, gold, or silver.

In some embodiments, the step of providing a structured conductor layer on the release layer, which is opposite to the carrier substrate, comprises a step of growing an electrically conductive material layer, such as for example copper, on the release layer.

In some embodiments, the conductor layer can be provided on the release layer, particularly on the whole surface of the release layer. The conductor layer can then be structured such that a resulting structured conductor layer comprises electrical conductor paths. The at least one optoelectronic component can then be arranged on the structured conductor layer such that the electrical conductor paths are connected with electric contacts of the at least one optoelectronic component.

In some embodiments, the planarization layer can comprise or consist of an elastic material, such as polyvinyl butyral (PVB). Optionally, the planarization layer can be a foil of the elastic material. A foil can be elastic and can adapt to non-planar contours or shapes. Alternatively, the planarization layer can comprise or consist of any other plastic, particularly any other resin, that has preferably a strong binding, optical clarity, adhesion to many surfaces, toughness and flexibility, as for example ethylene-vinyl acetate (EVA). In some embodiments, the structured conductor layer can be embedded in the planarization layer.

In some embodiments, the method further comprises a step of providing at least one stiffener on the release layer and/or the structured conductor layer. The step of providing at least one stiffener on the release layer and/or the structured conductor layer is preferably performed prior to the step of providing the first layer, as well as the step of removing the release layer and the temporary carrier substrate. The stiffener can preferably function as a stabilizer of at least a connection area of the optoelectronic device to allow a secured electrical interconnection of the optoelectronic device with the environment.

In some embodiments, the optoelectronic device can be of a flexible material and a rigid stiffener can be arranged in an edge area of the optoelectronic device to stabilize at least the edge area of the optoelectronic device. The edge area and particularly the stiffener can for example be used as a connection area of the optoelectronic device to allow a secured electrical interconnection of the optoelectronic device with the environment and/or at least one adjacent second optoelectronic device.

In some embodiments, the stiffener can comprise a rigid housing and electric conductor paths in the housing to electrically connect the optoelectronic device and particularly the optoelectronic components with the environment and/or at least one adjacent second optoelectronic device.

In some embodiments, the at least one stiffener is provided on an edge region of the release layer, wherein the edge region includes an edge of the release layer.

In some embodiments, the at least one stiffener can at least partly cover the structured conductor layer. The structured conductor layer can extend into the edge region of the release layer. Thus, the stiffener can also cover the portion of the structured conductor layer, which is placed in the edge region of the release layer.

In some embodiments, an outer edge of the at least one stiffener can be aligned with the edge of the release layer. Thus, a side surface of the at least one stiffener and a side surface of the release layer can be arranged in the same plane.

In some embodiments, the step of providing the first layer on the release layer can comprise at least partially embedding the at least one stiffener in the first layer. Optionally, the first layer must not completely cover the edge region of the release layer. The at least one stiffener therefore sticks out of the first layer. Accordingly, in some embodiments, the first layer is distal from the edge of the release layer.

In some embodiments, the stiffener comprises or consists of a rigid material, such as a rigid plastic material. Optionally, the stiffener is more rigid than the first layer and thus stiffens the first layer in at least an edge region of the first layer.

In some embodiments, the method further comprises, prior to providing the first layer on the release layer, a step of modifying a shape of an intermediate product. The intermediate product can comprise the carrier substrate and the release layer, the structured conductor layer on the release layer, the at least one optoelectronic component on the structured conductor layer, and optionally at least a stiffener on the release layer. The intermediate product can preferably be obtained by the steps of providing a carrier substrate and a release layer arranged on the carrier substrate, providing a structured conductor layer on the release layer, arranging at least one optoelectronic component on the structured conductor layer, and optionally providing at least one stiffener on the release layer and/or the structured conductor layer. The modified shape of the intermediate product can for example comprise at least one curved surface.

In some embodiments, after the step of modifying the shape of the intermediate product, the first layer is provided on the conductor layer and the at least one optoelectronic component. The step of modifying the shape of the intermediate product can be performed by pressing the intermediate product into the mold tool, for example by use of a mold tool. The first layer and the at least one optoelectronic component can then be provided on the conductor layer by for example molding the first layer onto the conductor layer and the at least one optoelectronic component. The first layer can therefore comprise or consists of a mechanically robust material such as for example a mold compound, a silicone, or a transparent or diffuse filled resin.

In some embodiments, the optoelectronic device can in a further step be arranged on a curved surface and can be fixed, particularly glued, to the curved surface. In a preferred embodiment, a curved surface of the intermediate product and/or a curved surface of the optoelectronic device can match with a curved surface on which the optoelectronic device shall be arranged.

In some embodiments, an optoelectronic device, in particular an at least partially transparent pane, for example of a vehicle, comprises a first layer, at least one optoelectronic component, which is at least partially or completely embedded in the first layer, and at least one structured conductor layer which is arranged on an upper surface of the first layer and on the at least one optoelectronic component. The structured conductor layer comprises electrical conductor paths for providing electricity to the at least one optoelectronic component.

In some embodiments, the optoelectronic device can further comprise a planarization layer on the upper surface of the first layer and/or the structured conductor layer and/or the at least one optoelectronic component. In some embodiments, the structured conductor layer can be embedded in the planarization layer. The structured conductor layer and/or the at least one optoelectronic component can in some embodiments be arranged between the first layer and the planarization layer, such that the structured conductor layer is for example arranged in the neutral plane of a laminate which comprises the first layer, the structured conductor layer and the planarization layer. The neutral plane is a conceptual plane within a laminate. When loaded by a bending force, the laminate bends so that for example, an inner surface is in compression and the outer surface is in tension or the other way around. The neutral plane is a plane within the laminate, where the material of the laminate is not under stress, either compression or tension.

In some embodiments, the at least one optoelectronic component can be completely embedded in the first layer, in particular such that a top surface of the optoelectronic component is arranged in a plane which is defined by the upper surface of the first layer. Thus, a largely flat upper surface can be provided by the first layer and the at least on optoelectronic component. In other words, the at least one optoelectronic component can be completely embedded in the first layer such that the top surface of the optoelectronic component is arranged in the plane which is defined by the upper surface of the first layer but the top surface is not covered by the first layer.

In some embodiments, the optoelectronic device further comprises at least one stiffener on the upper surface of the first layer and/or the structured conductor layer. The stiffener can in some embodiments be at least partially embedded in the first layer.

Thus, in some embodiments, the stiffener sticks out of the first layer, in particular sticks out of a side surface of the first layer.

In some embodiments, the upper surface of the first layer is curved.

In some embodiments, an optoelectronic device, in particular an at least partially transparent pane for example of a vehicle, comprises a layer stack, in particular an intermediate layer stack arranged between a cover layer and a carrier layer, having at least a top layer which comprises at least one opening, in particular an opening on an upper surface of the top layer. The optoelectronic device further comprises at least one electronic or optoelectronic component, which is arranged in the opening, and the optoelectronic device further comprises at least one electrical conductor arrangement, in particular a structured conductor layer, for providing electricity to the at least one electronic or optoelectronic component.

By arranging the at least one electronic or optoelectronic component in the opening, a topography of the optoelectronic device can be reduced and a subsequent process with the optoelectronic device can be simplified, as it can be technically difficult to balance optoelectronic components which are placed on a surface—but not arranged in an opening—on the top layer of the layer stack. Furthermore, by arranging the at least one electronic or optoelectronic component in the opening the topography of the optoelectronic device can be reduced. Thus, arranging the at least one electrical conductor arrangement, in particular a structured conductor layer can be improved. A further advantage can be that the at least one electronic or optoelectronic component can have a better mechanical stability when arranged in the opening. In particular, side surfaces of the opening can fix the electronic or optoelectronic component can be for example an optoelectronic light source, such as a LED, an optoelectronic detector, or an IC chip.

In some embodiments, a first portion of the electrical conductor arrangement is arranged on an upper surface of the top layer, and a second portion of the electrical conductor arrangement is arranged on a top surface of the electronic or optoelectronic component and is in contact with an electric contact of the electronic or optoelectronic component. The electric contact, in particular a contact pad, can be arranged on the top surface of the electronic or optoelectronic component.

In some embodiments, a boundary region is located between the top surface of the electronic or optoelectronic component and the adjacent upper surface of the top layer of the layer stack. An intermediate portion of the electrical conductor arrangement can extend across the boundary region and interconnect the first portion of the electrical conductor arrangement and the second portion of the electrical conductor arrangement.

Preferably, at least one electronic or optoelectronic component is arranged in an opening of a top layer of a layer stack, which is particularly an intermediate layer stack arranged between a cover layer and a carrier layer. An electrical conductor arrangement, in particular a conductor layer, is arranged on an upper surface of the top layer of the layer stack, and on a top surface of the electronic or optoelectronic component and is in contact with an electric contact of the electronic or optoelectronic component. Furthermore, the electrical conductor arrangement can extend across a boundary region, particularly across a gap between a shell surface of the electronic or optoelectronic component and the top layer. Thus, the electrical conductor arrangement can bridge the gap. The boundary region, particularly the gap, is preferably small as a distance to be bridged by the electrical conductor arrangement may be limited by a process to arrange the electrical conductor arrangement on the upper surface of the top, on the top surface of the electronic or optoelectronic component and on the electric contact of the electronic or optoelectronic component.

The formulation, that something is arranged on something, is not necessarily to be understood as something is directly arranged on something but may also comprise another element arranged between. Thus, the formulation that something is arranged on something can also be understood as something is indirectly arranged on or above something. In particular, the formulation that the electrical conductor arrangement is arranged on an upper surface of the top layer can be understood as the electrical conductor arrangement is arranged directly on an upper surface of the top layer or it can be understood as the electrical conductor arrangement is arranged above an upper surface of the top layer, but another element may be arranged between the electrical conductor arrangement and the upper surface of the top layer.

In some embodiments, the opening is a cavity or a through hole.

If the opening is a cavity, the layer stack preferably comprises only a single layer, in particular a top layer. In some embodiments, the cavity is having a bottom portion which is formed by the top layer, and the at least one electronic or optoelectronic component is arranged on the bottom portion.

If the opening is a through hole in the top layer, the layer stack preferably comprises only two layers, in particular a top layer and a bottom layer. In some embodiments, the layer stack comprises a bottom layer which is arranged below the top layer, and the bottom layer carries the at least one electronic or optoelectronic component, which is preferably arranged in the through hole in the top layer.

In some embodiment, the top layer is at least partially transparent.

In some embodiment, the bottom layer is at least partially transparent.

In some embodiments, the layer stack, in particular the intermediate layer stack, is preferably at least partially transparent, and is preferably arranged between a cover layer and a carrier layer, wherein at least one of the cover layer and the carrier layer is at least partially transparent. Preferably, each layer of the optoelectronic device is made of or at least comprises an at least partially transparent material. Thus, the optoelectronic device can be at least partially transparent.

In some embodiments, the optoelectronic device can comprise or can be integrated in an at least partially transparent pane, in particular a pane of a vehicle. For example, the optoelectronic device can be arranged between two glass plates, which together can form a window arrangement for a vehicle. The two glass plates can also be components of the optoelectronic device so that at least in some embodiments the optoelectronic device can comprise the glass plates.

In some embodiments, the at least one electronic or optoelectronic component is completely arranged in the opening, in particular such that a top surface of the electronic or optoelectronic component is arranged in a reference plane that extends through an upper surface of the top layer. In other words, the top surface of the electronic or optoelectronic component and the upper surface of the top layer are arranged within the same plane and form a flat upper surface.

In some embodiments, the at least one electric or optoelectronic component is partially arranged in the opening such that a top surface of the electronic or optoelectronic component protrudes an upper surface of the top layer, in particular by a height H.

The height H is preferably equal to or smaller than half of the thickness of the electronic or optoelectronic component. Thus, the electric or optoelectronic component can be partially arranged in the opening such that a half or less of the thickness of the electronic or optoelectronic component protrudes an upper surface of the top layer.

In some embodiments, the electronic or optoelectronic components can comprise or consist of at least one of the following: a light emitting diode (LED), particularly a flip chip LED, an integrated circuit (IC), a photodiode, a sensor, in particular an infrared sensor. All electric contacts of a flip chip LED can be arranged on the same surface, in particular on a top surface of the chip. A suitable flip chip LED can be a small LED with edge lengths of less than 150 µm, in particular down to less than 100 µm. Typical heights of suitable LEDs are, for example, in the range of 120 µm to 5 µm.

In some embodiments, the electronic or optoelectronic components can comprise or consist of a µLED. A µLED is a small LED, for example, with edge lengths of less than 70 µm, in particular down to less than 20 µm, in particular in the range from 1 µm to 10 µm. Another range is between 10-30 µm. This can result in a surface area from a few hundred µm² to a few tens of µm². For example, a µ-LED can have a surface area of approximately 60 µm² with an edge length of approximately 8 µm. In some cases, a µ-LED has an edge length of 5 µm or less, which results in a surface area size of less than 30 µm². Typical heights of such µ-LEDs are, for example, in the range of 1.5 µm to 10 µm.

Advantageously a micro light emitting diode chip, also called µLED-chip, is used as electronic or optoelectronic component. A micro light emitting diode can form a pixel or a subpixel and emit light of a selected colour.

In some embodiments, a boundary region is located between the top surface of the electronic or optoelectronic component and the adjacent upper surface of the top layer of the layer stack. The boundary region can comprise a gap between a shell surface of the electronic or optoelectronic component and a side surface of the opening. The side surface faces the shell surface and the gap preferably extends in a circumferential direction around the electronic or optoelectronic component around the shell surface. The shell surface is preferably formed by the outer surfaces of the electronic or optoelectronic component excluding the top surface and a bottom surface of the electronic or optoelectronic component opposing the top surface.

In some embodiments, the gap can be formed by the distance between the electronic or optoelectronic component arranged in the opening of the top layer and the side surfaces of the opening.

In some embodiments, the gap has a width of less than 10-15 µm. In particular, the gap has a width of less than 10-15 µm within the plane that extends through an upper surface of the top layer. Hence, an intermediate portion of the electrical conductor arrangement, which extends across the boundary region can extend over a distance of 10-15 µm or less. This can be advantageous, as a process to arrange the electrical conductor arrangement such that a first portion of the electrical conductor arrangement is arranged on an upper surface of the top layer, a second portion of the electrical conductor arrangement is arranged on a top surface of the electronic or optoelectronic component, and an intermediate portion of the electrical conductor arrangement extends across a boundary region, particularly the gap, and interconnects the first portion of the electrical conductor arrangement and the second portion of the electrical conductor arrangement, may be limited to a maximum distance that can be bridged by the intermediate portion of the electrical conductor arrangement.

In some embodiments, the gap is filled with a filler material, in particular with an adhesive. Optionally, an accumulation of the filler material is arranged on the filled gap and particularly on the plane that extends through an upper surface of the top layer. This can be advantageous, as for the case, that the electronic or optoelectronic component is protruding the upper surface, a process of arranging the electrical conductor arrangement such that, a first portion of the electrical conductor arrangement is arranged on an upper surface of the top layer, a second portion of the electrical conductor arrangement is arranged on a top surface of the electronic or optoelectronic component, and an intermediate portion of the electrical conductor arrangement extends across a boundary region, particularly a gap, and interconnects the first portion of the electrical conductor arrangement and the second portion of the electrical conductor arrangement, may be improved.

In some embodiments, the filler material is arranged between a layer of the layer stack and a bottom surface of the electronic or optoelectronic component, wherein the bottom surface of the electronic or optoelectronic component is opposite to a top surface of the electronic or optoelectronic component. The filler material can particularly comprise or consist of an adhesive, which fixes the electronic or optoelectronic component in the opening.

In some embodiments, the filler material can form a fillet weld between an upper surface of the top layer and a shell surface of the electronic or optoelectronic component. Particularly the filler material in form of a fillet weld can partially be arranged in the gap and partially form the fillet weld between the upper surface of the top layer and the shell surface of the electronic or optoelectronic component.

In some embodiments, a dielectric layer, in particular a dielectric intermediate layer is arranged between the electrical conductor arrangement and the top layer and/or between the electrical conductor arrangement and a top surface of the electronic or optoelectronic component. Such dielectric layer helps to prevent a short between the electrical conductor arrangement and at least one of the top layer and the top surface of the electronic or optoelectronic component.

In some embodiments, the top layer comprises at least one of the following materials:

Polyethylene terephthalate (PET), biaxial oriented PET (boPET), Polyethylene naphthalate (PEN), Polyvinyl butyral (PVB), Ethylene-vinyl acetate (EVA), a photoresist, and a material, which can be hardened by use of ultraviolet light. In some embodiments, boPET is the material of choice.

In some embodiments, the bottom layer comprises at least one of the following materials:

Polyethylene terephthalate (PET), biaxial oriented PET (boPET), polyethylene naphthalate (PEN), polyvinyl butyral (PVB), and ethylene-vinyl acetate (EVA). In some embodiments, boPET is the material of choice.

In some embodiments, a material of the at least one electrical conductor arrangement can comprise indium tin oxide and/or silver. In some embodiments, the electrical conductor arrangement comprises or consists of a metal and in particular comprises or consists of one of copper, silver and gold.

In some embodiments, a method of manufacturing an optoelectronic device, in particular an at least partially transparent pane, for example of a vehicle, comprises the following steps:

providing a layer stack having at least a top layer which comprises at least one opening, in particular an opening on an upper surface of the top layer;

arranging at least one electronic or optoelectronic component in the opening; and providing, in particular on an upper surface of the top layer, at least one electrical conductor arrangement, in particular a structured conductor layer, for providing electricity to the at least one electronic or optoelectronic component.

In some embodiments, the opening is a cavity having a bottom portion which is formed by the top layer, and the at least one electronic or optoelectronic component is arranged in the cavity such that it resides on the bottom portion.

In some embodiments, the opening is a through hole in the top layer. The layer stack further comprises a bottom layer below the top layer and the at least one electronic or optoelectronic component is arranged in the trough hole such that it resides on the bottom layer.

In some embodiments, the step of arranging the at least one electronic or optoelectronic component in the opening comprises a step of using a filler material, in particular an adhesive, to fix the at least one electronic or optoelectronic component in the opening. The filler material is preferably arranged in the opening by use of for example a step of dispensing, jetting or stamping the filler material. The at least one electronic or optoelectronic component can be arranged on the filler material in the opening and the filler material, particularly an adhesive, can in a further step be hardened.

In some embodiments, the step of arranging the at least one electronic or optoelectronic component in the opening comprises a step of temporarily heating the layer stack, in particular in the vicinity of the opening, to stick the at least one electronic or optoelectronic component to the layer stack.

In some embodiments a bottom layer of the layer stack, which comprises or consists of a material such as PVB or EVA, is temporarily heated and the at least one electronic or optoelectronic component is, particularly simultaneously, arranged in the opening, particularly on the bottom layer of the layer stack. A boundary region, particularly a gap, located between a top surface of the electronic or optoelectronic component and an adjacent upper surface of the top layer of the layer stack can preferably be filled by pressing the electronic or optoelectronic component onto the temporarily heated bottom layer as material of the bottom layer can flow into the boundary region.

In some embodiments, the step of providing the layer stack comprises providing an initial layer stack with an unstructured top layer and structuring the top layer to obtain the at least one opening in the top layer.

The step of structuring the top layer to obtain the at least one opening in the top layer can for example be performed by help of laser light by an ablation of the top layer to shape the opening.

In some embodiments, the step of structuring the top layer to obtain the at least one opening in the top layer can be performed by punching or mechanically cutting through holes into the top layer.

In some embodiments, the step of structuring the top layer to obtain the at least one opening in the top layer can be performed by lithographic structuring the top layer. A photostructurable resist can be provided on the top layer of the layer stack to provide a photomask on the top layer and etch the at least one opening into the top layer or a photostructurable resist can be provided as a top layer of the layer stack and be structured such that the openings are within the photostructurable resist. In said second case, the photostructurable resist can remain in the final product whereas in said first case the photostructurable resist can be removed.

In some embodiments, an optoelectronic device has a layer stack which provides a plurality of pixels. Each pixel of the plurality of pixels comprises at least one optoelectronic light source, which is embedded, in particular completely embedded, in a first layer of the layer stack. The optoelectronic light source comprises a first reflective layer on its upper surface and optionally a second reflective layer on its bottom surface. The upper surface faces towards a top surface of the layer stack and the bottom surface faces away from the top surface. Each pixel of the plurality of pixels further comprises a first pixel area on the top surface of the layer stack, and a structured light scattering arrangement for scattering light from the optoelectronic light source to homogeneously illuminate the first pixel area.

In a further embodiment, an optoelectronic device has a layer stack that provides a plurality of pixels. Each pixel of the plurality of pixels comprises at least one optoelectronic light source, which is embedded, in particular completely embedded, in a first layer of the layer stack. The optoelectronic light source comprises a first reflective layer on its upper surface and a second reflective layer on its bottom surface. The upper surface faces towards a top surface of the layer stack and the bottom surface faces away from the top surface. Each pixel of the plurality of pixels further comprises a first pixel area on the top surface of the layer stack, and a light scattering arrangement for scattering light from the optoelectronic light source to homogeneously illuminate the first pixel area. The light scattering arrangement forms a first portion of the first layer which circumferentially surrounds the optoelectronic light source.

In some embodiments, an optoelectronic device has a layer stack with a plurality of pixels. Each pixel of the plurality of pixels comprises at least one optoelectronic light source, which is embedded, in particular completely embedded, in a first layer of the layer stack. The optoelectronic light source comprises a first reflective layer on its upper surface and optionally a second reflective layer on its bottom surface. The upper surface faces towards a top surface of the layer stack and the bottom surface faces away from the top surface. Each pixel of the plurality of pixels further comprises a first pixel area on the top surface of the layer stack, and a light guiding layer arranged on the first layer. The first layer is arranged between the first pixel area and the light guiding layer, and a refractive index of the light guiding layer is higher than a refractive index of any other layer of the layer stack.

In some embodiments, an optoelectronic device has a layer stack that provides a plurality of pixels. Each pixel of the plurality of pixels comprises at least one optoelectronic light source, which is embedded, in particular completely embedded, in a first layer of the layer stack. Each pixel of the plurality of pixels further comprises a first pixel area on a top surface of the layer stack, and a light guiding layer arranged on the first layer. A refractive index of the light guiding layer is higher than a refractive index of any other layer of the layer stack. Each pixel of the plurality of pixels further comprises a third reflective layer for reflecting light from the optoelectronic light source to homogeneously illuminate the first pixel area. The third reflective layer forms an opening in the first layer in which the optoelectronic light source is located. The first layer has a curved surface, particularly the surface of the opening, that faces the optoelectronic light source. The curved surface can serve as a reflector such that light, which is emitted by the optoelectronic light source in substance in a radial direction, is reflected towards the first pixel area, in particular such that the first pixel area is illuminated homogenously. The curved surface can also be formed such that an output beam that passes through the first pixel area has a desired shape. Thus, the curved surface can be used for beam shaping purposes.

The structured light scattering arrangement or light scattering arrangement can be configured to scatter light being emitted from the optoelectronic light source such that the first pixel area is homogeneously illuminated by the scattered light. In particular, the structured light scattering arrangement or light scattering arrangement can be configured to scatter light being emitted from the optoelectronic light source such that the first pixel area is homogeneously illuminated by the scattered light and a defined and/or sharp edge of the first pixel area is created.

The first pixel area can comprise a central axis, which is perpendicular to the first pixel area and runs through the center of the first pixel area. The central axis extends in an orthogonal direction with regard to the first layer of the layer stack.

Each pixel of the plurality of pixels can further comprise a second pixel area. The second pixel area can for example be formed on a bottom surface of the layer stack. In some embodiments, the outer contour of the second pixel area can, in a view perpendicular to the first pixel area, match with the outer contour of the first pixel area. Thus, it can for example be achieved that each pixel of the plurality of pixels can be seen from two sides of the optoelectronic device when illuminated by light.

The first pixel area and/or the second pixel area can comprise, in a view perpendicular to the first pixel area, the form of a circle, square, rectangle or polygon. Thus, the first pixel area and/or the second pixel area can have an outer contour, which is of circular, quadratic, rectangular or polygonal form.

The optoelectronic light source can, in a view perpendicular to the first pixel area, be arranged behind the first pixel area and can be centred with regard to a central axis of the first pixel area. Thus, a center axis of the light source can be collinear with the central axis of the first pixel area.

The at least one optoelectronic light source can comprise a LED (light emitting diode) or a micro LED, also called μLED, or a LED-chip or a μLED-chip. However, the at least one optoelectronic light source can also comprise for example three LEDs or μLEDs that emit light at a selected color, in particular either red, green or blue. Each pixel of the plurality of pixels can thus form an RGB pixel.

The at least one optoelectronic light source can for example comprise a volume emitting LED or μLED. Thus, the at least one optoelectronic light source can emit light at a selected color in all directions. By help of for example a first reflective layer on the upper surface of the optoelectronic light source and optionally a second reflective layer on the bottom surface of the optoelectronic light source, the light being emitted from the optoelectronic light source can be guided in a preferred way. In some embodiments, it can be advantageous that the optoelectronic light source emits light in a radial direction through its side surfaces. However, it can also be advantageous that the optoelectronic light source emits light in a radial direction through its side surfaces and in a vertical direction through its upper and/or bottom surface.

The first layer can be the only layer of the layer stack, or the layer stack can further comprise additional layers, such as a second layer and a third layer as well as any number of further layers. The first layer can be sandwiched between the second layer and the third layer.

The first layer can preferably be at least partially transparent. Preferably, each layer of the layer stack is made of or at least comprises an at least partially transparent material. The optoelectronic device can therefore also be at least partially transparent.

In some embodiments, the optoelectronic device is an at least partially transparent pane, in particular a pane of a vehicle, and is preferably arranged between a cover layer and a carrier layer. At least one of the cover layer and the carrier layer can at least be partially transparent. The cover layer and the carrier layer can for example be glass layers, such as used in vehicle windows.

The structured light scattering arrangement can be arranged in the layer stack, preferably above the first layer, between the first pixel area and the optoelectronic light source.

A further structured light scattering arrangement can be arranged in the layer stack, preferably below the first layer, between a second pixel area and the optoelectronic light source.

In some embodiments, the structured light scattering arrangement, which is arranged above the first layer, between the first pixel area and the optoelectronic light source, can be configured to scatter light from the optoelectronic light source such that the first pixel area is homogeneously illuminated by the scattered light. Additionally or alternatively, the structured light scattering arrangement, which is arranged below the first layer, between the second pixel area and the optoelectronic light source, can be configured to scatter light from the optoelectronic light source such that the second pixel area is homogeneously illuminated by the scattered light.

The structured light scattering arrangement can be embedded, in particular completely embedded, in the first layer. The structured light scattering arrangement being embedded in the first layer can be configured to scatter light from the optoelectronic light source such that the first pixel area and/or a second pixel area is homogeneously illuminated by the scattered light.

The structured light scattering arrangement can comprise at least a first light scattering element and at least a second light scattering element. The second light scattering element can in a radial direction be further away from the at least one optoelectronic light source than the first light scattering element. "in a radial direction" can thereby be understood as a direction which is perpendicular to the central axis of the first pixel area.

The structured light scattering arrangement can also comprise a plurality of light scattering elements. A plurality of light scattering elements can be greater than 2, greater than 5, greater than 10 or greater than 50.

Each of the at least first light scattering element and second light scattering element can have a defined geometrical form, which is, preferably, the same for the at least first light scattering element and second light scattering element. Preferably, each of the at least first light scattering element and second light scattering element has a defined particle concentration of scattering particles within its defined geometrical form.

Each of the at least first light scattering element and second light scattering element can form a ring like structure around the at least one optoelectronic light source. Preferably, the ring like structure has, when seen in a top view, a circular, quadratic, rectangular, or polygonal form and/or, preferably, the ring like structure has a circular, quadratic, rectangular, or polygonal form in a cross sectional plane which comprises the central axis of the first pixel area.

In some embodiments, a cross sectional area of the first light scattering element can be smaller than a cross sectional area of the second light scattering element. The cross sectional areas lie in a cross sectional plane, which comprises the central axis of the first pixel area.

If the structured light scattering arrangement comprises a plurality of light scattering elements, a cross sectional area of the light scattering elements can be dependent on a distance, in a radial direction, between the respective light scattering element and the optoelectronic light source. In particular, the cross sectional area increases with an increasing distance. Thus, a light scattering element being closer to the optoelectronic light source can have a smaller a cross sectional area than a light scattering element which is further away from optoelectronic light source in a radial direction. The cross sectional areas are in the same cross sectional plane, which comprises the central axis of the first pixel area.

In some embodiments, a particle concentration of scattering particles in the first light scattering element is lower than a particle concentration of scattering particles in the second light scattering element.

If the structured light scattering arrangement comprises a plurality of light scattering elements, a particle concentration of scattering particles in the light scattering elements can rise with the distance, in a radial direction, between the respective light scattering element and the optoelectronic light source. Thus, a light scattering element being closer to the optoelectronic light source can have a lower particle concentration of scattering particles than a light scattering element being further away from optoelectronic light source in a radial direction.

The optoelectronic light source, the first reflective layer and optionally the second reflective layer can form an optoelectronic subassembly. The optoelectronic subassembly can be embedded in the first layer such that a top surface of the optoelectronic subassembly is arranged in the same plane as a top surface of the first layer and/or a bottom surface of the optoelectronic subassembly is arranged in the same plane as a bottom surface of the first layer. Thus, the optoelectronic subassembly can for example have at least approximately the same height as the first layer.

The structured light scattering arrangement can comprise an electro-wetting device, which is arranged, particularly in a layer of the layer stack, between the first layer and the first pixel area.

The electro-wetting device can comprise a first electrode, in particular an at least partially transparent electrode and a second electrode, in particular an at least partially transparent electrode. Between the first electrode and the second electrode a plurality of oil-covered droplets comprising light-scattering particles can be arranged. The plurality of oil-covered droplets can be embedded in a first medium. The first medium can in particular comprise or consist of air or any fluid.

When an electric voltage is applied to the two electrodes, the electro-wetting device forms a film of light-scattering particles to scatter light from the optoelectronic light source such that the first pixel area is homogeneously illuminated by the scattered light.

The electro-wetting device can for example be configured to form a transparent layer when no voltage is applied to the two electrodes and on the other hand to form a semitransparent layer, when an electric voltage is applied to the two electrodes.

The structured light scattering arrangement can comprise a first cavity which extends between the first layer and the first pixel area over the full length and width of the first pixel area. Thus, the first cavity can be below the first pixel area and it extends over the full length and width of the first pixel area. The first cavity can be formed by spacers that separate the first layer from one or more further layers of the layer stack.

In some embodiments, the optoelectronic device comprises a first fluid pump to selectively pump a first fluid into the first cavity or to evacuate the first cavity. The first fluid can comprise light scattering particles. Thus, when the first cavity is filled with the first fluid, light from the optoelectronic light source can be scattered by the first fluid such that the first pixel area is homogeneously illuminated by the scattered light.

The structured light scattering arrangement can comprise a set of interconnected fluid channels. The interconnected fluid channels can extend in a layer of the layer stack below the first pixel areas of the plurality of pixels along the length and width directions of the first pixel areas. When seen in a top view, the fluid channels can be arranged behind a grid-like structure of boundary regions that separate neighboring first pixel areas from each other.

The optoelectronic device can further comprise a second fluid pump to selectively pump a second fluid into the fluid channels or to evacuate the fluid channels, wherein the second fluid comprises light absorbing particles, in particular black particles. Thus, when the fluid channels are filled with the second fluid, light being emitted from the optoelectronic light source can be absorbed by the second fluid, such that a defined and/or sharp edges of the first pixel areas are created.

An outer surface of the light scattering arrangement forming a first portion of the first layer, which circumferentially surrounds the optoelectronic light source, can be aligned with outer edges of the first pixel area, when seeing in a view perpendicular to the first pixel area.

A second portion of the first layer can circumferentially surround the first portion of the first layer, and a refractive index of the first portion can be different, particularly larger, from a refractive index of the second portion. Thus, light from the optoelectronic light source gets reflected when passing the first portion of the first layer and impinges on the second portion of the first layer due to internal total reflection. Thus, the light scattering arrangement forming a first portion of the first layer can be configured to reflect light at a boarder between the first and the second portion of the first layer and scatter light such that the first pixel area is homogeneously illuminated by the scattered light.

The layer stack can comprise a light guiding layer arranged on the first layer. The first layer can be arranged between the first pixel area and the light guiding layer. A refractive index of the light guiding layer can be higher than a refractive index of any other layer of the layer stack. Light, which is emitted by the optoelectronic light source into the first layer, can be coupled into the light guiding layer and thereby distributed in radial directions with regard to the central axis. The light scattering arrangement of the first portion of the first layer can include light scattering particles, which are very close to the interface between the light guiding layer and the first layer. These light scattering particles can scatter also light propagating in the light guiding layer. Therefore, light can again be coupled out from the light guiding layer, in particular towards the first pixel area. Thereby, a homogeneous illumination of the first pixel area can be obtained.

The layer stack can further comprise a scattering layer arranged on the first layer, opposite to the light guiding layer. The scattering layer can comprise light scattering particles to homogeneously illuminate the first pixel area. The light scattering arrangement of the first portion of the first layer can include the scattering layer so that they form a single layer with a height that is larger than the height of the first layer and/or the optoelectronic light source.

The layer stack can further comprise a scattering layer arranged above the first layer, opposite to the light guiding layer. The scattering layer can comprise light scattering particles to homogeneously illuminate the first pixel area. Light from the optoelectronic light source, which is reflected or totally reflected from interfaces below the scattering layer, can be scattered by light scattering particles in the scattering layer. A homogeneous illumination of the first pixel area above the scattering layer can thus be obtained.

The layer stack can further comprise a scattering layer arranged on the light guiding layer opposite to the first layer. The scattering layer can comprise light scattering particles to homogeneously illuminate a second pixel area opposite to the first pixel area and it can be very thin, particularly it can have a thickness of at least approximately the thickness of the diameter of one light scattering particle.

Light from the optoelectronic light source can be coupled into the light guiding layer which is arranged on the first layer and decoupled from the light guiding layer via the scattering layer arranged on the light guiding layer. Thus, the scattering layer can be configured to scatter light from the optoelectronic light source such that a second pixel area opposite to the first pixel area is being homogeneously illuminated.

The layer stack can include further layers, for example, one or more protecting layers. The optoelectronic device can also be arranged between two at least partially transparent layers, for example, it can be laminated between the two layers. The layers can be glass plates. One side of the optoelectronic device can also be laminated on a layer, which can be at least partially transparent or non-transparent.

In some embodiments, an optoelectronic device comprises a plurality of optoelectronic light sources being arranged on a first layer. The first layer is for example an intermediate layer which is arranged between a cover layer and a carrier layer. The first layer comprises or consists of an at least partially transparent material and each optoelectronic light source of the plurality of optoelectronic light sources comprises an individual light converter for converting light emitted by the associated light source into converted light, or at least partially converted light as for example white light. The light converter of each optoelectronic light source is arranged on the first layer and/or on the associated optoelectronic light source.

The term "individual light converter", can mean that one light converter is assigned to exactly one optoelectronic light source and thus each optoelectronic light source is provided with its own light converter for converting light emitted by the associated light source into converted or at least partially converted light.

In some embodiment, the light converters of different light sources are separated from each other. In other words, the light converters are spaced apart and are not in contact with each other.

In some embodiments, the optoelectronic light sources are distributed over a first surface area of the first layer. They can be distributed over the first surface area in a non-regular pattern or in a regular pattern, and they can form any desired shape or symbol, and each optoelectronic light source is provided with its own light converter. The light converters can be different, so that different converted or at least partially converted light can be obtained from different optoelectronic light sources.

In some embodiments, the optoelectronic device forms an at least partially transparent pane of a vehicle, particularly a windshield or a window of a vehicle. Accordingly, the pane and particularly the windshield or window comprises a plurality of optoelectronic light sources, each of which comprises an individual light converter. The optoelectronic light sources can illuminate the pane at least partially and/or information can be display on at least parts of the pane.

The optoelectronic device can be part of any other surface, as for example the headliner, the roof, or the outer surface of for example a vehicle. Accordingly, the optoelectronic device can have a 3-dimensional shape and/or it can be arranged on a surface that is curved. The headliner or the outer surface thus can comprise a plurality of optoelectronic light sources, with each light source comprising an individual light converter to illuminate the headliner or the outer surface at least partially and/or to display information on at least parts of the headliner or the outer surface.

In some embodiments, an LED is used as an optoelectronic light source. The LED can in particular be referred to as a mini LED, which is a small LED, for example, with edge lengths of less than 200 µm, in particular down to less than 40 µm, in particular in the range from 200 µm to 10 µm. Another range is between 150-40 µm. However, the LED can also be referred to as a micro LED, also called µLED, or a µLED-chip, in particular for the case of the edge lengths being in a range of 100 µm to 10 µm.

A mini LED or a µLED-chip, can be used as optoelectronic light source. The mini LED or µLED-chip can form a pixel or a subpixel and emit light of a selected colour. The mini LED or µLED-chip can in a preferred embodiment be an unpackaged semiconductor chip. Unpackaged can mean that the chip is without a housing around its semiconductor layers such as for example an unpacked semiconductor die.

The light converters associated with the optoelectronic light sources can comprise conversion particles to convert the light being emitted from the optoelectronic light source into light of a selected color, as for example green, blue, red, or yellow. However, the light converters associated with the optoelectronic light sources can also comprise conversion particles to partially convert light being emitted from the optoelectronic light source, to emit mixed light as for example white light.

At least partially converting the light being emitted from the optoelectronic light source to emit white light can have the advantage that the wiring and control of the light source can be simplified compared to mixing white light by use of an RGB pixel. For example in a transparent windshield or headliner, the wiring and control should be reduced to a minimum to ensure the transparency of the optoelectronic device.

Further, white light may be desired to imitate light effects on a headliner, in particular a transparent headliner, of a vehicle or a reading light arranged in the headliner or a side window of a vehicle. In some embodiments, it can be a style aspect to provide optoelectronic light sources emitting white light to display for example logos or symbols.

In some embodiments, each light converter comprises conversion particles with a diameter of at least approximately 1 µm to 30 µm, particularly with a diameter of at least approximately 3 µm to 10 µm. Such small light conversion particles can in combination with small LEDs for example be used since small conversion particles help to ensure a desired conversion of the light being emitted from the LEDs. Furthermore, if the optoelectronic light source is for example glued to the first layer by use of an adhesive, and the adhesive is comprising the conversion particles and thus is forming the light converter, then the conversion particles need to be sufficiently small to fit into the gap between the optoelectronic light source and the first layer to convert the light being emitted by the optoelectronic light source.

In some embodiments, each light converter comprises quantum dots acting as conversion particles. Quantum dots can be tiny semiconductor particles a few nanometres in size, having optical and electronic properties that differ from larger particles due to quantum mechanics.

The light converters are preferably configured to convert light of a first wavelength emitted by the optoelectronic light source into light of a second wavelength, wherein the first wavelength is different to the second wavelength, in particular the first wavelength is smaller than the second wavelength. By use of different converting particles, the light converters can convert light into various colors as for example red, green, blue and yellow.

In some embodiments, the optoelectronic light sources are distributed over a first surface area of the first layer, wherein the first surface area is larger, in particular by a factor of at least approximately 30, than the sum of the cross sectional areas of the optoelectronic light sources. The cross sectional area of an optoelectronic light source is particularly defined by the cross section through the optoelectronic light source within a plane that is at least approximately parallel to the first surface area or rather a plane that is at least approximately oriented perpendicular to the main emitting surface of the optoelectronic light source.

In some embodiments, the first surface area is larger, in particular by a factor of at least approximately 30, than the sum of light emitting surfaces of the optoelectronic light sources being distributed over the first surface area of the first layer.

In some embodiments, the optoelectronic light sources are distributed over a first surface area of the first layer in an irregular pattern. This can mean that the optoelectronic light sources are not distributed in a regular matrix with a plurality of regularly arranged rows and columns of the regular matrix over a first surface area of the first layer. However, the irregular pattern of optoelectronic light sources might include a single row or column of optoelectronic light sources arranged among further irregularly distributed optoelectronic light sources.

In some embodiments, the optoelectronic light sources are distributed over a first surface area of the first layer in a regular pattern. This can mean that the optoelectronic light sources are distributed over a first surface area of the first layer in a matrix with at least one row and at least one column, wherein each optoelectronic light source can be individually addressed.

In some embodiments, each light converter is arranged within a beam path of the light being emitted from the associated optoelectronic light source.

In some embodiments, each light converter comprises a droplet form covering or enclosing the associated optoelectronic light source. The droplet can for example comprise or consist of an adhesive with conversion particles. Thus, the droplet can form the light converter. The adhesive can be dripped onto the optoelectronic light sources, particularly one droplet per optoelectronic light source, in an at least largely liquid state, wherein the adhesive forms a droplet over each optoelectronic light source due to capillary forces and subsequently cures.

In some embodiments, each light converter is arranged between the first layer and the associated optoelectronic light source. Each light converter can for example comprise an adhesive to fix the associated optoelectronic light source to the first layer. The light converter can therefore form a glue fillet to fix the associated optoelectronic light source to the first layer.

In some embodiments, each light converter is arranged on the first layer, opposite to the associated optoelectronic light source, and faces a light emitting surface of the associated optoelectronic light source. Thus, each light converter and the associated optoelectronic light source can be arranged on two different sides of the first layer.

In some embodiments, each light converter is formed as a platelet being arranged, particularly glued, on the first layer and faces a light emitting surface of the associated optoelectronic light source. Each platelet can comprise conversion particles arranged within a matrix material such as for example silicone, glass or polysiloxane. Alternatively, each light converter can directly be printed onto the first layer by use of a respective material, particularly ink, comprising the conversion particles.

In some embodiments, a light-blocker extends in a circumferential direction around each light converter, in particular forming a light blocking structure on the first layer. In other words, the light converters are each surrounded by a light-blocker, in particular when seen in a view perpendicular to the first surface area of the first layer. The light blocker can for example comprise black light blocking particles to block light, which is emitted from the optoelectronic light sources. Light can therefore be coupled out along an optical path, which is unblocked for example in a direction perpendicular to a main emitting surface of the optoelectronic light sources. In particular, the light-blocker can block an out coupling of light, on side surfaces of the light converters.

In some embodiments, a contact area between the first layer and each light converter and/or a contact area between the first layer and each optoelectronic light source can be roughened. Light from the optoelectronic light sources can thereby be coupled into the light converter in an improved way. The roughening can for example be achieved by processing the contact area by use of laser light. However, any technique or material known from the prior art for coupling light from the optoelectronic light sources into the converter can be used.

In some embodiments, each light converter and optionally the associated optoelectronic light source is embedded into the first layer. The light converters can for example be completely embedded into the first layer such that an outer surface of the light converters and an outer surface of the first layer are arranged within the same plane. The light converters can also protrude the first layer or be set back therein.

In some embodiments, each light converter is embedded into the first layer on a side opposite to the associated optoelectronic light source and faces a light emitting surface of the associated optoelectronic light source. In some embodiment, each light converter is embedded into the first layer on the same side as the associated optoelectronic light source is arranged on.

The light converters can for example be embedded into the first layer by "hot embossing" the first layer and pressing the light converters into the first layer or by filling a resulting cavity with the light converters. This can for example be expedient, to reduce the topology of the first layer compared to gluing the light converters onto the first layer.

In some embodiments, the optoelectronic device further comprises a set of light sources without a light converter. Thus, the optoelectronic device comprises a set of light sources with a light converter being associated to and a set of light sources without a light converter being associated to.

In some embodiments, the light converters include at least a first set of light converters and a second set of light converters. The second set of light converters is configured to convert light to a different wavelength than the first set of light converters. Thus, the light being emitted from the optoelectronic light sources can be converted or at least partially converted into light of at least two out of white light and colored light, as for example green, blue, red, or yellow light.

In some embodiments, an optoelectronic device comprises at least one optoelectronic light source. The at least one optoelectronic light source is arranged on a first layer between a cover layer and the first layer. Each of the first layer and the cover layer comprises or consists of an at least partially transparent material and the optoelectronic device is a wind deflector for a vehicle.

A wind deflector can be a small windshield for a vehicle, particularly made of plastic or glass. However, a wind deflector can also be an extension of an existing windshield of a vehicle. Contrary to its appearance, the design of the wind deflector can be very durable and stable, even at high speeds of the vehicle. The wind deflector can prevent the driver and passengers of the vehicle being buffeted by wind as well as flying debris.

In some embodiments, a wind deflector can be an accessory that can be fitted to parts of a vehicle that are often open when driving. Such parts can for example be windows and sunroofs. The wind deflector can prevent the driver and passengers being buffeted by wind. Furthermore, noise can be reduced and flying debris can be kept out of the vehicle.

In some embodiments, the wind deflector can be mounted to a 2-, 3-, or 4-wheeler such as for example a motorbike, or it can for example be mounted to a quad. In some embodiments, the wind deflector can be mounted to the handlebar of a 2-, 3-, or 4-wheeler such as for example a motorbike, or it can for example be mounted to the handlebar of a quad. Thus, the vehicle can for example be a motorcycle, a quad, a water vessel, an open top race car, or any other 2-, 3-, or 4-wheeler. The vehicle can also be a water vessel, such as a boat or a ship.

In some embodiments, the vehicle is not a car or a truck.

In some embodiments, the wind deflector can be a windscreen or an extension of the windscreen of for example a 2-, 3- or 4-wheeler, such as for example a motorbike or a quad or a trike. Other examples are a water vessel, such as for example a boat, or a top less race car, such as for example a formula one race car.

In some embodiments, the first layer of the optoelectronic device comprises or consists of an elastic plastic material, such as for example polyethylene terephthalate (PET), polycarbonate (PC), or polyethylene naphthalate (PEN). Thus, the first layer and optionally the whole optoelectronic device can be deformable, in particular bendable. However, the bendability of the first layer and particularly the whole optoelectronic device can be limited such that it holds well and it is stiff even at high speeds of the vehicle.

In some embodiments, the cover layer comprises or consists of an elastic plastic material, particularly an elastic foil, such as for example polyvinyl chloride (PVC), polyvinyl butyral (PVB), or ethylene-vinyl acetate (EVA). Thus, the at least one optoelectronic light source can be arranged on the first layer and an elastic foil can be laminated on top of the at least one optoelectronic light source.

In some embodiments, the first layer and the cover layer are free of glass or a glass-like material. The wind deflector can differ from a common windscreen of a vehicle, as for example a car, in that the wind deflector does not comprise a cover layer made of glass or a glass-like material. Thus, the wind deflector can differ from a "normal" window, which is for example made of safety glass.

In some embodiments, the optoelectronic device comprises one or more further layers arranged above the cover layer and/or below the first layer. All of the further layers can in some embodiments be free of glass. In particular, all layers of the optoelectronic device can be free of glass. However, the optoelectronic light sources can include a glass-like material in one or more of their components.

In some embodiments, the at least one optoelectronic light source is a LED. A LED can in particular be referred to as a mini LED, which is a small LED, for example, with edge lengths of less than 200 µm, in particular down to less than 40 µm, in particular in the range from 200 µm to 10 µm. Another range is between 150-40 µm. However, the LED can also be referred to as a micro LED, also called µLED, or a µLED-chip, in particular for the case of the edge lengths being in a range of 100 µm to 10 µm.

A mini LED or a µLED-chip, can be used as optoelectronic light source. The mini LED or µLED-chip can form a pixel or a subpixel and emit light of a selected colour. The mini LED or µLED-chip can in a preferred embodiment be an unpackaged semiconductor chip. Unpackaged can mean that the chip is without a housing around its semiconductor layers such as for example an unpacked semiconductor die.

In some embodiments, the at least one optoelectronic light source can be a volume emitter or surface emitter. A volume emitters can emit light at its top surface, at its side surfaces, as well as at its bottom side, for example through a surface region which is located between contact pads that are arranged on the bottom side. A surface emitter can emit light at its top surface.

In some embodiments, the at least one optoelectronic light source is a plurality of optoelectronic light sources which are arranged such as to form a symbol or an indicator when the optoelectronic device is in operation. The symbol or the indicator can for example be a navigation symbol, a warning symbol, a daytime running light, position lights, an indicator for the charging level, speed indicator or many more status indicators or driving information.

In some embodiments, the at least one optoelectronic light source is a plurality of optoelectronic light sources which are arranged such as to form a display. By use of a display, driving information or status indicators, for example actual driving information, such as vehicle speed, or status indicators can be displayed.

In operation of the optoelectronic device, the symbol or indicator can be visible for a user of the optoelectronic device, particularly of the vehicle. In other words, the symbol or indicator can be within the line of sight of the user of the optoelectronic device when the optoelectronic device is in operation. The line of sight can particularly be the direction of view from the user's eyes forward through the optoelectronic device when being in driving position.

In some embodiments, a light blocker is arranged on either the first layer or the cover layer and faces the at least one optoelectronic light source. The light blocker can block light emitted from the at least one optoelectronic light source. It can thus be obtained that light emitted by the at least one optoelectronic light source leaves the optoelectronic device only in a desired direction. This can prevent blinding a user of the optoelectronic device or a third party person.

In some embodiments, the light blocker is arranged to block the emission of light through the first layer or through the cover layer. The light blocker can therefore be arranged between the at least one optoelectronic light source and a user of the optoelectronic device or between the at least one optoelectronic light source and a third party person.

In some embodiments, a vehicle comprises an optoelectronic device according to any one of the aforementioned aspects. The optoelectronic device is a wind deflector of the vehicle and the at least one optoelectronic light source of the optoelectronic device is arranged to be visible for a driver of the vehicle or for a person outside the vehicle.

In some embodiments, the at least one optoelectronic light source comprises a first set of light sources. The first set of light sources is arranged such that, in operation of the optoelectronic device, the first set of light sources is visible for the driver. In other words, the first set of light sources can be within the line of sight of the user of the vehicle when the optoelectronic device is in operation. The line of sight can particularly be the direction of view from the user's eyes forward through the optoelectronic device when being in driving position.

In some embodiments, the first set of light sources is configured to indicate information to the driver, wherein, preferably, the first set of light sources forms a symbol or an indicator. The symbol or the indicator can for example be a navigation symbol, a warning symbol, a daytime running light, position lights, an indicator for the charging level, speed indicator or many more status indicators or driving information.

In some embodiments, the at least one optoelectronic light source comprises a second set of light sources. The second set of light sources is arranged such that, in operation of the optoelectronic device, the second set of light sources is visible from the front and/or from the sides of the vehicle. Thus, the second set of light sources can be visible for a person outside the vehicle.

In some embodiments, an optoelectronic device comprises a layer stack, which includes a carrier layer, a cover layer, and a first layer. The first layer is in particular an intermediate layer, which is arranged between the cover layer and the carrier layer. At least one electronic or optoelectronic element, in particular an optoelectronic light source, is arranged on the first layer and at least one layer of the layer stack and preferably all layers of the layer stack are at least partially transparent. The layer stack comprises at least one layer which comprises particles that provide an increase of the thermal conductivity of the layer and/or at least one thermally conductive layer which is arranged between two adjacent layers of the layer stack.

Although, the electronic or optoelectronic element can be any element that produces heat during its operation, the following description mainly refers to an optoelectronic light source.

Due to the increase of thermal conductivity, the at least one layer of the layer stack comprises particles with a high thermal conductivity. The at least one layer can be one of the carrier layer, the cover layer, and the first layer, or another layer of the layer stack. The particles provide a thermal conductivity of the respective layer such that the overall thermal conductivity of the layer is at least 25% higher than the thermal conductivity of the respective layer without particles.

The layer which comprises particles with a high thermal conductivity and/or the at least one thermally conductive layer can particularly be configured to transport heat which is generated from the at least one optoelectronic light source away from the at least one optoelectronic light source. At the same time, the particles can be arranged in at least one layer of the layer stack such that a desired transparency of the device is achieved, and the thermally conductive layer is designed such that the desired transparency of the device is achieved.

The layer which comprises particles with a high thermal conductivity and/or the at least one thermally conductive layer can particularly be configured to transport heat away from the electronic element located in the layer stack. Such an electronic element can for example be a micro integrated circuit (μIC) or a micro integrated circuit chip. Other examples of electronic elements are drivers, sensors and detectors.

The formulation that something is "arranged on" something shall not necessarily be understood as something is directly arranged on something but may also comprise another element arranged between. Thus, the formulation that something is arranged on something, can also be understood as something is indirectly arranged above something or embedded in something. In particular, the formulation that the at least one optoelectronic light source is arranged on the first layer can be understood as an optoelectronic light source being arranged directly on an upper surface of the first layer or can be understood as an optoelectronic light source being arranged above an upper surface of the first layer, but another element may be arranged between the optoelectronic light source and the upper surface of the first layer. However, the formulation can also be understood as the at least one optoelectronic light source is arranged on the first layer and partially or completely embedded in the first layer.

The at least one thermally conductive layer can comprises a thermally conductive mesh, for example a metallic mesh, in particular a copper mesh. The mesh can have knots and interconnects between the knots, wherein, preferably, at least the majority of the interconnects are not interrupted. The at least one thermally conductive layer can thus be structured and comprise a plurality of thin thermally conductive lines being connected with each other.

The mesh can have a regular or an irregular pattern, wherein an irregular pattern can be preferred, as an irregular pattern can increase the transparency of the thermally conductive layer. The reason for this can be that an irregular pattern can be more difficult to perceive by the human eye.

In some embodiments, the at least one thermally conductive layer comprises an electric line which is electrically connected to a contact pad of the optoelectronic light source. The width of the electric line can thereby be at least half of the width of the optoelectronic light source. The at least one thermally conductive layer can therefore be of a good electrically and thermally conductive material such as for example copper, silver, gold and aluminum. The thermally conductive layer can therefore be configured to transport heat which is generated from the at least one optoelectronic light source away from the at least one optoelectronic light source as well as supply electric energy to the at least one optoelectronic light source. To ensure a sufficient cooling of the at least one optoelectronic light source, the width of the electric line can be increased.

In some embodiments, the at least one thermally conductive layer comprises a plurality of electric lines. The plurality of electric lines are electrically connected to a same contact pad of the optoelectronic light source and extend in parallel to each other at least in sections of the electric lines. The electric lines can in particular be thin compared to the width of a single line connected to the contact pad and can in particular be thin compared to the width of the optoelectronic light source.

In some embodiments, at least one of the electric lines comprises one or more blind conduction paths. A blind conduction path can for example be a conduction path with a free end. This is an end, which is not connected to either the at least one optoelectronic light source or a power supply. The blind conduction path can for example act as a heat spreader to transport heat, which is generated from the at least one optoelectronic light source, away from the at least one optoelectronic light source.

Electric lines in combination with a plurality of blind conduction paths can for example form a pattern such as a herringbone pattern.

In some embodiments, the at least one thermally conductive layer comprises one or more electrically conductive lines for transporting heat away from the optoelectronic light source, but which are electrically disconnected from the optoelectronic light source. The optoelectronic light source can therefore comprise a further contact pad electrically disconnected from the optoelectronic light source for transporting heat away from the optoelectronic light source. The electrically conductive lines for transporting heat away from the optoelectronic light source, but which are electrically disconnected from the optoelectronic light source can be connected to the further contact pad but can be disconnected from the contact pads electrically connected to the optoelectronic light source. The thermally conductive layer can thus comprise at least one electric line electrically connected to the optoelectronic light source to transport heat away from the at least one optoelectronic light source. Moreover, it can serve to supply electric energy to the at least one optoelectronic light source. Furthermore, the thermally conductive layer can comprise one or more electrically conductive lines for transporting heat away from the optoelectronic light source, but which are electrically disconnected from the optoelectronic light source.

In some embodiments, the at least one thermally conductive layer comprises a coating, particularly a copper, palladium or molybdenum coating. In case of the at least one thermally conductive layer being of a good electrically and thermally conductive material such as a metal, the coating can for example reduce the visibility of the usually reflective metals. However, the coating can also increase the thermal conductivity of the thermally conductive layer.

In some embodiments, the at least one thermally conductive layer is arranged between the first layer and the at least one optoelectronic light source. In some embodiments, the at least one thermally conductive layer is arranged on the first layer on the opposite side of the at least one optoelectronic light source. Moreover, in some embodiments, a first thermally conductive layer is arranged between the first layer and the at least one optoelectronic light source at the same side as the at least one optoelectronic light source, and a second thermally conductive layer is arranged on the first layer on the opposite side of the at least one optoelectronic light source.

The first thermally conductive layer or at least sections of the first thermally conductive layer can for example be connected to the at least one optoelectronic light source to transport heat which is generated from the at least one optoelectronic light source away from the at least one optoelectronic light source as well as supply electric energy to the at least one optoelectronic light source. The second thermally conductive layer can for example transport heat, which is generated from the at least one optoelectronic light source away from the at least one optoelectronic light source. The second thermally conductive layer can be electrically disconnected from the at least one optoelectronic light source.

In some embodiments, the layer stack further comprises a first auxiliary layer arranged between the cover layer and the first layer and/or a second auxiliary layer arranged be-tween the carrier layer and the first layer. The first and/or second auxiliary layer can for example be leveling layers which comprises or consists of a material such as polyvinyl butyral (PVB) or ethylene-vinyl acetate (EVA). In case of the at least one optoelectronic light source arranged on the first layer protrudes an upper surface of the first layer, the first auxiliary layer can form a leveling layer such that the protruding portion of the optoelectronic light source is embedded in the first auxiliary layer. The same applies to a protruding portion of the at least one thermally conductive layer protruding from one of the layers of the layer stack, which can be embedded in the first and/or the second auxiliary layer.

In some embodiments, the at least one thermally conductive layer is arranged between the first auxiliary layer and the cover layer. In some embodiments, the at least one thermally conductive layer is arranged between the second auxiliary layer and the carrier layer. Moreover, in some embodiments, a first thermally conductive layer is arranged between the first auxiliary layer and the cover layer and a second thermally conductive layer is arranged between the second auxiliary layer and the carrier layer. In all three cases, the thermally conductive layer can for example transport heat which is generated from the at least one optoelectronic light source away from the at least one optoelectronic light source but is in particular electrically disconnected from the at least one optoelectronic light source.

In some embodiments, the at least one thermally conductive layer can comprise an electrically conductive mesh, which can be configured as a so called "metal-mesh-sensor". A metal-mesh-sensor can be used to identify an organic element, particularly a finger of a human being, which is close to the metal-mesh as well as the position of the finger. Such metal-mesh-sensors are particularly used for touchscreens and displays with a touch function. Thus, the thermally conductive layer can on the one hand be used to transport heat, which is generated from the at least one optoelectronic light source, away from the at least one optoelectronic light source as well as function as a metal-mesh-sensor for enabling a touch function for the optoelectronic device.

In some embodiments, the particles with a high thermal conductivity are arranged in the first auxiliary layer and/or the second auxiliary layer. The particles can provide a thermal conductivity of the first auxiliary layer and/or the second auxiliary layer such that the overall thermal conductivity of the layer is at least 25% higher than the thermal conductivity of the layer without particles.

In some embodiments, the particles with a high thermal conductivity are of an at least partially transparent material such as for example glass particles or ceramic particles. In some embodiments, the particles with a high thermal conductivity are silicon dioxide ($SiO_2$) particles. In particular, the particles with a high thermal conductivity can have an at least approximately similar refractive index as the material of the layer in which they are arranged in. In some embodiments, the particles can be of a material with a certain phase transition temperature. At this temperature, short temperature peaks are buffered to a certain extent.

In some embodiments, at least one of the layers of the layer stack is tinted. In some embodiments, at least an auxiliary layer is tinted which is arranged opposite to the at least one optoelectronic light source opposite to the main emitting direction of the at least one optoelectronic light source. Tinted layers can for example improve the optical properties of the optoelectronic device. However, tinted foils can increase the internal temperature of the layer stack. Therefore, it can be advantageous that a layer which is tinted is not arranged in main emitting direction of the at least one optoelectronic light source.

In some embodiments, a reflective layer is arranged between two layers of the layer stack. The reflective layer is configured to reflect light in the ultraviolet and/or infrared spectrum but is permeable to light in the visible spectrum. Preferably, the reflective layer is arranged on the first layer and between the first layer and the at least one optoelectronic light source. In some embodiments, the reflective layer is arranged between the at least one optoelectronic light source and a layer which is tinted, wherein the reflective layer and the tinted layer are not arranged in the main emitting direction of the at least one optoelectronic light source.

In some embodiments, the at least one thermally conductive layer is a coating, particularly a carbon nanotube (CNT), graphene or an indium tin oxide (ITO) coating. In some embodiments, the at least one thermally conductive layer can be a coating of a surface of the cover layer facing the first layer, or the at least one thermally conductive layer can be a coating of a surface of the carrier layer facing the first layer. Moreover, in some embodiments, a first thermally conductive layer can be a coating of a surface of the cover layer facing the first layer and a second thermally conductive layer can be a coating of a surface of the carrier layer facing the first layer.

In some embodiments, an optoelectronic device comprises a plurality of optoelectronic light sources being arranged on a first layer. The plurality of optoelectronic light sources is in particular arranged between a cover layer and the first layer. A second layer is arranged above the plurality of optoelectronic light sources and the second layer comprises a plurality of light scattering structures. Each light scattering structure is associated with one optoelectronic light source of the plurality of optoelectronic light sources, and each light scattering structure is individually designed, in particular by use of focused light, in particular laser light, in dependence on an operational parameter of the associated optoelectronic light source.

The formulation that something is "arranged on" something shall not necessarily be understood as something is directly arranged on something but may also comprise another element arranged between. Thus, the formulation that something is arranged on something, can also be understood as something is indirectly arranged above something or embedded in something. In particular, the formulation that a plurality of optoelectronic light sources is arranged on the first layer can be understood as the optoelectronic light sources being arranged directly on an upper surface of the first layer or can be understood as the optoelectronic light sources being arranged above an upper surface of the first layer, but another element may be arranged between the optoelectronic light sources and the upper surface of the first layer. However, the formulation can also be understood as the optoelectronic light sources are arranged on the first layer and being partially or completely embedded in the first layer. Each light scattering structure can be arranged in the second layer above the associated optoelectronic light source such that the light scattering structure scatters light emitted by the associated optoelectronic light source. In particular, each light scattering structure can scatter the light emitted by the associated optoelectronic light source such that the brightness of the light passing the light scattering structure is reduced, or to modify, for example enhance, the conversion efficiency by scattering unconverted light back to a converter of the associated optoelectronic light source.

By use of individually designed light scattering structures, the homogeneity of the optoelectronic device can be increased. For this purpose, individually designed light scattering structures can be arranged above optoelectronic light sources. As the light sources usually emit light at a slightly different brightness or color value, the scattering structures can be designed to compensate this difference and a more homogeneous brightness or color over, for example, a display might be achieved. Moreover, an improvement in homogeneity can for example be obtained in regard to the color reproduction provided by the optoelectronic device. Therefore, the scattering structures can be individually configured in dependence on an operational parameter of the associated optoelectronic light source, for example a value of the brightness or color of light emitted by the particular light source, in order to adapt the light emitted by the associated optoelectronic light source in such a way that it does not disturb the overall homogeneity of the optoelectronic device.

Another advantage of such individually designed light scattering structures can be that a binning process of the optoelectronic light sources, before arranging the optoelectronic light sources on the first layer, can be simplified. The range of the operational parameters can be chosen broader for the bins as the homogeneity of the optoelectronic device can be adjusted by use of individually designed light scattering structures. The larger the range of the operational parameters of the bin, the more the values of the operational parameters of the individual optoelectronic light sources may differ, and the optoelectronic light sources are accordingly cheaper. At the same time the homogeneity of the optoelectronic device can be increased. This contrasts a tighter binning, as the tighter the binning the more expensive the sorting process is.

Due to the individually designed light scattering structures it can also be possible to calibrate an operational parameter, for example brightness or color value, of the optoelectronic device in accordance with customer requirements.

In some embodiments, at least one and preferably all optoelectronic light sources comprise a light converter. The light converter is preferably arranged between the optoelectronic light sources and the second layer. The light converter is preferably configured to convert light of a first wavelength emitted by the optoelectronic light source into light of a second wavelength, wherein the first wavelength is different to the second wavelength, in particular the first wavelength is smaller than the second wavelength. By use of different light converters, the optoelectronic light sources can emit light of various colors as for example red, green, blue and yellow.

By use of individually designed light scattering structures, the amount of converting particles within a light converter may be chosen less precisely as the homogeneity, in particular in regard to color, of the optoelectronic device can be readjusted by use of the individually designed light scattering structures. This can be advantageous as the process of controlling the quantity of converting particles within a light converter may be simplified. In particular in case of small optoelectronic light sources and thus small light converters, this can be advantageous, as with the size of the light converter the quantity of needed converting particles within a light converter drops.

Operational parameters that can affect the homogeneity of the optoelectronic device can for example be:
  the wavelength of the emitted light of each optoelectronic light source,
  the amount of converting particles in a light converter arranged above an optoelectronic device and thus the wavelength of the converted light,
  the colour value of the emitted light of each optoelectronic light source, and/or
  the brightness of each optoelectronic light source.

In some embodiments, each light scattering structure is individually designed such that light within a defined range of the operational parameter is provided by the optoelectronic device.

In some embodiments, the operational parameter is the brightness of the associated optoelectronic light source. Each light scattering structure can be individually designed in dependence on the brightness of the associated optoelectronic light source. Each light scattering structure can for example reduce the brightness of the light emitted by the associated optoelectronic light source to a defined level such that the optoelectronic device provides homogeneous light within a defined range of brightness. The defined range can for example be within 50% or less of the brightness of the darkest optoelectronic light source.

In some embodiments, at least one optoelectronic light source is not associated with a light scattering structure. The optoelectronic light source not being associated with a light scattering structure can for example be the darkest optoelectronic light source of the plurality of optoelectronic light sources. The brightness of the emitted light of the darkest optoelectronic light source can therefore be a reference value to individually design the light scattering structures. Each light scattering structure can be individually designed, to reduce the brightness of the light emitted by the associated optoelectronic light source to at least approximately the level of the reference value. Optoelectronic light sources, which emit light with a brightness that at least approximately correlates to the reference value however may not have an associated light scattering structure.

In some embodiments, the operational parameter is a color value of the light emitted by an optoelectronic light source. Each light scattering structure can be individually designed in dependence on the color value of the light emitted by the associated optoelectronic light source, in particular after the light was converted by a converter of the associated optoelectronic light source. Each light scattering structure can for example enhance the conversion efficiency by scattering unconverted light back to the converter. The color value can be changed by for example 0.1 in each of the directions x and y of the CIE xyY color space, which in particular corresponds to approximately 100 color points. The change of the color value is in particular to obtain a desired color value, which corresponds to the color value provided by a selected optoelectronic light source. In the CIE xyY color space the Y parameter can be a measure of the luminance of a color, wherein the chromaticity can be specified by the two derived parameters x and y. The color value can in some embodiments correlate to the so-called "tristimulus value".

In some embodiments, each light scattering structure, which is associated with an optoelectronic light source that provides a particular color, such as for example red, green or blue, in particular after the light was converted by a converter of the associated optoelectronic light source, is individually designed such that the color value is within a predefined range with regard to the color value of the light provided by a selected one of the optoelectronic light sources. The predefined range can be within a delta of 0.1, 0.05, or 0.03 in each of the directions x and y of the CIE xyY color space with regard to the color value of the light provided by the selected optoelectronic light source.

In some embodiments, different light scattering structures scatter light differently, in particular each light scattering structure scatters light differently. A first light scattering structure can for example scatter a first portion of light emitted by the associated optoelectronic light source and a second light scattering structure scatter a second portion of light emitted by the associated optoelectronic light source, wherein the first and the second portion are different. The second layer can thus comprise a plurality of light scattering structures, wherein each light scattering structure can be individually designed and scatter light differently.

In some embodiments, at least one and preferably all layers of the optoelectronic device comprise or consist of an at least partially transparent material.

In some embodiments, each light scattering structure extends, when seen in a top view of the second layer, over the outer edges of the associated optoelectronic light source. A cross sectional area of each light scattering structure that is within a plane, which is parallel to a top surface of the second layer, can thus be larger than a cross sectional area of the associated optoelectronic light source that is within another plane, which is also parallel to the top surface of the second layer. However, the outer edges of each light scattering structure, can, when seen in the top view of the second layer, correlate with the outer edges of the associated optoelectronic light source or be arranged within the outer edges of the associated optoelectronic light source. The cross sectional area of each light scattering structure that is within the plane, which is parallel to the top surface of the second layer, can thus be equal to or smaller than the cross sectional area of the associated optoelectronic light source that is within the other plane, which is parallel to the top surface of the second layer.

In case of the cross sectional area of each light scattering structure being larger than the cross sectional area of the associated optoelectronic light source, less light and in particular none of the light being emitted by the associated optoelectronic light source shines past the light scattering structure, but in particular all light shines through the light scattering structure. In case of the cross sectional area of each light scattering structure being equal to or smaller than the cross sectional area of the associated optoelectronic light source, the transparency of the second layer can be increased.

In some embodiments, each light scattering structure can have isotropic properties or anisotropic properties. This means that each light scattering structure can either scatter light equally in all spatial directions such that independently from the viewing angle onto the light scattering structure the light emitted by the light scattering structure has an at least approximately equal brightness. Alternatively, each light scattering structure can scatter light differently in different spatial directions in dependence on for example the form of the light scattering structure.

In some embodiment, the first layer is arranged between a cover layer and a carrier layer. In some embodiments, the second layer corresponds to the cover layer.

In some embodiments, the optoelectronic device further comprises a first auxiliary layer arranged between the cover layer and the first layer and/or a second auxiliary layer arranged between the carrier layer and the first layer. The first and/or second auxiliary layer can for example be leveling layers which comprises or consists of a material such as polyvinyl butyral (PVB) or ethylene-vinyl acetate (EVA). In case of the optoelectronic light sources being arranged on the first layer protruding an upper surface of the first layer, the first auxiliary layer can form a leveling layer such that the protruding portions of the optoelectronic light sources are embedded in the first auxiliary layer.

By use of individually designed light scattering structures, variations in the thickness of any of the layers of the optoelectronic device, and thus variations in the brightness and color of the light being emitted by the optoelectronic device can be compensated to obtain a desired homogeneity of the optoelectronic device.

In some embodiments, a set of optoelectronic devices comprises at least two optoelectronic devices according to any one of the aforementioned embodiments. At least some of the light scattering structures of one of the optoelectronic devices are designed or positioned differently than the light scattering structures of the other optoelectronic device. Hence, the two optoelectronic devices are different from each other, as the individually designed light scattering structures are designed and/or positioned differently for both optoelectronic devices.

In some embodiment, a method of manufacturing an optoelectronic device comprises a step of providing a plurality of optoelectronic light sources, which are arranged on a first layer. The method further comprises a step of producing a plurality of light scattering structures in a second layer above the plurality of optoelectronic light sources. Each light scattering structure is associated with an optoelectronic light source. The step of producing a light scattering structure includes individually producing, in particular by use of laser light, the light scattering structure in the second layer in dependence on an operational parameter of the associated optoelectronic light source.

In some embodiments, before the step of producing the plurality of light scattering structures, the method further comprises a step of determining a value of the operational parameter for each optoelectronic light source. The determination can for example comprise a switching on of the optoelectronic device, such that the plurality of optoelectronic light sources emits light. The determination can further comprise a step of taking a picture of the optoelectronic device, in particular of a top view of the optoelectronic device, by use of a camera. In a further step, the step of determination can comprise a measurement step on basis of the taken image to determine a value of the operational parameter for each optoelectronic light source. In a following step, an optoelectronic light source having a value of the operational parameter that fulfils a predefined criterion is identified.

In some embodiments, the method comprises a step of producing for an optoelectronic light source, which is not the optoelectronic light source having the value of the operational parameter that fulfils the predefined criterion, an associated light scattering structure. The light scattering structure is produced such as to scatter light from the associated optoelectronic light source such that the value of the operational parameter of this optoelectronic light source fulfils the predefined criterion, in particular when the light emitted from this optoelectronic light source has passed the associated light scattering structure. However, in some embodiments, the value of the operational parameter, in particular when the light emitted from this optoelectronic light source has passed the associated light scattering structure, does not have to fulfil the predefined criterion but may be within a predefined range of the predefined criterion.

In some embodiments, between the steps of determining a value of the operational parameter for each optoelectronic light source and the step of producing the light scattering structures, the method further comprises a step of calculating an individual design for each light scattering structure in dependence on the determined value of the operational parameter of the associated optoelectronic light source.

In some embodiments, the operational parameter is brightness and the predefined criterion requires that the optoelectronic light source which fulfils the criterion is the darkest optoelectronic light source of the plurality of optoelectronic light sources.

In some embodiments, the step of producing a light scattering structure comprises producing a light scattering structure for each optoelectronic light source which is not the darkest optoelectronic light source.

In some embodiment, each light scatting structure reduces the brightness of the associated optoelectronic light source to a level which corresponds to, or is equal to the brightness of the darkest optoelectronic light source.

In some embodiments, the step of producing the a light scattering structures comprises using a laser to provide the light scattering structures sequentially one after the other, or using two or more lasers to provide two or more light scattering structures in parallel.

By use of laser light, scattering centres can be provided by laser writing into the second layer forming the light scattering structures. The scattering centres can for example comprise or consist of defects in the material of the second layer.

In some embodiments, the optoelectronic device comprises a first layer, also referred to as first layer segment, intermediate layer or bottom layer of a layer stack, as well as a carrier layer and a cover layer, also referred to as second and third layer. The first layer can be arranged between the carrier layer and the cover layer. The first layer can carry the at least one electronic or optoelectronic element or optoelectronic light source and/or the at least one electronic or optoelectronic element or optoelectronic light can be partially or completely embedded in the first layer.

In some embodiments, the first layer can at least be partially transparent and comprise or consist of a material, such as high or low grade polyethylene terephthalate (PET), polyethylene naphthalate (PEN), polycarbonates (PC), (colorless) polyimide (PI), polyurethane (PU), poly(methyl methacrylate) (PMMA), polycyclic aromatic hydrocarbons (PAK), or any other suitable material. Particularly, the first layer can comprise or consist of an at least partially transparent plastic, in particular an at least partially transparent foil, in particular a flexible foil.

Each of the carrier layer and the cover layer may be made of a glass material, a plastic material and/or any other suitable material. Each of the carrier layer and the cover layer may contain only one layer or several layers of the same or different materials.

In some embodiments, the optoelectronic device further comprises at least one auxiliary layer, which also is referred to as adhesive layer, planarization layer, bottom layer of a layer stack, second or third layer, or further layer. A first auxiliary layer can be arranged between the first layer and the cover layer and optionally a second auxiliary layer can be arranged between the first layer and the carrier layer.

The at least one auxiliary layer can be formed by one of the following:
 a molten material layer or
 an adhesive layer, in particular a hot-melt adhesive layer,
  a resin, such as Ethylene Vinyl Acetate (EVA), Polyvinyl Butyral (PVB), or
 a ionomer based system.

In some embodiments, the at least one auxiliary layer can enclose the first layer in the same layer. The at least one auxiliary layer can have the same height as the first layer, however the at least one auxiliary layer can also have a height which is different, in particular larger, than the height of the first layer. The at least one auxiliary layer can enclose the first layer not only in a circumferential direction, since the first layer can be completely embedded in the at least one auxiliary layer.

In some embodiments, the at least one auxiliary layer can at least be partially transparent. In some embodiments, the at least one auxiliary layer can be blackened, resulting in an at least partially transparent auxiliary layer. If the optoelectronic apparatus comprises more than one auxiliary layer, none, one, a selection of the auxiliary layers, or all auxiliary layers can be blackened.

In some embodiments, the at least one electronic or optoelectronic element or optoelectronic light source, in particular LED, can be smaller than 300 μm, in particular smaller than 150 μm. With these spatial extensions, at least one electronic or optoelectronic element or optoelectronic light source is almost invisible for the human eye.

In some embodiments, the at least one electronic or optoelectronic element or optoelectronic light source is a LED. A LED can in particular be referred to as a mini LED, which is a small LED, for example, with edge lengths of less than 200 µm, in particular down to less than 40 µm, in particular in the range from 200 µm to 10 µm. Another range is between 150 µm to 40 µm.

The LED also can be referred to as a micro LED, also called µLED, or a µLED-chip, in particular for the case of the edge lengths being in a range of 100 µm to 10 µm. In some embodiments, the LED can have spatial dimensions of 90×150 µm or the LED can have spatial dimensions of 75×125 µm.

The mini LED or µLED-chip can in some embodiments be an unpackaged semiconductor chip. Unpackaged can mean that the chip is without a housing around its semiconductor layers such as for example an unpacked semiconductor die. In some embodiments, unpackaged can mean that the chip is free of any organic material. Thus, the unpackaged device does not contain organic compounds, which contain carbon in covalent bonding.

In some embodiments, each optoelectronic element or optoelectronic light source can comprise a mini LED or a µLED-chip configured to emit light of a selected color. In some embodiments, each optoelectronic element or optoelectronic light source can comprises one or more mini LEDs, or µLED-chips, such as for example a RGB-Pixel, which comprises three mini LEDs or µLED-chips. A RGB-Pixel can for example emit light of the colors red, green and blue as well as any mixed color.

In some embodiments, an RGB-Pixel can further comprise one or more integrated circuits (IC), in particular small integrated circuits as for example micro integrated circuits (µIC).

In some embodiments, the optoelectronic device comprises at least one conductor line, also referred to as conductor path, conductor layer segment, or portion of an electrical conductor arrangement, and preferably two conductor lines, particularly to supply electric energy and/or a data signal to the at least one electronic or optoelectronic element or optoelectronic light source.

In some embodiments, the first layer carries the at least one conductor line. However in some embodiments, at least one auxiliary layer can carry the at least one conductor line.

In some embodiments, the at least one conductor line can be of a conductive material, such as for example copper. The at least one conductor line can be coated and/or blackened to reduce the reflectance of the outer surface area of the at least one conductor line. The coating can for example be a palladium or molybdenum coating. In some embodiments, the at least one conductor line can have a width in the range between 5 µm to 50 µm.

In some embodiments, the at least one conductor line can be formed as a conductive mesh, particularly a metallic mesh. The mesh can be coated and/or blackened, in particular to reduce the reflectance of the outer surface area of the conductive mesh. The coating can for example be a palladium or molybdenum coating.

In some embodiments, an optoelectronic device comprises a layer stack, which includes a first layer as well as a cover layer and a carrier layer. The first layer is in particular an intermediate layer, which is arranged between the cover layer and the carrier layer. At least one electronic or optoelectronic element, in particular an optoelectronic light source, is arranged on the first layer and at least one layer of the layer stack and preferably all layers of the layer stack are at least partially transparent. The layer stack comprises at least one electrically conductive layer, which is arranged between two adjacent layers of the layer stack or embedded in a layer.

In some embodiments, the at least one electrically conductive layer comprises at least one conductive line which is electrically connected to a contact pad of the optoelectronic light source. The at least one electrically conductive layer can be of a good electrically and thermally conductive material such as for example copper, silver, gold and aluminum. The at least one electrically conductive layer and particularly the at least one conductive line can be coated and/or blackened to reduce the reflectance of the outer surface area of the at least one conductive line. The coating can for example be a palladium or molybdenum coating. In some embodiments, the at least one electric line can have a width in the range between 5 µm to 50 µm.

The at least one electrically conductive layer can comprise an electrically conductive mesh, for example a metallic mesh, in particular a copper mesh. The mesh can have nodes and interconnects between the knots, wherein, preferably, at least the majority of the interconnects are not interrupted. The at least one electrically conductive layer can thus be structured and comprise a plurality of conductive lines being connected with each other.

The mesh can have a regular or an irregular pattern, wherein an irregular pattern can be preferred, as an irregular pattern can increase the transparency of the electrically conductive layer. The reason for this can be that an irregular pattern can be more difficult to perceive by the human eye.

In some embodiments, the conductive mesh is coated and/or blackened, in particular to reduce the reflectance of the outer surface area of the conductive mesh. The coating can for example be a palladium or molybdenum coating.

At least some embodiments of the optoelectronic device as described herein can be arranged on non-flat or curved surfaces, for example on the outside or in the interior of a vehicle or a building. This is in particular possible as at least some embodiments of the optoelectronic device as described herein can be built on the basis of a layer structure which is flexible.

The invention therefore also relates to a larger entity, such as a vehicle or building, which comprises on its exterior or interior, in particular on an exterior or interior surface, at least one optoelectronic device.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

BRIEF DESCRIPTION OF THE DRAWINGS

In the following, the invention is described by way of example only and by reference to exemplary embodiments in conjunction with the accompanying drawings:

FIG. 4 shows schematically an exemplary cross sectional view of a further embodiment of an optoelectronic device in accordance with the present invention.

FIG. 5 shows schematically an exemplary cross sectional view of yet a further embodiment of an optoelectronic device in accordance with the present invention.

FIG. 11A to 11C show steps of an exemplary embodiment of a method for manufacturing an optoelectronic device in accordance with the present invention.

FIG. 12A to 12C show steps of another exemplary embodiment of a method for manufacturing an optoelectronic device in accordance with the present invention.

FIG. 13A to 13C show steps of another exemplary embodiment of a method for manufacturing an optoelectronic device in accordance with the present invention.

FIG. 14A to 14C show steps of another exemplary embodiment of a method for manufacturing an optoelectronic device in accordance with the present invention.

FIGS. 15A and 15B show steps of another exemplary embodiment of a method for manufacturing an optoelectronic device in accordance with the present invention.

FIG. 16A to 16D show cross sectional and top views of an intermediate product.

FIG. 17A to 17C show cross sectional views of exemplary embodiments of an optoelectronic device in accordance with the present invention.

FIG. 18A to 18C show cross sectional views of an intermediate product.

FIG. 19A to 19C show cross sectional views of exemplary embodiments of an intermediate product.

FIG. 20A to 20E show scanning-electron microscopy (SEM) images of exemplary embodiments of an optoelectronic device in accordance with the present invention.

FIGS. 21A to 21C show steps of an exemplary embodiment of a method for manufacturing an optoelectronic device in accordance with the present invention.

FIG. 38A shows a top view and a cross sectional view of an optoelectronic device.

FIG. 38B shows a top view and a cross sectional view of an embodiment of an optoelectronic device in accordance with the present invention.

FIGS. 41A to 41C show each a top view of an embodiment of an optoelectronic device in accordance with the present invention.

FIGS. 67, 68, 69A, 69B, and 70 to 72 show embodiments of optoelectronic devices in accordance with the present invention.

DETAILED DESCRIPTION

Figure 1:
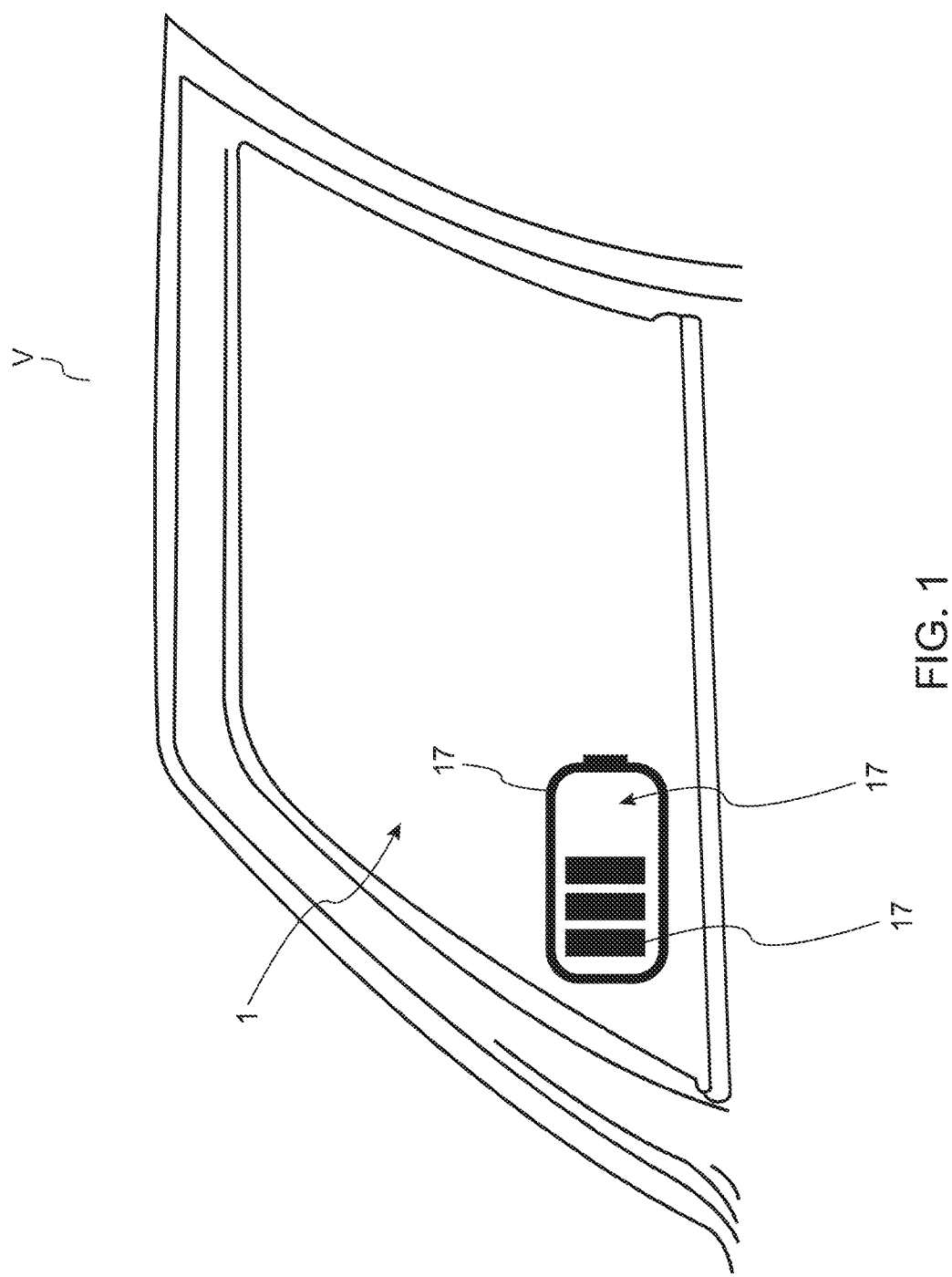
FIG. 1 shows schematically an exemplary embodiment of an optoelectronic device in accordance with the present invention.

The exemplary optoelectronic device as shown in FIG. 1 can be a pane 1. The at least partially transparent pane 1 is part of a side door of a vehicle V. Inside the pane 1 two-dimensional indicator areas 17 are provided. These indicator areas 17 show symbols for example for depicting a state of charge of a battery of the vehicle. Here the indicator areas 17 are located on a bottom left side of the pane 1. The indicator areas 17 further can show symbols, colours and/or animations. Additionally or alternatively, the exhaust class, the car number, further technical data or advertisements are indicated at pane 1.

Figure 2:
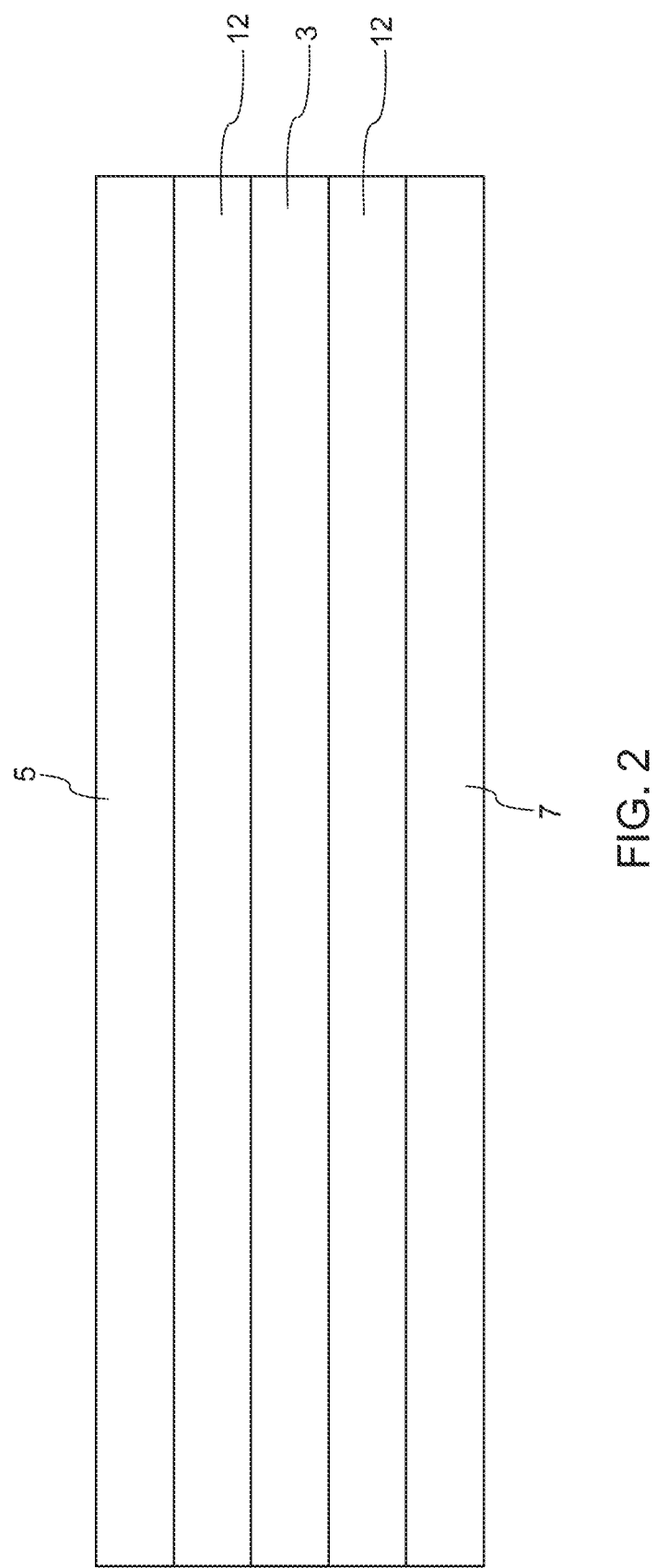
FIG. 2 shows schematically an exemplary cross sectional view of an embodiment of an optoelectronic device in accordance with the present invention.

The pane 1 can have a cross-sectional structure as shown in FIG. 2. The pane 1 can include a carrier layer 7, an intermediate layer 3, and a cover layer 5. Adhesive layers 12 are used for attaching the cover layer 5, the intermediate layer 3 and the carrier layer 7 to each other. Thus, the carrier layer 7, intermediate layer 3, and cover layer 5 can be glued together.

Alternatively, the intermediate layer 3 can be a foil, which is laminated on the cover layer 5 and the carrier layer 7, without applying additional adhesive layers 12. The cover layer 5 and the carrier layer 7 can for example be glass layers. Each layer can thereby consist of one or more glass layers, and can for example correspond to a layer of security glass.

The intermediate layer 3 can be flexible and can follow a nonplanar shape of glass layers 5, 7. The foil can comprise plastics, for example PET (polyethylene terephthalate). An adhesive can be PVB (polyvinyl butyral). Glass can be substituted by PMMA (poly methyl methacrylate) and/or PC (polycarbonate).

The intermediate layer 3 carries optoelectronic components like optoelectronic light sources 9 (not shown in FIG. 2). Moreover, the intermediate layer 3 can serve as an optical element, since it can act as a guide for the light emitted by the light sources 9 and it can further provide features for spreading and/or extracting the light from the intermediate layer 3.

Figure 3:
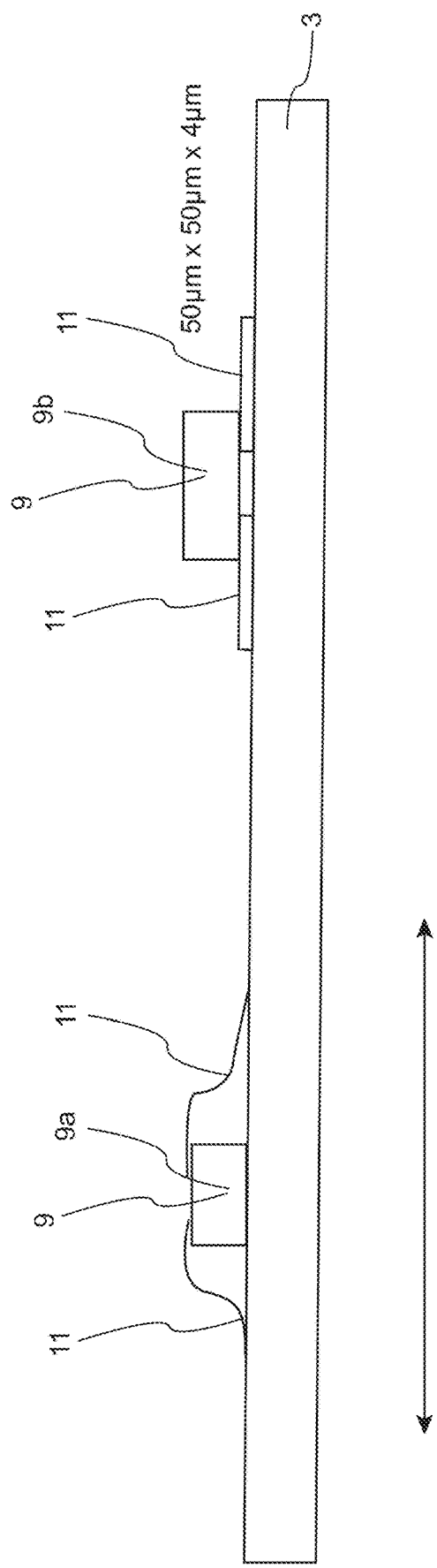
FIG. 3 shows schematically an exemplary cross sectional view of another embodiment of an optoelectronic device in accordance with the present invention.

As shown in FIG. 3, the intermediate layer 3, which can be a foil, can serve as a carrier for optoelectronic components, such as light sources 9. The light sources 9 can for example be LEDs. The light sources 9 can be flip chips that have both electric contacts at a bottom surface. As shown in FIG. 3, light source 9a is turned upside down, and bond wires can be used to connect the electric contacts of the light source 9a to conductor paths 11, which are used to provide electricity to the light sources 9a, 9b. The conductor paths 11 can be arranged on the intermediate layer 3. As further shown in FIG. 3, the electric contacts at the bottom side of flip chip 9b can be directly placed on contacts of the conductor paths 11.

The light sources 9 can for example be volume emitters or surface emitters. Volume emitters can emit light at their top surface, which is on the opposite side of the bottom side and on its side surfaces. A surface emitter can emit light at the top surface. The light source 9a can for example be a surface emitter, which emits light at the surface that is in contact with the surface of the intermediate layer 3. Thus, the emitted light can be directly emitted into the intermediate layer 3. The light source 9b can be a surface emitter that emits light at the top surface, which is facing away from the intermediate layer, or it can be a volume emitter. The light source 9b is not usable to input light into the intermediate layer 3.

The light sources 9 can be of a size in the range of 50 µm×50 µm×4 µm and they can be provided as chips without a package. The double arrow in FIG. 3 indicates spatial extensions of the electrically and mechanically connected chips in a range, which is smaller than 200 µm, in particular smaller than 150 µm. The interspacing between neighbouring chips can be in the same range or larger. Thus, switched off chips are not or barely visible.

FIG. 4 shows a cross sectional view of an optoelectronic device, in particular a pane (see pane 1 in FIG. 1). Here the light sources 9 are chips, for example without package, and they are at least partially integrated into the intermediate layer 3, which can be a flexible foil.

For example, the light sources 9 are pressed into the intermediate layer 3. On one surface of the intermediate layer 3, electrical conductor paths 11 are arranged. The intermediate layer 3 can also act as an adhesive, thus a separate adhesive layer is not required.

The intermediate layer 3 of FIG. 3 can provide a light guide function, based on the setting that the refractive index is larger in comparison to the material of the cover layer and the carrier layer being adjacent to the intermediate layer 3. The electrical conductor paths 11 are made of a metal, such as silver or gold, or of a transparent conductive material, such as ITO.

The three light sources 9 on the right of FIG. 4 comprise reflective structures 15, 15a, 15b, 15c on one or on both main surfaces of each light source 9. The main surfaces are the top surface and the bottom surface, wherein both electric contacts are on the bottom surface if the light sources 9 are flip chips as indicated in FIG. 4. In the view of FIG. 4, the top side of the light sources 9 is facing downward, and the electric contacts of the flip chips are attached to respective conductor paths 11.

The reflective structures 15 on the top and/or bottom surfaces of the chips can be a mirror 15a, a metal coating 15b and or a dielectric coating 15c. The metal coating 15b can comprise or consist of aluminium and/or silver and/or gold. Other metals are also possible. The dielectric coating 15c can be a distributed Bragg reflector. The reflective structures 15 can be combined. Thus, different reflective structures can be provided on the same chip. Due to the reflective structures, a chip can act as a side emitter, which effectively emits light through the sidewalls, which are not equipped with reflective structures. The light emitted by the light sources 9 is therefore efficiently distributed in the intermediate layer 3.

Now referring to FIG. 5, an optoelectronic light source 9 provided as a LED chip is again pressed into intermediate layer 3, which can be a foil and comprise conductor paths 11 on its top surface. According to the example of FIG. 5, conductor paths 11 can reach down into the foil to contact the electric contacts of the light source 9 which are facing away from the top surface of the intermediate layer 3.

The intermediate layer 3 can include converter material 21. For example, the light sources can be configured to emit UV light or blue light which can be converter by use of the converter material 21 into light with a longer wavelength, for example red light. The converter material 21 can be located at a preset distance with respect to the light source 9, and the intermediate layer 3 can serve as a light guide that guides the light from the light source 9 to the converter material 21. At least some of the converted light can exit the device in a direction, which is perpendicular to the surfaces of the intermediate layer 3 at the position of the converter material 21. Thus light can be visible at the outside.

Figure 6:
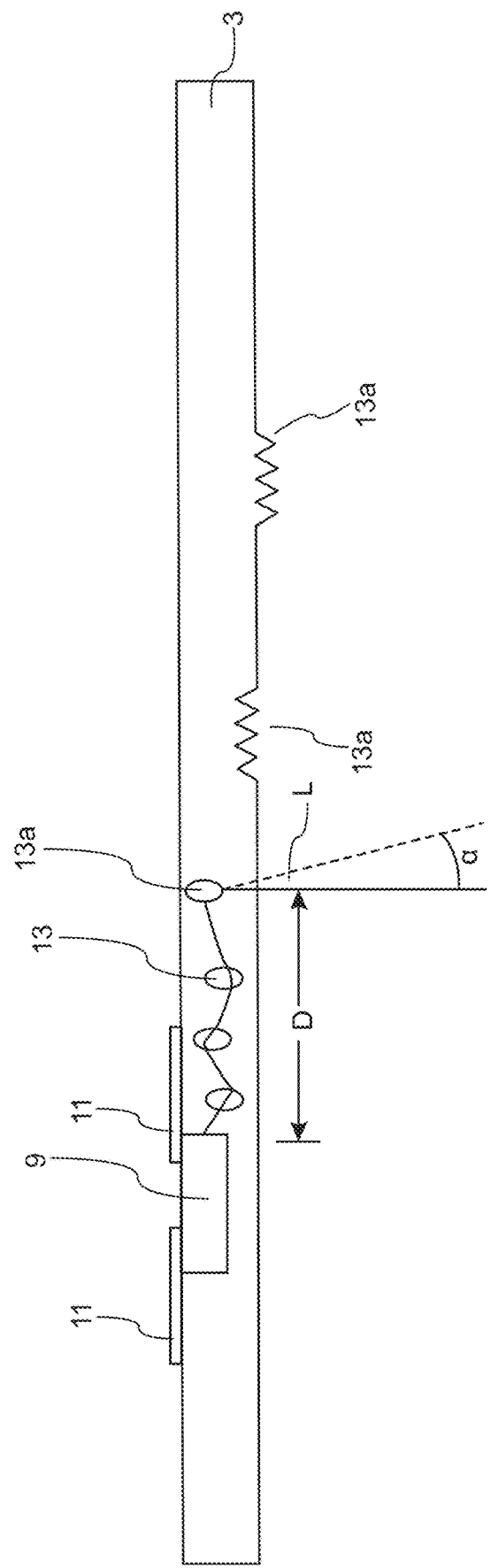
FIG. 6 shows schematically an exemplary cross sectional view of a further embodiment of an optoelectronic device in accordance with the present invention.

In the example shown in FIG. 6, the intermediate layer 3 is adapted to enable an uniform areal light emission. The intermediate layer 3 is for example a foil. Electric contacts and conductor paths 11 are formed at one main surface of the foil. The light sources 9 are pressed into the foil and are for example LED chips.

The LEDs chip can emit light at least partially from a side into the foil 3. Within the foil scattering or dispersive structures 13 are formed. For example, the dispersive or scattering structures 13 can be diffusion centers 13a. They can cause the emitted light L to spread in and along the foil up to a certain distance D. Within distance D, the light L can exit the foil on one or two main sides of the foil, i.e. on the top surface and/or on the bottom surface of the foil 3 as shown in FIG. 6. An angle of view a can be between 0° to 90° relative to a direction perpendicular to the foil.

The diffusion centers 13a can be stamped into and/or arranged within the foil. The diffusion centers 13a can be provided as transparent particles 13b, white particles 13c, holes, air bubbles, and/or as density modifications of the foil material in the foil. At or on the surface of the foil 3 scattering structures 13 can be formed as well.

The scattering concentration of diffusion centers 13 can be implemented such that a mean free path length is larger than the thickness of the foil 3. The sizes of the diffusion centers 13a can be smaller than the wavelengths of the emitted light. Thus, the diffusion centers can scatter in all directions. For example, scattering or dispersive material can be titanium dioxide and/or zirconium.

For supporting a light guiding function the refractive index of the foil 3 is larger than the surrounding material, which corresponds for example to the material of the cover layer and the carrier layer.

The optoelectronic device with an intermediate layer 3 as shown in FIG. 6 can provide two-dimensional emission areas which are larger than the size of a small optoelectronic light source 9, for example by a factor of 5 to 1000 or even more. A homogenous light extraction can be provided. The contacted chips are not visible since they are preferably smaller than 150 µm.

Figure 7:
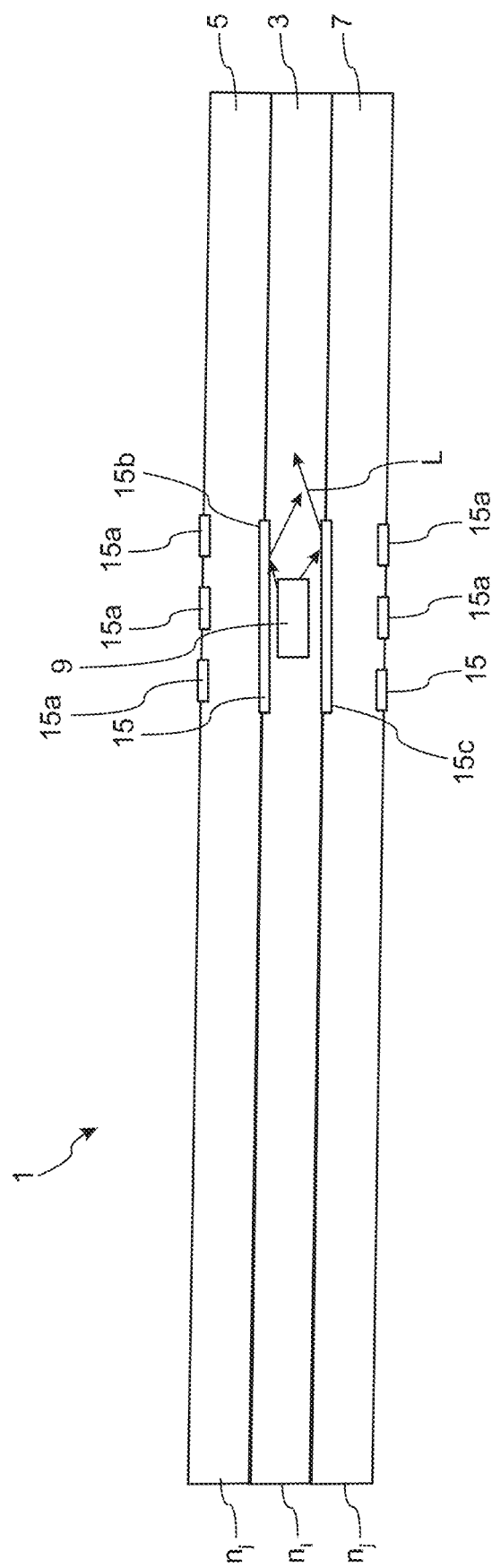
FIG. 7 shows schematically an exemplary cross sectional view of a further embodiment of an optoelectronic device in accordance with the present invention.

In the example as shown in FIG. 7, the pane 1 comprises a cover layer 5, an intermediate layer 3 and a carrier layer 7. The refractive index ni of the intermediate layer 3 is larger than the refractive indexes nj of the adjacent glasses. Thus, the intermediate layer 3 can serve as a light guide for the light provided by optoelectronic light source 9. The emitted light is spread in and along the intermediate layer 3 for example up to the end faces of the intermediate layer 3.

The optoelectronic light source 9 can be accompanied by reflective structures, which are configured to direct the emitted light L in and along the intermediate layer 3. The reflective structures 15, 15b, 15c can be formed at both main surfaces of the intermediate layer 3. Furthermore, reflective structures 15, 15a can be formed on the outer surface of the cover layer and the outer surface of the carrier layer 7. The reflective structures can be, for example, metal coatings 15b or dielectric coatings 15c. The dielectric coating 15c can form a distributed Bragg reflector.

Figure 8:
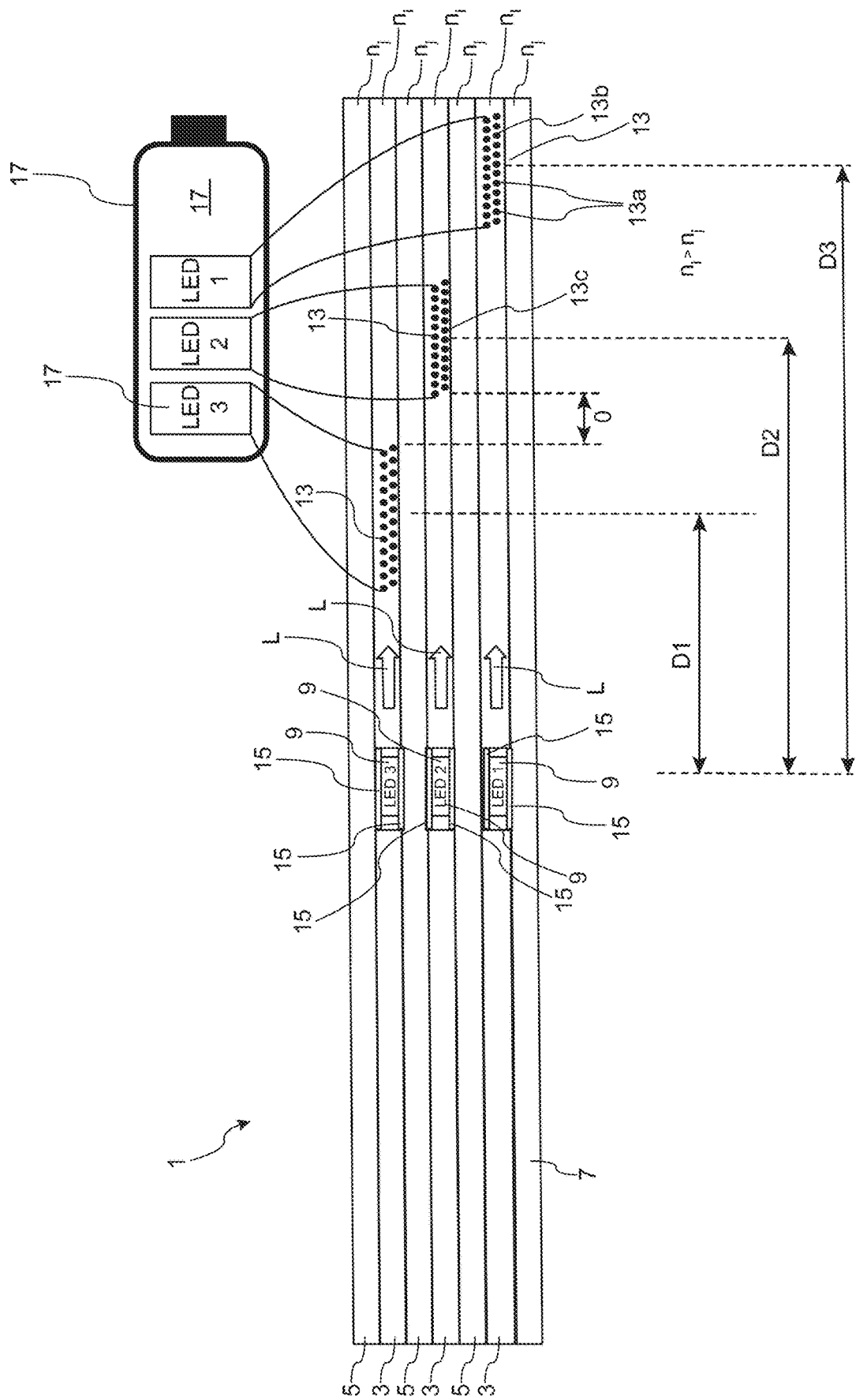
FIG. 8 shows schematically an exemplary cross sectional view of another embodiment of an optoelectronic device in accordance with the present invention.

The example of FIG. 8 comprises three cover layers 5 and three intermediate layers 3, which are stacked on one carrier layer 7. Inside each intermediate layer 3, at least one optoelectronic light source 9, such as a LED or PLED, is integrated. On the top and the bottom surface of the light source 9, a reflective structure 15 is formed.

The light sources 9 therefore act as side emitters that in substance emit light in a direction, which is parallel to the top and bottom surfaces of the intermediate layers 3. The light is therefore distributed in the intermediate layers 3.

Each intermediate layer 3 further comprises at least a scattering structure 13, which covers a volume within the intermediate layer 3. The scattering structures 13 can be formed for example by diffusion centers 13a, transparent particles 13b, or white particles 13c.

The light sources 9 in different intermediate layers 3 emit light at different colours. For example, the light sources 9 in one of the intermediate layers 3 emit red light. The light sources 9 in another intermediate layer 3 emit green light, and the light sources in the third intermediate layer 3 emit blue light.

At the location of a respective scattering or dispersive structure 13 the light L can exit the intermediate layers 3, in particular perpendicularly and/or under a viewing angle α which is less than for example 45° to the perpendicular direction, towards the side of the cover layer 5 and towards the carrier layer 7. Exiting on the outer surface of the carrier layer 7, for example, can be blocked by applying a light absorbing layer on the outer surface. Thus, light in substance only leaves the pane 1 of FIG. 3 on the outer surface of the top cover layer 5.

The location of the scattering or dispersive structure 13 is at a pre-set distance D1, D2, D3 from the corresponding light source 9. The scattering or disperse structures 13 are shifted to each other so that the light scattered from each structure 13 is leaving the pane 1 at slightly different positions. The structures 13 do not disturb each other concerning the extraction of light from the intermediate layers. Accordingly, a certain offset O is provided between the structures 13.

By use of the structures 13, a two-dimensional, areal emission of light can be obtained. Thus, symbols or indicators for example can be visualised at the top surface of the pane 1. As the light sources 9 in the different intermediate layers 3 provide light at different colours, differently coloured symbols or indicators can be produced as well.

In some embodiments, the pane 1 can be a part of a vehicle window. Alternatively, the pane 1 can be a cover of a vehicle lamp, a cover of a vehicle light or a mirror glass. The pane 1 can also be at least a part of a front lamp, a rear light or an interior light. The pane 1 can be a unit of a car body lighting by covering at least parts of a car body.

Figure 9:
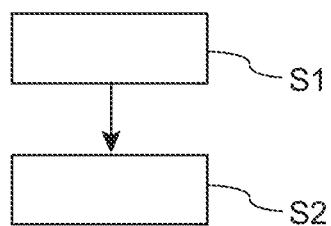
FIG. 9 shows a flow diagram of an exemplary embodiment of a method in accordance with the present invention.

As shown in the flow diagram of FIG. 9, in step S1 of a method of manufacturing an optoelectronic device, at least one and preferably, a plurality of optoelectronic light sources is arranged on at least one surface of an intermediate layer and/or is at least partially embedded in the intermediate layer. In step S2, the intermediate layer is arranged between a cover layer and a carrier layer.

Figure 10A:
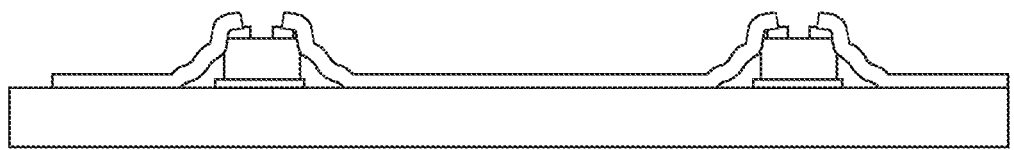
FIG. 10A shows a cross sectional view of an optoelectronic device.
Figure 10B:
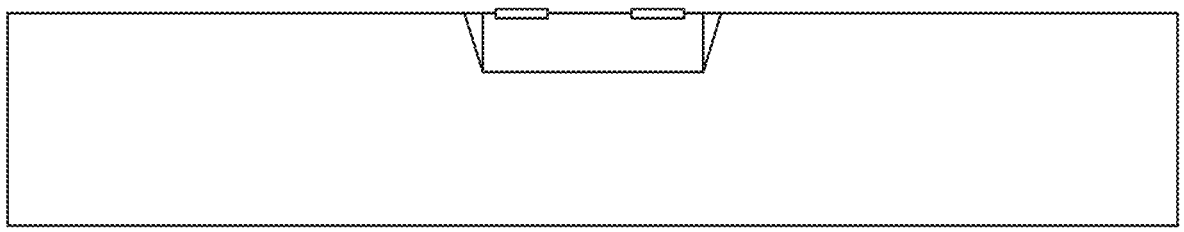
FIG. 10B shows a cross sectional view of another optoelectronic device.

Referring now to FIGS. 10A and 10B two optoelectronic devices are shown. It was found by the inventors, that in order to manufacture a transparent LED-substrate, which in particular is to be placed in glass (between two glass panes) or that is to be mounted behind a glass pane, LED-substrates are created with a respective topography, which is technically difficult to balance in a subsequent process. Such an LED-substrate can for example be seen in FIG. 10A.

The inventors further found that for an electrically interconnection of the LEDs on such an LED-substrate, particularly by help of aforementioned PlCOS process, the lowest possible topography is required in order to provide contact paths overmolding the topography of the LEDs. As shown in FIG. 10A, current LEDs, particularly flip chip LEDs, need a technically complex "ramp" or fillet to guide the contact paths to the contact pads of the LED.

To counteract such circumstances, efforts have been made to embed the LED in the substrate as shown in FIG. 10B. These include for example adapted spacer foils with defined holes to the LED layout, compensation foils that embed the LEDs and thus level the surface ("perforated mask"), or sprayed materials for the planarization of the surface.

As shown in FIG. 10B, such approaches have led to a gap between the LEDs and the substrate. The gap makes it difficult to electrically interconnect the LEDs on such an LED-substrate, particularly by help of a PlCOS process, as a contact path to the contact pads of the LED needs to bridge the gap.

Therefore it is an object of the present invention to provide an improved optoelectronic device comprising a first layer, particularly a thermoplastic substrate, with at least one electronic or optoelectronic component being partially or completely embedded in the first layer, wherein on the one hand a lowest possible topography of the optoelectronic device is provided and on the other hand the occurrence of a gap between the first layer and the at least one electronic or optoelectronic component is prevented or is at least minimized.

The optoelectronic device 1 of FIGS. 11C and 12C comprises a first layer 3, two electronic or optoelectronic components 9, particularly two μLEDs, which are completely (see FIG. 11C) or at least partially (see FIG. 12C) embedded in the first layer 3, as well as a structured conductor layer 11. A first portion 11.1 of the conductor layer 11 is arranged on an upper surface 3.1 of the first layer 3, and a second portion 11.2 of the conductor layer 11 is arranged on a top surface 9.1 of the electronic or optoelectronic component 9 and is in contact with an electric contact 18 of the electronic or optoelectronic component 9. The electric contact 18, in particular a contact pad, is arranged on the top surface 9.1 of the electronic or optoelectronic component 9. A boundary region 19 is located between the top surface 9.1 of the electronic or optoelectronic component 9 and the adjacent upper surface 3.1 of the first layer 3 and an intermediate portion 11.3 of the conductor layer 11 extends across the boundary region 19 and interconnects the first portion 11.1 of the conductor layer 11 and the second portion 11.2 of the conductor layer 11.

The electronic or optoelectronic component 9 is according to FIG. 11C completely embedded in the first layer 3 such that the top surface 9.1 of the electronic or optoelectronic component 9 is arranged in a plane 20 that extends through the upper surface 3.1 of the first layer 3.

The electronic or optoelectronic component 9 according to FIG. 12C is partially embedded in the first layer 3 such that the top surface 9.1 of the electronic or optoelectronic component 9 protrudes the upper surface 3.1 of the first layer 3 by a height H, wherein, preferably, the height H is equal to or smaller than a third of the thickness t of the electronic or optoelectronic component 9, particularly the height H is smaller than 20 μm.

The first layer 3 each comprises two recesses, wherein a side surface 3.2 of the first layer 3 facing a shell surface 9.2 of the electronic or optoelectronic component 9 is formed by a side surface of the recess in the first layer 3. The electronic or optoelectronic component 9 is arranged in the recess of the first layer 3 and thus, the boundary region 19, respectively a gap 21 as shown in FIG. 12C, is formed by the distance between the electronic or optoelectronic component 9 arranged in the recess of the first layer 3 and the side surfaces 3.2 of the first layer 3.

According to FIG. 12C the gap 21 is filled with a filler material 22, in particular with an adhesive. The filler material 22 forms a fillet weld between the upper surface 3.1 and the shell surface 9.2 of the electronic or optoelectronic component 9. Moreover, the filler material 22 in form of a fillet weld is partially arranged in the gap 21 and partially forms a fillet weld above the gap 21 and between the upper surface 3.1 and the shell surface 9.2 of the electronic or optoelectronic component 9.

Compared to FIGS. 10A and 10B the topography of the optoelectronic device is reduced due to embedding the electronic or optoelectronic component 9 into the first layer 3 and thus a subsequent processing of the optoelectronic device is simplified. In addition, a boundary region, particularly the gap, is preferably small to allow the use of for example a PICOS process to interconnect the electronic or optoelectronic component 9, as the distance/size of the gap to be bridged by the conductor layer may be limited for such process.

According to FIG. 11C, the filler material 22 is arranged between the first layer 3 and a bottom surface 9.3 of the electronic or optoelectronic component 9, wherein the bottom surface 9.3 of the electronic or optoelectronic component 9 is opposite to the top surface 9.1 of the electronic or optoelectronic component 9.

FIGS. 11A and 11B show steps for manufacturing the optoelectronic device 1 according to FIG. 11C as well as FIGS. 12A and 12B show steps for manufacturing the optoelectronic device 1 according to FIG. 12C.

In a first step two electronic or optoelectronic components 9 are arranged and glued on the upper surface 3.1 of the first layer 3 using an adhesive 22. According to FIG. 11A the adhesive 22 is arranged between the electronic or optoelectronic component 9 and the first layer, wherein according to FIG. 12A the adhesive 22 is arranged between the electronic or optoelectronic component 9 and the first layer and forms a fillet weld between the upper surface 3.1 and the shell surface 9.2 of the electronic or optoelectronic component 9.

The two electronic or optoelectronic components 9 are then embedded into the first layer 3, such that according to FIG. 11B the electronic or optoelectronic components 9 are completely embedded into the first layer 3 or according to FIG. 12B are partially embedded into the first layer 3.

The step of embedding can for example be performed by help of locally heating the first layer 3 and pressing the electronic or optoelectronic component 9 into the upper surface 3.1 of the first layer 3, heating the electronic or optoelectronic component 9 and pressing the electronic or optoelectronic component 9 into the upper surface 3.1 of the first layer 3, or deep drawing at least a portion of the first layer 3, thereby generating a recess portion 21, and pressing the electronic or optoelectronic component 9 into the recess portion 21.

The step of embedding the at least one electronic or optoelectronic 9 component at least partially or completely into the first layer 3 can also be performed by heating the first layer 3 to a temperature which is just below a softening temperature of the material of the first layer 3 as well as heating the electronic or optoelectronic component 9 and, particularly simultaneously, pressing the electronic or optoelectronic component 9 into the upper surface 3.1 of the first layer 3.

In a further step, a structured conductor layer 11 is arranged as shown in FIGS. 11C and 12C, wherein a first portion 11.1 of the conductor layer 11 is arranged on the upper surface 3.1 of the first layer 3, a second portion 11.2 of the conductor layer 11 is arranged on a top surface 9.1 of the electronic or optoelectronic component 9, and an intermediate portion 11.3 of the conductor layer 11 extends across the boundary region 19 and interconnects the first portion 11.1 of the conductor layer 11 and the second portion 11.2 of the conductor layer 11.

FIGS. 13A to 13C show steps of another exemplary embodiment of a method for manufacturing an optoelectronic device in accordance with the present invention. In contrast to the FIGS. 11A to 11C, the electronic or optoelectronic components 9 are glued to the first surface 3.1 using a temporary adhesive 22. When performing the step of embedding the electronic or optoelectronic components 9 into the first layer 3 by for example locally heating the first layer 3 and pressing the electronic or optoelectronic component 9 into the upper surface 3.1 of the first layer 3, or heating the electronic or optoelectronic component 9 and pressing the electronic or optoelectronic component 9 into the upper surface 3.1 of the first layer 3, the temporary adhesive 22 evaporates at least partially or completely. Thus, the optoelectronic device 1 of FIG. 13C does not comprise any adhesive arranged between the electronic or optoelectronic component 9 and the first layer 3. However, it can also be that residues of the temporary adhesive stay between the electronic or optoelectronic component 9 and the first layer 3.

According to the FIGS. 14A to 14C, another exemplary embodiment of a method for manufacturing an optoelectronic device in accordance with the present invention uses a heated stamp 30, to pick up an electronic or optoelectronic component 9, heat the component, arrange the component on a respective position on the upper surface 3.1 of the first layer 3 and press the component into the first layer 3 at the respective position. In addition, the first layer 3 can be heated to a temperature which is just below a softening temperature of the material of the first layer 3. Thus, no adhesive is required to fix the electronic or optoelectronic component 9 to the first surface 3.1, as the heated stamp 30 keeps the electronic or optoelectronic component 9 in position while pressing the electronic or optoelectronic component 9 into the first layer 3.

FIGS. 15A and 15B show steps of another exemplary embodiment of a method for manufacturing an optoelectronic device 1 in accordance with the present invention. The optoelectronic device 1 comprises, additionally to the aforementioned embodiments, a second layer 26, in particular a first thermal release film or a lamination layer, which is arranged on a surface of the first layer 3 opposite to the upper surface 3.1. The optoelectronic device 1 further comprises:
a carrier layer 7, in particular a PET carrier layer, which is arranged on the second layer 26 opposite to the first layer 3, a third layer 27, in particular a second thermal release film or a photoresist layer, which is arranged on the carrier layer 7 opposite to the second layer 26, and
a temporary carrier layer 28, which is arranged on the third layer 27 opposite to the carrier layer 7.

The electronic or optoelectronic component 9 can be embedded into the first layer by help of any one of the aforementioned processes and, as shown in FIG. 15B, a multilayer 110 of three structured conductor layers 11a, 11b and 11c, is arranged on the first surface 3.1, the top surface 9.1 and the electric contacts 18. The three structured conductor layers 11a, 11b and 11c are arranged on top of each other, wherein adjacent conductor layers 11a, 11b & 11b, 11c are separated from each other by an isolation layer 24a, 24b. Each conductor layer includes one or more conductive vias, which are filled with a dielectric material 25 and more particularly each conductor layer includes conductor paths, which interconnect different conductor layers, wherein in a contacting portion of the conductor layers comprises sinks, which are filled with a dielectric material 25. The dielectric material can be arranged on the conductor layers in form of a planarization layer and can particularly be photostructurable.

FIG. 15B further shows a gap 21 between the shell surface 9.2 of the electronic or optoelectronic component 9 and the side surface 3.2 of the first layer 3 facing the shell surface 9.2. The gap is filled with a filler material 22, particularly a planarization layer, to provide a planar surface of the filler material 22 in the plane 20 that extends through the upper surface 3.1 of the first layer 3.

On top of the multilayer 110 of the three structured conductor layers 11a, 11b, 11c an electronic chip 29, such as an integrated circuit (IC), is arranged and electrically coupled to at least one of the structured conductor layers 11a, 11b and 11c.

FIGS. 16A to 16D show cross sectional views and top views of an intermediate product, which is generated during the execution of an exemplary embodiment of a method for manufacturing an optoelectronic device in accordance with the present invention. The intermediate product comprises a first layer 3 and at least one of a variety of electronic and optoelectronic components 9, which are embedded into the first layer 3.

According to FIG. 16A, a sapphire flipchip LED 9 is completely embedded into the first layer 3. FIG. 16B shows a thinfilm flipchip LED 9 comprising silicon, which is completely embedded into the first layer 3 with a light emitting surface of the LED facing the first layer 3. The electric contacts 18 of the sapphire flipchip LED 9 and/or the thinfilm flipchip LED 9 can for example be of a metal, such as gold.

FIG. 16C shows an electronic chip 9, such as an integrated circuit (IC), which is embedded into the first layer 3, whereas the electronic chip may comprise one or more sensors, such as optical, thermal, or mechanical sensors. The electric contacts 18 can be of a metal, such as aluminum.

In yet another embodiment, the electronic or optoelectronic component 9 comprises a subassembly of for example at least one of a LED, a µLED, a flipchip LED, a thinfilm flipchip LED, an IC chip, an optical sensor, a thermal sensor and a mechanical sensor, as it is shown in FIG. 16D. The aforementioned components can be arranged on a substrate 31 and they can be covered with an encapsulating material 32. The electric contacts 18 of the subassembly 9 can for example be of a metal, such as gold. FIGS. 17A to 17C show a cross sectional view of exemplary embodiments of an optoelectronic device in accordance with the present invention. The structured conductor layer 11 is as shown in FIG. 17A arranged on the first surface 3.1, the top surface 9.1 and the electric contacts 18 by a so-called PICOS (Planar Interconnect On Substrate) process. Such a PICOS process can comprise the following steps:

In a first step, a seed layer, in particular a titanium-copper alloy is applied to the top surface 9.1 of the at least one electronic or optoelectronic component 9, the electric contacts 18, the upper surface 3.1 of the first layer 3 and the boundary region 19. A photoresist layer is applied to the seed layer and is structured so that regions of the seed layer are exposed. The exposed areas of the seed layer are galvanized and copper-titanium is electrodeposited onto the exposed areas of the seed layer. The areas of the photoresist layer left by the structuring and the underlying seed layer are removed.

The steps of the galvanization of the seed layer and the applying of a photoresist layer, which is then structured, can be switched. Thus, the galvanization can be performed on a larger surface and the structuring is performed afterwards.

Using this procedure, the electronic or optoelectronic component 9 can be "framed" by a structured conductor layer 11. It is therefore possible to use a PICOS process to provide both, mechanical stability and an electrical interconnect of the at least one electronic or optoelectronic component 9.

The structured conductor layer 11 can be arranged on the first surface 3.1, the top surface 9.1 and the electric contacts 18 by a jetting process as shown in FIG. 17A. Therefore a silver- or copper-nanotube ink can be serially or in parallel and locally applied to the top surface 9.1 of the at least one electronic or optoelectronic component 9, the electric contacts 18, the upper surface 3.1 of the first layer 3 and the boundary region 19 to electrically interconnect the at least one electronic or optoelectronic component 9.

According to FIG. 17C, the optoelectronic device 1 comprises, additionally to the aforementioned embodiments, a dielectric layer 25 between the structured conductor layer 11 and the first layer 3 and between the structured conductor layer 11 and the top surface 9.1 of the electronic or optoelectronic component 9. Such dielectric layer 25 can be advantageous, as a short between the structured conductor layer 11 and the first layer 3 and/or between the structured conductor layer 11 and the top surface 9.1 of the electronic or optoelectronic component 9 can be prevented.

FIGS. 18A to 19C show cross sectional views of exemplary embodiments of an intermediate product of an optoelectronic device in accordance with the present invention. As in FIGS. 16A to 16D the intermediate product comprises a first layer 3 and an electronic or optoelectronic component 9, which is embedded into the first layer 3. However, the step of arranging a structured conductor layer 11 on the first surface 3.1, the top surface 9.1 and the electric contacts 18 is still pending. FIGS. 18A to 18C show three cross sectional views, wherein a gap 21 between a shell surface 9.2 of the electronic or optoelectronic component 9 and a side surface 3.2 of the first layer 3 facing the shell surface 9.2 varies in the size, decreasing from FIG. 18A to FIG. 18C. The shell surface 9.2 is preferably formed by the outer surfaces of the electronic or optoelectronic component 9 excluding the top surface 9.1 and a bottom surface 9.3 of the electronic or optoelectronic component 9 opposing the top surface 9.1.

The gap has according to FIGS. 18A and 18B a conical cross section. Particularly the distance between the shell surface 9.2 and the side surface 3.2 is in a plane 20 that extends through the upper surface 3.1 of the first layer 3 greater than in a plane that extends through the bottom surface 3.1 of the electronic or optoelectronic component 9. The gap 21 preferably extends in a circumferential direction around the electronic or optoelectronic component 9 around the shell surface 9.2.

The gap 21 has preferably a width of less than 10-15 μm. In particular, the gap 21 has a width of less than 10-15 μm within the plane 20 that extends through the upper surface 3.1 of the first layer 3.

As shown in FIGS. 19A to 19C, the gap 21 is filled with a filler material 22, in particular with an adhesive, wherein the amount of filler material that is arranged in the gap 21 varies from FIG. 19A to FIG. 19C.

According to FIG. 19A, there is no or no significant amount of the filler material 22 arranged in the gap 21. In FIG. 19B however the filler material is arranged between a bottom surface of the electronic or optoelectronic component 9 and the first layer 3, whereas between the shell surface 9.2 of the electronic or optoelectronic component 9 and the side surface 3.2 of the first layer no or no significant amount of the filler material 22 is arranged in the gap 21.

As shown in FIG. 19C the filler material is arranged between a bottom surface of the electronic or optoelectronic component 9 and the first layer 3 and between the shell surface 9.2 of the electronic or optoelectronic component 9 and the side surface 3.2 of the first layer 3. In addition, an accumulation of the filler material 22 is arranged above the gap 21 and particularly on the plane 20 that extends through the upper surface 3.1 of the first layer 3.

FIGS. 20A to 20D show scanning-electron microscopy (SEM) images of exemplary embodiments of an optoelectronic device in accordance with the present invention. A gap 21 between a shell surface 9.2 of the electronic or optoelectronic component 9 and a side surface 3.2 of the first layer 3 facing the shell surface 9.2 varies in the size, decreasing from FIG. 20A to FIG. 20C. It can be seen from the figures, that the gap 21 has a conical cross section with a distance between the shell surface 9.2 and the side surface 3.2, measured in a plane that extends through the upper surface 3.1 of the first layer 3, being greater than in a plane that extends through a bottom surface of the electronic or optoelectronic component 9.

FIG. 20A shows a gap 21 with a distance between the shell surface 9.2 and the side surface 3.2, measured in a plane that extends through the upper surface 3.1 of the first layer, being too big to arrange a structured conductor layer on an upper surface 3.1 of the first layer 3, a top surface 9.1 of the electronic or optoelectronic component 9 and electric contacts 18 of the electronic or optoelectronic component 9 by help of a PICOS process.

FIG. 20B, and a detailed view of the respective gap 21 shown in FIG. 20E, show a gap 21 with a width of 10-15 μm and in particular a width of 12.77 μm. Hence, a PICOS process to arrange a structured conductor layer on an upper surface 3.1 of the first layer 3, a top surface 9.1 of the electronic or optoelectronic component 9 and electric contacts 18 of the electronic or optoelectronic component 9 is possible.

FIG. 20D shows scanning-electron microscopy (SEM) images of flip chip LEDs 9 being embedded into a first layer 3, wherein a gap 21 between a shell surface of the flip chip LEDs 9 and a side surface of the first layer 3 facing the shell surface varies in size.

Referring now to FIG. 21A, a cross sectional view of an intermediate product of an exemplary embodiment of an optoelectronic device 1 is shown. The optoelectronic device 1 comprises a carrier layer 7 and at least two layer segments 3.1, 3.2, which are arranged adjacent to each other on the carrier layer 7 with a predefined distance d. On each of the layer segments 3.1, 3.2 three optoelectronic components 9, particularly LEDs that can emit light at a selected color, in particular either red, green or blue, are arranged and connected by a conductor layer segment 11. The three LEDs can thus form an RGB pixel. The predefined distance d can be in a range from 0-1500 μm and can be dependent on the flow behavior of the material of the adjacent layer segments 3.1, 3.2.

The layer segments 3.1, 3.2 comprise or consist of a material such as polyvinyl butyral (PVB) or ethylene-vinyl acetate (EVA). Particularly, the layer segments can be a foil of a material such as polyvinyl butyral (PVB) or ethylene-vinyl acetate (EVA). Alternatively, the layer segments 3.1, 3.2 can comprise or consist of any other plastic, particularly any other resin, that has preferably a strong binding, optical clarity, adhesion to many surfaces, toughness and flexibility.

In a next step, as shown in FIG. 21B, the two layer segments 3.1, 3.2 are mechanically connected by at least partially melting opposing edge regions 3.1.1, 3.2.1 (see FIG. 21A) of the adjacent layer segments 3.1, 3.2, in particular with a laser or a heating device such as an autoclav or a hotplate. Alternatively, the adjacent layer segments can be homogeneously melted to mechanically connect them with each other. This is preferably done by use of a heating device, such as an autoclav or a hotplate.

After the step of mechanically connecting the adjacent layer segments 3.1, 3.2, a largely homogeneous and planar layer 3 is formed.

As shown in FIG. 21C, a planarization layer 33 is arranged on the layer segments 3.1, 3.2. The planarization layer 33 can comprise or consist of the same material as the layer segments 3.1, 3.2. Particularly the planarization layer 33 can be a foil of a material such as polyvinyl butyral (PVB) or ethylene-vinyl acetate (EVA). The optoelectronic components 9 can be embedded in the planarization layer 33.

Figure 22:
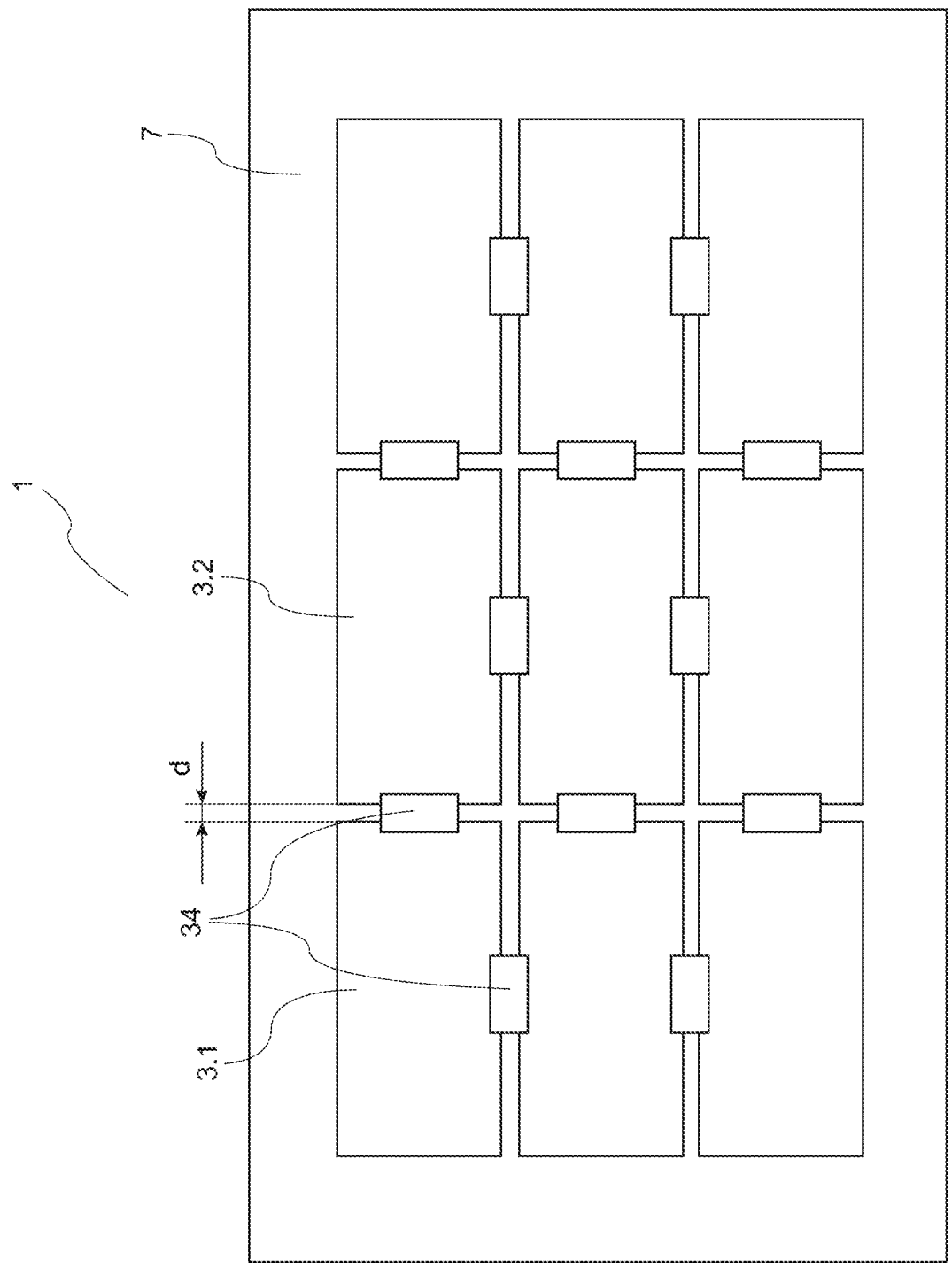
FIG. 22 shows a top vie of an intermediate product of an exemplary embodiment of an optoelectronic device in accordance with the present invention.

Referring now to FIG. 22, the optoelectronic device 1 comprises a carrier layer 7 and a number of layer segments 3.1, 3.2, . . . , which are arranged adjacent to each other on the carrier layer 7 with a predefined distance d. Here the number of layer segments is nine. The layer segments can be arranged in a regular matrix structure on the carrier layer 7, wherein the predefined distance d is the same for all distances between the opposing edges of adjacent layer segments. Thus, the layer segments are spaced apart in each row of the matrix with the predefined distance d and in each column of the matrix with the predefined distance d.

The optoelectronic device 1 further comprises a number of electric bridging elements 34, which extend between any of two adjacent layer segments 3.1, 3.2 and electrically interconnect conductor layer segments 11, which are arranged on the layer segments 3.1, 3.2. Here the number of bridging elements 34 is twelve.

In some embodiments, the electric bridging elements 34 comprise an at least partially transparent and/or flexible tape. The tape can comprise at least one conductor path to interconnect the conductor layer segments 11 of two adjacent layer segments 3.1, 3.2. Such a transparent and/or flexible tape, comprising at least one conductor path, can for example be provided by help of an ink-jetting process.

In some embodiments, the electric bridging elements 34 are provided on a cover layer not shown in the figure). An electric bridging element can have the form of a conductor path. The cover layer is arranged on the layer segments 3.1, 3.2, . . . after they have been placed on the carrier layer 7. The electric bridging elements on the cover layer then interconnect the conductor layer segments 11 of two adjacent layer segments 3.1, 3.2.

The layer segments 3.1, 3.2, . . . have a rectangular form, and preferably have a length of at least approximately 125 mm and a width of at least approximately 70 mm.

Figure 23:
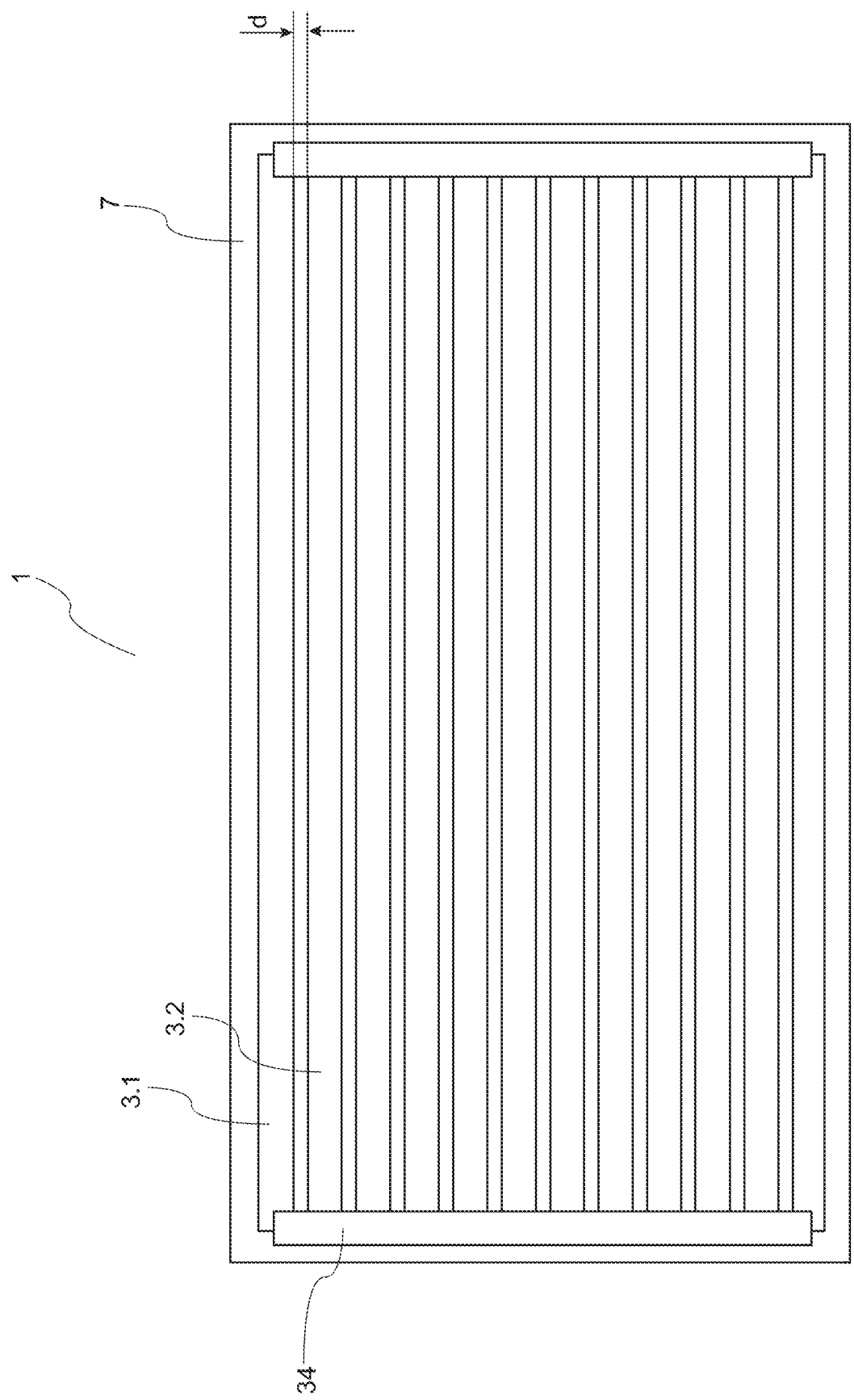
FIG. 23 shows a top vie of an intermediate product of an exemplary embodiment of another optoelectronic device in accordance with the present invention.

The layer segments 3.1, 3.2, . . . shown in FIG. 23 have a rectangular form, with a length compared to the width of each layer segment being greater than a factor of at least approximately 3. In other words, the form of the layer segments is similar to stripes.

The layer segments 3.1, 3.2 are arranged on the carrier layer 7 adjacent to each other in only one column with a predefined distance d. The predefined distance d is in a range from 0-1500 μm and particularly is dependent on the flow behavior of the material of the adjacent layer segments 3.1, 3.2.

The optoelectronic device 1 further comprises two electric bridging elements 34, which extend between any of two adjacent layer segments 3.1, 3.2 and electrically interconnect conductor layer segments 11, which are arranged on the layer segments 3.1, 3.2.

The two electric bridging elements 34 each connect all of the adjacent layer segments 3.1, 3.2, wherein a first electric bridging element 34 connects the adjacent layer segments 3.1, 3.2 in a first edge region and a second electric bridging element 34 connects the adjacent layer segments 3.1, 3.2 in a second edge region. The first and the second edge region are particularly located at the two short edges of the layer segments.

By use of the two electric bridging elements, electric current can be provided to each layer segment. The layer segments can be connected in parallel or in serial with respect to each other.

Referring now to FIGS. 24A to 24E a method of manufacturing an optoelectronic device 1, for example an at least partially transparent pane for example of a vehicle, comprises the steps: arranging at least one optoelectronic component 9 on an upper surface 3.1 of a first layer 3,
providing a conductor layer 11.0 on the upper surface 3.1 and on the at least one optoelectronic component 9,
structuring the conductor layer 11.0 such that a resulting structured conductor layer 11 comprises electrical conductor paths for providing electricity to the at least one optoelectronic component 9 by use of the structured conductor layer 11.

Figure 24A:
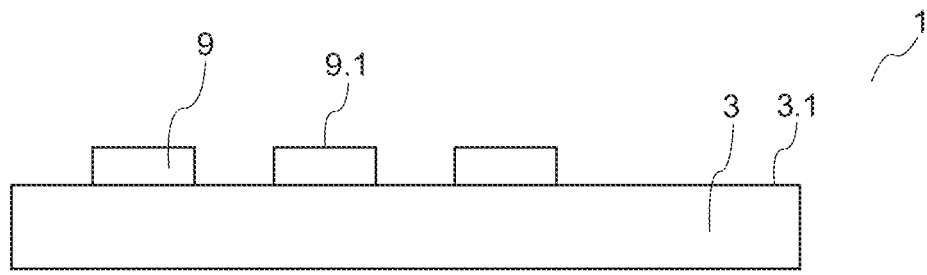
FIGS. 24A to 24E show steps of an exemplary embodiment of a method for manufacturing an optoelectronic device in accordance with the present invention.

As shown in FIG. 24A a number of optoelectronic components 9 is arranged on the upper surface 3.1 of the first layer 3. Here the number of optoelectronic components is three.

The optoelectronic components particularly comprise electric contacts 18, which are arranged on a top surface 9.1 of the optoelectronic components 9. Particularly all of the electric contacts 18 of the optoelectronic components 9, in particular contact pads, are arranged on the top surface 9.1 of the optoelectronic components 9. The optoelectronic components 9 are arranged on the upper surface 3.1 of the first layer 3 such that the electric contacts 18 are facing away from the upper surface 3.1 of the first layer 3. Thus, the optoelectronic components 9 can be formed as a flipchip LED, a thinfilm flipchip LED, or a flipchip μLED.

In some embodiments, the step of arranging at least one optoelectronic component 9 on an upper surface 3.1 of a first layer 3 can be followed by a step of detecting the position of the at least one optoelectronic component 9, in particular using an automated optical inspection (AOI). It can thereby be ensured that the optoelectronic component 9, particularly at least one electric contact 18 arranged on a top surface 3.1 of the optoelectronic component, is aligned with the structured conductor layer 11 In a later step. Alternatively, a placement process can be used which provides a sufficient accuracy such that the optoelectronic component 9, particularly at least one electric contact 18 arranged on a top surface 9.1 of the optoelectronic component 9, is aligned with the structured conductor layer.

Figure 24B:
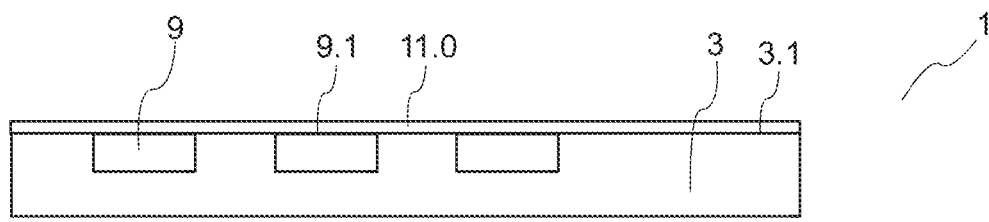

As shown in FIG. 24B a conductor layer 11.0 is provided on the upper surface 3.1 and on the optoelectronic components 9. Particularly, the step of providing the conductor layer 11.0 on the upper surface 3.1 and on the optoelectronic components 9 comprises laminating the conductor layer 11.0 on the upper surface 3.1 and on the optoelectronic components 9 by use of a lamination device. Particularly, a heated roll laminator can be used for laminating the conductor layer 11.0 on the upper surface 3.1 and on the optoelectronic components 9, in particular in a roll-to-roll process.

The step of providing the conductor layer 11.0 on the upper surface 3.1 and on the optoelectronic components 9 further comprises embedding the optoelectronic components 9 at least partially into the first layer 3. The optoelectronic components 9 are pressed into the first layer 3 and the conductor layer 11.0 is simultaneously arranged on the upper surface 3.1 of the first layer 3 and on the optoelectronic components 9. Hence, the steps of embedding the at least one optoelectronic component 9 into the first layer 3 and arranging, particularly laminating, the conductor layer 11.0 on the upper surface 3.1 of the first layer 3 and on the optoelectronic components 9 are preferably performed simultaneously. This can for example be carried out in that the optoelectronic components 9 and/or the first layer 3 are heated to a suitable temperature and the optoelectronic components 9 are pressed into the first layer 3 while the optoelectronic components 9 and/or the first layer 3 are at the suitable temperature.

The optoelectronic components 9 are particularly embedded into the first layer 3 such that a top surface 9.1 of the optoelectronic components 9 is arranged in the plane, which is defined by the upper surface 3.1 of the first layer 3 (see FIG. 24B). Thus, the conductor layer 11.0 is arranged on a largely flat surface, which is formed by the upper surface 3.1 of the first layer 3 and the top surface 9.1 of the optoelectronic components 9.

Figure 24C:
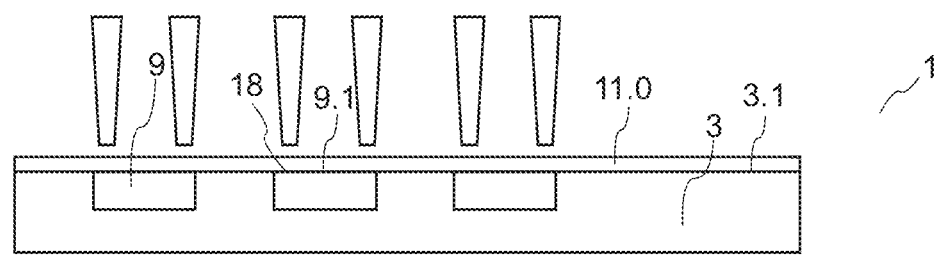

A mechanically and electrically interconnection between the conductor layer 11.0 and an electric contact 18 of the optoelectronic components 9 is then provided as shown in FIG. 24C.

The step of mechanically and electrically interconnecting the conductor layer 11.0 with an electric contact 18 of the optoelectronic components 9 thereby comprises punctual laser welding the conductor layer 11.0 with the electric contact 18 in a region above the electric contact 18. Particularly, the punctual laser welding of the conductor layer 11.0 with the electric contact 18 is only performed in regions above an electric contact 18 such that a mechanically and electrically interconnection of the conductor layer with an electric contact of the optoelectronic component is provided.

Figure 24D:
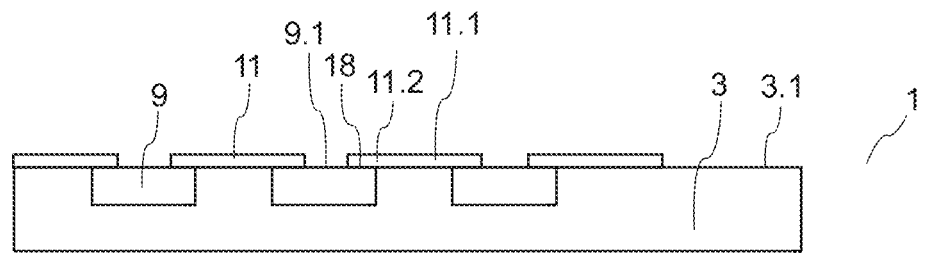

The conductor layer 11.0 can be structured as shown in FIG. 24D such that a resulting structured conductor layer 11 comprises electrical conductor paths for providing electricity to the at least one optoelectronic component 9 by use of the structured conductor layer 11.

Particularly, the step of structuring the conductor layer 11.0 comprises a lithographic structuring of the conductor layer 11.0, particularly a photolithographic structuring of the conductor layer 11.0. By use of a photomask (also called an optical mask), a geometric pattern of light is transferred to a photosensitive, in particular light-sensitive, chemical photoresist on the conductor layer 11.0. The exposure to light causes a chemical change of the photoresist that allows some of the photoresist to be removed by a special solution called developer. Positive photoresist, a common type, becomes soluble in the developer when exposed to light. By use of a negative photoresist, unexposed regions become soluble in the developer. With a series of chemical treatments, the exposure pattern can be etched into the conductor layer 11.0.

Thus, a first portion 11.1 of the conductor layer is arranged on an upper surface 3.1 of the first layer 3, and a second portion 11.2 of the conductor layer is arranged on a top surface 9.1 of the optoelectronic components 9 and is in contact with an electric contact 18 of the optoelectronic components 9. Particularly, the second portion 11.2 of the conductor layer is mechanically and electrically interconnected with an electric contact 18 of the optoelectronic components 9.

Figure 24E:
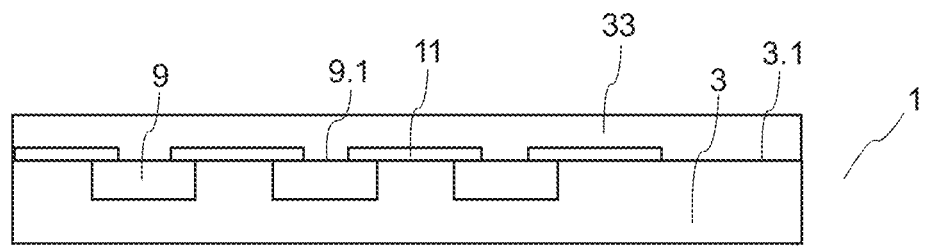

As shown in FIG. 24E the method further comprises a step of arranging a planarization layer 33 on the first layer 3 and the structured conductor layer 11 such that the structured conductor layer 11 is embedded in the planarization layer 33.

FIGS. 25A to 25E show steps of another exemplary embodiment of a method for manufacturing an optoelectronic device 1. In contrast to the embodiment shown in FIGS. 24A to 24E a conductive adhesive or a solder is provided, in form of electrical contact elements 11.5, on at least an electric contact 18 of the optoelectronic components before the conductor layer 11 is provided on the upper surface 3.1 and on the optoelectronic components 9. Particularly the electrical contact elements 11.5 are arranged only on the electric contacts 18 but not on the upper surface 3.1 of the first layer 3 and on an exposed area of the top surface 9.1 of the optoelectronic components 9.

Figure 25A:
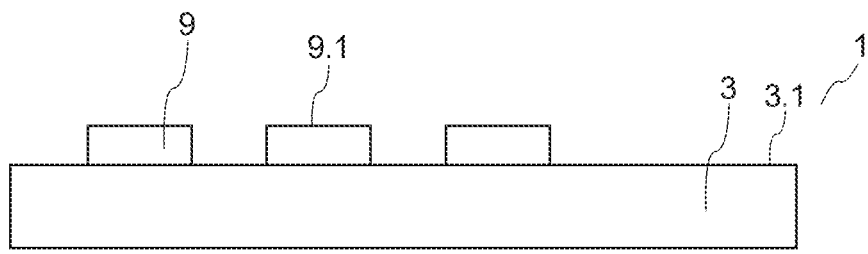
FIGS. 25A to 25E show steps of another exemplary embodiment of a method for manufacturing an optoelectronic device in accordance with the present invention.
Figure 25B:
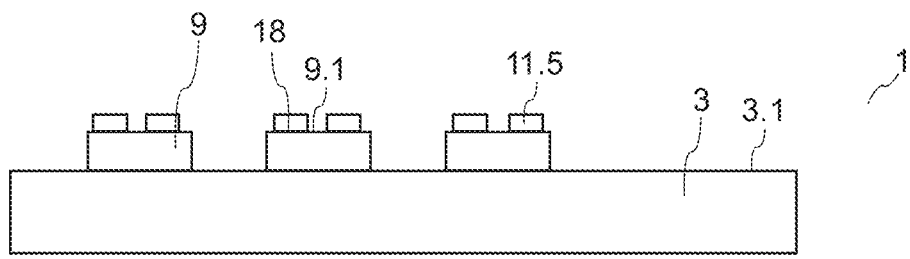
Figure 25C:
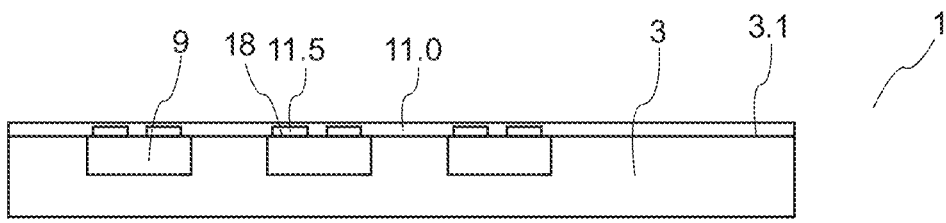

The step of providing, particularly laminating, the conductor layer 11 on the upper surface 3.1 and on the optoelectronic components 9 includes, as shown in FIG. 25C, the step of mechanically and electrically interconnecting the conductor layer 11.0 with an electric contact 18 of the optoelectronic components 9. Therefore, the conductor layer 11.0 is heated above a melting/reaction temperature of the material of the electrical contact elements 11.5. Particularly, after cooling down the electrical contact elements 11.5, a mechanically and electrically interconnection of the conductor layer 11.0 with an electric contact 18 of the optoelectronic components 9 is provided.

Figure 25D:
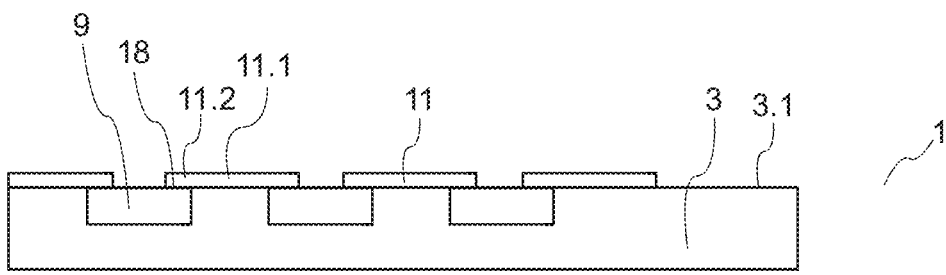
Figure 25E:
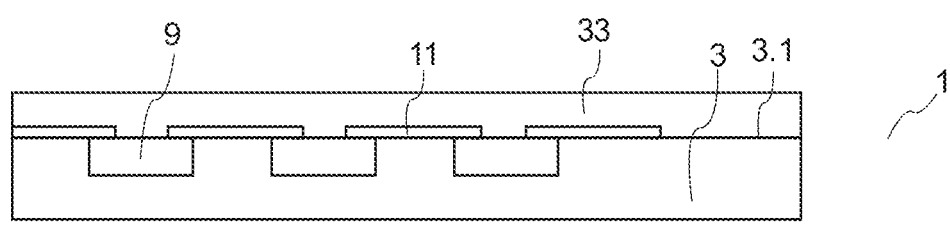

The conductor layer 11.0 is structured as shown in FIG. 25D and a planarization layer is arranged on the first layer 3 and the structured conductor layer 11 such that the structured conductor layer 11 is embedded in the planarization layer 33, as shown in FIG. 25E.

Referring now to FIGS. 26A to 26E the conductor layer 11.0 comprises, compared to the aforementioned embodiments, a first 11.01 and a second 11.02 electrically conductive material layer. The second electrically conductive material layer 11.02 can particularly comprise or consist of an adhesive, a solder or a solder glue that provides an isotropic or anisotropic electrical conductivity. Compared to FIG. 25B, the second electrically conductive material layer 11.02 is arranged on the first electrically conductive material layer 11.01 before providing the conductor layer 11.0 on the upper surface 3.1 and on the optoelectronic components 9. Thus, the second electrically conductive material layer 11.02 is provided on the whole area of the upper surface 3.1 of the first layer 3 and not only between electric contacts 18 of the optoelectronic components 9 and the conductor layer 11.0.

Figure 26A:
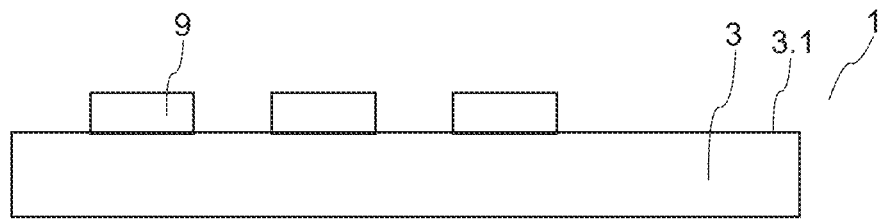
FIGS. 26A to 26E show steps of another exemplary embodiment of a method for manufacturing an optoelectronic device in accordance with the present invention.
Figure 26B:
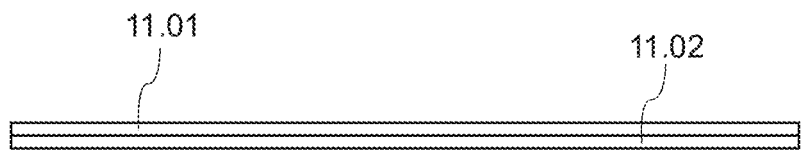
Figure 26C:
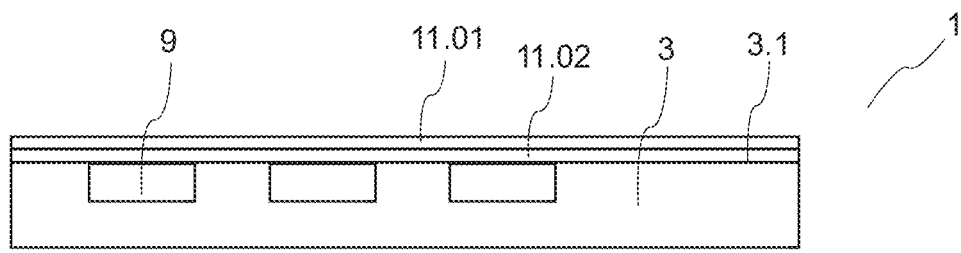
Figure 26D:
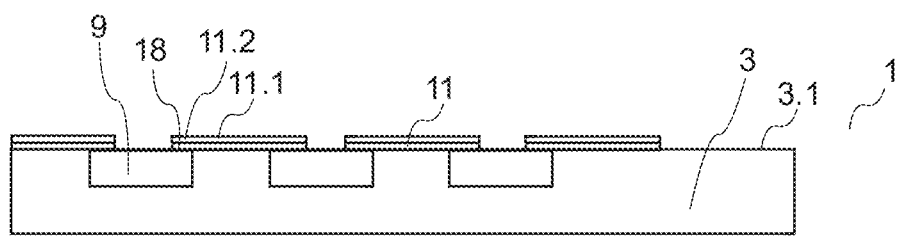
Figure 26E:
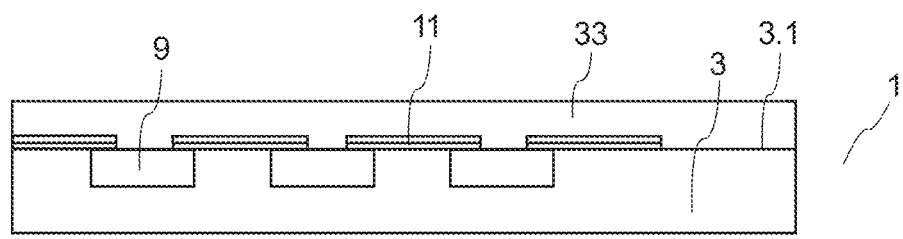

The step of providing, particularly laminating, the conductor layer 11 on the upper surface 3.1 and on the optoelectronic components 9 includes, as shown in FIG. 26C, the step of mechanically and electrically interconnecting the conductor layer 11.0 with an electric contact 18 of the optoelectronic components 9. Therefore, the conductor layer 11.0 is heated above a melting/reaction temperature of the second electrically conductive material layer 11.02. Particularly, after cooling down the second electrically conductive material layer 11.02 a mechanical and electrical interconnection of the conductor layer 11.0 with an electric contact 18 of the optoelectronic components 9 is provided.

Figure 27A:
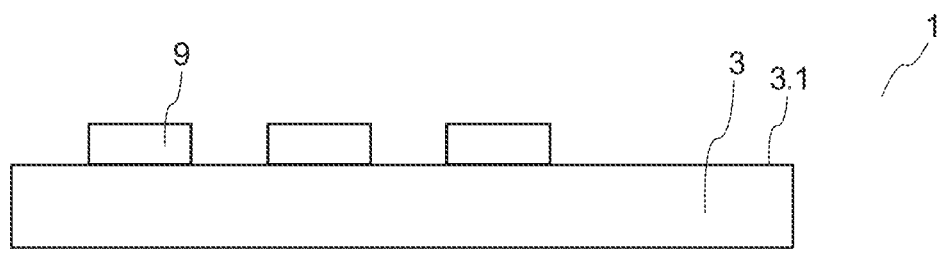
FIGS. 27A to 27E show steps of another exemplary embodiment of a method for manufacturing an optoelectronic device in accordance with the present invention.
Figure 27B:
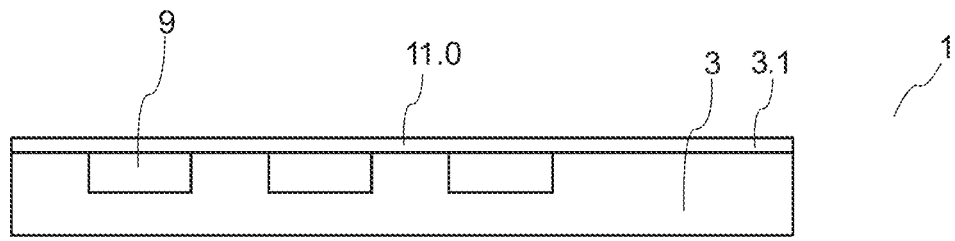

FIGS. 27A to 27B show steps of another exemplary embodiment of a method for manufacturing an optoelectronic device 1. In contrast to the embodiment shown in FIGS. 24A to 24E the conductor layer 11.0 comprises or consists of a photostructurable nanoparticle paste, which includes electrically conductive nanoparticles, such as silver and/or gold and/or copper nanoparticles.

Figure 27C:
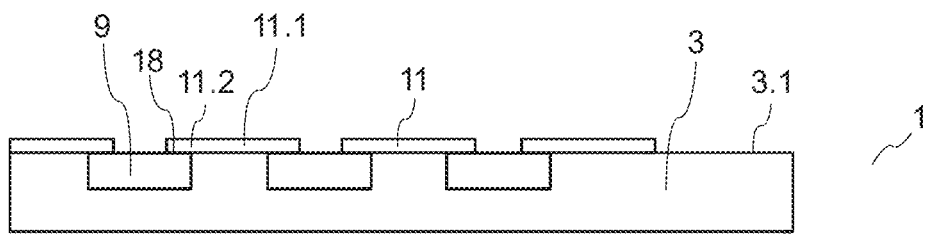
Figure 27D:
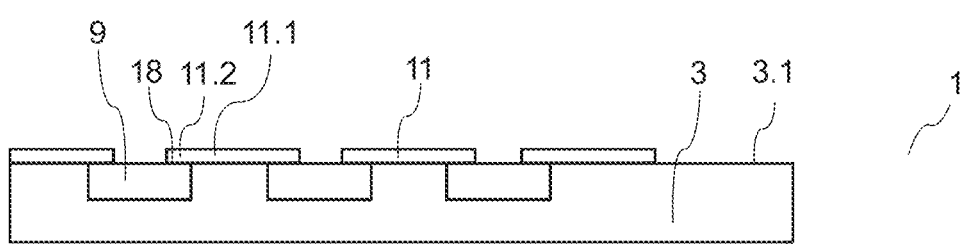

The conductor layer 11.0 is structured as shown in FIG. 27C and a mechanical and electrical interconnection of the conductor layer 11.0 with an electric contact 18 of the optoelectronic components 9 is provided by sintering the conductor layer 11.0, in particular the photostructurable nanoparticle paste, as shown in FIG. 27D. The step of sintering can comprise an oven process if the first layer 3 and the optoelectronic components 9 tolerate temperatures of at least approximately 140° C. Alternatively the step of sintering can comprise a photonic curing process.

Figure 27E:
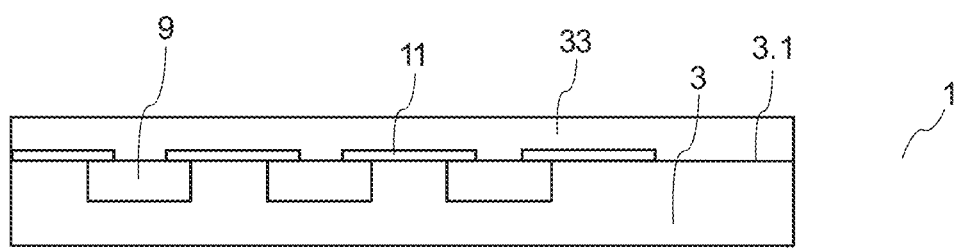

A planarization layer is arranged on the first layer 3 and the structured conductor layer 11 such that the structured conductor layer 11 is embedded in the planarization layer 33, as shown in FIG. 27E.

Figure 28A:
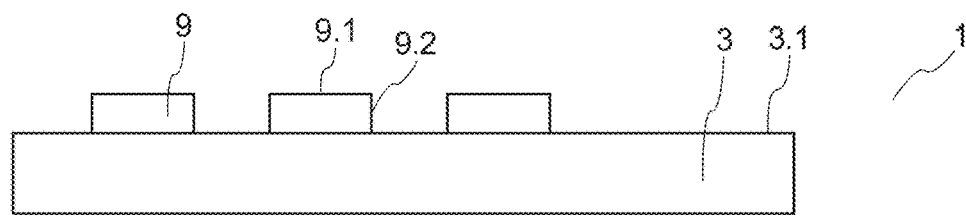
FIGS. 28A to 28E show steps of another exemplary embodiment of a method for manufacturing an optoelectronic device in accordance with the present invention.
Figure 28B:
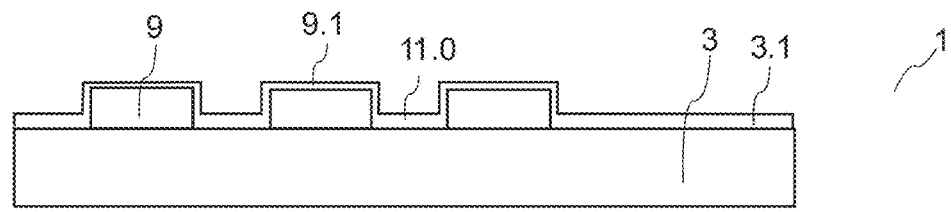

FIGS. 28A to 28B show steps of another exemplary embodiment of a method for manufacturing an optoelectronic device 1. Compared to the aforementioned embodiments, the optoelectronic components 9 are not embedded into the first layer 3, but they are arranged on the upper surface 3.1 of the first layer 3.

In an intermediate step between the FIGS. 28A and 28B, a flat conductor layer 11.0 is provided on a top surface 9.1 of the optoelectronic components. FIG. 28B then shows a step of deep drawing the conductor layer 11.0 such that the optoelectronic components 9 and the upper surface 3.1 of the first layer 3 are covered by the conductor layer 11.0.

Figure 28C:
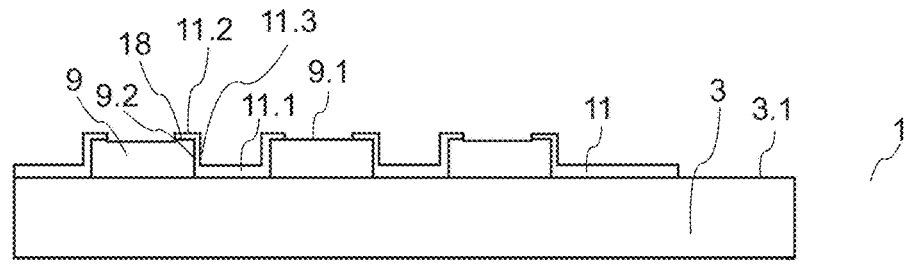

The conductor layer 11.0 is structured, as shown in FIG. 28C, such that a first portion 11.1 of the conductor layer is arranged on an upper surface 3.1 of the first layer 3, a second portion 11.2 of the conductor layer is arranged on a top surface 9.1 of the optoelectronic component 9, and an intermediate portion 11.3 of the conductor layer is arranged on a side surface 9.2 of the optoelectronic component 9. The intermediate portion 11.3 of the conductor layer interconnects the first 11.1 and the second portion 11.2 of the conductor layer.

Figure 28D:
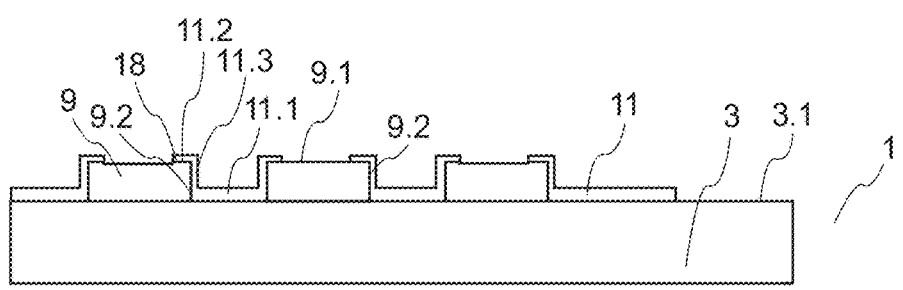
Figure 28E:
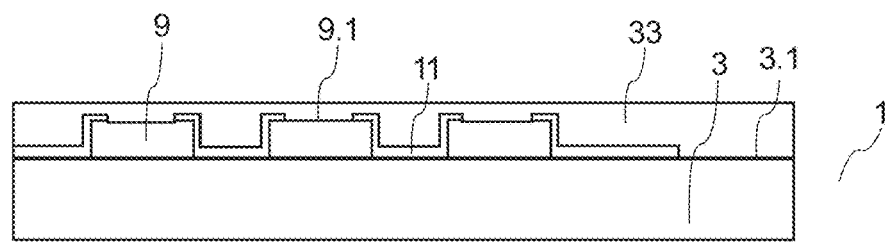

A mechanical and electrical interconnection of the conductor layer 11.0 with an electric contact 18 of the optoelectronic components 9 is provided by sintering the conductor layer 11.0, in particular the photostructurable nanoparticle paste, as shown in FIG. 28D. In addition, a planarization layer is arranged on the first layer 3 and the structured conductor layer 11 such that the structured conductor layer 11 and the optoelectronic components are embedded in the planarization layer 33, as shown in FIG. 28E.

Figure 29A:
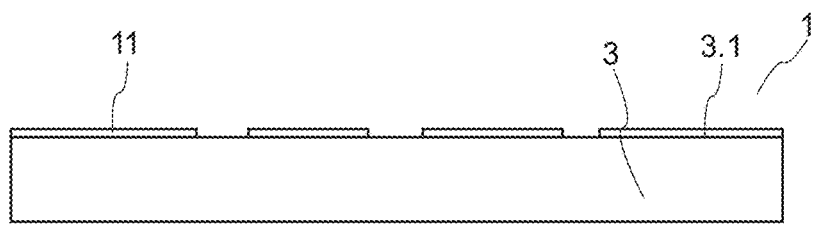
FIGS. 29A to 29E show steps of another exemplary embodiment of a method for manufacturing an optoelectronic device in accordance with the present invention.

As shown in FIG. 29A a conductor layer is provided on an upper surface 3.1 of a first layer 3 being structured such that a resulting structured conductor layer 11 comprises electrical conductor paths suitable for providing electricity to at least one optoelectronic component.

Figure 29B:
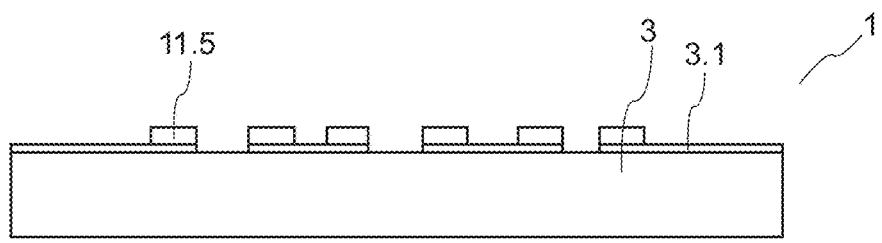
Figure 29C:
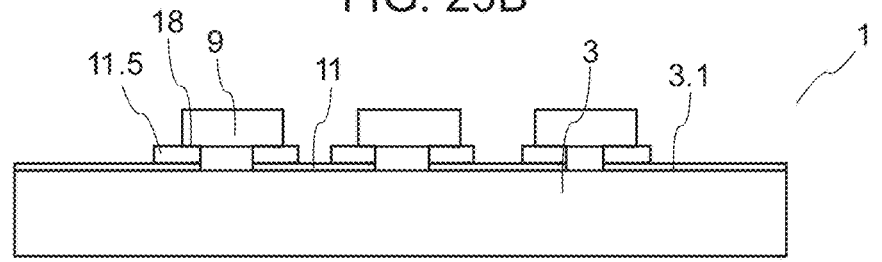

Electrical contact elements 11.5 are provided on the structured conductor layer 11 as shown in FIG. 29B for electrically connecting contacts of at least one optoelectronic component with the structured conductor layer. The electrical contact elements 11.5 are provided on the structured conductor layer 11 such that the contact elements are aligned with contacts of the at least one optoelectronic component, which are arranged on the structured conductor layer, particularly on the electrical contact elements as shown in FIG. 29C. In particular, the contact elements 11.5 are provided on defined positions on the structured conductor layer 11. The positions are defined such that the contact elements 11.5 are aligned with electric contacts 18 of the optoelectronic components 9.

Each optoelectronic component 9 can for example be a flipchip which has two electric contacts 18 at defined locations on its bottom surface. The contact elements 18 for such a flipchip are arranged on the structured conductor layer 11 such that each contact 18 of the flipchip 9 gets into contact with one contact element 11.5.

Figure 29D:
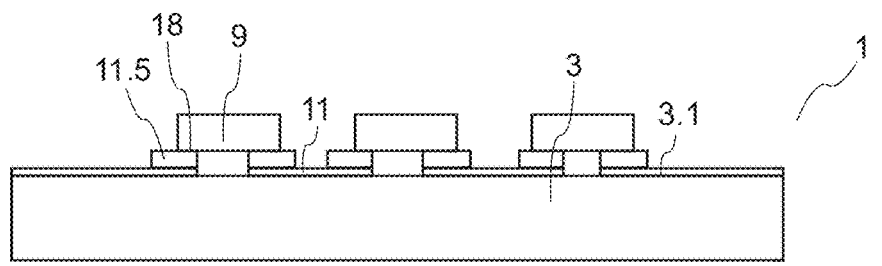

The contact elements 11.5 are provided by an application of solder paste on the structured conductor layer 11 and as shown in FIG. 29D heated by use of photonic soldering to mechanically and electrically interconnect the conductor layer 11 with an electric contact (18) of the optoelectronic component 9.

Figure 29E:
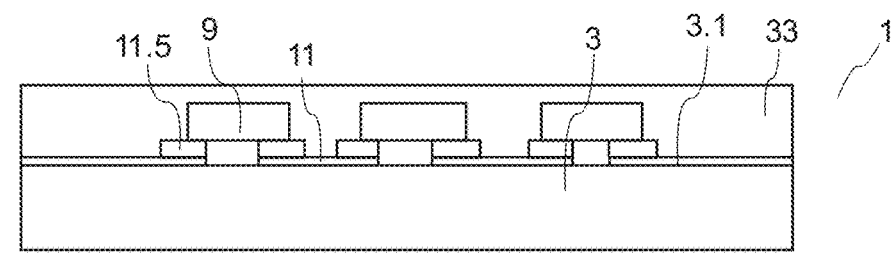

As shown in FIG. 29E a planarization layer is arranged on the first layer 3 and the structured conductor layer 11 such that the structured conductor layer 11, the electrical contact elements 11.5 and the optoelectronic components 9 are embedded in the planarization layer 33.

In some embodiments of the present invention, a at least partially flexible optoelectronic device comprises a stiffener, to stabilize at least a connection area of the optoelectronic device to allow a secured electrical interconnection of the optoelectronic device with the environment.

Figure 30A:
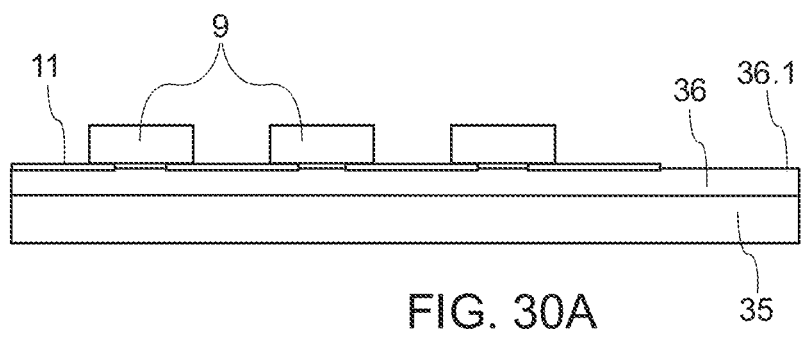
FIGS. 30A to 30D show steps of an exemplary embodiment of a method for manufacturing an optoelectronic device in accordance with the present invention.
Figure 30B:
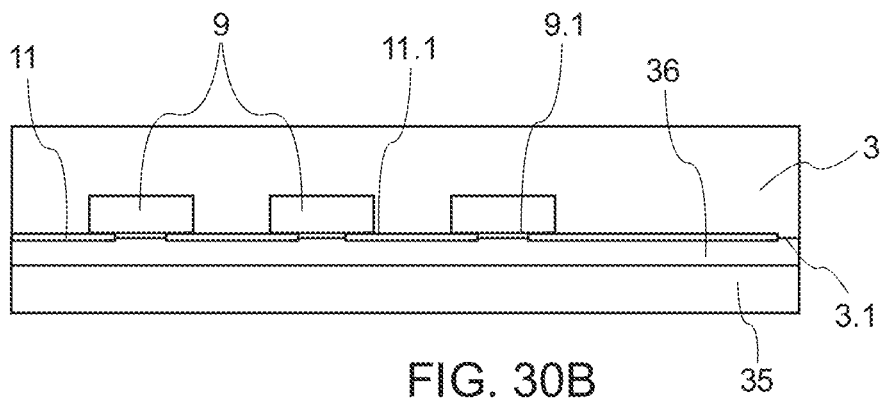
Figure 30C:
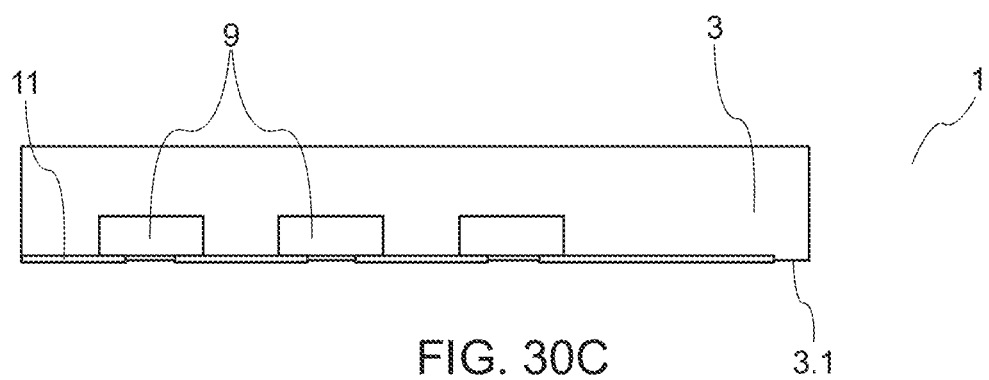

Referring now to FIGS. 30A to 30D a method of manufacturing an optoelectronic device 1, for example an at least partially transparent pane for example of a vehicle, comprises the steps:
- providing a carrier substrate 35 and a release layer 36 arranged on the carrier substrate 35,
- providing a structured conductor layer 11 on the release layer 36 which is opposite to the carrier substrate 35,
- arranging at least one optoelectronic component 9 on the structured conductor layer 11,
- wherein the structured conductor layer 11 comprises electrical conductor paths for providing electricity to the at least one optoelectronic component 9,
- providing a first layer 3 on the release layer 36 (see FIG. 30B),
- wherein the first layer 3 covers the conductor layer 11 and the at least one optoelectronic component 9 such that the at least one optoelectronic component 9 is at least partially embedded in the first layer 3, and
- removing the carrier substrate 35 and the release layer 36 (see FIG. 30C).

As shown in FIG. 30A a structured conductor layer 11 is arranged on a top surface 36.1 of the release layer 36 and a number of optoelectronic components 9 is arranged on the structured conductor layer and/or the top surface 36.1 of the release layer. Here the number of optoelectronic components 9 is three.

In some embodiments the step of providing the structured conductor layer on the release layer can comprises a step of growing an electrically conductive material layer such as for example copper on the release layer.

As shown in FIG. 30B, a first layer 3 is then provided on the release layer 36, such that the first layer 3 covers the conductor layer 11 and the optoelectronic components 9. In particular, the optoelectronic components 9 and the structured conductor layer are embedded in the first layer 3 such that a top surface 11.1 of the structured conductor layer and/or a top surface (9.1) of the optoelectronic components (9) is arranged in the plane, which is defined by an upper surface 3.1 of the first layer 3.

The carrier substrate 35 and the release layer 36 are then removed as shown in FIG. 30C by dissolving the release layer 36 either by temperature, a laser light or a chemical dissolving process. Thus, an easy and non-destructive removal of the optoelectronic device from the carrier substrate can be provided. The release layer 36 can therefore comprise or consist of a dissolvable material such as for example silicon nitride (SiN).

Figure 30D:
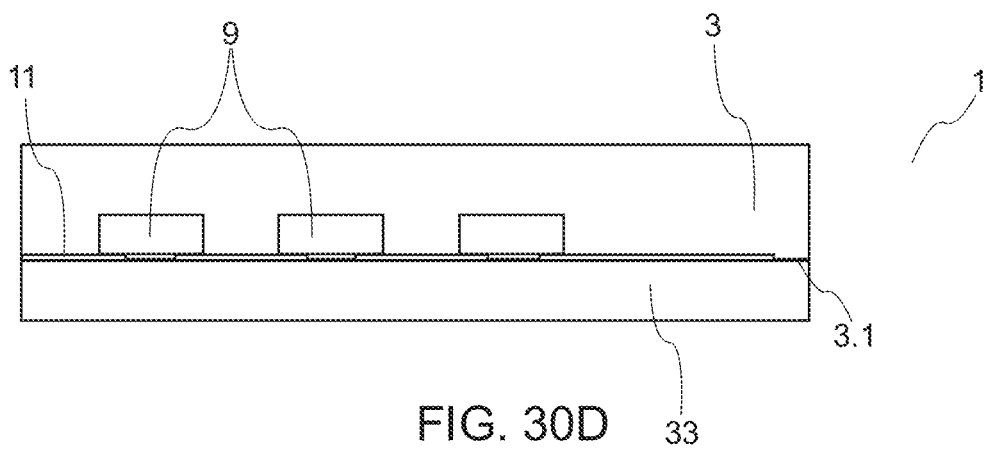

As shown in FIG. 30D, the method can further comprise, after removing the carrier substrate 35 and the release layer 36, a step of providing a planarization layer 33 on the first layer 3 and/or the structured conductor layer 11 and/or the optoelectronic components 9. Accordingly, the structured conductor layer 11 and/or the optoelectronic components 9 can be arranged between the first layer 3 and the planarization layer 33. The structured conductor layer 11 can thus be arranged in the neutral fiber of a laminate of the first layer 3, the structured conductor layer 11 and the planarization layer 33.

Figure 31A:
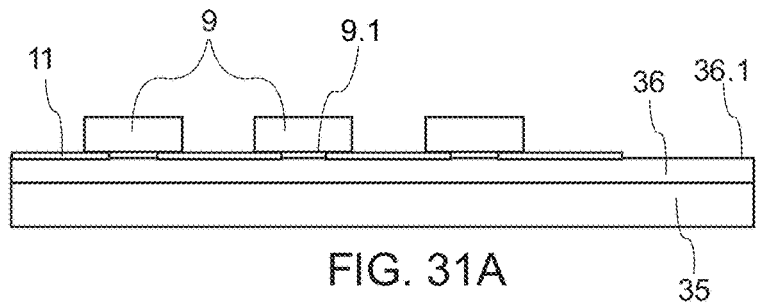
FIGS. 31A to 31E show steps of another exemplary embodiment of a method for manufacturing an optoelectronic device in accordance with the present invention.
Figure 31B:
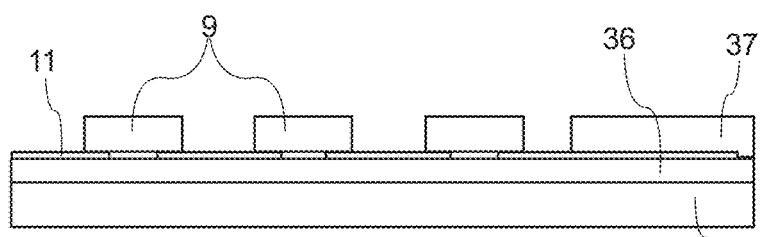

FIGS. 31A to 31E show steps of another exemplary embodiment of a method for manufacturing an optoelectronic device 1. In addition to the embodiment shown in FIGS. 30A to 30D the method further comprises a step of providing at least one stiffener 37 on the release layer 36 and/or the structured conductor layer 11 as shown in FIG. 31B. The step of providing at least one stiffener 37 on the release layer 36 and/or the structured conductor layer 11 is performed prior to the step of providing the first layer 3 (see FIG. 31C), as well as the step of removing the release layer 36 and the temporary carrier substrate 35 (see FIG. 31D). The stiffener can preferably function as a stabilizer of at least a connection area of the optoelectronic device to allow a secured electrical interconnection of the optoelectronic device with the environment.

The optoelectronic device can for example be of a flexible material and a rigid stiffener can be arranged in an edge area of the optoelectronic device to stabilize at least the edge area of the optoelectronic device to make it stiffer. The edge area and particularly the stiffener can for example be used as a connection area of the optoelectronic device to allow a secured electrical interconnection of the optoelectronic device with the environment and/or at least one adjacent second optoelectronic device.

The stiffener is particularly provided on an edge region of the release layer 36, wherein the edge region includes an edge 36.2 of the release layer.

As shown in FIGS. 31B to 31E, the stiffener 37 covers the structured conductor layer 11 at least partly, wherein the stiffener preferably covers the structured conductor layer 11 in an edge region of the structured conductor layer 11 and the edge region of the structured conductor layer 11 includes an edge 11.4 of the structured conductor layer 11. The edge region of the structured conductor layer 11 can at least partly match with the edge region of the release layer 36.

An outer edge 37.1 of the stiffener 37 is according to the figures aligned with the edge 36.2 of the release layer 36. Thus, each a side surface of the at least one stiffener and a side surface of the release layer is arranged within the same plane.

Figure 31C:
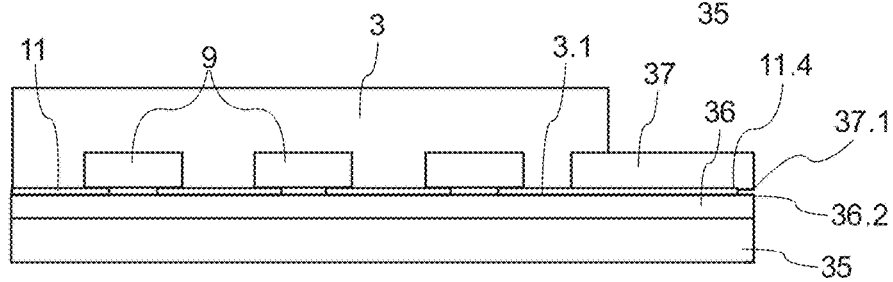
Figure 31D:
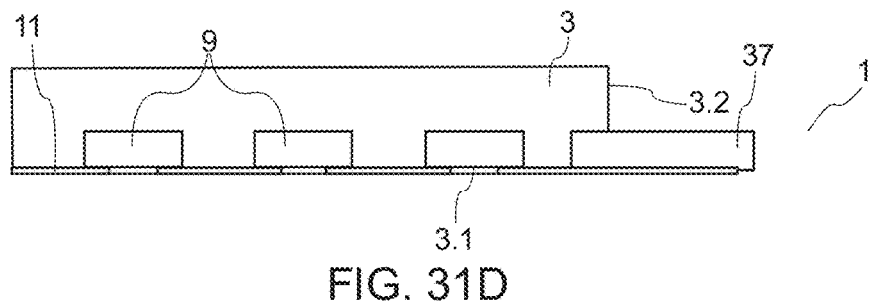

As shown in FIG. 31C, a first layer 3 is then provided on the release layer 36, such that the first layer 3 covers the conductor layer 11, the optoelectronic components 9, and the stiffener 37. In particular, the optoelectronic components 9 and the structured conductor layer are embedded in the first layer 3 such that a top surface 11.1 of the structured conductor layer is arranged in the plane, which is defined by an upper surface 3.1 of the first layer 3. The stiffener 37 however is partially embedded in the first layer 3 such that the stiffener 37 sticks out of the first layer, particularly of a side surface 3.2 of the first layer.

Accordingly, the first layer 3 does not completely cover the edge region of the release layer 36 and thus the first layer 3 is distal from the edge 36.2 of the release layer 36.

Figure 31E:
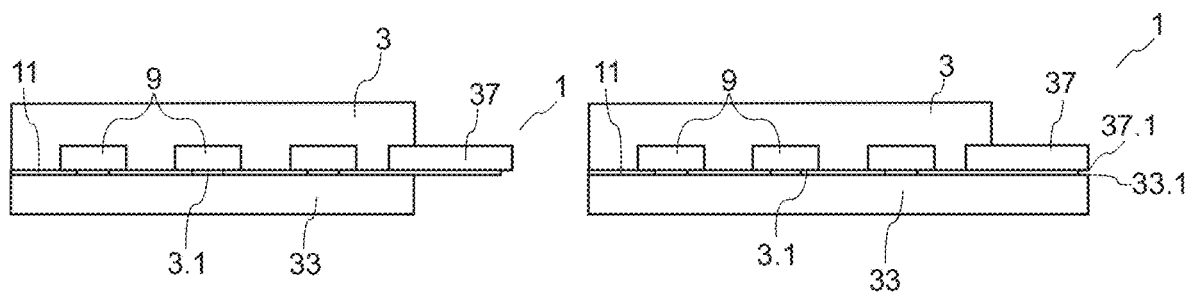

As shown in FIG. 31E, the method can further comprise, after removing the carrier substrate 35 and the release layer 36, a step of providing a planarization layer 33 on the first layer 3 and/or the structured conductor layer 11 and/or the optoelectronic components 9 and/or the stiffener 37. The planarization layer 33 can in some embodiments match with the size of the first layer 3 as shown in the left of FIG. 31E or can in some embodiments be larger as the size of the first layer 3 as shown in the right of FIG. 31E. Particularly, an edge 33.1 of the planarization layer 33 can in some embodiments be aligned with an outer edge 37.1 of the stiffener 37.

Figure 32A:
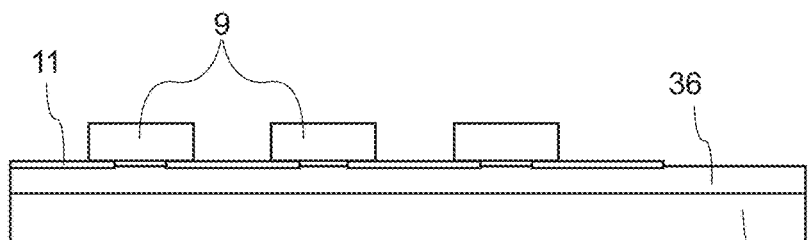
FIGS. 32A to 32D show steps of another exemplary embodiment of a method for manufacturing an optoelectronic device in accordance with the present invention.
Figure 32B:
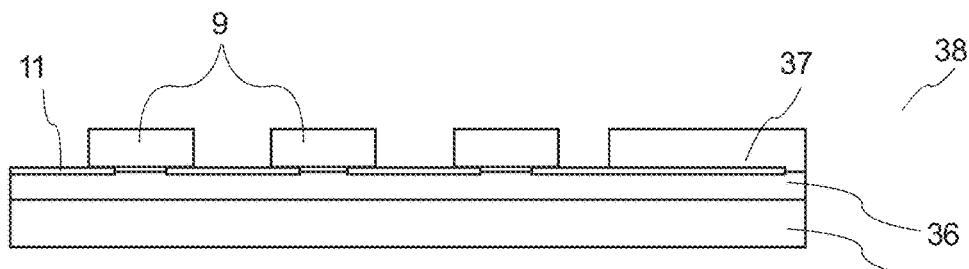
Figure 32C:
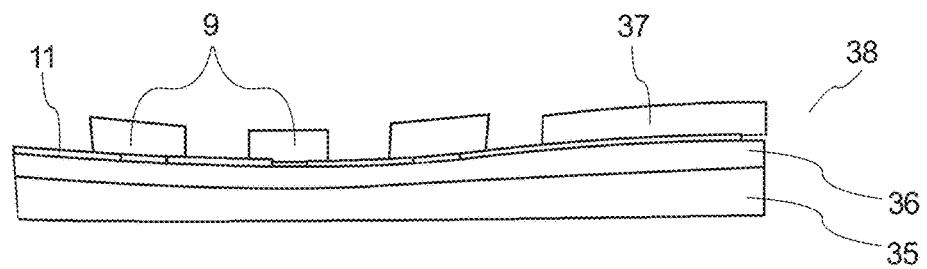
Figure 32D:
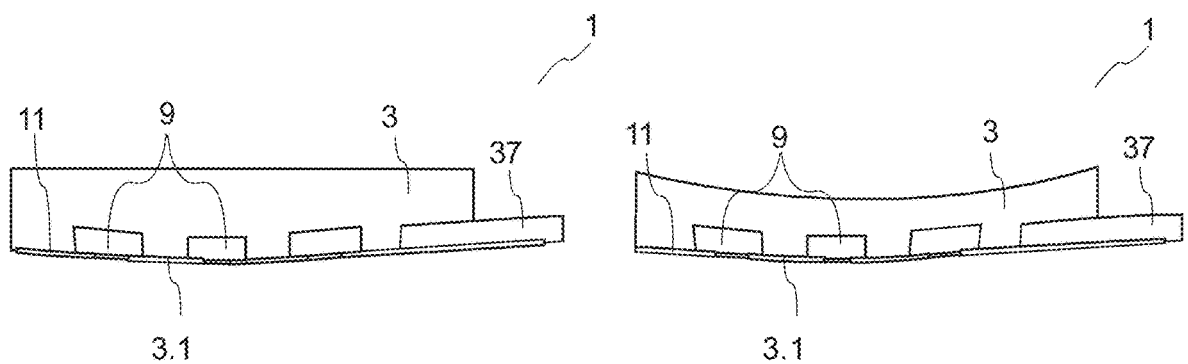

Referring now to FIGS. 32A to 32D, the method can further comprise, prior to providing the first layer 3 on the release layer 36 (see FIG. 32D), a step of modifying a shape of an intermediate product 38 (see FIG. 32C). The intermediate product 38 comprises the carrier substrate 35 and the release layer 36, the structured conductor layer 11 on the release layer 36, the optoelectronic components 9 on the structured conductor layer 11, and optionally at least a stiffener 37 on the release layer 36. The intermediate product 38 can preferably be obtained by the steps of providing a carrier substrate 35 and a release layer 36 arranged on the carrier substrate 35, providing a structured conductor layer 11 on the release layer 36, arranging optoelectronic components 9 on the structured conductor layer 11, and providing at least one stiffener 37 on the release layer 36 and/or the structured conductor layer 11. The modified shape of the intermediate product 38 can, as shown in FIGS. 32C and 32D, comprise at least one curved surface, in particular a curved upper surface 3.1 of the first layer 3.

After the step of modifying the shape of the intermediate product 38, the first layer 3 is provided on the conductor layer 11 and the optoelectronic components 9 as shown in FIG. 32D. The step of modifying the shape of the intermediate product 38 can be performed by use of for example a mold tool by pressing the intermediate product 38 into the mold tool. The first layer 3 can then be provided on the conductor layer 11 and the optoelectronic components 9 by for example molding the first layer 3 onto the conductor layer 11 and the optoelectronic components 9. The first layer 3 can therefore comprise or consists of a mechanically robust material such as for example a mold compound, a silicone, or a transparent or diffuse filled resin.

As shown in FIG. 32D, the first layer can comprise a curved upper surface 3.1 (see FIG. 32D on the left) as well as a curved surface opposite to the upper surface 3.1 (see FIG. 32D on the right).

Figure 33A:
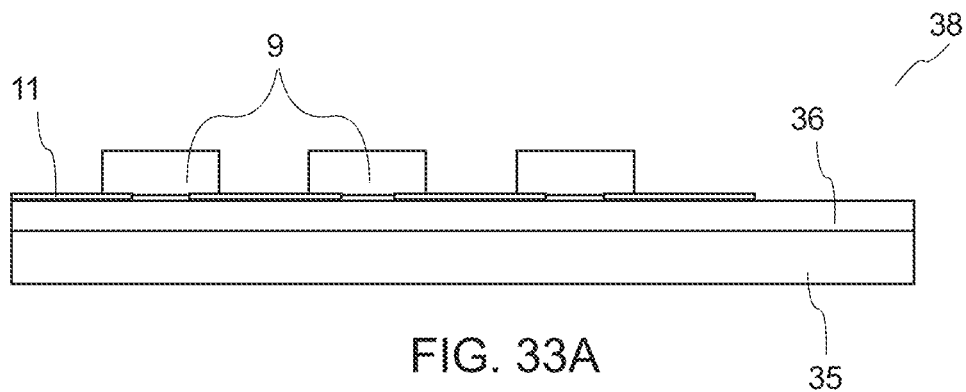
FIGS. 33A to 33C show steps of another exemplary embodiment of a method for manufacturing an optoelectronic device in accordance with the present invention.
Figure 33B:
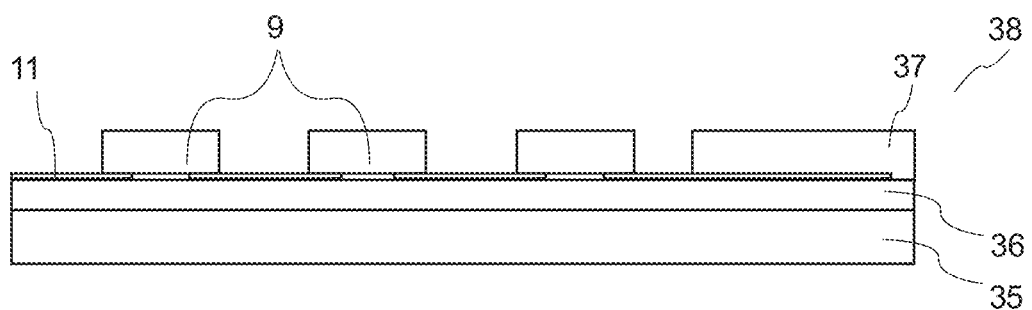
Figure 33C:
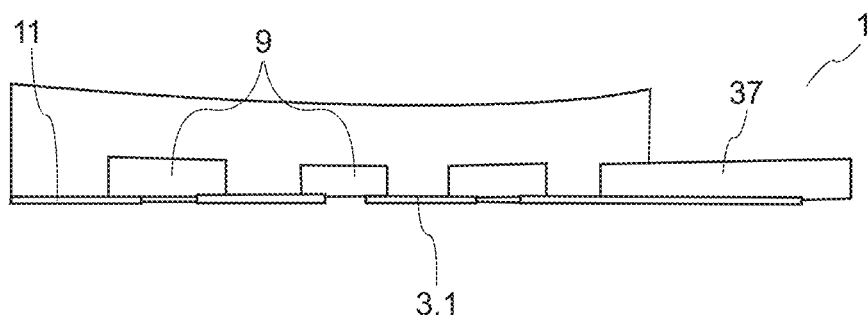

Referring now to FIGS. 33A to 33C the first layer 3 can be provided on the conductor layer 11 and the optoelectronic components 9 by for example molding the first layer 3 onto the conductor layer 11 and the optoelectronic components 9 without modifying the shape of the intermediate product 38 (see FIG. 33C). Thus, the upper surface 3.1 and the structured conductor layer 11 can form a largely flat surface.

In a further step, the optoelectronic device 1 can be arranged on a curved surface and can be fixed, particularly glued, to the curved surface. In a preferred embodiment, a curved surface of the intermediate product 38 and/or a curved surface of the optoelectronic device 1 can match with a curved surface on which the optoelectronic device 1 is supposed to be arranged on.

Figures 34, 35:
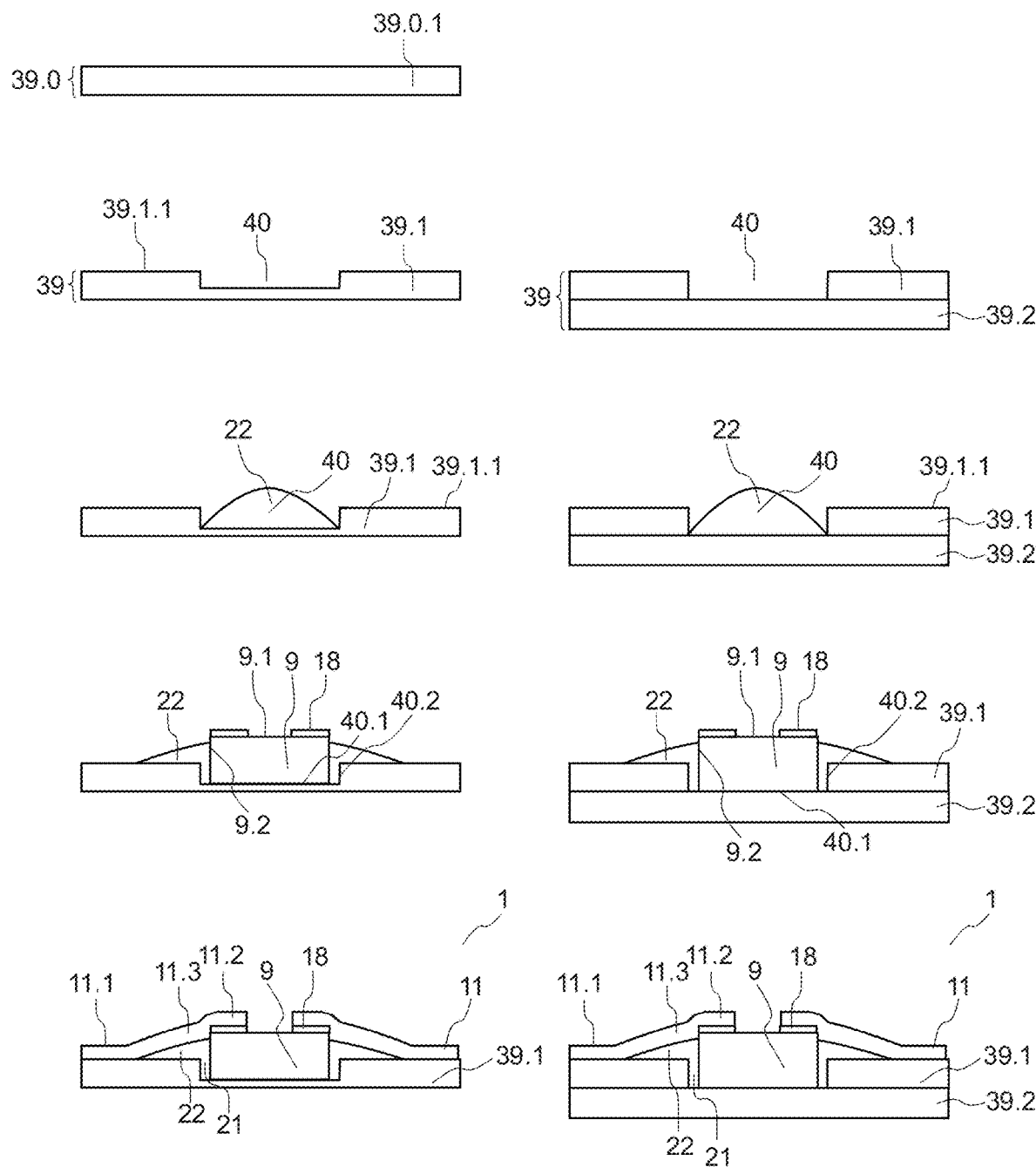
FIG. 34 shows steps of an exemplary embodiment of a method for manufacturing an optoelectronic device in accordance with the present invention.
FIG. 35 show steps of another exemplary embodiment of a method for manufacturing an optoelectronic device in accordance with the present invention.

Referring now to FIG. 34 a method for manufacturing an optoelectronic device is shown. A layer stack, in particular an initial layer stack 39.0 with an unstructured top layer 39.0.1 is provided in a first step. The unstructured top layer 39.0.1 is then structured by for example use of laser light. By for example partly ablation of the top layer 39.1 an opening 40 is obtained on an upper surface 39.1.1 of the top layer. The opening has the form of a cavity with a bottom portion 40.1 and side surfaces 40.2 formed by the top layer 39.1.

The opening 40 is filled with a filler material 22, particularly an adhesive, and an electronic or optoelectronic component 9 is arranged in the opening 40 on the bottom portion 40.1 of the opening 40. The electric contacts 18 of the electronic or optoelectronic component 9 are arranged on a top surface 9.1 of the component 9 and are thus facing away from the layer stack 39. By arranging the electronic or optoelectronic component 9 into the opening 40, a boundary region, particularly a gap 21, is formed between a shell surface 9.2 of the electronic or optoelectronic component 9 and the side surfaces 40.2 of the opening. By pressing the electronic or optoelectronic component 9 into the opening 40 and thus into the filler material 22, the gap 21 is filled with the filler material 22 and an accumulation of the filler material 22 is generated on the filled gap 21 and particularly on a plane that extends through the upper surface 39.1.1 of the top layer 39.1.

The filler material can be arranged between the top layer 39.1 and a bottom surface of the electronic or optoelectronic component 9. The bottom surface of the electronic or optoelectronic component 9 is opposite to a top surface 9.1 of the electronic or optoelectronic component 9.

The filler material 22 can particularly comprise or consist of an adhesive, which fixes the electronic or optoelectronic component 9 in the opening 40 after being hardened.

In some embodiments, the filler material 22 can form a fillet weld between the upper surface 39.1.1 of the top layer 39.1 and a shell surface 9.2 of the electronic or optoelectronic component 9. Particularly, the filler material 22 can partially be arranged in the gap 21 and partially form a fillet weld between the upper surface 39.1.1 of the top layer 39.1 and the shell surface 9.2 of the electronic or optoelectronic component 9.

An electrical conductor arrangement, in particular a structured conductor layer 11, is arranged on the upper surface 39.1.1 of the top layer 39.1 and on the top surface 9.1 of the electronic or optoelectronic component 9 and is in contact with an electric contact 18 of the electronic or optoelectronic component 9. The electrical conductor arrangement extends across the boundary region, particularly the gap 21 between the shell surface 9.2 of the electronic or optoelectronic component 9 and the side surfaces 40.2 of the opening 40, and thus bridges the gap 21.

Therefore, a first portion 11.1 of the electrical conductor arrangement 11 is arranged on the upper surface 39.1.1 of the top layer 39.1, and a second portion 11.2 of the electrical conductor arrangement 11 is arranged on a top surface 9.1 of the electronic or optoelectronic component 9 and is in contact with an electric contact 18 of the electronic or optoelectronic component 9. The electric contact 18 can particularly be formed by a contact pad and be arranged on the top surface 9.1 of the electronic or optoelectronic component 9.

An intermediate portion 11.3 of the electrical conductor arrangement 11 extends across the boundary region and interconnect the first portion 11.1 of the electrical conductor arrangement 11 and the second portion 11.2 of the electrical conductor arrangement 11. The intermediate portion 11.3, extending across the boundary region, is arranged on the filler material 22.

The electronic or optoelectronic component 9 can comprise or consist of at least one of the following: a light emitting diode (LED), particularly a flip chip LED, an integrated circuit (IC), a photodiode, a sensor, in particular an infrared sensor. In the depicted example the component 9 is a flip chip LED. All electric contacts 18 of the flip chip LED 9 are arranged on the top surface 9.1 of the chip 9. By arranging the electrical conductor arrangement 11 on the upper surface 39.1.1 of the top layer 39.1 and on the electric contacts 18 of the electronic or optoelectronic component 9 the electronic or optoelectronic component 9 can be provided with electricity.

In some embodiments, the step of arranging the first, second and intermediate portion of the electrical conductor arrangement comprises a so-called PICOS (Planar Interconnect On Substrate) process. Such a PICOS process can comprise for example the following steps: A seed layer, in particular a titanium-copper alloy is applied to the top surface 9.1 of the at least one electronic or optoelectronic component 9 and/or the upper surface 39.1.1 of the top layer 39.1 and/or the boundary region, particularly the gap 21, and thus on the filler material 22. A photoresist layer is then applied to the seed layer and is structured so that regions of the seed layer are exposed. The exposed areas of the seed layer are galvanized and copper-titanium is electrodeposited onto the exposed areas of the seed layer. The areas of the photoresist layer left by the structuring and the underlying seed layer are removed. The steps of the galvanization of the seed layer and the applying of a photoresist layer, which is then structured, can also be switched. Thus, the galvanization can be performed on a bigger surface and the structuring can be performed afterwards. The step of galvanization can also comprise an electro plating process. Instead of a galvanization step, a jetting or printing process can be employed at least in some embodiments.

Through this procedure, the electronic or optoelectronic component 9 can be "framed" by the electrical conductor arrangement 11, so that it can be possible to use the PICOS process to ensure both a mechanical stability and an electrical interconnection of the at least one electronic or optoelectronic component 9.

As shown in FIG. 35, the layer stack 39 comprises a top layer 39.1 and a bottom layer 39.2. The bottom layer 39.2 is arranged below the top layer 39.1. As explained in FIG. 34, an initial layer stack 39.0 with an unstructured top layer 39.0.1 can be provided and the top layer 39.0.1 can be structured to obtain at least one opening 40 on the upper surface 39.1.1 of the top layer 39.1.

In some embodiments, a layer stack 39 with an already existing at least one opening 40 can be provided. The at least one opening can therefore for example be generated by punching or mechanically cutting through holes into the top layer 39.1 before the layer stack 39 is provided.

A filler material 22 is then filled into the opening 40 by a step of for example dispensing, jetting, printing, spraying and/or stamping the filler material 22.

An electronic or optoelectronic component 9 is arranged in the opening and pressed into the filler material 22, such that the bottom layer 39.2 carries the electronic or optoelectronic component 9. By arranging the electronic or optoelectronic component 9 into the opening 40, a boundary region, particularly a gap 21, is formed between a shell surface 9.2 of the electronic or optoelectronic component 9 and the side surfaces 40.2 of the opening 40 and the gap 21 is filled by the filler material 22.

As shown in both FIGS. 34 and 35, the electric or optoelectronic component 9 is partially arranged in the opening 40 such that a top surface 9.1 of the electronic or optoelectronic component 9 protrudes an upper surface 39.1.1 of the top layer 39.1. In particular, by a height H. The height H is preferably equal to or smaller than half of the thickness t of the electronic or optoelectronic component 9. Thus, the electric or optoelectronic component 9 can be partially arranged in the opening 40 such that a half or less of the thickness t of the electronic or optoelectronic component 9 protrudes an upper surface 39.1.1 of the top layer 39.1.

In some embodiments, the at least one electronic or optoelectronic component 9 can be completely arranged in the opening 40. A top surface 9.1 of the electronic or optoelectronic component 9 can be arranged in a reference plane that extends through an upper surface 39.1.1 of the top layer 39.1. In other words, the top surface 9.1 of the electronic or optoelectronic component 9 and the upper surface 39.1.1 of the top layer 39.1 are arranged within the same plane and form a flat surface.

As explained for the embodiment of FIG. 34, an electrical conductor arrangement, in particular a structured conductor layer 11, is arranged on the upper surface 39.1.1 of the top layer 39.1, and on the top surface 9.1 of the electronic or optoelectronic component 9. It is in contact with an electric contact 18 of the electronic or optoelectronic component 9. The electrical conductor arrangement extends across the boundary region. Thus, it bridges the gap 21 between the shell surface 9.2 of the electronic or optoelectronic component 9 and the side surfaces 40.2 of the opening 40.

Figures 36, 37:
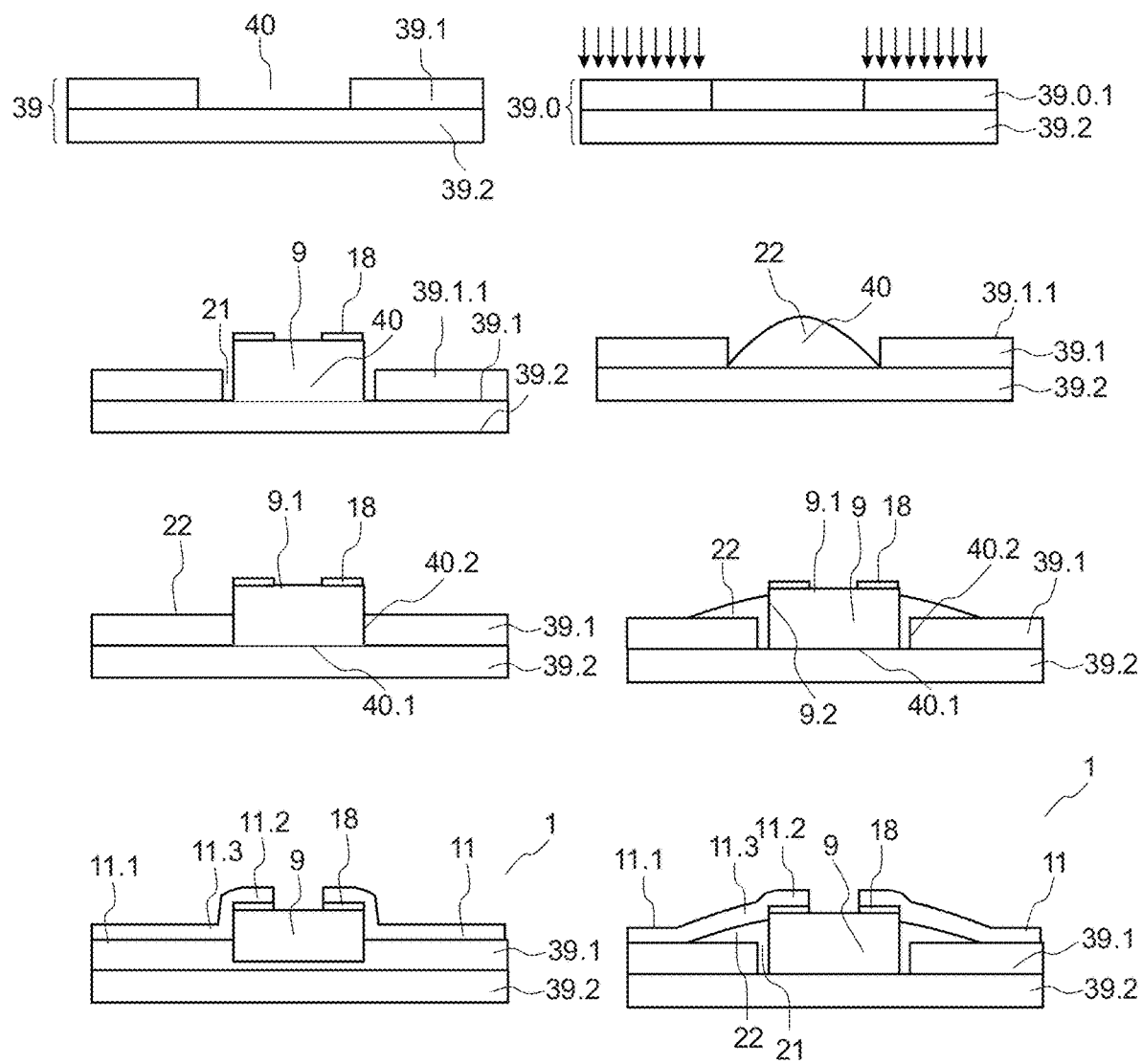
FIG. 36 show steps of another exemplary embodiment of a method for manufacturing an optoelectronic device in accordance with the present invention.
FIG. 37 show steps of another exemplary embodiment of a method for manufacturing an optoelectronic device in accordance with the present invention.

Referring now to FIG. 36 the layer stack 39 comprises a top layer 39.1 and a bottom layer 39.2. The bottom layer 39.2 preferably comprises or consists of a material such as PVB or EVA.

Compared to the aforementioned FIG. 35, no filler material is used to fix the electric or optoelectronic component 9 in the opening 40. Instead, at least the bottom layer 39.2 is temporarily heated and the electronic or optoelectronic component 9 is, particularly simultaneously, arranged in the opening and pressed on the bottom layer 39.2. A boundary region, particularly a gap 21, located between the top surface 9.1 of the electronic or optoelectronic component 9 and the adjacent upper surface 39.1.1 of the top layer 39.1 is filled by pressing the electronic or optoelectronic component 9 onto the temporarily heated bottom layer 39.2 as material of the bottom layer 39.2 flows into the boundary region.

An electrical conductor arrangement, in particular a structured conductor layer 11, is arranged on the upper surface 39.1.1 of the top layer 39.1 and on the top surface 9.1 of the electronic or optoelectronic component 9 and is in contact with an electric contact 18 of the electronic or optoelectronic component 9. The electrical conductor arrangement extends across the hardened boundary region.

As shown in FIG. 37, an initial layer stack 39.0 with an unstructured top layer 39.0.1 and a bottom layer 39.2, wherein the unstructured top layer 39.0.1 comprises or consists of a photoresist, in particular a photostructurable resist. The unstructured top layer 39.0.1 is structured by use of for example lithographic structuring (see arrows in FIG. 37), to obtain at least one opening 40 on the upper surface 39.1.1 of the top layer 39.1.

After the at least one opening 40 on the upper surface 39.1.1 of the top layer 39.1 is obtained, the process steps as shown in FIG. 35 are carried out according to the associated description.

Referring now to FIG. 38A a top view and a cross sectional view of an optoelectronic device according to the state of the art is shown. The optoelectronic device comprises a transparent substrate with four pixels, each pixel comprising a light emitter being arranged in the transparent substrate. The light being emitted from the optoelectronic light sources illuminates each pixel such that, when seen in a top view, a brighter point of light is located in the middle of the pixel and less bright light fills the remaining area of the pixel.

FIG. 38B shows a top view and a cross sectional view of an optoelectronic device 1 in accordance with the present invention. The optoelectronic device comprises a layer stack 39 with a plurality of pixels 90. The plurality of pixels 90 is in FIG. 38B exemplarily shown with four pixels. Each pixel of the plurality of pixels comprises at least one optoelectronic light source 9 and a first pixel area 90.1 on a top surface 39.3 of the layer stack 39. Light from the optoelectronic light sources 9 illuminates each pixel area such that, when seen in a top view, the whole pixel area is homogeneously illuminated by the scattered light and a defined and/or sharp edge of the first pixel area is created. In some embodiments, the optoelectronic device 1 can therefore for example comprise a light scattering arrangement or a structured light scattering arrangement for scattering light from the optoelectronic light source 9 to homogeneously illuminate the whole pixel area 90.1. In some embodiments, the optoelectronic device 1 can comprise a light guiding layer and/or reflective layer to guide or reflect light from the optoelectronic light source 9 to homogeneously illuminate the pixel area 90.1.

The pixel area 90.1 is defined by the luminous area of each pixel and it can have a rectangular, square, round, oval or any other free outer contour. The shape and size of each pixel area can vary from pixel to pixel. In FIG. 38B, a pixel area 90.1 with a square form is exemplarily shown.

Figure 39:
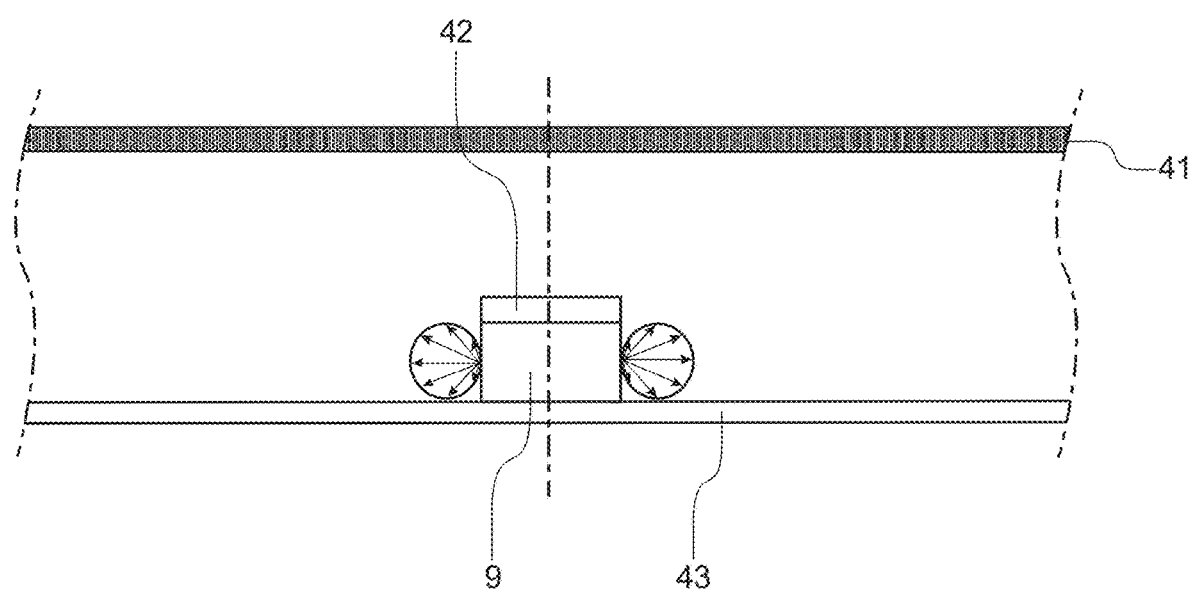
FIG. 39 shows a cross sectional view of an optoelectronic device.

FIG. 39 shows a cross sectional view of an optoelectronic device according to the state of the art. The optoelectronic device comprises an optoelectronic light source 9 being embedded in a transparent substrate, a first reflective layer 42 being arranged on the upper surface of the optoelectronic light source 9, a second reflective layer 43 being arranged below the optoelectronic light source 9 and a light scattering layer 41 being arranged on a top surface of the transparent substrate. The scattering layer 41 can be configured to scatter light from the optoelectronic light source 9, which leads to an illumination of the optoelectronic device as shown in FIG. 38A. Thus, when seen in a top view, a brighter point of light is located in the middle of the optoelectronic device and less bright light fills the remaining area of the optoelectronic device.

In some embodiments, by modifying the scattering layer, a homogeneous illumination of the pixels of an optoelectronic device can be achieved.

Figure 40:
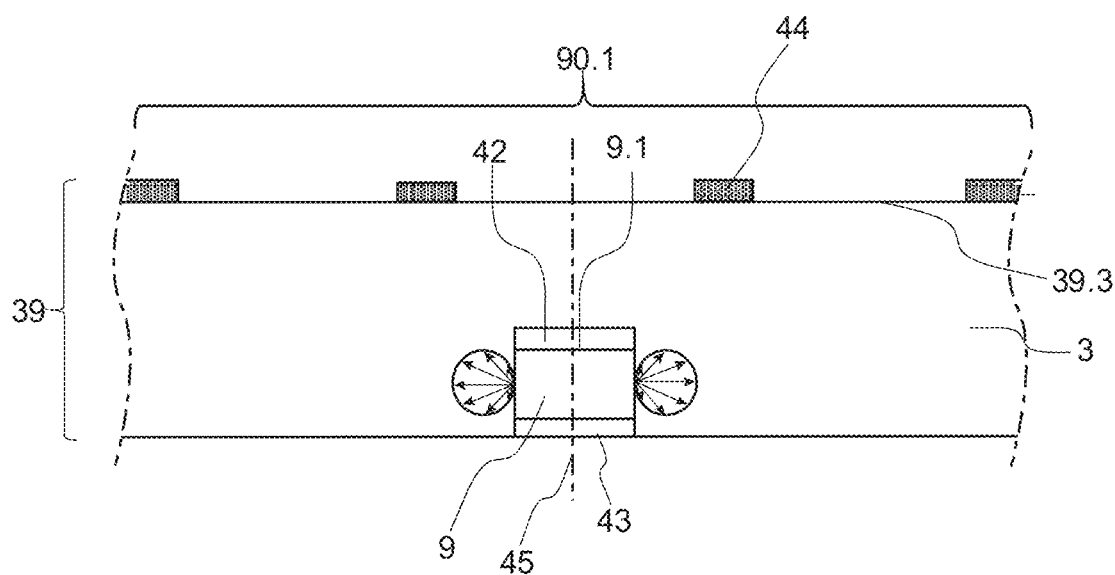
FIG. 40 shows a cross sectional view of an optoelectronic device in accordance with the present invention.

The optoelectronic device shown in FIG. 40 comprises a layer stack with a plurality of pixels 90. Exemplarily, only one of the plurality of pixels is shown in FIG. 40. The pixel comprises an optoelectronic light source 9, which is embedded in a first layer 3 of the layer stack 39. According to this embodiment, the first layer 3 is the only layer of the layer stack, whereas the layer stack can also comprise further layers. A first reflective layer 42 is arranged on the upper surface 9.1 of the optoelectronic light source and a second reflective layer 43 is arranged on the bottom surface 9.3 of the optoelectronic light source. The upper surface 9.1 faces towards a top surface 39.3 of the layer stack 39 and the bottom surface 9.3 faces away from the top surface 39.3. The first and the second reflective layer can guide light from the optoelectronic light source in a preferred way. As shown in the figure, the light being emitted from the optoelectronic light source is guided such that the optoelectronic light source emits light in a radial direction through its side surfaces.

The pixel further comprises a first pixel area 90.1 on the top surface 39.3 of the layer stack, and a structured light scattering arrangement 44 for scattering light from the optoelectronic light source 9 to homogeneously illuminate the first pixel area 90.1.

The first pixel area 90.1 comprises a central axis 45, which is perpendicular to the first pixel area 90.1 and runs through the center of the first pixel area. The central axis 45 extends in an orthogonal direction with regard to the first layer 3 of the layer stack 39.

The structured light scattering arrangement 44 is arranged in the layer stack 39 on top of the first layer 3 as shown in the figure, but it can also be at least partially be embedded in the first layer. The structured light scattering arrangement 44 can, when seeing in a top view, cover an area of at least approximately 1 to 50% of the size of the pixel area 90.1, particularly an area of at least approximately 1 to 20% of the size of the pixel area 90.1.

For scattering light from the optoelectronic light source 9, the structured light scattering arrangement 44 can comprise light scattering particles and/or a rough outer surface, particularly a rough outer surface facing the pixel area 90.1. The outer surface of the first layer, particularly the top and the bottom surface of the first layer, can however comprise a smooth, low-scattering surface.

FIGS. 41A to 41C each show a top view of an embodiment of the optoelectronic device. The structured light scattering arrangement 44 can comprise a plurality of light scattering elements. As shown in FIGS. 41A and 42B the structured light scattering arrangement 44 comprises a first light scattering element 44.1, a second light scattering element 44.2 and a third light scattering arrangement. The third and the second light scattering elements 44.3 and 44.2 are in a radial direction be further away from the optoelectronic light source 9 than the first light scattering element 44.1, and the third light scattering element 44.3 is in a radial direction be further away from the optoelectronic light source 9 than the second light scattering element 44.2. "in a radial direction" thereby means a direction which is perpendicular to a central axis 45 of the first pixel area 90.1.

The plurality of light scattering elements can be greater than 3, greater than 10 or greater than 50 as shown in FIG.

41C. There the structured light scattering arrangement 44 comprises a plurality of light scattering elements greater than for example 100 or 1000.

Each of the light scattering elements 44.1, 44.2 and 44.3 can have a defined geometrical form, which is, preferably, the same for all light scattering elements. Preferably, each of the light scattering elements has a defined particle concentration of scattering particles within its defined geometrical form.

As shown in FIGS. 41A and 41B the light scattering elements 44.1, 44.2 and 44.3 form a ring like structure around the optoelectronic light source 9. According to FIG. 41A the ring like structure has, seen in a top view, a circular form and according to FIG. 41B the ring like structure has a quadratic form. The structure can however also be of a rectangular or polygonal form.

In addition, the ring like structure has a rectangular form in a cross sectional plane which comprises a central axis 45 of the first pixel area 90.1. The central axis 45 is perpendicular to the first pixel area 90.1 and runs through the center of the first pixel area 90.1. However, the ring like structure can have a circular, quadratic, or polygonal form in a cross sectional plane which comprises the central axis 45.

As shown in FIG. 41C the light scattering elements can form scattering points distributed in an area, which extends over the whole length and width of the pixel area. A concentration of scattering points being distributed in the area, which extends over the whole length and width of the pixel area, is, as shown in FIG. 41C, in a radial direction further away from the optoelectronic light source 9 higher than in a radial direction closer away from the optoelectronic light source 9. Thus, a homogeneous illumination of the whole pixel area can be achieved.

Figure 42:
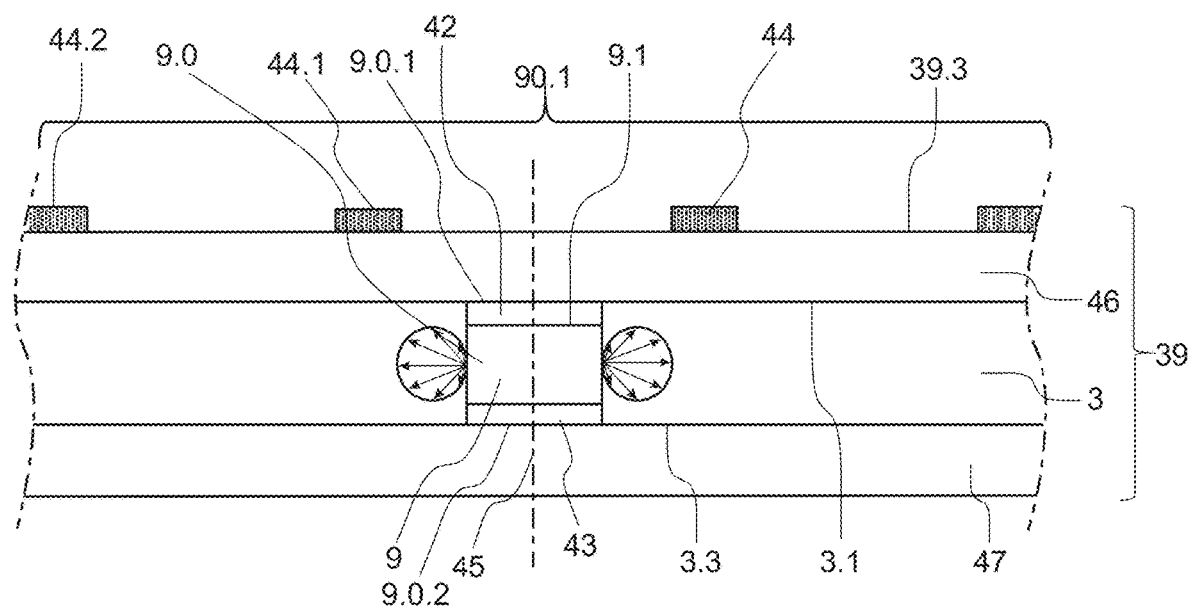
FIG. 42 shows a cross sectional view of another embodiment of an optoelectronic device in accordance with the present invention.

Referring now to FIG. 42 the layer stack 39 comprises a second layer 46 and a third layer 47. The first layer 3 is arranged between the second layer 46 and the third layer 47 and the structured light scattering arrangement 44 is arranged in the layer stack 39 on top of the second layer 46 as shown in the figure, but it can also be at least partially be embedded in the second layer.

The optoelectronic light source 9, the first reflective layer 42 and the second reflective layer 43 form an optoelectronic subassembly 9.0. The optoelectronic subassembly 9.0 is embedded in the first layer 3 such that a top surface 9.0.1 of the optoelectronic subassembly 9.0 is arranged in the same plane as a top surface 3.1 of the first layer 3 and a bottom surface 9.0.2 of the optoelectronic subassembly 9.0 is arranged in the same plane as a bottom surface 3.3 of the first layer 3. Thus, the optoelectronic subassembly 9.0 can have at least approximately the same height as the first layer 3.

Figure 43:
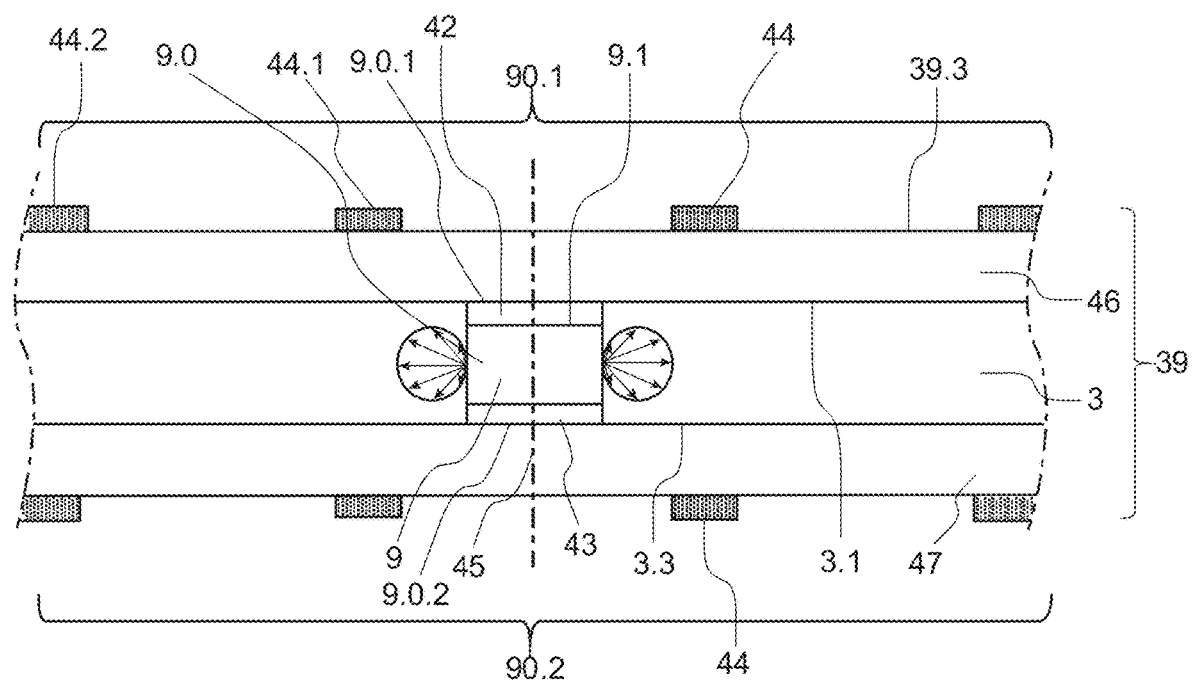
FIG. 43 shows a cross sectional view of another embodiment of an optoelectronic device in accordance with the present invention.

Referring now to FIG. 43 the layer stack 39 comprises a further structured light scattering arrangement 44. The further structured light scattering arrangement 44 is arranged in the layer stack 39, preferably below the first layer 3, between a second pixel area 90.2 and the optoelectronic light source 9. In more detail, the further structured light scattering arrangement 44 is arranged on the third layer 47 opposite to the first layer 3 but can also be at least partially be embedded in the third layer.

The structured light scattering arrangement 44 being arranged on top of the second layer 46 is configured to scatter light from the optoelectronic light source 9 such that the first pixel area 90.1 is homogeneously illuminated by the scattered light. The structured light scattering arrangement 44 being arranged on the third layer 47, opposite to the first layer 3, is configured to scatter light from the optoelectronic light source 9 such that the second pixel area 90.2 is homogeneously illuminated by the scattered light.

Figure 44:
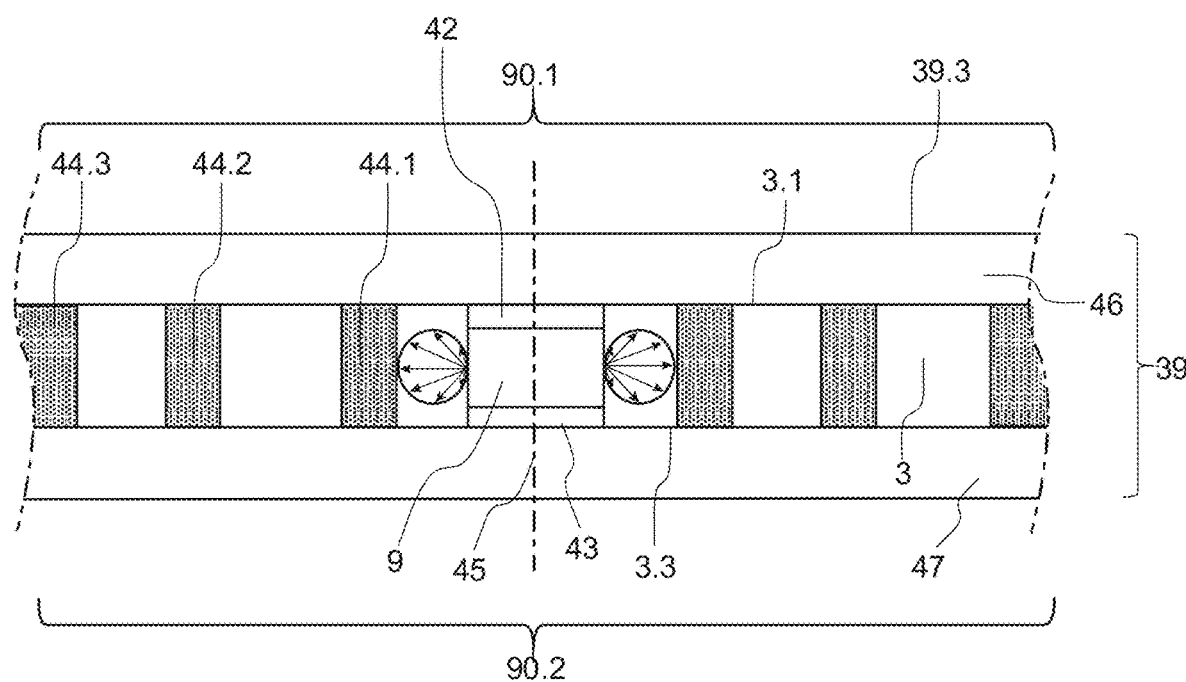
FIG. 44 shows a cross sectional view of another embodiment of an optoelectronic device in accordance with the present invention.

In contrast to FIG. 42, the structured light scattering arrangement 44 can be embedded, in particular completely embedded, in the first layer 3 as shown in FIG. 44. The structured light scattering arrangement 44 comprises a first, second and third light scattering element 44.1, 44.2 and 44.3 which have at least approximately the same rectangular form and size in a cross sectional plane, which comprises the central axis 45 of the first pixel area 90.1.

For an improved homogeneous illumination of the whole first 90.1 and optionally second 90.2 pixel area, a particle concentration of scattering particles in the first light scattering element 44.1 is lower than a particle concentration of scattering particles in the second light scattering element 44.2 and a particle concentration of scattering particles in the second light scattering element 44.2 is lower than a particle concentration of scattering particles in the third light scattering element 44.3.

If the structured light scattering arrangement 44 comprises more than three light scattering elements, a particle concentration of scattering particles in the light scattering elements can increase in dependence on the distance, in a radial direction, between the respective light scattering element and the optoelectronic light source 9. Thus, a light scattering element which is closer to the optoelectronic light source 9 can have a lower particle concentration of scattering particles than a light scattering element which is further away from optoelectronic light source 9 in a radial direction.

The structured light scattering arrangement 44 and with it, all three light scattering elements 44.1, 44.2 and 44.3 have, as shown in FIG. 44, at least approximately the same height as the first layer. Thus, light scattering elements 44.1, 44.2 and 44.3 are embedded in the first layer 3 such that each a top surface of the light scattering elements 44.1, 44.2 and 44.3 is arranged in the same plane as a top surface 3.1 of the first layer and each a bottom surface of the light scattering elements 44.1, 44.2 and 44.3 is arranged in the same plane as a bottom surface 3.3 of the first layer 3.

Figure 45:
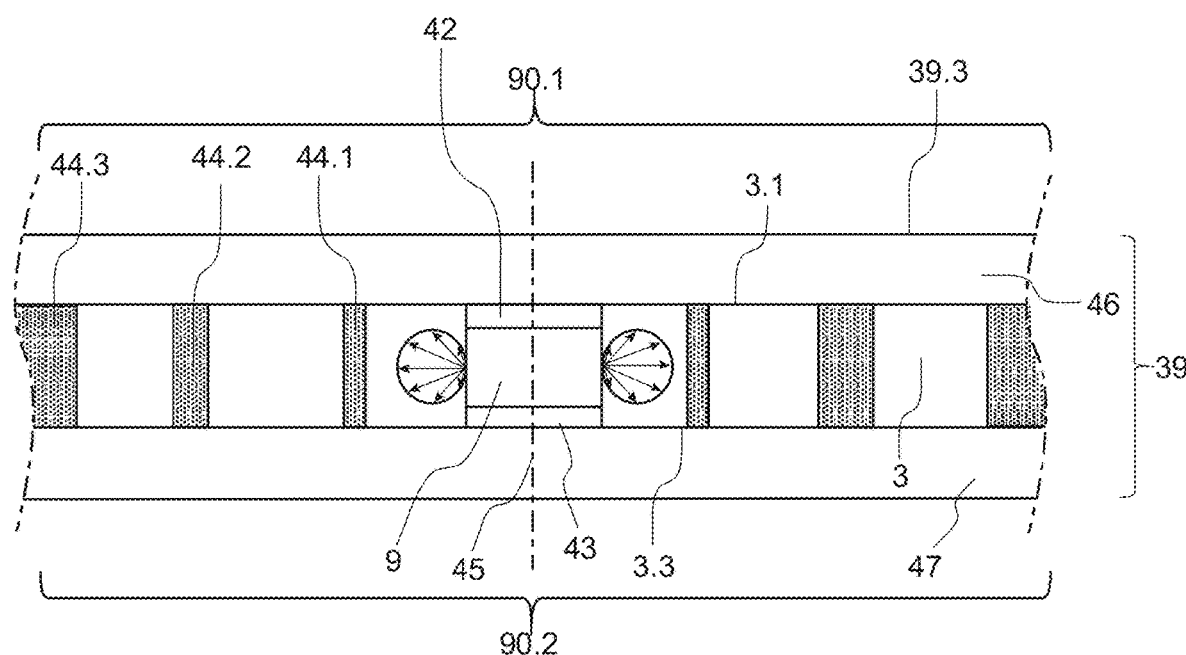
FIG. 45 shows a cross sectional view of another embodiment of an optoelectronic device in accordance with the present invention.

In contrast to FIG. 44, the structured light scattering arrangement 44 shown in FIG. 45 comprises a first, second and third light scattering element 44.1, 44.2 and 44.3 which have at least approximately a same particle concentration of scattering particles. The form and size of the first, second and third light scattering element 44.1, 44.2 and 44.3 in a cross sectional plane, which comprises the central axis 45 of the first pixel area 90.1, however varies. The cross sectional area of the first light scattering element is smaller than the cross sectional area of the second light scattering element and the cross sectional area of the second light scattering element is smaller than the cross sectional area of the third light scattering element. The cross sectional areas are in the same cross sectional plane, which comprises the central axis of the first pixel area.

As shown in FIG. 45, the height of the first, second and third light scattering element 44.1, 44.2 and 44.3 is at least approximately the same as shown for the embodiment of FIG. 44.

The thickness of the cross sectional area of the first, second and third light scattering element 44.1, 44.2 and 44.3 varies and increases with the distance in radial direction between the respective light scattering element and the optoelectronic light source 9.

Figure 46:
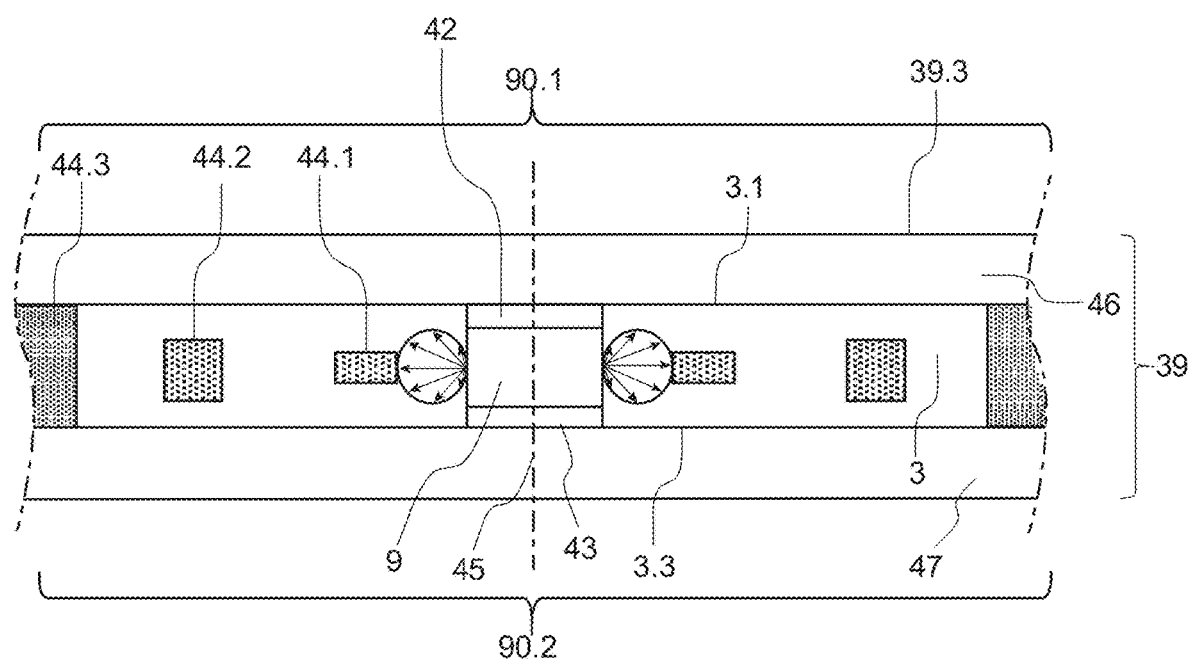
FIG. 46 shows a cross sectional view of another embodiment of an optoelectronic device in accordance with the present invention.

In contrast to FIG. 45, FIG. 46 shows an embodiment in which the thickness of the first, second and third light scattering element 44.1, 44.2 and 44.3 is at least approximately the same as shown for the embodiment of FIG. 44.

The height of the cross sectional area of the first, second and third light scattering element 44.1, 44.2 and 44.3 varies and increases with the distance in radial direction between the respective light scattering element and the optoelectronic light source 9.

Figure 47A:
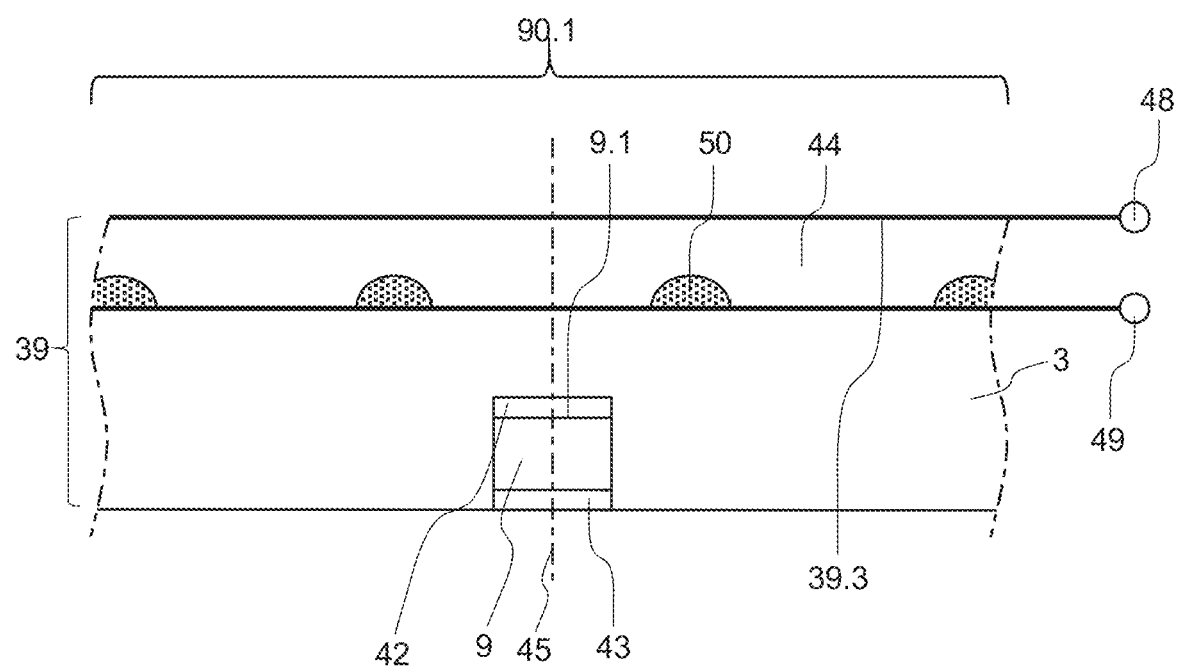
FIGS. 47A and 47B show a cross sectional view of another embodiment of an optoelectronic device in accordance with the present invention.
Figure 47B:
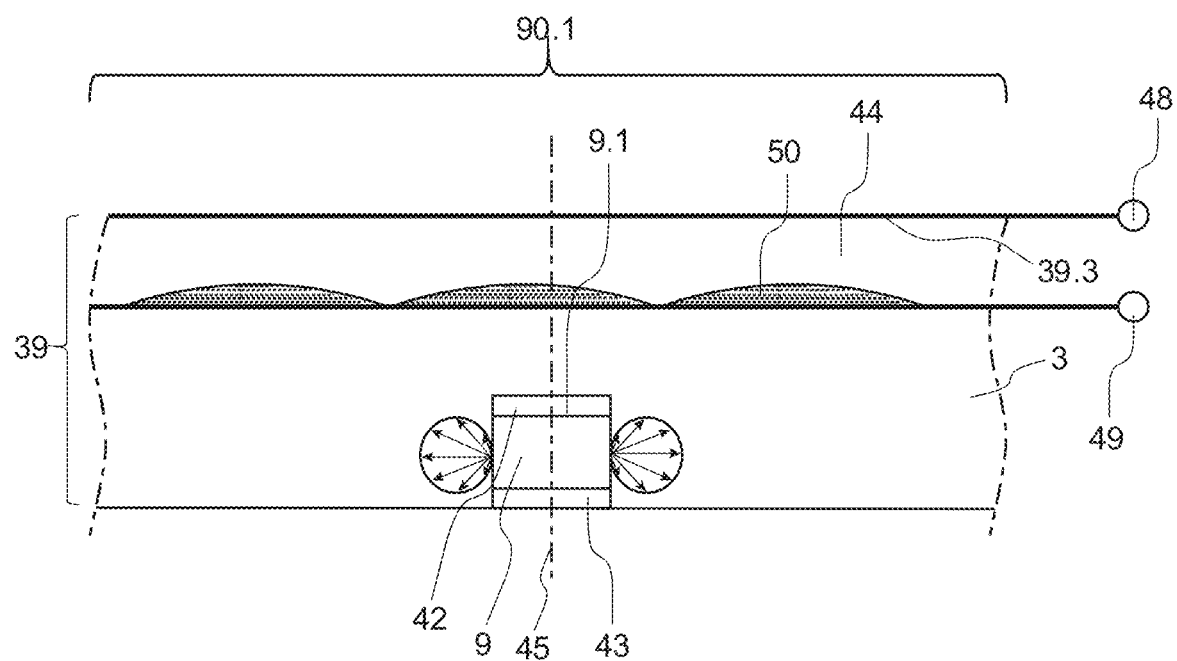

FIGS. 47A and 47B show an embodiment of an optoelectronic device comprising a layer stack with a plurality of pixels 90. Exemplarily only one of the plurality of pixels is shown in the figures. The pixel comprises an optoelectronic light source 9, which is embedded in a first layer 3 of the layer stack 39. According to this embodiment, the first layer 3 is the only layer of the layer stack, whereas the layer stack can also comprise further layers. A first reflective layer 42 is arranged on the upper surface 9.1 of the optoelectronic light source and a second reflective layer 43 is arranged on the bottom surface 9.3 of the optoelectronic light source. The upper surface 9.1 faces towards a top surface 39.3 of the layer stack 39 and the bottom surface 9.3 faces away from the top surface 39.3. The first and the second reflective layer can guide the light being emitted from the optoelectronic light source in a preferred way. As shown in the FIG. 47B, the light being emitted from the optoelectronic light source is guided such that the optoelectronic light source emits light in a radial direction through its side surfaces.

The pixel further comprises a first pixel area 90.1 on the top surface 39.3 of the layer stack, and a structured light scattering arrangement 44 for scattering light from the optoelectronic light source 9 to homogeneously illuminate the first pixel area 90.1.

The structured light scattering arrangement 44 is arranged in the layer stack 39 on top of the first layer 3 as shown in the figure. The structured light scattering arrangement 44 comprises an electro-wetting device, which is arranged, particularly in a layer of the layer stack, between the first layer 3 and the first pixel area 90.1.

The electro-wetting device comprises a first electrode 48, in particular an at least partially transparent electrode and a second electrode 49, in particular an at least partially transparent electrode. Between the first electrode and the second electrode a plurality of oil-covered droplets 50 comprising light-scattering particles are arranged. The plurality of oil-covered droplets are embedded in a first medium 51. The first medium can in particular comprise or consist of air or any fluid.

When an electric voltage is applied between the two electrodes 48 and 49, the electro-wetting device can form a film of light-scattering particles to scatter light being emitted from the optoelectronic light source 9 such that the first pixel 90.1 area is homogeneously illuminated by the scattered light.

Figure 48A:
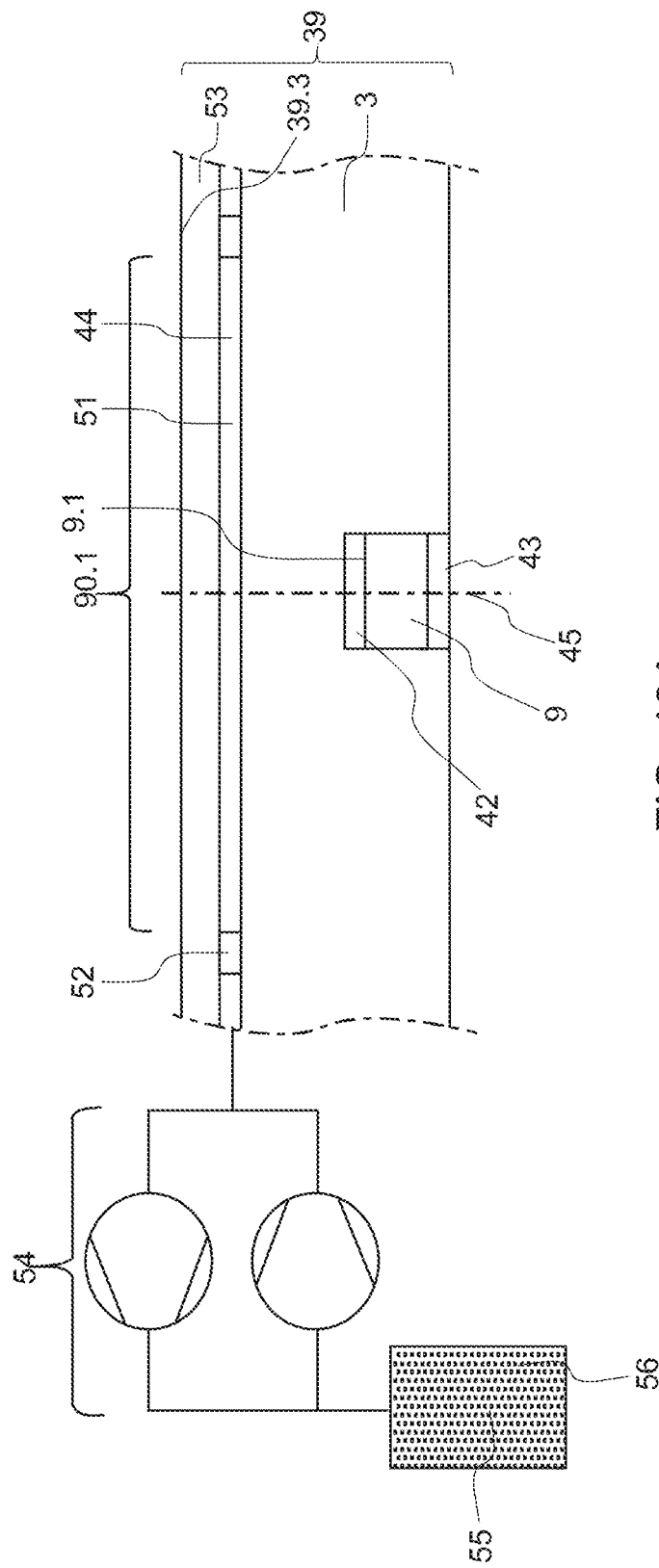
FIGS. 48A and 48B show a cross sectional view of another embodiment of an optoelectronic device in accordance with the present invention.
Figure 48B:
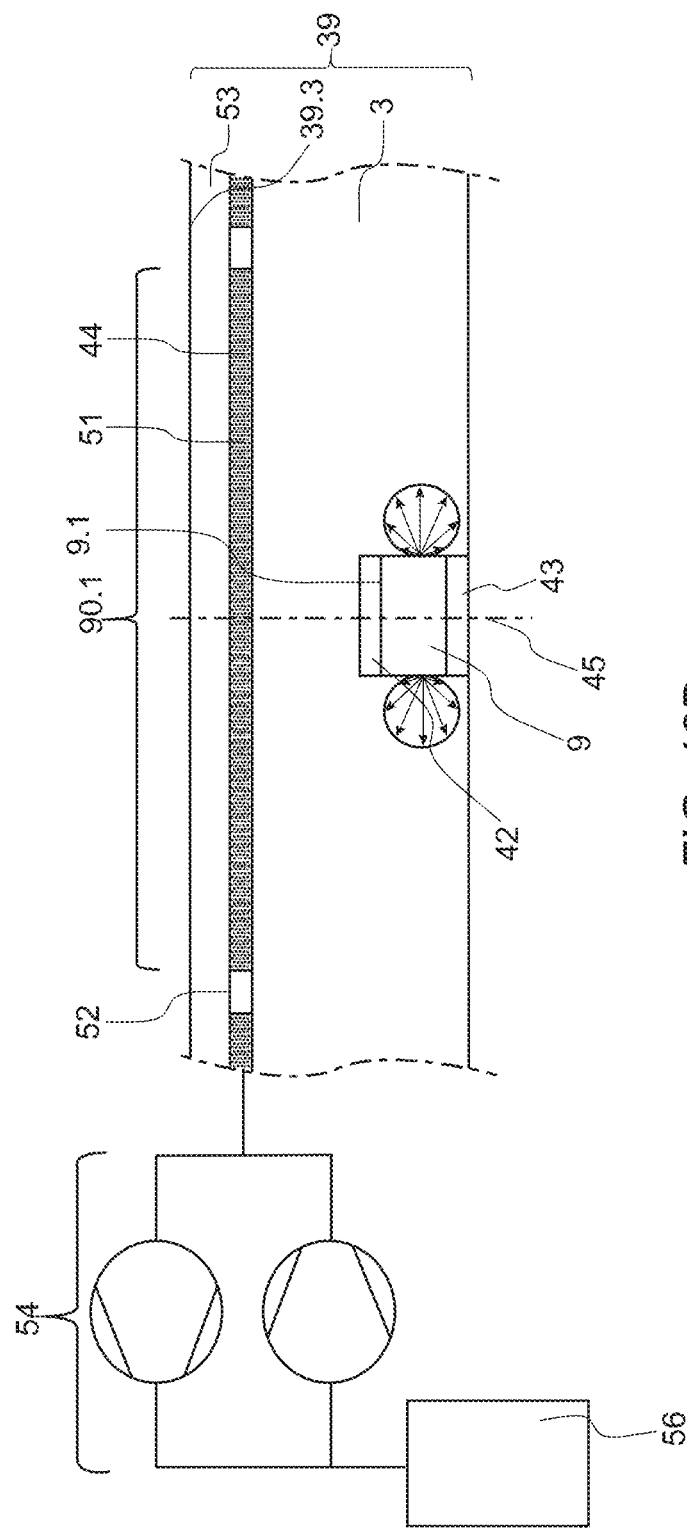

Referring now to FIGS. 48A and 48B the structured light scattering arrangement 44 comprises a first cavity 51 which extends between the first layer 3 and the first pixel area 90.1 over the full length and width of the first pixel area 90.1. Thus, the first cavity 51 is arranged below the first pixel area 90.1 and extends over the full length and width of the first pixel area 90.1. According to the figures, the first cavity 51 is formed by spacers 52 that separate the first layer 3 from a further layer 53 of the layer stack 39.

Figure 49:
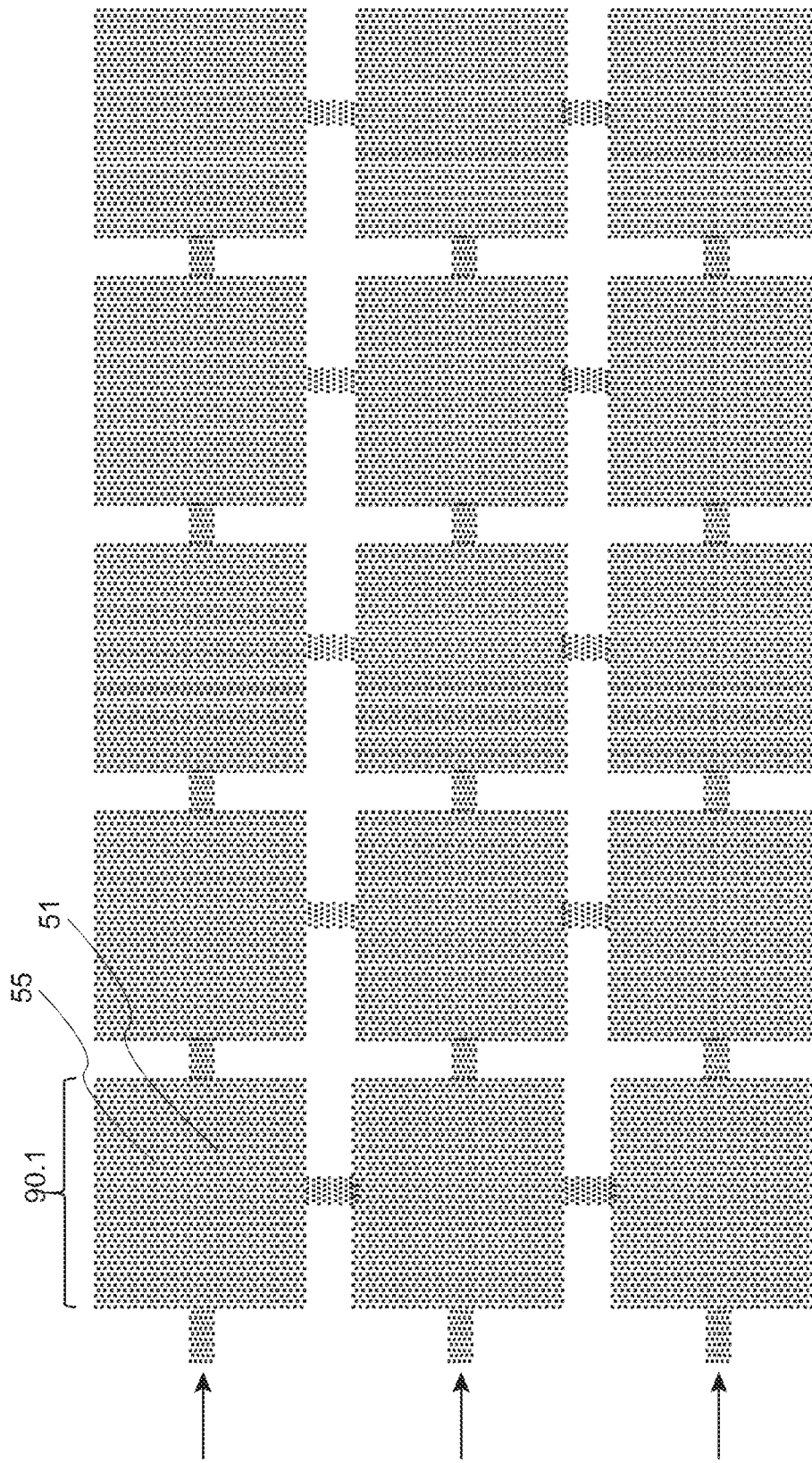
FIG. 49 shows a top view of an embodiment of an optoelectronic device in accordance with the present invention.

The optoelectronic device further comprises a first fluid pump 54 and a reservoir 56 to selectively pump a first fluid 55 into the first cavity 51 or to evacuate the first cavity 51. The first fluid 55 comprises light scattering particles. Thus, when the first cavity 51 is filled with the first fluid, as shown in FIG. 49, light being emitted from the optoelectronic light source 9 can be scattered by the first fluid 55 such that the first pixel area 90.1 is homogeneously illuminated by the scattered light.

Figure 50:
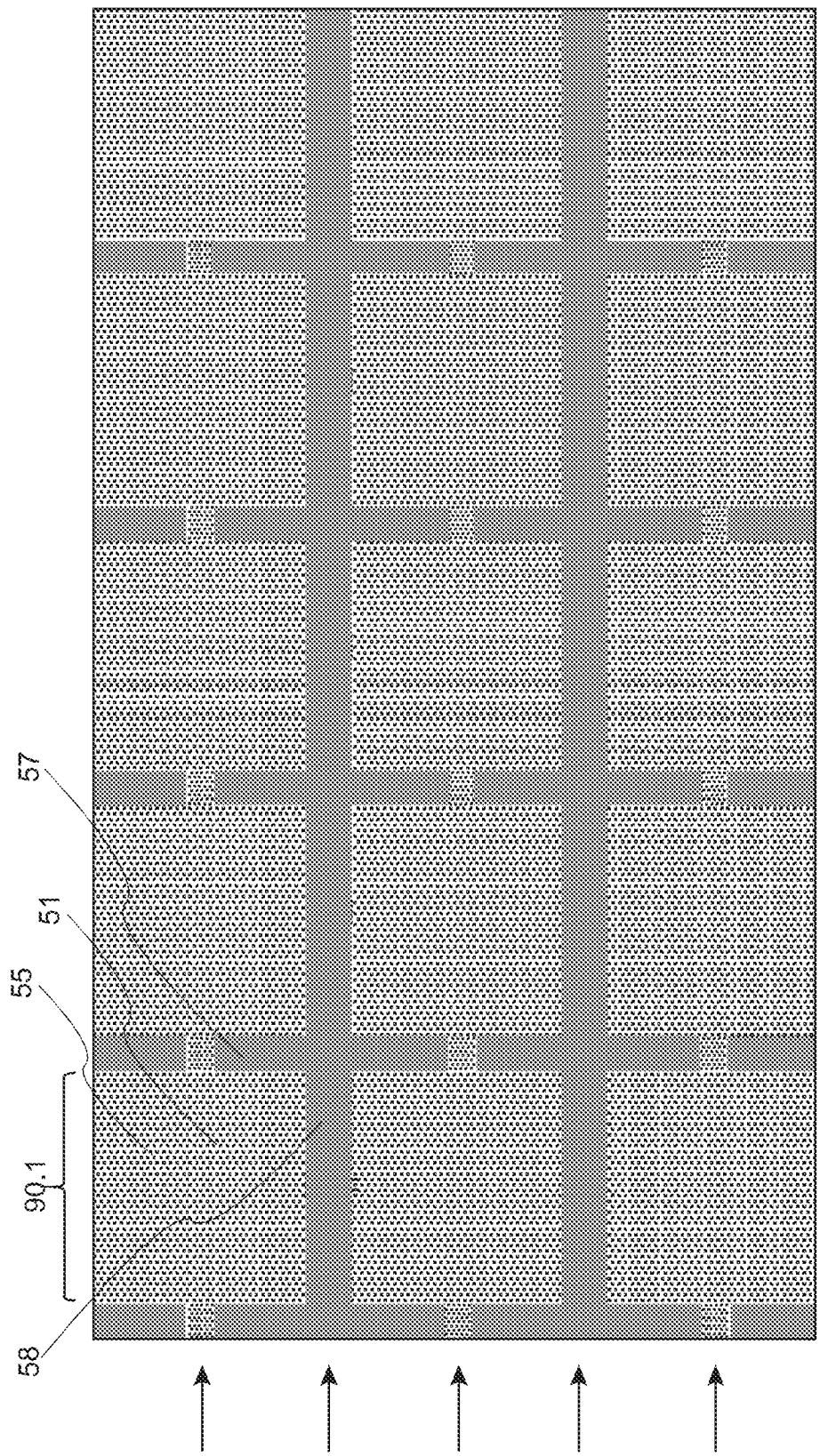
FIG. 50 shows a top view of another embodiment of an optoelectronic device in accordance with the present invention.

The structured light scattering arrangement 44 can further comprise a set of interconnected fluid channels 57 as shown in FIG. 50. The interconnected fluid channels extend in a further layer 53 of the layer stack 39 below the first pixel areas 90.1 of the plurality of pixels along the length and width directions of the first pixel areas 90.1. When seen in a top view, the fluid channels 57 can be arranged behind a grid-like structure of boundary regions that separate neighboring first pixel areas 90.1 from each other.

According to at least this embodiment, the optoelectronic device further comprises a second fluid pump to selectively pump a second fluid 58 into the fluid channels 57 or to evacuate the fluid channels 57, wherein the second fluid comprises light absorbing particles, in particular black particles. Thus, when the fluid channels 57 are filled with the second fluid, as shown in FIG. 50, light being emitted from the optoelectronic light source 9 can be absorbed by the second fluid, such that a defined and/or sharp edge of the first pixel areas 90.1 is created.

Figure 51:
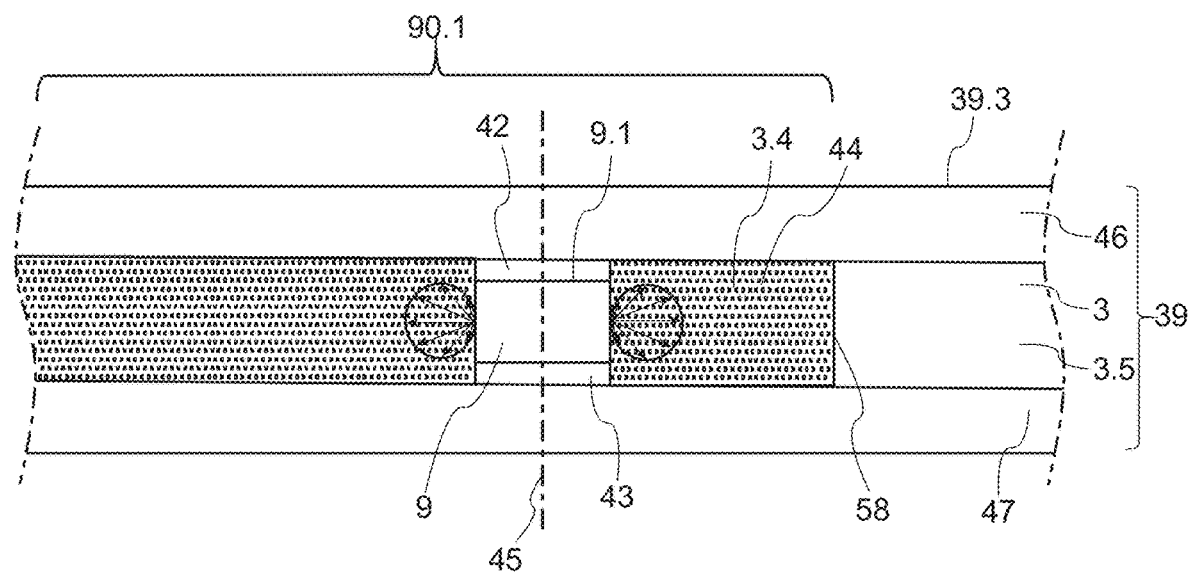
FIG. 51 shows a cross sectional view of another embodiment of an optoelectronic device in accordance with the present invention.

FIG. 51 shows an embodiment of an optoelectronic device comprising a layer stack 39 with a plurality of pixels. Exemplarily only one of the plurality of pixels is shown in the figure. The pixel comprises an optoelectronic light source 9, which is embedded in a first layer 3 of the layer stack 39. The layer stack 39 further comprises a second layer 46 and a third layer 47. The first layer 3 is arranged between the second layer 46 and the third layer 47. A first reflective layer 42 is arranged on the upper surface 9.1 of the optoelectronic light source and a second reflective layer 43 is arranged on the bottom surface 9.3 of the optoelectronic light source. The upper surface 9.1 faces towards a top surface 39.3 of the layer stack 39 and the bottom surface 9.3 faces away from the top surface 39.3. The first and the second reflective layer can guide the light being emitted from the optoelectronic light source in a preferred way. As shown in FIG. 51, the light being emitted from the optoelectronic light source is guided such that the optoelectronic light source emits light in a radial direction through its side surfaces.

The pixel further comprises a first pixel area 90.1 on the top surface 39.3 of the layer stack 39, and a light scattering arrangement 44 for scattering light, being emitted from the optoelectronic light source 9, to homogeneously illuminate the first pixel area 90.1. The light scattering arrangement 44 is forming a first portion 3.4 of the first layer which circumferentially surrounds the optoelectronic light source 9.

An outer surface 44.0 of the light scattering arrangement 44 is aligned with outer edges of the first pixel area 90.1, when seeing in a view perpendicular to the first pixel area 90.1.

Figure 52:
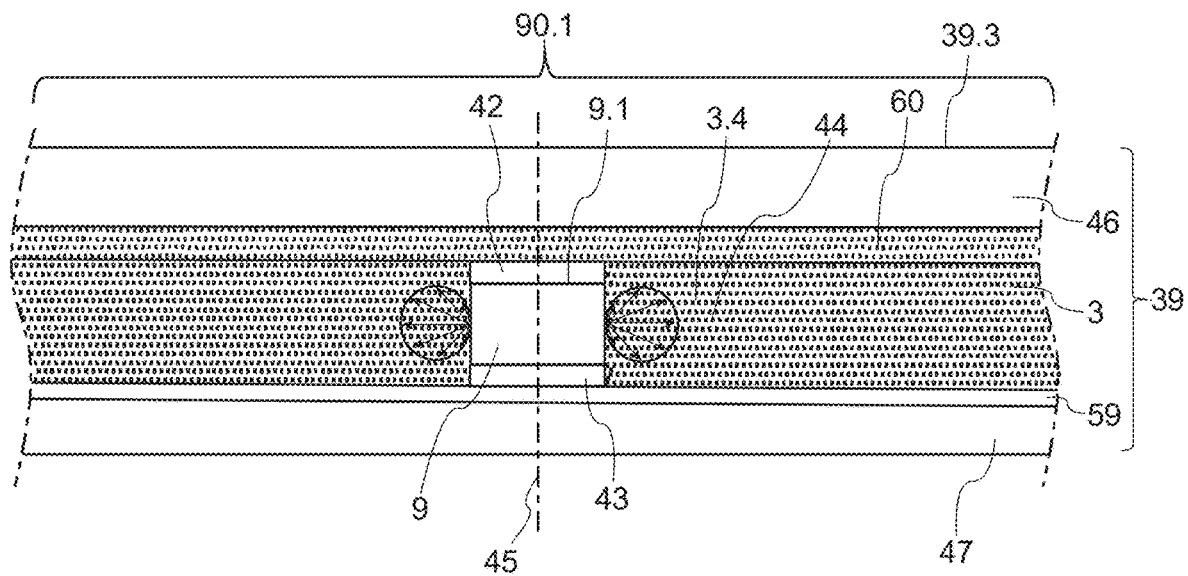
FIG. 52 shows a cross sectional view of another embodiment of an optoelectronic device in accordance with the present invention.

A second portion 3.5 of the first layer 3 circumferentially surrounds the first portion 3.4 of the first layer 3, and a refractive index of the first portion 3.4 is different, particularly larger, than a refractive index of the second portion 3.5. Thus, light being emitted from the optoelectronic light source 9 gets reflected due to internal total reflection when passing the first portion 3.4 of the first layer 3 and impinging on the second portion 3.5 of the first layer 3. Thus, the light scattering arrangement 44 can be configured to reflect light at a border 58 between the first 3.4 and the second portion 3.5 of the first layer 3 and scatter light such that the first pixel area 90.1 is homogeneously illuminated by the scattered light. In addition to FIG. 41, the layer stack 39 can further comprise a light guiding layer 59 as shown in FIG. 52. The light guiding layer 59 is arranged on the first layer 3 opposite to the first pixel area 90.1. Thus, the first layer 3 is arranged between the first pixel area 90.1 and the light guiding layer 59. A refractive index of the light guiding layer 59 can be higher than a refractive index of any other layer of the layer stack 39, to achieve total internal reflection at the light guiding layer 59 of the light being emitted from the optoelectronic light source 9. Light scattering particles in the light scattering arrangement can scatter light propagating in the light guiding layer 59. An improved illumination of the first pixel area 90.1 can thereby be obtained.

The layer stack 39 comprise a scattering layer 60 which is arranged on the first layer 3, opposite to the light guiding layer 59. The scattering layer 60 can comprise light scattering particles to homogeneously illuminate the first pixel area. The light scattering layer 60 can form a single layer with the first portion of the first layer 3.

Figure 53:
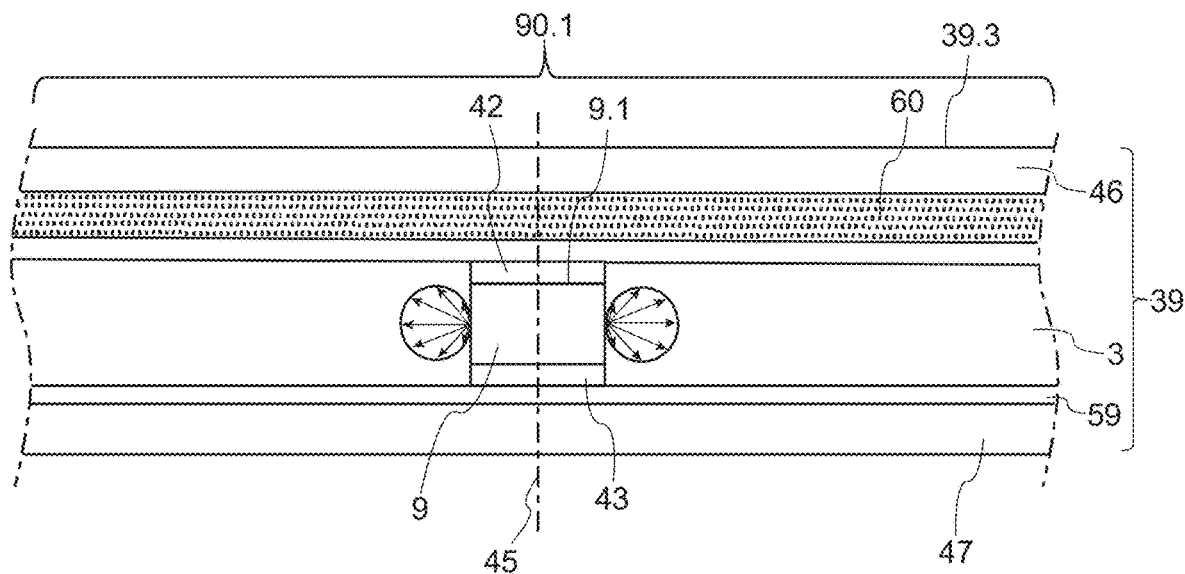
FIG. 53 shows a cross sectional view of another embodiment of an optoelectronic device in accordance with the present invention.

FIG. 53 shows an embodiment of an optoelectronic device comprising a layer stack 39 with a plurality of pixels. Exemplarily only one of the plurality of pixels is shown in the figure. The pixel comprises an optoelectronic light source 9, which is embedded in a first layer 3 of the layer stack 39. The layer stack 39 further comprises a second layer 46 and a third layer 47. The first layer 3 is arranged between the second layer 46 and the third layer 47. A first reflective layer 42 is arranged on the upper surface 9.1 of the optoelectronic light source and a second reflective layer 43 is arranged on the bottom surface 9.3 of the optoelectronic light source. The upper surface 9.1 faces towards a top surface 39.3 of the layer stack 39 and the bottom surface 9.3 faces away from the top surface 39.3. The first and the second reflective layer can guide the light being emitted from the optoelectronic light source in a preferred way.

As shown in FIG. 53, the light being emitted from the optoelectronic light source is guided such that the optoelectronic light source emits light in a radial direction through its side surfaces.

The pixel comprises a first pixel area 90.1 on the top surface 39.3 of the layer stack 39, and a light guiding layer 59 arranged on the first layer 3 opposite to the first pixel area 90.1. Thus, the first layer 3 is arranged between the first pixel area 90.1 and the light guiding layer 59. A refractive index of the light guiding layer 59 is higher than a refractive index of any other layer of the layer stack to achieve total internal reflection at the light guiding layer 59 of the light being emitted from the optoelectronic light source 9.

The layer stack 39, particularly the second layer 46, further comprises a scattering layer 60 arranged above the first layer 3, opposite to the light guiding layer. The scattering layer 60 comprises light scattering particles to homogeneously illuminate the first pixel area. Reflected or totally reflected light from interfaces below the scattering layer 60 can also be scattered by the scattering layer 60. This helps to obtain a homogeneous illumination of the first pixel area 90.1.

Figure 54:
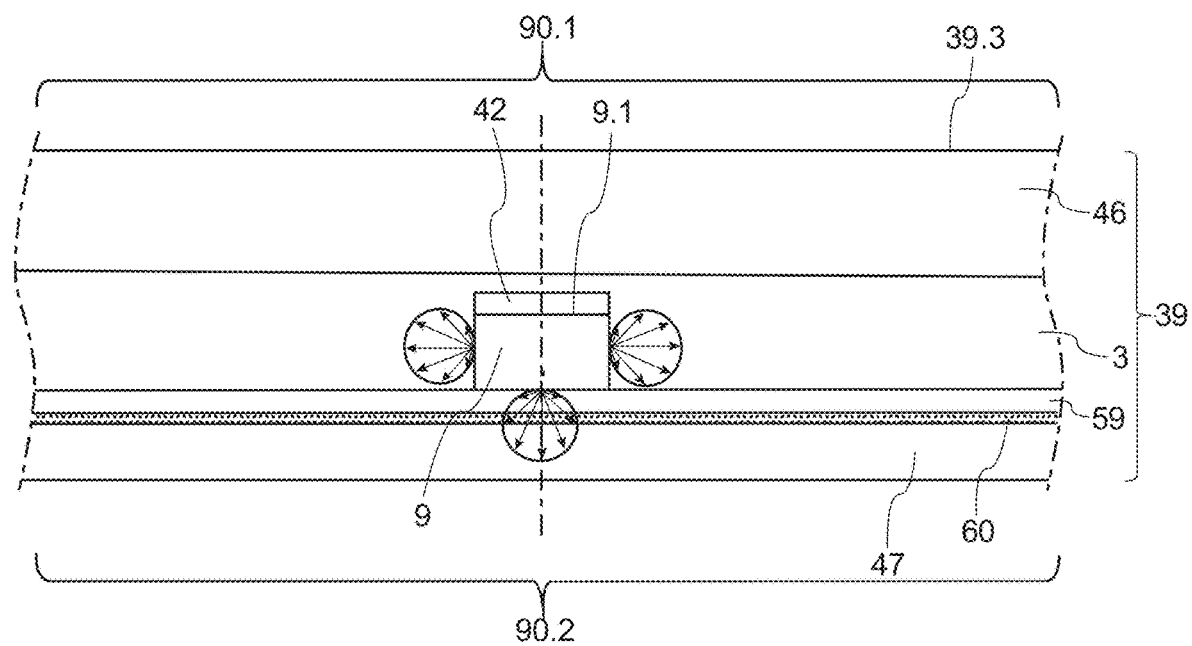
FIG. 54 shows a cross sectional view of another embodiment of an optoelectronic device in accordance with the present invention.

FIG. 54 shows an embodiment of an optoelectronic device comprising a layer stack 39 with a plurality of pixels. Exemplarily only one of the plurality of pixels is shown in the figure. The pixel comprises an optoelectronic light source 9, which is embedded in a first layer 3 of the layer stack 39. The layer stack 39 further comprises a second layer 46 and a third layer 47. The first layer 3 is arranged between the second layer 46 and the third layer 47. A first reflective layer 42 is arranged on the upper surface 9.1 of the optoelectronic light source. The first reflective layer can guide the light being emitted from the optoelectronic light source in a preferred way. As shown in FIG. 54, the light being emitted from the optoelectronic light source 9 is guided such that the optoelectronic light source emits light in a radial direction through its side surfaces and in a vertical direction through its bottom surface.

The pixel further comprises a first pixel area 90.1 on the top surface 39.3 of the layer stack 39, and a light guiding layer 59 arranged on the first layer 3 opposite to the first pixel area 90.1. Thus, the first layer 3 is arranged between the first pixel area 90.1 and the light guiding layer 59. A refractive index of the light guiding layer 59 is higher than a refractive index of any other layer of the layer stack to achieve total internal reflection at the light guiding layer 59 of the light being emitted from the optoelectronic light source 9.

The layer stack 39 comprises a scattering layer 60 arranged on the light guiding layer 59 opposite to the first layer 3. The scattering layer 60 comprises light scattering particles to homogeneously illuminate a second pixel area 90.2 on a bottom surface 39.4 of the layer stack 39. The scattering layer 60 can be very thin. The thickness of the scattering layer 60 can particularly be the same as at least approximately the thickness of the diameter of one light scattering particle.

Light from the optoelectronic light source 9 can be coupled into the light guiding layer 59 and decoupled from the light guiding layer 59 via the scattering layer 60 arranged on the light guiding layer 59. Thus, the scattering layer 60 can be configured to scatter light being emitted from the optoelectronic light source such that the second pixel area 90.2 is being homogeneously illuminated.

Figure 55:
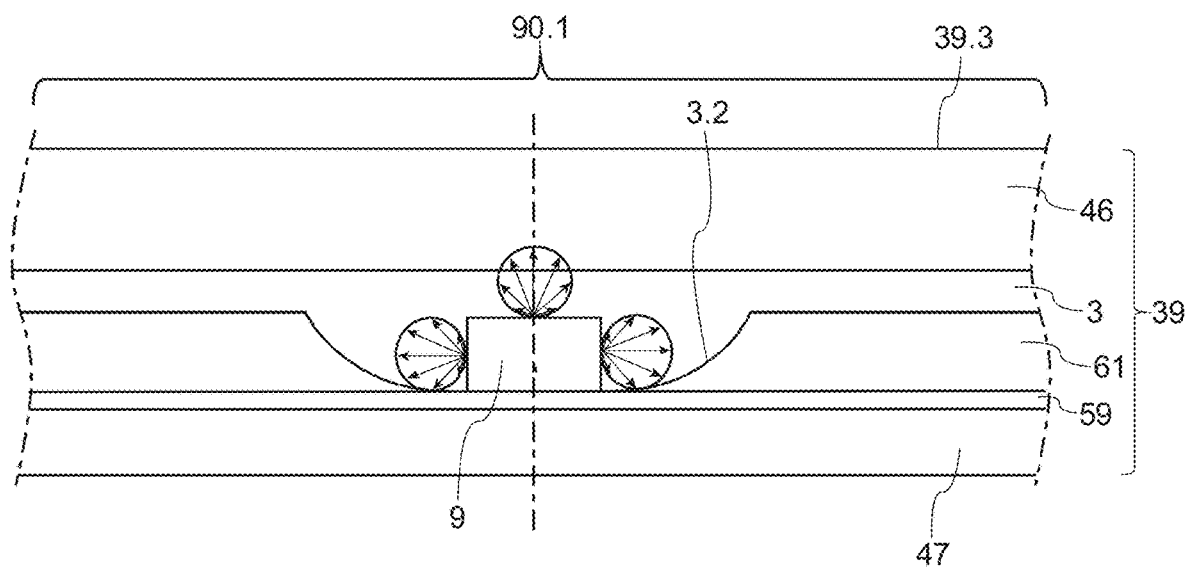
FIG. 55 shows a cross sectional view of another embodiment of an optoelectronic device in accordance with the present invention.

FIG. 55 shows an embodiment of an optoelectronic device comprising a layer stack 39 with a plurality of pixels. Exemplarily only one of the plurality of pixels is shown in the figure. The pixel comprises an optoelectronic light source 9, which is embedded in a first layer 3 of the layer stack 39. The pixel further comprises a first pixel area 90.1 on the top surface 39.3 of the layer stack 39, and a light guiding layer 59 arranged on the first layer 3 opposite to the first pixel area 90.1. A refractive index of the light guiding layer 59 is higher than a refractive index of any other layer of the layer stack 39 to achieve total internal reflection at the light guiding layer 59 of the light being emitted from the optoelectronic light source 9.

The pixel comprises a third reflective layer 61 for reflecting light from the optoelectronic light source 9 to homogeneously illuminate the first pixel area 90.1. The third reflective layer 61 is forming an opening 62 in the first layer 3 in which the optoelectronic light source 9 is located. The first layer 3 is having a curved surface 3.2, particularly the surface of the opening, that is facing the optoelectronic light source 9. The curved surface 3.2 is formed such that light which is emitted by the optoelectronic light source 9, in substance in a radial direction, is reflected towards the first pixel area 90.1, in particular such that the first pixel area 90.1 is illuminated homogenously.

Figure 56:
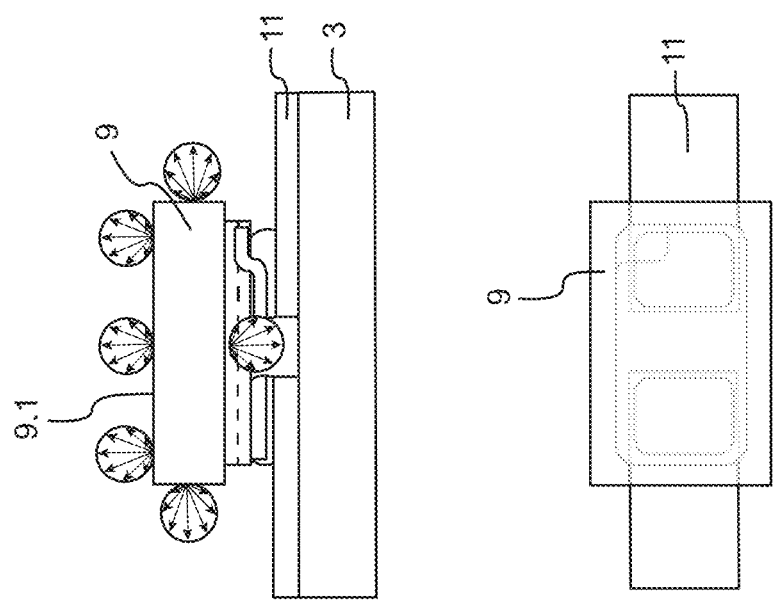
FIG. 56 shows a cross sectional view and a top view of an optoelectronic device.

FIG. 56 shows schematically an optoelectronic device 1 with a first layer 3. The first layer can be a foil and can serve as a carrier for optoelectronic components, such as an optoelectronic light source 9. The optoelectronic light source 9 can for example be a small LED as for example a mini LED. The optoelectronic light source 9 can be a flip chip that has both electric contacts at a bottom surface. Conductor paths 11 can be arranged on the first layer 3. The electric contacts at the bottom side of the optoelectronic light source 9 can be directly placed on contacts of the conductor paths 11. Such an arrangement may be called "chip last" in the following description, as the optoelectronic light source 9 is arranged on the conductor paths 11 after the conductor paths 11 have been arranged on the first layer.

Figure 57:
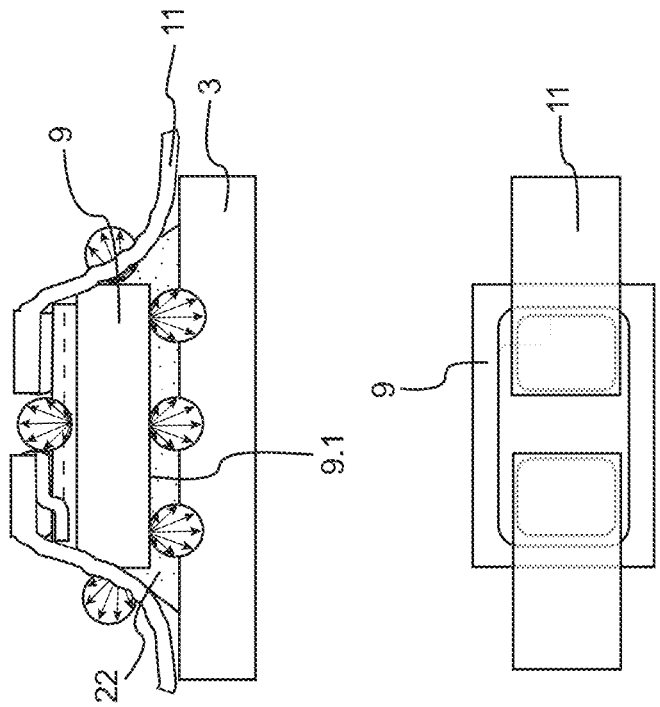
FIG. 57 shows a cross sectional view and a top view of another optoelectronic device.

As shown in FIG. 57, optoelectronic light source 9 is turned upside down, and conductor paths 11 extend from the first layer 3 to the electric contact pads at the bottom surface of the optoelectronic light source 9 enclosing the optoelectronic light source 9. Conductor paths 11 are used to provide electricity to the optoelectronic light source 9. The optoelectronic light source 9 is fixed to the first layer using an at least partly transparent adhesive forming a glue fillet. Such an arrangement may be called "chip first" in the following description, as the optoelectronic light source 9 is arranged on the first layer before the conductor paths 11 are arranged on the first layer 3 and the optoelectronic light source 9.

The optoelectronic light source 9 of FIGS. 56 and 57 can for example be a volume emitter or surface emitter. Volume emitters can emit light at their top surface 9.1, which is on the opposite side of the bottom side, on its side surfaces as well as on its bottom side between the contact pads being arranged on the bottom side. A surface emitter can emit light at the top surface 9.1. As indicated by the small arrows in FIGS. 56 and 57, volume emitters are preferably used as an optoelectronic light source 9. The conductor paths 11 can function as a reflector to guide the light being emitted from the optoelectronic light source 9 at least partly into a desired direction.

Figure 58:
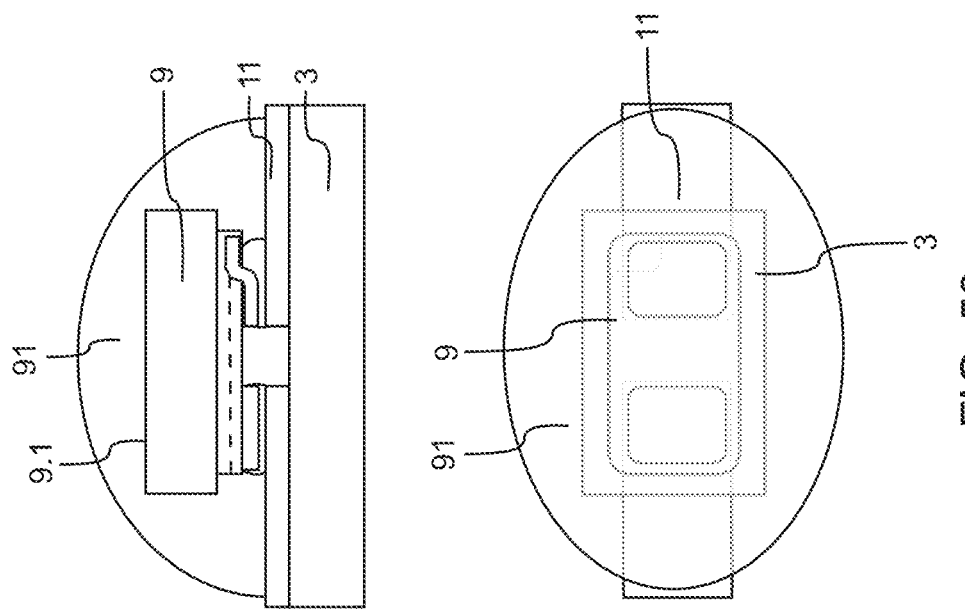
FIG. 58 shows a cross sectional view and a top view of an optoelectronic device in accordance with the present invention.

Referring now to FIG. 58, an optoelectronic device 1 is shown comprising a plurality of optoelectronic light sources 9 being arranged on a first layer 3 in particular an intermediate layer being arranged between a cover layer and a carrier layer. Exemplarily only one optoelectronic light source 9 is shown being arranged on conductor paths 11 which are arranged on the first layer 3. Hence, the optoelectronic light sources are arranged according to "chip last". However it should be noted that in accordance with the invention a plurality of optoelectronic light sources 9 is arranged on conductor paths 11 which are arranged on the first layer 3, and the first layer 3 comprising the conductor paths 11 and optoelectronic light sources 9 is arranged between a carrier layer and a cover layer (not shown in the figure).

The first layer 3 comprises or consists of an at least partially transparent material and each optoelectronic light source 9 of the plurality of optoelectronic light sources comprises an individual light converter 91 for converting light emitted by the associated light source 9 into converted, or at least partially converted light. The light converter 91 of each optoelectronic light source is arranged on the first layer 3 and the associated optoelectronic light source 9 forming a droplet enclosing the optoelectronic light source 9. The light converter comprises conversion particles to convert the light being emitted from the optoelectronic light source.

Between neighbouring optoelectronic light sources 9 no light converter 91 is arranged, such that the light converters 91 of different light sources are separated from each other. In other words, the light converters 91 are spaced apart and are not in contact with each other.

Figure 59:
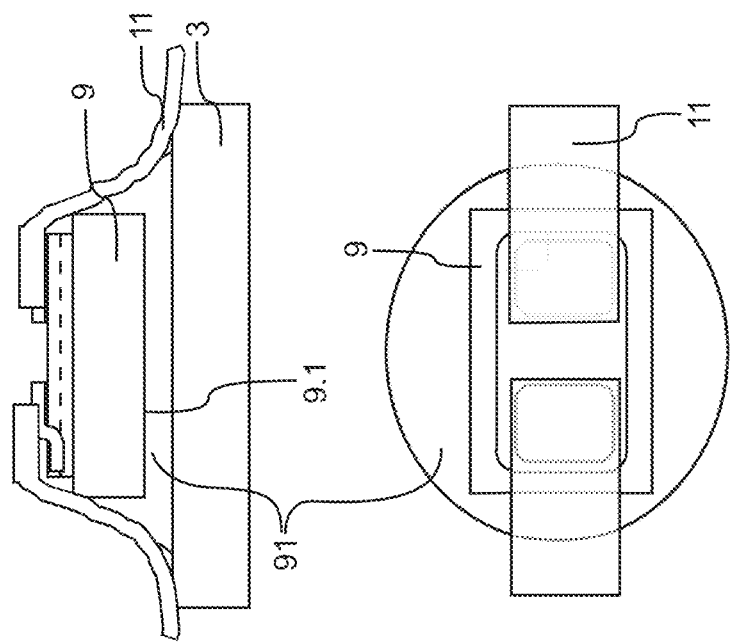
FIG. 59 shows a cross sectional view and a top view of another optoelectronic device in accordance with the present invention.

FIG. 59 shows an optoelectronic device 1, which in addition to the optoelectronic device shown in FIG. 57 comprises conversion particles within the adhesive forming the glue fillet and thus the adhesive forming the glue fillet is forming the light converter 91. Light from the optoelectronic light source, in particular in form of a volume emitting LED, is passing the light converter or is reflected by the conductor paths 11 and subsequently passes the light converter and thus is converted. Respectively the light converter 91 forms the connecting component between first layer 3 and optoelectronic light source 9.

Figure 60:
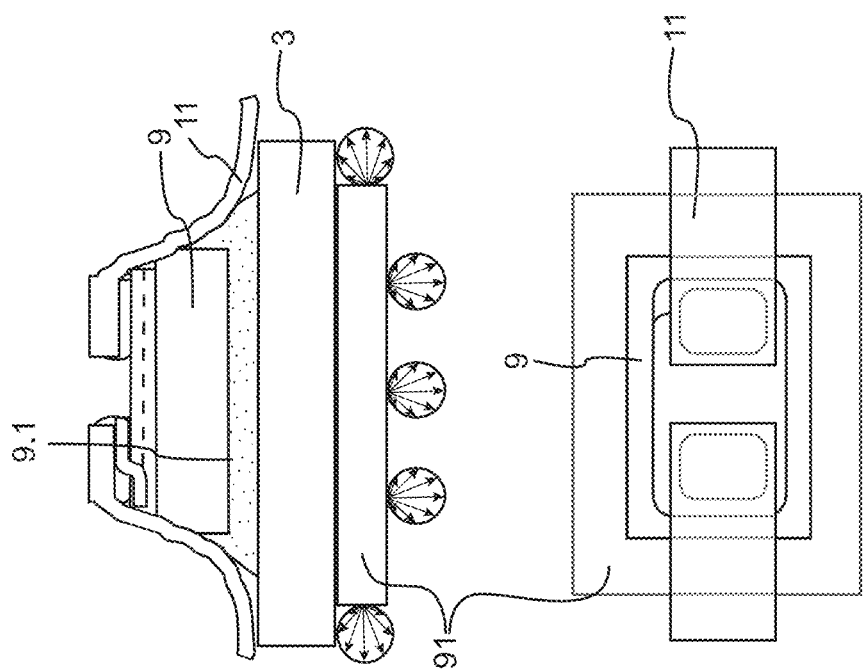
FIG. 60 shows a cross sectional view and a top view of another optoelectronic device in accordance with the present invention.

Referring now to FIG. 60, the optoelectronic device is according to the "chip first" arrangement. A light converter 91 is formed as a platelet being glued or directly printed onto the first layer 3 opposite to the optoelectronic light source and facing the top surface 9.1 of the optoelectronic light source. The platelet can comprise or consist of a matrix material as for example glass or silicone comprising light conversion particles.

The contact area between the first layer 3 and the light converter 91 can be roughened by for example laser light, to improve the coupling of light being emitted from the optoelectronic light sources into the light converter 91. However, any technique or material known from the prior art for coupling light being emitted from the optoelectronic light sources into the converter can be used such as for example scattering particles being arranged between the first layer 3 and the light converter 91.

As indicated by the small arrows in FIG. 60, the converted or at least partially converted light can be coupled out of a top surface of the light converter into a direction perpendicular to the top surface 9.1 of the optoelectronic light source as well as to the side surfaces of the light converter.

Figure 61:
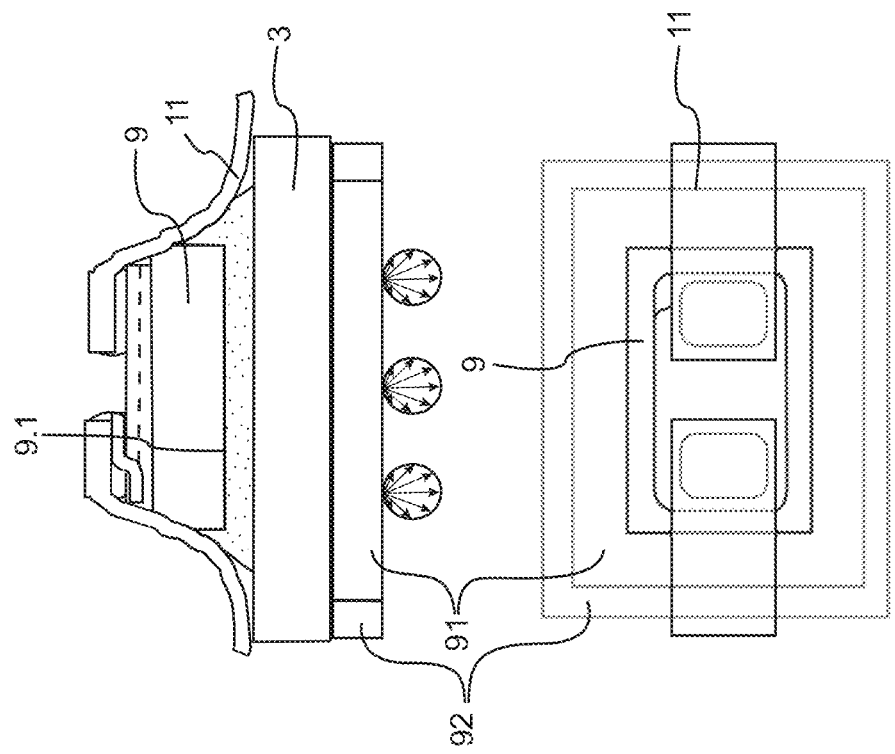
FIG. 61 shows a cross sectional view and a top view of another optoelectronic device in accordance with the present invention.

For a directional radiation of light being coupled out of the light converter 91, a light-blocker 92 can extend in a circumferential direction around the light converter 91, in particular forming a light blocking structure on the first layer 3, as shown in FIG. 61. In other words, the light converter 91 is surrounded by a light-blocker 92, in particular when seen in a view perpendicular to the top surface 9.1 of the optoelectronic light source 9. The light blocker 92 can for example comprise black light blocking particles to block light, being emitted from the optoelectronic light source 9 in desired areas in order to couple light out of the optoelectronic device preferably in a direction perpendicular to the top surface 9.1 of the optoelectronic light source 9, indicated by the small arrows in FIG. 61.

The width of the light-blocker 92, in particular the width in a circumferential direction surrounding the light converter 91, is in a preferred embodiment small, in particular such that it is invisible to the human eye. The width of the light-blocker 92 can in particular be dependent on the thickness of the first layer 3, wherein the thickness of the first layer is in particular the thickness in a direction perpendicular to the top surface 9.1 of the optoelectronic light source. The width of the light-blocker 92 as well as the material of the light blocker can in particular be chosen such as to obtain a transmittance of light through the light blocker of less than 10% and in particular less than 5%.

Figure 62:
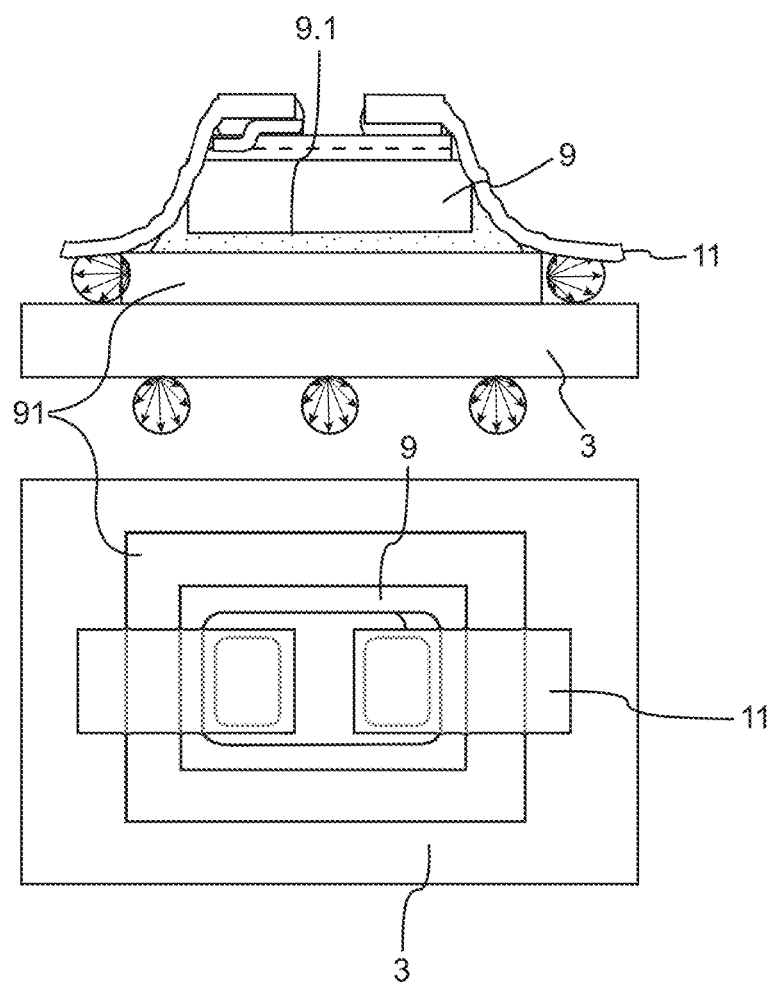
FIG. 62 shows a cross sectional view and a top view of another optoelectronic device in accordance with the present invention.

Referring now to FIG. 62, the light converter of FIG. 60, in particular formed as a platelet, is glued or directly printed onto the first layer 3 on the same sides as the optoelectronic light source and facing the top surface 9.1 of the optoelectronic light source 9. The optoelectronic light source 9 is glued onto the light converter according to the "chip first" arrangement shown in FIG. 57.

Figure 63:
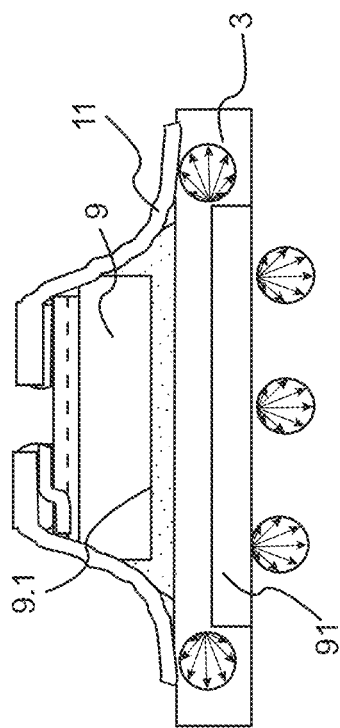
FIG. 63 shows a cross sectional view of another optoelectronic device in accordance with the present invention.
Figure 64:
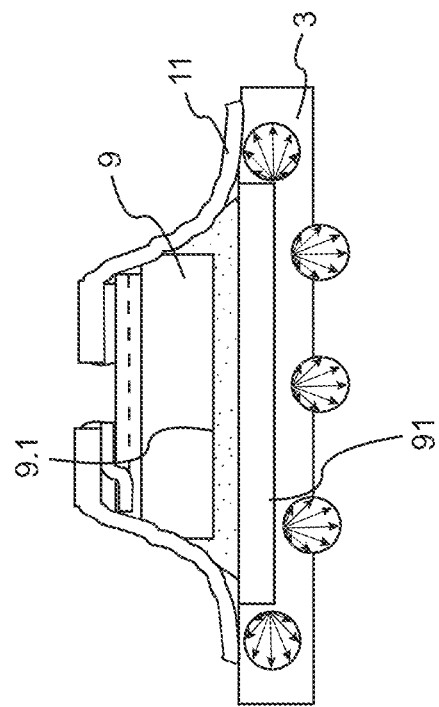
FIG. 64 shows a cross sectional view of another optoelectronic device in accordance with the present invention.

FIGS. 63 and 64 show a modification of the optoelectronic devices of FIGS. 60 and 62. The light converters 91 are according to FIGS. 63 and 64 embedded into the first layer, particularly completely embedded into the first layer such that an outer surface of the light converters and an outer surface of the first layer is arranged within the same plane. However, the light converters can also protrude the first layer or be set back therein.

As shown in FIG. 63, the light converter 91 is embedded into the first layer 3 on a side opposite to the associated optoelectronic light source 9 and faces the top surface 9.1 of the associated optoelectronic light source 9. Whereas, as shown in FIG. 64 the light converter 91 is embedded into the first layer 3 on the same side as the associated optoelectronic light source 9 is arranged on.

The light converters 91 can for example be embedded into the first layer by "hot embossing" the first layer and pressing the light converters into the first layer or by filling a resulting cavity 51 with the light converters 91. This can for example be expedient, to reduce the topology of the first layer 3 compared to gluing the light converters 91 onto the first layer 3.

Figure 65C:
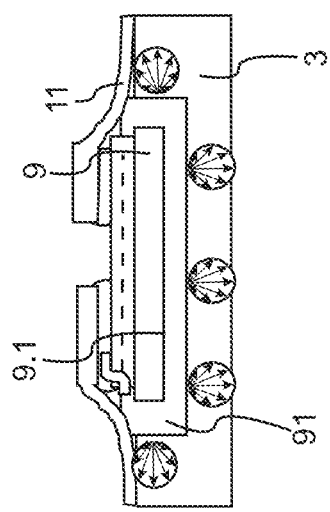
FIG. 65A to 65C show steps of a method of manufacturing an optoelectronic device in accordance with the present invention.
Figure 65B:
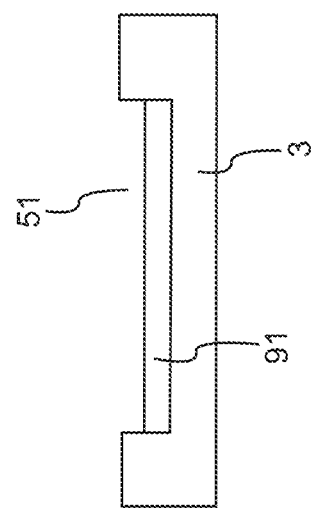
Figure 65A:
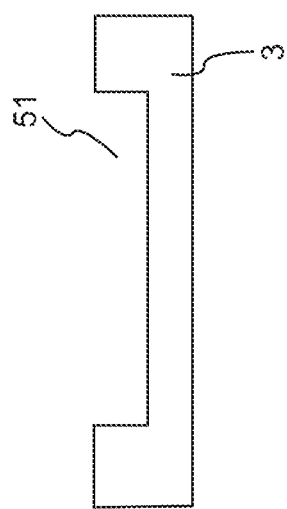

Such a process is for example illustrated in FIGS. 65A to 65C. Cavities 51 are formed into the first layer by for example a "hot embossing" process as shown in FIG. 65A. The cavities 51 are filled with an adhesive comprising conversion particles as shown in FIG. 65B and the optoelectronic light source 9 is subsequently pressed into the cavity 51 as shown in FIG. 65C such that not only the light converter 91 but also the optoelectronic light source 9 is embedded into the first layer 3. While pressing the optoelectronic light source into the cavity 51 the light converter is in an at least partially liquid state but is cured after the optoelectronic light source is positioned at a desired position. By pressing the optoelectronic light source into the cavity 51, the light converter 91 encloses the optoelectronic light source such that light being emitted from the optoelectronic light source is converted by the light converter 91.

Figure 66:
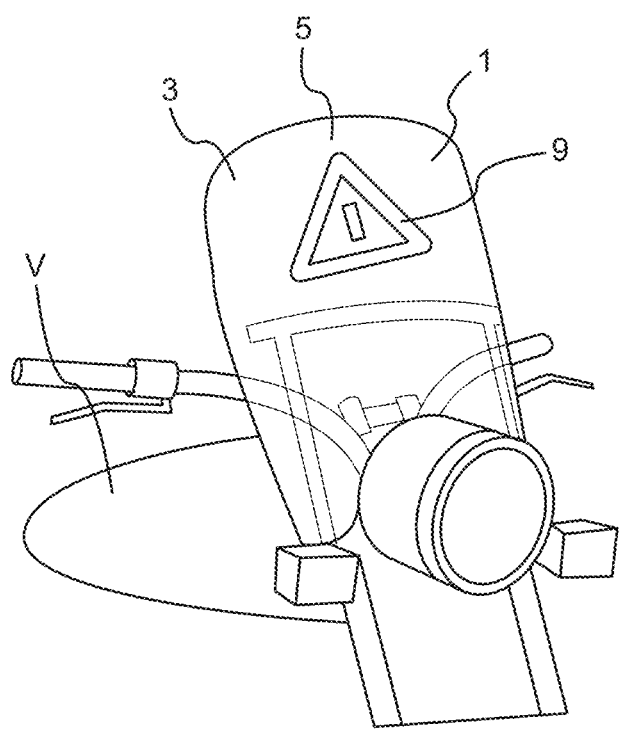
FIG. 66 shows an optoelectronic device in accordance with the present invention mounted onto a motorcycle.

FIG. 66 shows an optoelectronic device 1 mounted onto a motorcycle V. The optoelectronic device is a wind deflector and comprises optoelectronic light sources 9. The optoelectronic light sources 9 are arranged on a first layer 3 between a cover layer 5 and the first layer 3. The optoelectronic light sources 9 are arranged such that, in operation of the optoelectronic device, the optoelectronic light sources 9 form a symbol or an indicator. Exemplarily, a warning triangle is shown in the figure as a symbol. However, the optoelectronic light sources 9 can form various other symbols or indicators such as for example a navigation symbols, a daytime running light, position lights, an indicator for the charging level, speed indicator or many more status indicators or driving information.

Such various symbols or indicators are exemplarily shown in FIGS. 67 to 72.

FIG. 67 for example shows a navigation arrow being visible to a user of the optoelectronic device, particularly the user of a vehicle comprising the optoelectronic device, to guide the user to a desired location. However, the arrangement of optoelectronic light sources 9 is not limited to display an arrow to the right but can vary over time and display for example an arrow to the left or a vertical arrow.

In addition or as an alternative, the arrangement of optoelectronic light sources 9 can display a warning triangle, as shown in FIG. 68, to indicate for example an error message in accordance with a functional error of the optoelectronic device or the vehicle comprising the optoelectronic device. However, the triangle could also indicate for example an obstacle within the driving direction of the vehicle comprising the optoelectronic device.

FIG. 69A shows a top view of an optoelectronic device 1, wherein the arrangement of optoelectronic light sources 9 forms a daytime running light. FIG. 69B shows a cross sectional view through the optoelectronic device 1 shown in FIG. 69A along the line A-A. The optoelectronic device 1 further comprises a light-blocker 92 arranged on the first layer facing the optoelectronic light sources. The light-blocker is arranged on the first layer to block light emitted from the light sources to prevent blinding a user of the optoelectronic device. Thus, the light-blocker is arranged on the first layer within the line of sight L of the user between the user and the optoelectronic light sources. The line of sight L is indicated by the arrow from the left to the right through the optoelectronic device. In other words, the light-blocker is arranged on the first layer between a user of the optoelectronic device and the optoelectronic light sources to obtain, that light emitted from the optoelectronic light sources leaves the optoelectronic device not in a direction against the line of sight L of the user.

As shown in the two figures, the light blocker as well as the light sources are arranged along the whole outer edge of the optoelectronic device. Thus, on the one hand a large area for the daytime running light as well as a large transparent area in the center of the optoelectronic device can be provided to still allow the user of the optoelectronic device to look through it.

According to FIG. 70, the arrangement of optoelectronic light sources 9 displays a speed indicator and/or revolution indicator. It can thus be desired, that the indicators can vary quickly over time as speed and revolution of for example a vehicle comprising the optoelectronic device can vary very quickly.

FIG. 71 shows an optoelectronic device 1, wherein the arrangement of optoelectronic light sources 9 displays a charging level of for example a vehicle comprising the optoelectronic device.

FIG. 72 shows an optoelectronic device 1, wherein the arrangement of optoelectronic light sources 9 displays position lights of for example a boat. For such a use case, it can be desired, that the optoelectronic light sources 9 are volume emitters, as it can be desired that the position lights emit light into all compass directions such that the position lights can be seen from all directions.

Figure 73D:
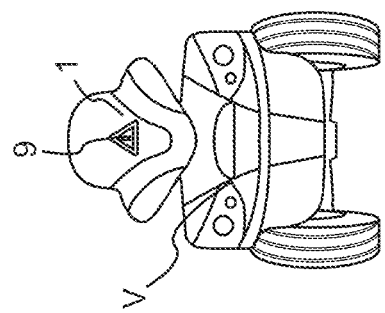
FIGS. 73A to 73E show embodiments of vehicles comprising an optoelectronic device in accordance with the present invention.
Figure 73C:
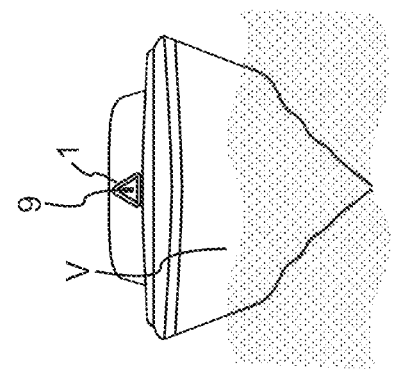
Figure 73E:
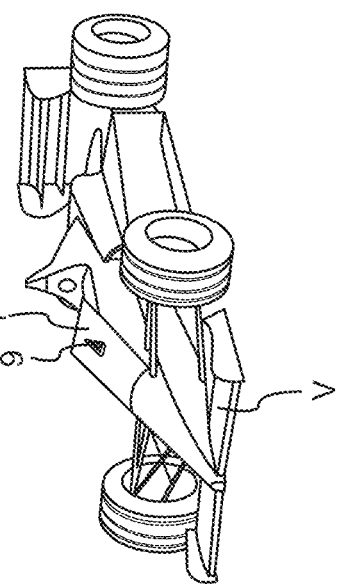
Figure 73B:
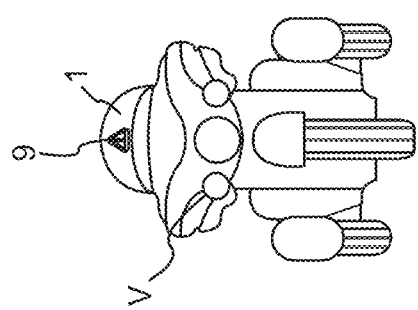
Figure 73A:
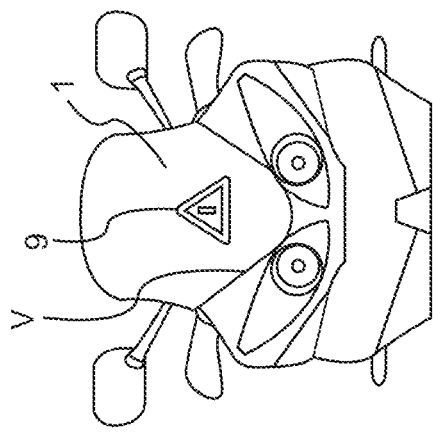

Referring now to FIGS. 73A to 73E, it is shown various embodiments of vehicles which comprise an optoelectronic device 1. As shown in FIG. 73A the vehicle can for example be a motorcycle, as shown in FIG. 73B the vehicle can be a water vessel, particularly a boat, as shown in FIG. 73C the vehicle can be a 3-wheeled motorcycle, as shown in FIG. 73D the vehicle can be a quad and as shown in FIG. 73E the vehicle can be an open top race car such as for example a formula one race car.

Figure 74:
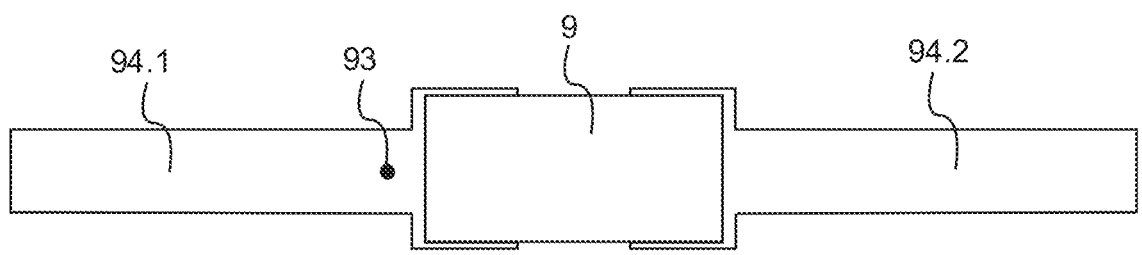
FIG. 74 shows a top view of a thermally conductive layer and an optoelectronic light source in accordance with the present invention.

FIG. 74 shows a top view of a thermally conductive layer 93 and an optoelectronic light source 9. The thermally conductive layer 93 is arranged between a first layer 3 and a cover layer of a layer stack 39, wherein the layer stack includes a carrier layer 7, the cover layer 5, and the first layer 3. The first layer 3 is in particular an intermediate layer, arranged between the cover layer 5 and the carrier layer 7. The optoelectronic light source 9 is arranged on the first layer 3. The formulation "is arranged on" means in this embodiment that the thermally conductive layer 93 can and respectively is arranged between the first layer and the optoelectronic light source. According to the figure, the thermally conductive layer 93 comprises two electric lines 94.1, 94.2, each being connected to a contact pad of the optoelectronic light source 9. The electric lines 94.1, 94.2 can be configured to transport heat, which is generated from the at least one optoelectronic light source 9, away from the at least one optoelectronic light source 9 as well as supply electric energy to the at least one optoelectronic light source 9. The width of the electric lines 94.1, 94.2 is at least half of the width of the optoelectronic light source 9, but can be increased to ensure a sufficient cooling of the at least one optoelectronic light source 9.

The electric lines 94.1, 94.2 can be of a good electrically and thermally conductive material such as a metal. To reduce the visibility of the usually reflective metals the at least one thermally conductive layer can comprises a coating, particularly a thin a copper, palladium or molybdenum coating.

Figure 75:
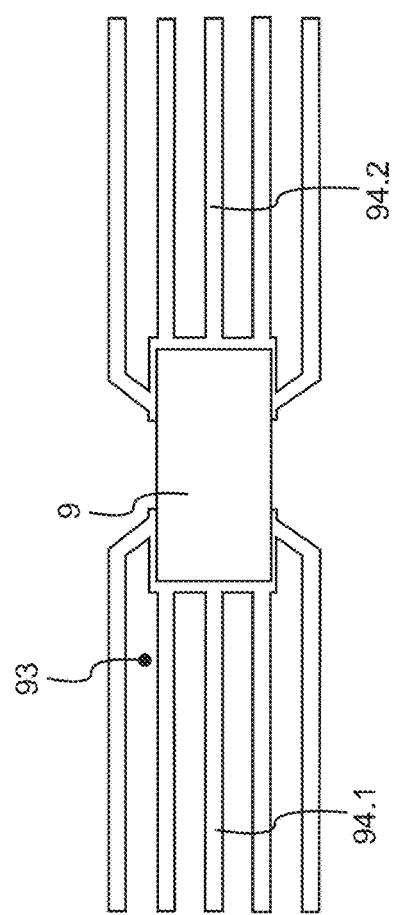
FIG. 75 shows a top view of another thermally conductive layer and an optoelectronic light source in accordance with the present invention.

FIG. 75 shows a top view of another thermally conductive layer 93 and an optoelectronic light source 9. In contrast to the thermally conductive layer 93 depicted in FIG. 74, the thermally conductive layer 93 comprises a first plurality of electric lines 94.1 and a second plurality of electric lines 94.2, wherein the first plurality of electric lines 94.1 is connected to a first contact pad of the optoelectronic light source 9 and the second plurality of electric lines 94.2 is connected to a second contact pad of the optoelectronic light source 9. Here each five electric lines exemplarily depict the first plurality and the second plurality of electric lines. The electric lines of the first plurality 94.1 and the electric lines of the second plurality 94.2 extend in parallel to each other at least in sections of the electric lines. The electric lines are in particular thin compared to the width of the optoelectronic light source. Here the electric lines can have a width of less than 50 μm.

Figure 76A:
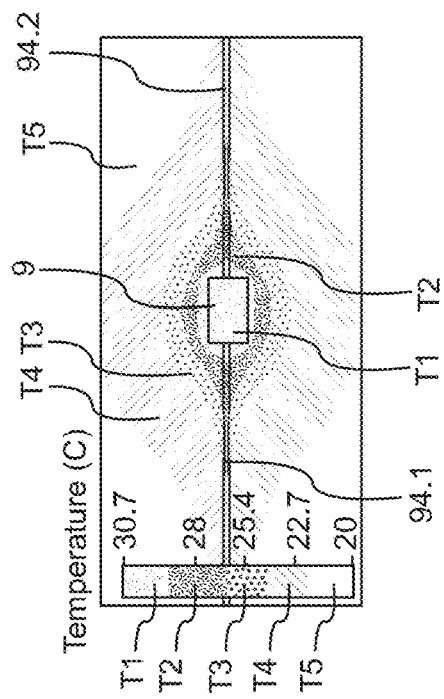
FIGS. 76A and 76B show top views of a thermal simulation of two thermally conductive layers and an optoelectronic light source.
Figure 76B:
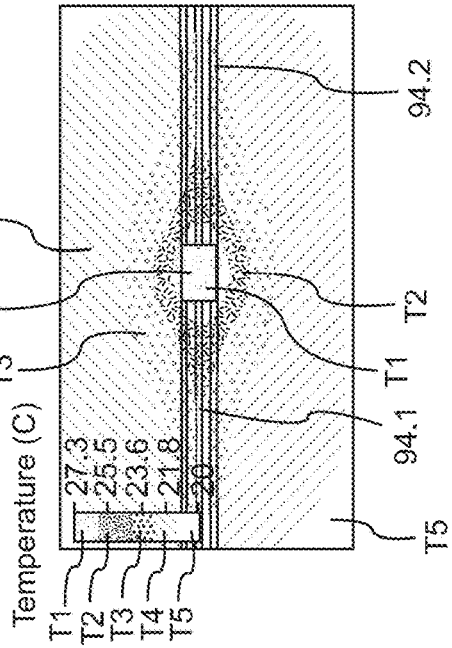

FIGS. 76A and 76B each show a top view of a thermal simulation of a thermally conductive layer 93 and an optoelectronic light source 9. The thermally conductive layer 93 in FIG. 76A comprises two electric lines 94.1, 94.2, each being connected to a contact pad of the optoelectronic light source 9, whereas the thermally conductive layer 93 in FIG. 76B comprises a first plurality of electric lines 94.1 and a second plurality of electric lines 94.2. The first plurality of electric lines 94.1 is connected to a first contact pad of the optoelectronic light source 9 and the second plurality of electric lines 94.2 is connected to a second contact pad of the optoelectronic light source 9. Here each three electric lines exemplarily depict the first plurality and the second plurality of electric lines. The thickness of the electric lines is similar for all electric lines of the thermally conductive layer 93 shown in FIGS. 76A and 76B. As a result of the thermal simulation the temperature distribution within the optoelectronic device is shown, represented by the differently hatched areas T1 to T5, when the optoelectronic device is in operation and thus the optoelectronic light source is switched on. It can be seen from the two figures that the maximum temperature in the optoelectronic device is lower, particularly by 3.4° C., in FIG. 76B than in FIG. 76A. The maximum temperature in the optoelectronic device in FIG. 74A is 30.7° C. (see area T1) whereas the maximum temperature in the optoelectronic device in FIG. 76B is 27.3° C. (see area T1). Further to this, the temperature distributes in the optoelectronic device in FIG. 76B over a larger area than in the optoelectronic device in FIG. 76A. This can especially be seen from the areas T2 and T3 being larger in FIG. 76A than in FIG. 76B. This results from the two different designs of the thermally conductive layer 93 as the heat generated from the optoelectronic light source 9 is better transported away from the optoelectronic light source the more electric lines are connected to the optoelectronic light source.

Figure 77:
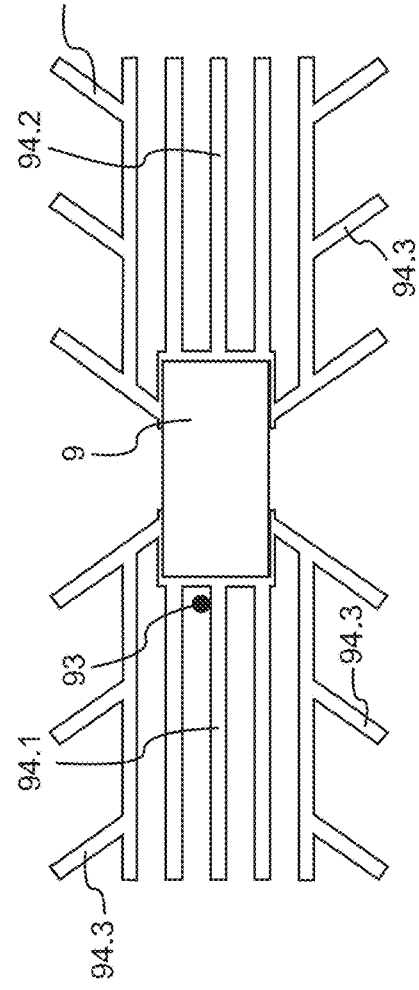
FIG. 77 shows a top view of another thermally conductive layer and an optoelectronic light source in accordance with the present invention.

FIG. 77 shows a top view of another thermally conductive layer 93 and an optoelectronic light source 9. In contrast to the thermally conductive layer 93 depicted in FIG. 75, the thermally conductive layer 93 comprises blind conduction paths 94.3. The blind conduction paths have a free end, which is not connected to either the optoelectronic light source 9 or a power supply. The blind conduction paths 94.3 can act as a heat spreader to transport heat, which is generated from the optoelectronic light source 9, away from the optoelectronic light source.

As shown in FIG. 77, a plurality of blind conduction paths 94.3 is connected to each of the external lines of the first and the second plurality of electric lines 94.1, 94.2. The blind conduction paths 94.3 particularly extend into a direction different to the direction in which the electric lines of the first plurality 94.1 and the electric lines of the second plurality 94.2 extend in parallel to each other. In the embodiment shown in the figure, the electric lines 94.1, 94.2 in combination with the plurality of blind conduction paths 94.3 forms a pattern that resembles a herringbone pattern. The blind conduction paths 94.3 can for example act as a heat spreader to transport heat, which is generated from the optoelectronic light source 9, away from the optoelectronic light source.

Figure 78:
FIG. 78 shows schematically a top view of a possible pattern of a thermally conductive layer in accordance with the present invention.

FIG. 78 shows schematically a microscopic image of a top view of a thermally conductive layer 93. The thermally conductive layer 93 comprises a thermally conductive mesh. The mesh has knots and interconnects between the knots, wherein, preferably, at least the majority of the interconnects are not interrupted. The mesh can have a regular or an irregular pattern, wherein an irregular pattern is shown in FIG. 78. An irregular pattern can increase the transparency of the thermally conductive layer as an irregular pattern can be more difficult to perceive by the human eye.

Figure 79A:
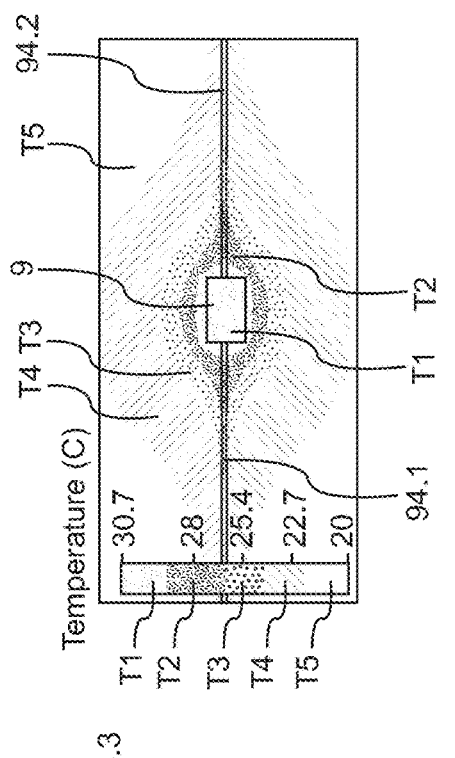
FIGS. 79A and 79B show top views of a thermal simulation of two thermally conductive layers and an optoelectronic light source.
Figure 79B:
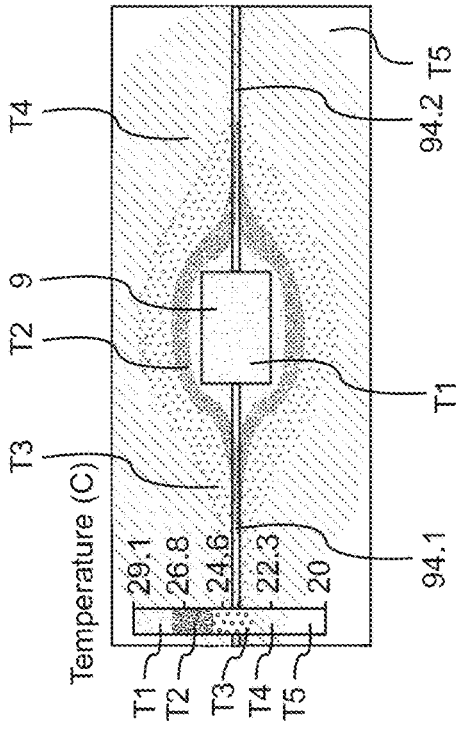

FIGS. 79A and 79B each show a top view of a thermal simulation of a thermally conductive layer 93 and an optoelectronic light source 9. The thermally conductive layer 93 in FIG. 79A comprises two electric lines 94.1, 94.2, each being connected to a contact pad of the optoelectronic light source 9. The thermally conductive layer 93 in FIG. 79B further comprises blind conduction paths 94.3 or is of a regular or irregular mesh (not shown in the figure) such that the thermally conductive layer 93 covers at least approximately 5-20% of a surface area of the first layer 3 on which the thermally conductive layer 93 is arranged. As a result of the thermal simulation the temperature distribution within the optoelectronic device is shown, represented by the differently hatched areas T1 to T5, when the optoelectronic device is in operation and thus the optoelectronic light source is switched on. It can be seen from the two figures that the maximum temperature in the optoelectronic device is lower, particularly by 1.8° C., in FIG. 79B than in FIG. 79A. The maximum temperature in the optoelectronic device in FIG. 79A is 30.7° C. (see area T1) whereas the maximum temperature in the optoelectronic device in FIG. 79B is 29.1° C. (see area T1). This results from the two different designs of the thermally conductive layer 93 as the heat generated from the optoelectronic light source 9 is better transported away from the optoelectronic light source the larger the surface area of the first layer is, which is covered by the thermally conductive layer 93.

Figure 80:
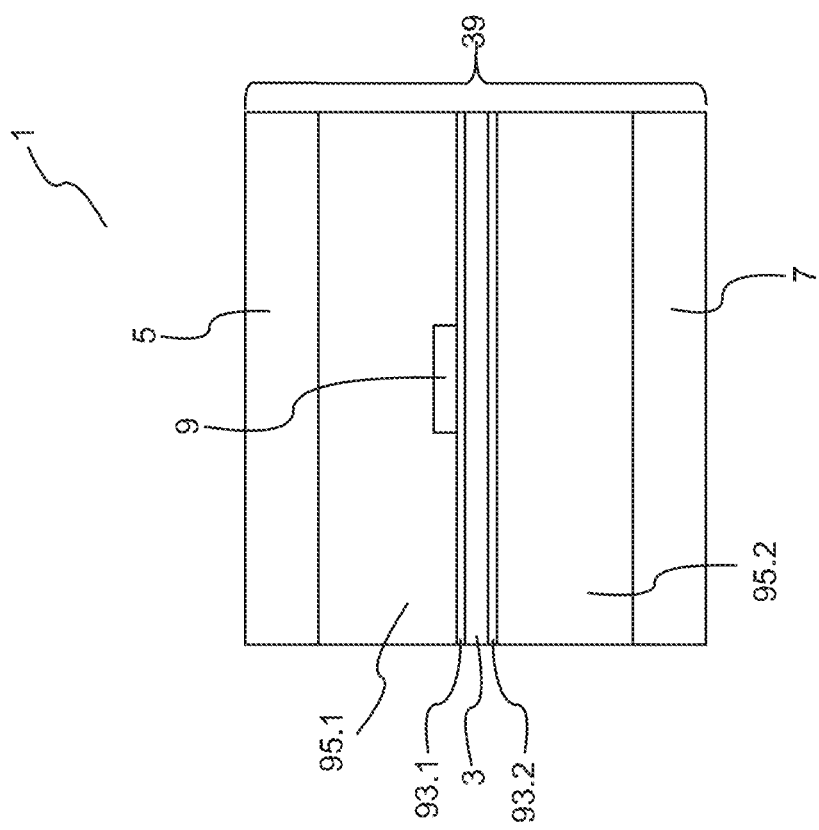
FIG. 80 shows a cross sectional view of a optoelectronic device in accordance with the present invention.

FIG. 80 shows a cross sectional view of an optoelectronic device 1. The optoelectronic device 1 comprises a layer stack 39, which includes a carrier layer 7, a cover layer 5, and a first layer 3. The first layer 3 is an intermediate layer arranged between the cover layer 5 and the carrier layer 7. The layer stack 39 further includes a first auxiliary layer 95.1 arranged between the first layer 3 and the cover layer 5 as well as a second auxiliary layer 95.2 arranged between the first layer 3 and the carrier layer 7. At least one optoelectronic light source 9 is arranged on the first layer 3. In the embodiment shown, only one optoelectronic light source 9 is exemplarily arranged on the first layer 3. A first thermally conductive layer 93.1 is arranged between the optoelectronic light source 9 and the first layer 3, particularly on the same side of the first layer 3 as the optoelectronic light source 9. The first thermally conductive layer 93.1 comprises two electric lines, each electric line being connected to a respective contact pad of the optoelectronic light source 9. The first thermally conductive layer 93.1 is particularly configured to transport heat, which is generated from the optoelectronic light source 9, away from the optoelectronic light source 9 as well as supply electric energy to the optoelectronic light source 9.

The optoelectronic device 1 shown in FIG. 80 further comprises a second thermally conductive layer 93.2, which is arranged on the first layer 3 on a side of the first layer 3 opposite to the optoelectronic light source 9. The second thermally conductive layer 93.2 is particularly configured to transport heat, which is generated from the optoelectronic light source 9, away from the optoelectronic light source 9, but is not electrically connected to the optoelectronic light source 9.

Figure 81:
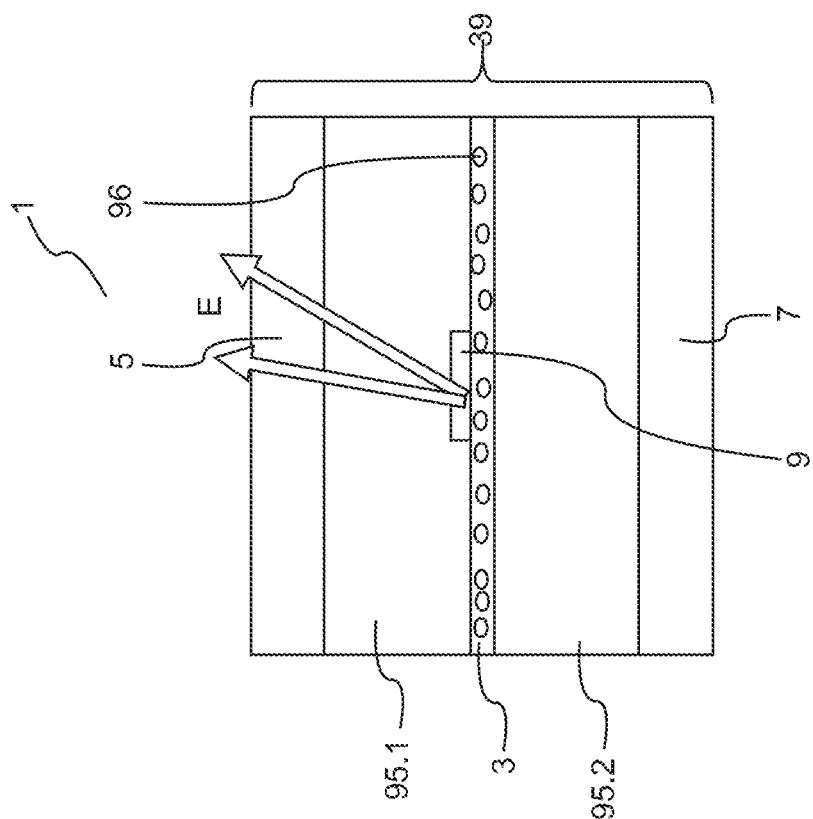
FIGS. 81 to 87 show cross sectional views of embodiments of optoelectronic devices in accordance with the present invention.
Figure 83:
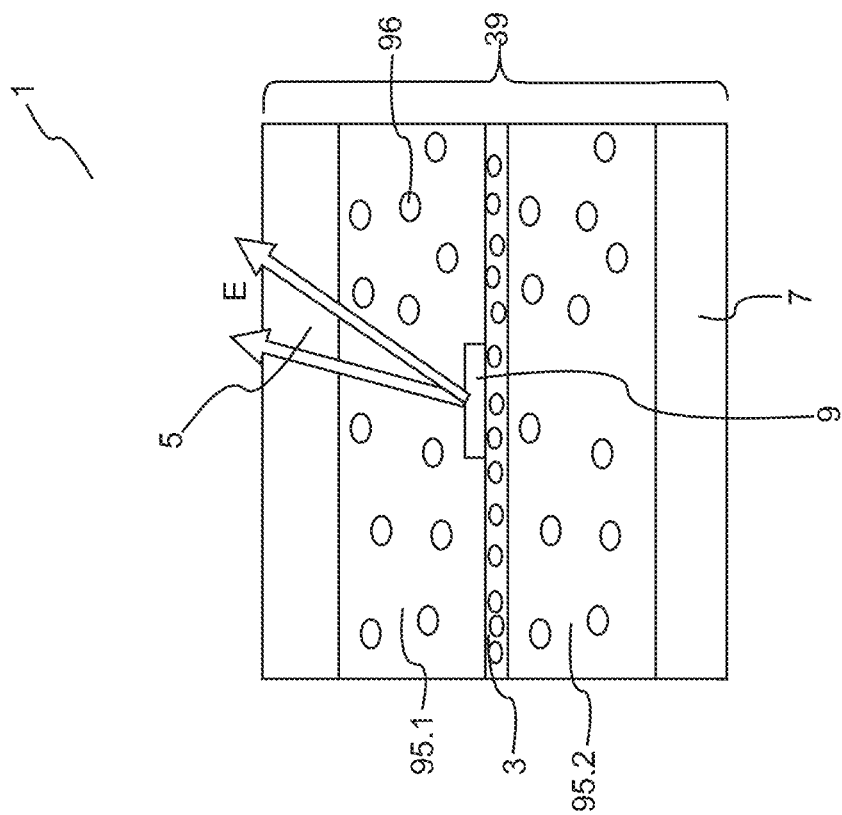
Figure 82:
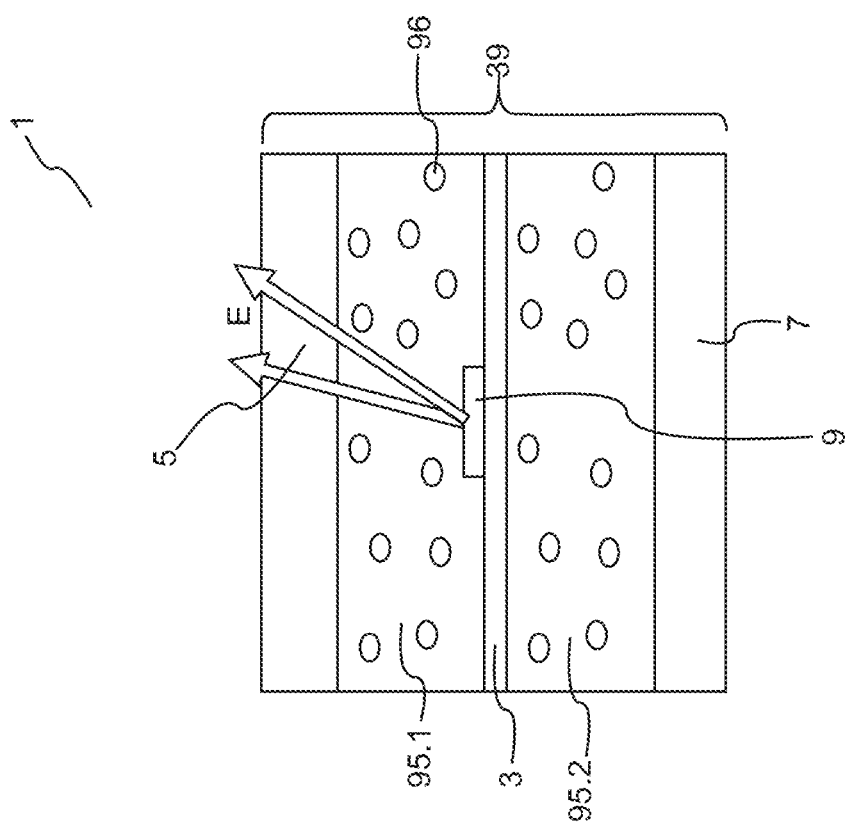

FIGS. 81 to 83 show cross sectional views of further embodiments of an optoelectronic device 1. In contrast to the optoelectronic device 1 shown in FIG. 80, the optoelectronic device 1 does not comprise a specific thermally conductive layer 93, but electric lines (not shown) to electrically connect the optoelectronic light source 9. In addition to the earlier figure, a main emitting direction E of the optoelectronic light source is depicted in the figures.

The optoelectronic device 1 of FIG. 81 further comprises particles 96 with a high thermal conductivity being arranged in the first layer 3. The optoelectronic device 1 shown in FIG. 82 comprises particles 96 with a high thermal conductivity being arranged in the first auxiliary layer 95.1 and the second auxiliary layer 95.2 but not in the first layer 3. And the optoelectronic device 1 shown in FIG. 83 comprises particles 96 with a high thermal conductivity being arranged in the first auxiliary layer 95.1, the second auxiliary layer 95.2 and in the first layer 3.

The particles 96 and particularly the layer(s) comprising the particles 96 can be configured to transport heat, which is generated from the optoelectronic light source 9, away from the optoelectronic light source 9. The density and the material of the particles 96 are in particular chosen, such that on the one hand enough heat is transported away from the optoelectronic light source 9 and on the other hand a desired transparency of the first and second auxiliary layer 95.1, 95.2 and/or the first layer 3 is maintained.

Figure 84:
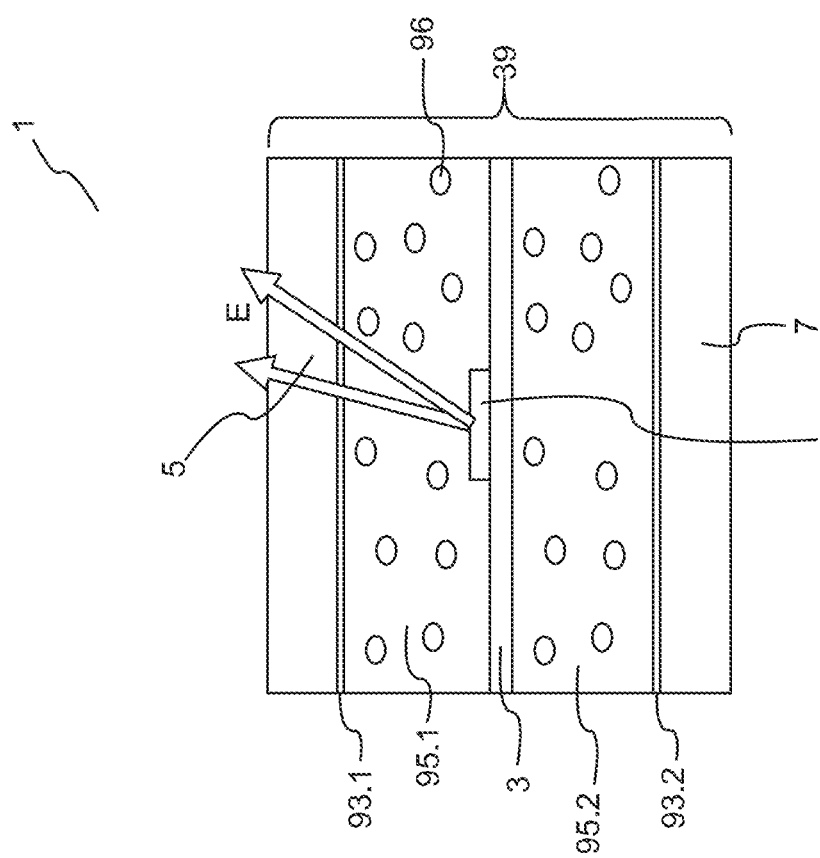

FIG. 84 shows cross sectional views of a further embodiment of an optoelectronic device 1. In addition to the optoelectronic device 1 shown in FIG. 82, the optoelectronic device 1 further comprises a first thermally conductive layer 93.1, which is arranged between the cover layer 5 and the first auxiliary layer 95.1 and a second thermally conductive layer 93.2, which is arranged between the carrier layer 7 and the second auxiliary layer 95.2. The first and the second thermally conductive layer 93.1, 93.2 are particularly configured to transport heat, which is generated from the optoelectronic light source 9, away from the optoelectronic light source 9, but are not electrically connected to the optoelectronic light source 9. In particular, heat, which is generated from the optoelectronic light source 9, propagates through the first and second auxiliary layer 95.1, 95.2—comprising particles 96 with a high thermal conductivity—into the first and second thermally conductive layer 93.1, 93.2 and is thus transported away from the optoelectronic light source 9.

Figure 85:
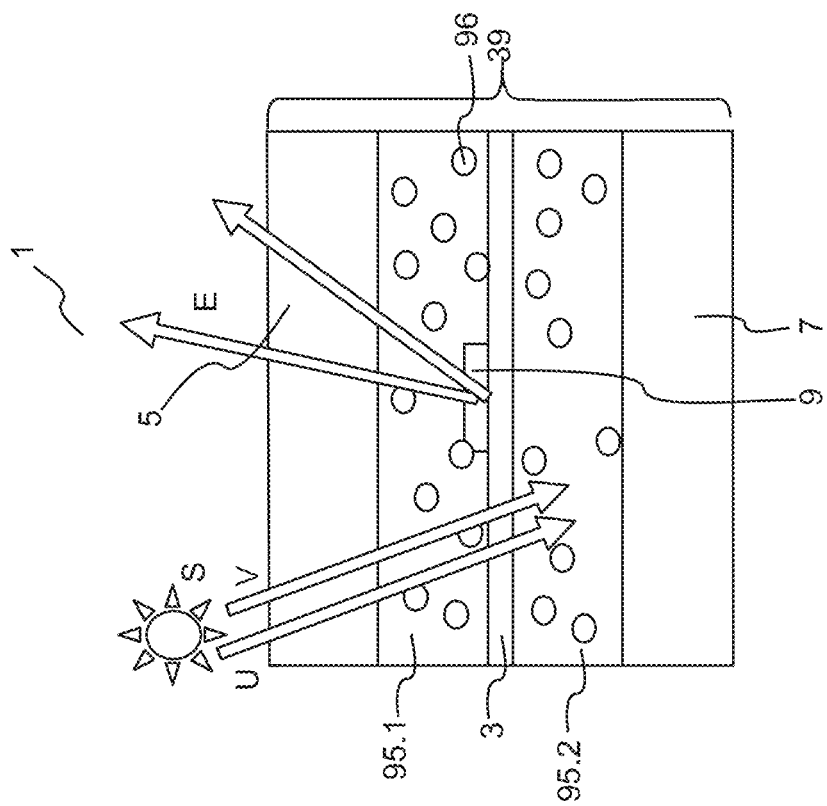

The second auxiliary layer 95.2 of the optoelectronic device 1 shown in FIG. 85 is in contrast to the optoelectronic device shown in FIG. 82. tinted. This can be advantageous, as the particles 96 with a high thermal conductivity as well as electric lines (not shown) to electrically connect the optoelectronic light source 9 can be less visible to the human eye when seeing through the optoelectronic device 1. However, light, entering the optoelectronic device 1 from the outside, as for example light of the sun S, can additionally heat up the optoelectronic device and particularly heat up the tinted layer, as the light gets absorbed by the tinted second auxiliary layer 95.2.

Figure 86:
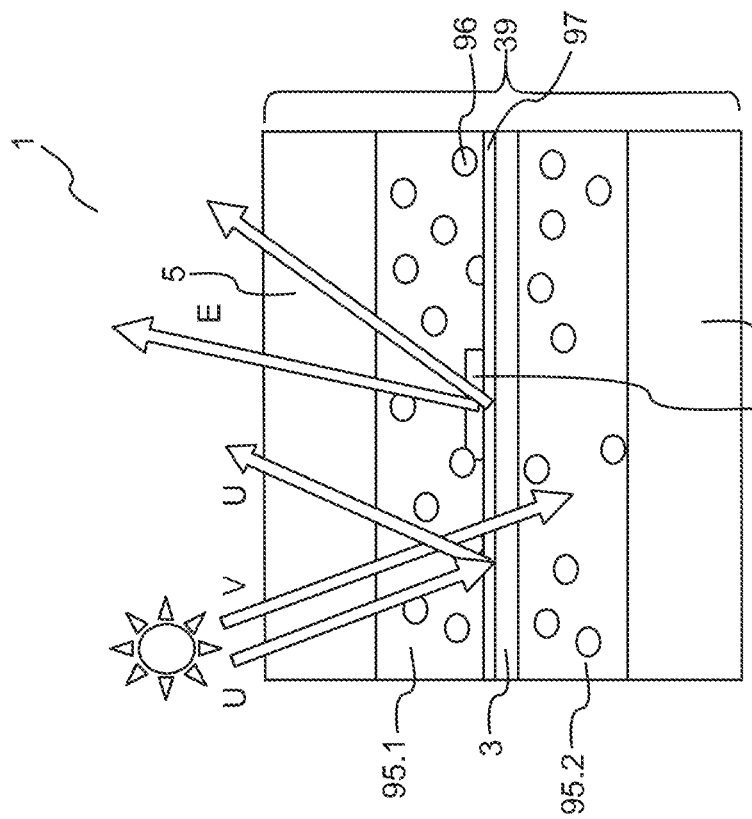

Therefore, as shown in FIG. 86, the optoelectronic device 1 further comprises a reflective layer 97 arranged between the first layer 3 and the optoelectronic light source 9. The reflective layer 97 is thus arranged between the optoelectronic light source and the tinted second auxiliary layer 95.2 is in particular not arranged within the main emitting direction E of the optoelectronic light source 9. The reflective layer 97 is configured to reflect light in the ultraviolet spectrum U but is permeable to light in the visible spectrum V. Thus, the tinted second auxiliary layer 95.2 is not heated up by light in the ultraviolet spectrum U entering the optoelectronic device 1 from the outside.

Figure 87:
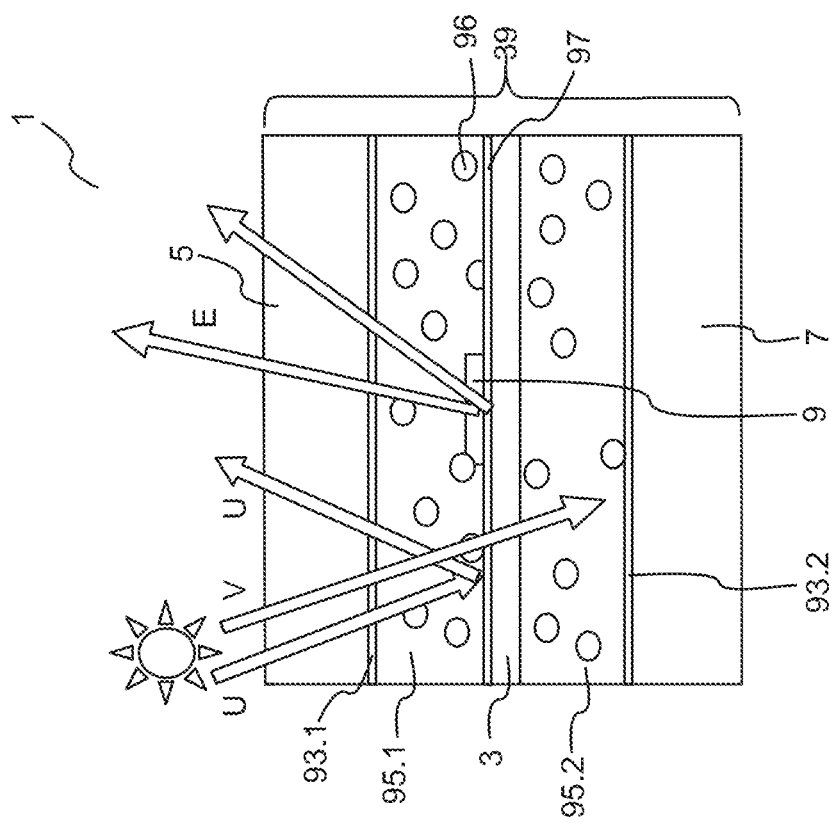

In addition to this, the optoelectronic device 1 can further comprise a first thermally conductive layer 93.1, which is arranged between the cover layer 5 and the first auxiliary layer 95.1 and a second thermally conductive layer 93.2, which is arranged between the carrier layer 7 and the second auxiliary layer 95.2 (see FIG. 87). The first and the second thermally conductive layer 93.1, 93.2 are particularly configured to transport heat, which is generated from the optoelectronic light source 9, away from the optoelectronic light source 9, but are not electrically connected to the optoelectronic light source 9. In particular, heat, which is generated from the optoelectronic light source 9, propagates through the first and second auxiliary layer 95.1, 95.2—comprising particles 96 with a high thermal conductivity—into the first and second thermally conductive layer 93.1, 93.2 and is thus transported away from the optoelectronic light source 9. The first and second thermally conductive layer 93.1, 93.2 are in particular a coating, particularly a carbon nanotube (CNT), graphene or a indium tin oxide (ITO) coating.

Figure 88B:
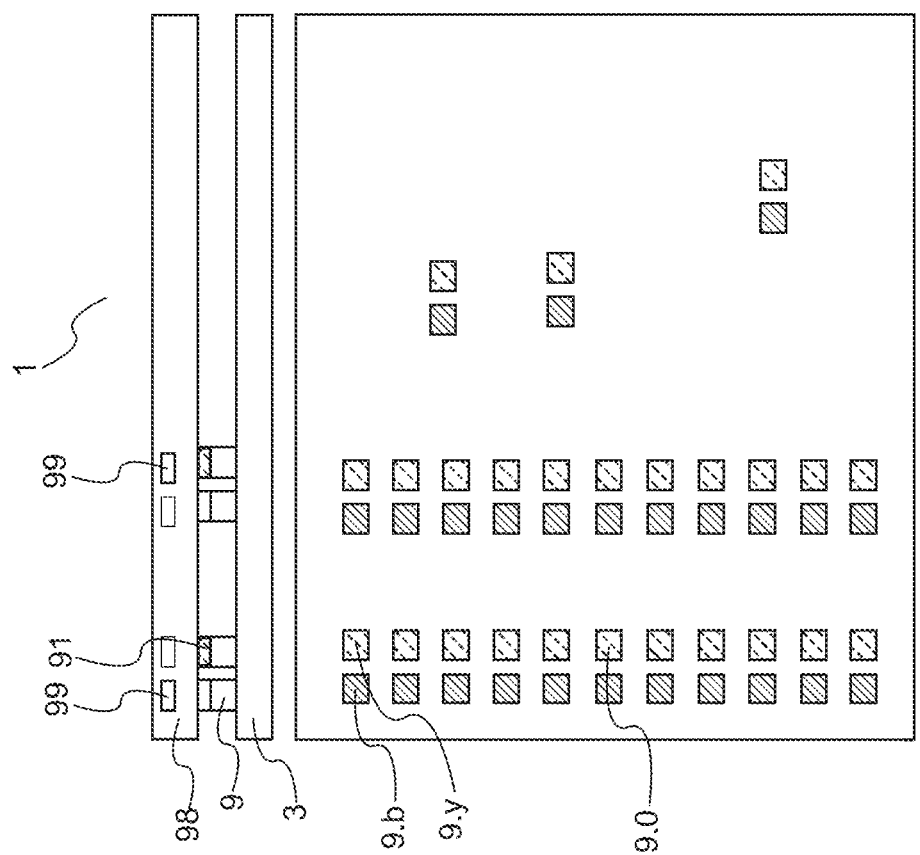
FIG. 88B shows a top and a cross sectional view of another embodiment of an optoelectronic device in accordance with the present invention.
Figure 88A:
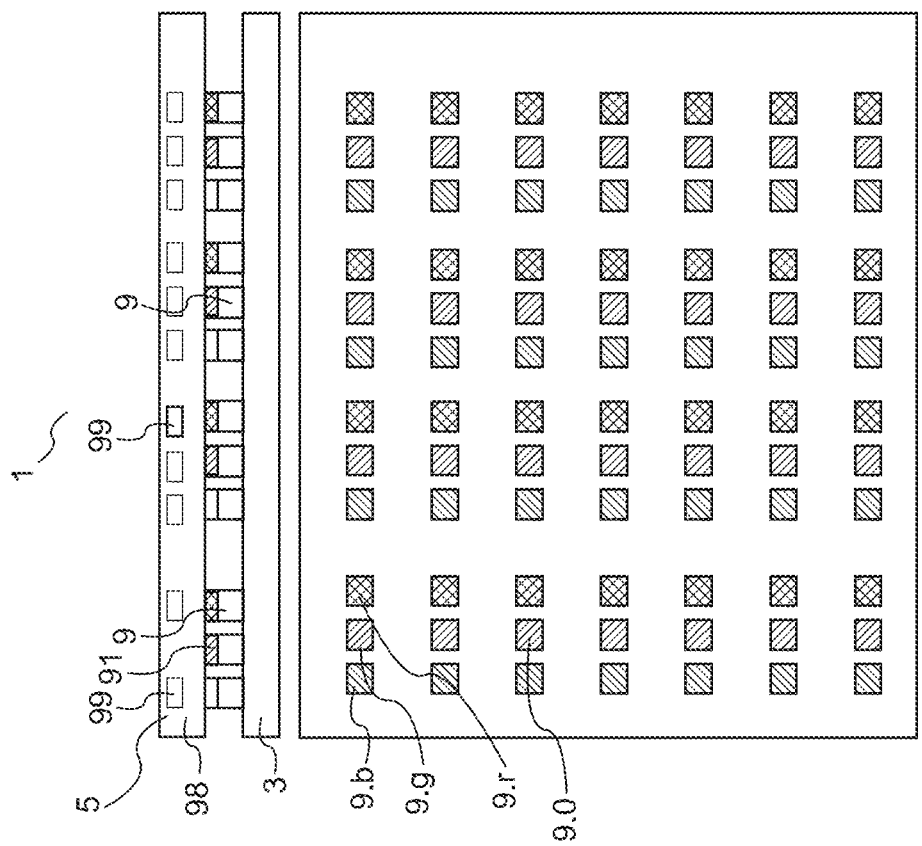
FIG. 88A shows a top and a cross sectional view of an embodiment of an optoelectronic device in accordance with the present invention.

FIG. 88A shows a top and a cross sectional view of an optoelectronic device 1. The optoelectronic device comprises a plurality of optoelectronic light sources 9 on a first layer 3. The optoelectronic light sources 9 are arranged on the first layer 3 in a matrix, each three optoelectronic light sources 9.r, 9.g, 9.b are forming a pixel. Here the optoelectronic light sources are forming a so called "RGB-pixel", wherein each one of the three optoelectronic light sources can emit light of one of the colours red green and blue. The optoelectronic light sources 9 can however be arranged in any other way as for example in a regular or an irregular pattern or to form any kind of symbol or indicator.

At least one and preferably all optoelectronic light sources 9 comprise a light converter 91, which is arranged above the optoelectronic light sources 9. Each light converter can for example be configured to convert light of a first wavelength emitted by the associated optoelectronic light source into light of a second wavelength, wherein the first wavelength is different to the second wavelength, in particular the first wavelength is smaller than the second wavelength. By use of different light converters, the optoelectronic light sources can emit light of various colors as for example red, green and blue to form the RGB-pixel.

The optoelectronic device 1 further comprises a second layer 98, which is arranged above the optoelectronic light sources 9 opposite to the first layer 3. Here the second layer 98 correlates to a cover layer 5 of the optoelectronic device 1. The second layer comprises a plurality of light scattering structures 99. Each light scattering structure 99 is associated to one optoelectronic light source and is individually designed in dependence on an operational parameter of the associated optoelectronic light source. Here, all optoelectronic light sources of the plurality of optoelectronic light sources 9, besides one optoelectronic light source 9.0, are associated with a light scattering structure 99. The optoelectronic light source 9.0 is in particular the darkest optoelectronic light source of the plurality of optoelectronic light sources 9 when the optoelectronic light sources are turned on.

In some embodiments, the darkest and the brightest optoelectronic light source can be considered. A difference between the brightness of the darkest and the brightest optoelectronic light source can be an indicator whether a change of the brightness of the brightest optoelectronic light source towards the darkest optoelectronic light is achievable.

In some embodiments, the optoelectronic light source 9.0 is the selected optoelectronic light source, providing for example green light, having a specific color value. The light scattering structures of the other green optoelectronic light sources 9.*g* can then be configured such that their color values are shifted to respective color values that are within a desired range with regard to the specific color value provided by the selected optoelectronic light source 9.0.

The light scattering structures 99 are arranged in the second layer 98 and particularly completely embedded in the second layer 98. The second layer 98 is particularly a solid layer and the light scattering structures 99 are floating within this solid layer. The light scattering structures 99 are individually designed and particularly individually produced within the second layer by use of laser light. A laser beam is writing in the second layer forming scattering centres and thus forming the light scattering structures. The resulting light scattering structures are arranged in the second layer in a common plane, but are spaced apart from each other.

By use of the light scattering structures 99, the brightness of the light from each optoelectronic light source, but not the darkest optoelectronic light source, being emitted from the optoelectronic device can be reduced to increase the homogeneity of the optoelectronic device.

FIG. 88B shows a top and a cross sectional view of another optoelectronic device 1. The optoelectronic device in FIG. 88B comprises compared to the optoelectronic device in FIG. 88A optoelectronic light sources 9 being arranged on the first layer 3 in a matrix, wherein each two optoelectronic light sources 9.*b*, 9.*y* are forming a pixel. Here the optoelectronic light sources are forming a pixel which is configured to emit white light. Therefore each one of the two optoelectronic light sources can emit light of one of the colors blue and yellow which mixed together results in white light.

As seen in the figure, a first portion of the plurality of optoelectronic light sources 9 is arranged in a matrix, whereas a second portion of the plurality of optoelectronic light sources 9 is arranged in an irregular pattern.

Figure 89:
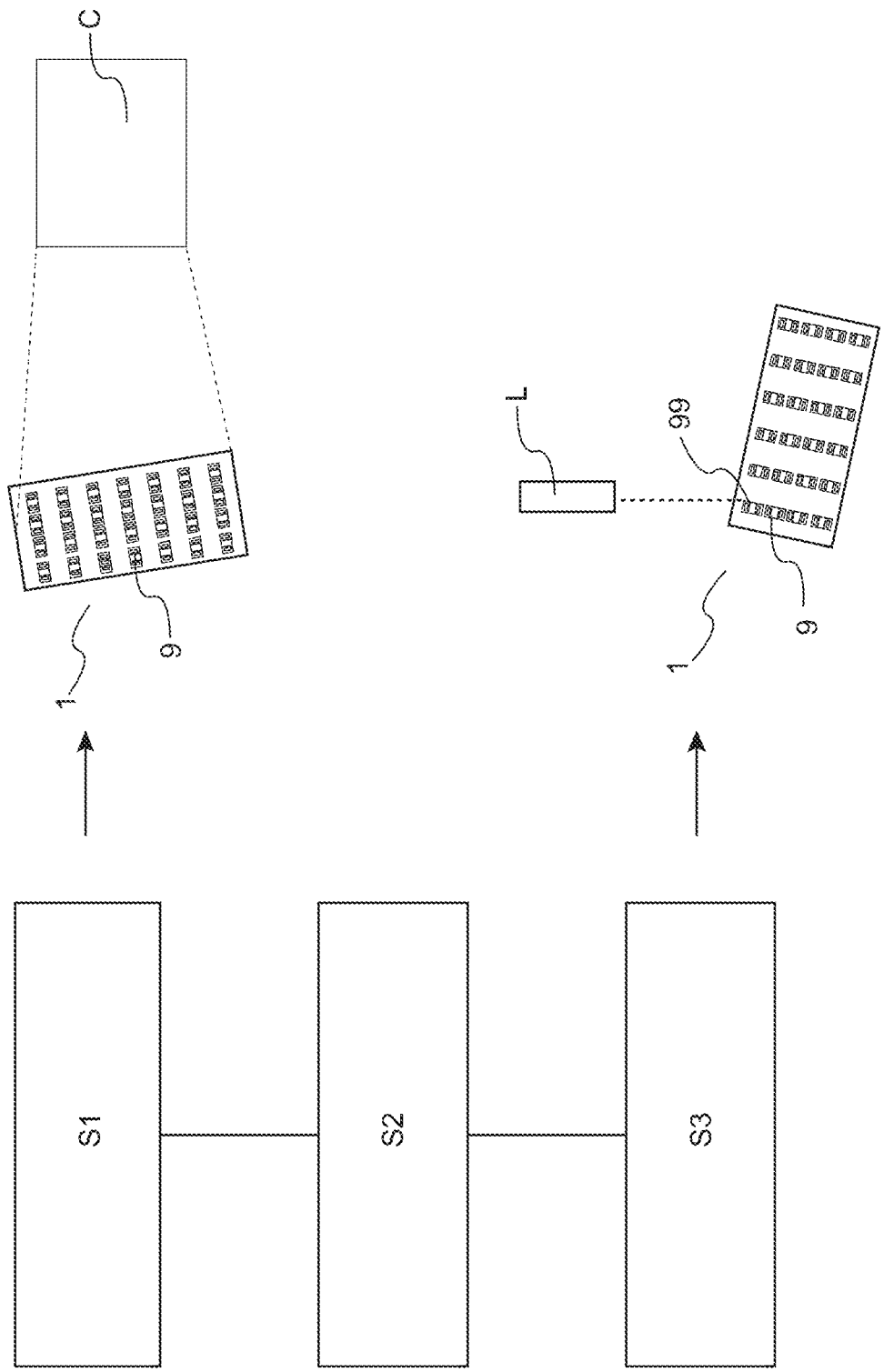
FIG. 89 shows steps of a method of manufacturing an optoelectronic device in accordance with the present invention.

FIG. 89 shows steps of a method of manufacturing an optoelectronic device 1. In a first step S1, a plurality of optoelectronic light sources 9 being arranged between a first layer 3 and a second layer 98 are provided and a value of an operational parameter for each optoelectronic light source is determined. The optoelectronic device 1 is therefore turned on, such that the plurality of optoelectronic light sources emit light. While the optoelectronic device 1 is turned on, a picture of the optoelectronic device, in particular of a top view of the optoelectronic device, is taken by use of a camera C. On basis of the taken image, the value of the operational parameter for each optoelectronic light source is determined. Here, the operational parameter is for example the brightness of the light emitted from each optoelectronic light source.

In a following step S2, an optoelectronic light source having a value of the operational parameter that fulfils a predefined criterion is identified. Here, the darkest optoelectronic light source is identified. In addition to this, an individual design for a plurality of light scattering structures is calculated in dependence on the determined values of the brightness of the optoelectronic light sources, but not the darkest optoelectronic light source. The individual design of the light scattering structures is calculated to obtain a light scattering structure associated to a optoelectronic light sources, but not the darkest optoelectronic light source, to reduce their brightness to a value that corresponds to the brightness of the darkest optoelectronic light source.

In a third step S3 the calculated individual design of the light scattering structures 99 is produced in the second layer 98. By use of a laser L, a plurality of light scattering structures is produced in the second layer 98 above the plurality of optoelectronic light sources 9. Each light scattering structure is thereby associated with the optoelectronic light source for which the individual design of the light scattering structures has been calculated.

In the following, various devices and arrangements as well as methods for manufacturing, processing and operating are listed as Items again. The following items present various aspects and implementations of the proposed principles and concepts, which can be combined in different ways. Such combinations are not limited to those given below:

1. An optoelectronic device, in particular an at least semi-transparent pane (1) for example for a vehicle (V), comprises:

a cover layer (5), a carrier layer (7), an intermediate layer (3) between the cover layer (5) and the carrier layer (7), wherein at least one and preferably a plurality of optoelectronic light sources (9), in particular μLEDS, is arranged on at least one surface of the intermediate layer (3) and/or is at least partially embedded in the intermediate layer (3), wherein the intermediate layer (3) is adapted such that light (L) emitted by the optoelectronic light sources (9) at least partially spreads in and along the intermediate layer (3) and exits the intermediate layer (3) within and/or at a pre-set distance (D) to the respective optoelectronic light source (9) in a direction through the cover layer (5) and/or through the carrier layer (7).

2. The optoelectronic device according to item 1, characterized in that the light which spreads in and along the intermediate layer (3) exits the intermediate layer (3) within a preset angle of view (a), in particular almost perpendicular to the intermediate layer (3).

3. The optoelectronic device according to item 1 or 2, characterized in that
the intermediate layer (3) comprises or consists of a foil, which is laminated or fixed by an adhesive (12) at the cover layer (5) and/or at the carrier layer (7).

4. The optoelectronic device according to item 1, 2 or 3, the refractive index ($n_i$) of the intermediate layer (3) is larger than the refractive index ($n_j$) of material adjacent to the intermediate layer (3).

5. The optoelectronic device according to item 4, characterized in that
the refractive index ($n_i$) of the intermediate layer (3) is larger than the refractive index ($n_j$) of the cover layer (5) and of the carrier layer (7) or of an adhesive (12) covering the intermediate layer (3).

6. The optoelectronic device according to any one of the preceding items,
characterized in that
for light spreading and/or light extraction dispersive structures (13) and/or scattering structures and/or reflective structures (15) are arranged on at least one surface of the intermediate layer (3) and/or are at least partially embedded in the intermediate layer (3).

7. The optoelectronic device according to item 6, characterized in that
the dispersive or scattering structures (13) are diffusion and/or scattering centers (13a).

8. The optoelectronic device according to item 7, characterized in that
a diffusion concentration of the diffusion centers (13a) is pre-set such that the mean free path length of light is larger than the thickness of the intermediate layer (3).

9. The optoelectronic device according to item 6, 7 or 8, characterized in that
the dispersive or scattering structures (13) are formed in the intermediate layer (3) as transparent particles (13b), white particles (13c), holes, density modifications, or air bubbles, in particular comprising sizes smaller than the emitted light wavelengths, in particular around or smaller than 2 µm.

10. The optoelectronic device according to any one of items 6 to 9,
characterized in that
the dispersive or scattering structures (13) are formed at the intermediate layer (3) as structured areas, in particularly structured by stamping, printing and/or by applying laser light.

11. The optoelectronic device according to any one of the items 6 to 10,
characterized in that
the reflective structures (15) are formed close to a respective optoelectronic light source (9).

12. The optoelectronic device according to any one of the items 6 to 11,
characterized in that
the reflective structures (15) are formed at a surface of the cover layer (5) and/or at a surface of the carrier layer (7).

13. The optoelectronic device according to one of the items 6 to 12,
characterized in that
the reflective structures (15) are formed outside of the cover layer (5) and/or outside of the carrier layer (7).

14. The optoelectronic device according to any one of the items 6 to 13,
characterized in that
the reflective structures (15) are mirrors (15a) and/or metal coatings (15b) and/or dielectric coatings (15c).

15. The optoelectronic device according to any one of the items 6 to 14,
characterized in that
the reflective structures (15) directly cover at least one of the main surfaces of an optoelectronic light source (9).

16. The optoelectronic device according to any one of the preceding items,
characterized in that
the device comprises between the cover layer (5) and the intermediate layer (3) on the one hand and the carrier layer (7) on the other hand one or more additional combinations of a cover layer (5) and an intermediate layer (3).

17. The optoelectronic device according to item 16, characterized in that
the device comprises one or more further cover layers (5) and intermediate layer (3) combinations, wherein optoelectronic light sources (9) of each combination emits a selected colour, in particular at least one of red, green and blue.

18. The optoelectronic device according to item 16 or 17, characterized in that
light (L) emitted by each optoelectronic light source (9) at least partially spreads in and along the intermediate layer (3) and exits the intermediate layer (3) at a preset distance (D1, D2, D3) to the respective optoelectronic light source (9), wherein a dispersive or scattering structure (13), in particular with diffusion centers (13a), transparent particles (13b) and/or white particles (13c), is arranged on the inside of each intermediate layer (3).

19. The optoelectronic device according to item 18, characterized in that
the dispersive or scattering structures (13) form different two-dimensional indicator areas (17), in particular uniform symbols, colours and/or animations.

20. The optoelectronic device according to item 18 or 19, characterized in that
the dispersive structures (13) of the intermediate layers (3) are staggered along the intermediate layers (3).

21. The optoelectronic device according to any one of the preceding items,
characterized in that
for light spreading and/or light extraction a converter material (21) is integrated into the intermediate layer (s) (3).

22. The optoelectronic device according to any one of the preceding items,
characterized in that
the optoelectronic light sources (9) are smaller than 300 µm, in particular smaller than 150 µm.

23. The optoelectronic device according to any one of the preceding items,
characterized in that the optoelectronic light sources (9) are LED-chips or PLED-chips or packaged LED-chips or packaged PLED-chips.

24. The optoelectronic device according to any one of the preceding items,
characterized in that
the device includes electrical conductor paths (11) which are made of at least one transparent material and/or which comprise widths smaller than 300 µm, in particular smaller than 150 µm.

25. The optoelectronic device according to any one of the preceding items,
characterized in that
the device is a vehicle window, a cover of a vehicle lamp, a cover of a vehicle signal light, a mirror glass or an element of a car body lighting.

26. The optoelectronic device according to any one of the preceding items,
characterized in that
the cover layer (5) and/or the carrier layer (7) and/or the intermediate layer (3) is made of glass or another transparent material, for example, methacrylate (PMMA) or polycarbonate (PC) or polyvinyl butyral (PVB) or polyvinyl acetate (PVA) or polyethylene terephthalate (PET).

27. A method of manufacturing of an optoelectronic device, in particular an at least semi-transparent pane (1), in particular in accordance with any one of the preceding items, the method comprising:
arranging (S1) at least one and preferably a plurality of optoelectronic light sources (9), in particular LEDs, on at least one surface of an intermediate layer (3) and/or at least partially embedding the at least one and preferably the plurality of optoelectronic light sources (9) in the intermediate layer (3),
arranging (S2) the intermediate layer (3) between a cover layer (5) and a carrier layer (7).

28. An optoelectronic device (1), in particular an at least partially transparent pane for example of a vehicle (V), comprising:
a first layer (3), in particular an intermediate layer arranged between a cover layer and a carrier layer, at least one electronic or optoelectronic component (9), which is at least partially or completely embedded in the first layer (3),
at least one structured conductor layer (11),
wherein a first portion (11.1) of the conductor layer (11) is arranged on an upper surface (3.1) of the first layer (3), and a second portion (11.2) of the conductor layer (11) is arranged on a top surface (9.1) of the electronic or optoelectronic component (9) and is in contact with an electric contact (18) of the electronic or optoelectronic component (9),
wherein the electric contact (18), in particular a contact pad, is arranged on the top surface (9.1),
wherein a boundary region (19) is located between the top surface (9.1) of the electronic or optoelectronic component (9) and the adjacent upper surface (3.1) of the first layer (3), and
wherein an intermediate portion (11.3) of the conductor layer (11) extends across the boundary region (19) and interconnects the first portion (11.1) of the conductor layer (11) and the second portion (11.2) of the conductor layer (11).

29. The optoelectronic device according to item 28,
characterized in that
the first layer (3), in particular the intermediate layer, is at least partially transparent, and
wherein, optionally, the intermediate layer is arranged between a cover layer and a carrier layer, at least one of the cover layer and the carrier layer being at least partially transparent.

30. The optoelectronic device according to item 28 or 29,
characterized in that
the at least one electronic or optoelectronic component (9) is completely embedded into the first layer (3) such that the top surface (9.1) of the electronic or optoelectronic component (9) is arranged in a plane (20) that extends through the upper surface (3.1) of the first layer (3).

31. The optoelectronic device according to item 28 or 29,
characterized in that
the at least one electric or optoelectronic component (9) is partially embedded into the first layer (3) such that the top surface (9.1) of the electronic or optoelectronic component (9) protrudes the upper surface (3.1) of the first layer (3) by a height (H),
wherein, preferably, the height (H) is equal to or smaller than a third of the thickness (t) of the electronic or optoelectronic component (9).

32. The optoelectronic device according to any one of the items 28 to 31,
characterized in that
the boundary region (19) comprises a gap (21) between a shell surface (9.2) of the electronic or optoelectronic component (9) and a side surface of the first layer (3.2), wherein the side surface (3.2) faces the shell surface (9.2),
wherein, preferably, the gap (21) extends in a circumferential direction around the electronic or optoelectronic component (9) around the shell surface (9.2).

33. The optoelectronic device according to item 32,
characterized in that
the gap (21) has a conical cross section.

34. The optoelectronic device according to item 32 or 33,
characterized in that
the gap (21) has a width of less than 10-15 μm.

35. The optoelectronic device according to any one of the items 32 to 34,
characterized in that
the gap (21) is filled with a filler material (22), in particular with an adhesive, and optionally comprises an accumulation of the filler material (22) above a plane that extends through the upper surface (3.1) of the first layer (3).

36. The optoelectronic device according to any one of the items 28 to 35,
characterized in that
a dielectric layer (23) is arranged between the structured conductor layer (11) and the first layer (3) and/or between the structured conductor layer (11) and the top surface (9.1) of the electronic or optoelectronic component (9).

37. The optoelectronic device according to any one of the items 28 to 36,
characterized in that
the first layer (3) comprises at least one of the following materials:
PE, PS, PVC, PP, PMMA, PET, TPU, TPI, ABS, PPA, PC, PA, PPS, PEEK.

38. The optoelectronic device according to any one of the items 28 to 37,
characterized in that
the first layer (3) is a light guiding layer.

39. The optoelectronic device according to any one of the items 28 to 38,
characterized in that
the at least one conductor layer (11) comprises two or more structured conductor layers (11a, 11b) arranged on top of each other, wherein adjacent conductor layers (11a, 11b) are separated from each other by at least one isolation layer (24), such as a Polyimid layer,
wherein, optionally, each conductor layer includes one or more conductive vias which are filled with a dielectric material (25) and include conductor paths which interconnect different conductor layers.

40. The optoelectronic device according to any one of the items 28 to 39,
    characterized in that
    a second layer (26), in particular a first thermal release film or a lamination layer, is arranged on a surface of the first layer (3) opposite to the upper surface (3.1);
    a carrier layer (7), in particular a PET carrier layer, is arranged on the second layer (26) opposite to the first layer (3);
    optionally a third layer (27), in particular a second thermal release film or a photoresist layer, is arranged on the carrier layer (7) opposite to the second layer (26); and
    optionally a temporary carrier layer (28) is arranged on the third layer (27) opposite to the carrier layer (7).

41. The optoelectronic device according to any one of the items 28 to 40,
    characterized in that
    an electronic chip (29), such as an integrated circuit (IC), is arranged on the structured conductor layer (11).

42. The optoelectronic device according to any one of the items 28 to 41,
    characterized in that
    the electronic or optoelectronic component (9) comprises at least one of the following components:
    a LED, a μLED, a flipchip LED, a thinfilm flipchip LED, an IC chip, an optical sensor, a thermal sensor, a mechanical sensor, a subassembly comprising a selection of the aforementioned components.

43. A method of manufacturing an optoelectronic device, in particular an at least partially transparent pane (1), for example of a vehicle (V), the method comprising the steps:
    arranging at least one electronic or optoelectronic component (9) on an upper surface (3.1) of a first layer (3), in particular an intermediate layer arranged between a cover layer and a carrier layer,
    embedding the at least one electronic or optoelectronic component ( ) at least partially or completely into the first layer (3),
    arranging a structured conductor layer (11) such that, a first portion (11.1) of the conductor layer (11) is arranged on the upper surface (3.1) of the first layer (3), a second portion (11.2) of the conductor layer (11) is arranged on a top surface (9.1) of the electronic or optoelectronic component (9), and an intermediate portion (11.3) of the conductor layer (11) extends across a boundary region (19) and interconnects the first portion (11.1) of the conductor layer (11) and the second portion (11.2) of the conductor layer (11),
    wherein the second portion (11.2) of the conductor layer (11) is in contact with an electric contact (18) of the electronic or optoelectronic component (9) which is located on the top surface (9.1), and
    wherein the boundary region (19) is located between the top surface (9.1) of the electronic or optoelectronic component (9) and the adjacent upper surface (3.1) of the first layer (3).

44. The method according to item 43,
    characterized in that
    the step of embedding the at least one electronic or optoelectronic component (9) at least partially or completely into the first layer (3) comprises:
    locally heating the first layer (3) and pressing the electronic or optoelectronic component (9) into the upper surface (3.1) of the first layer (3).

45. The method according to item 43,
    characterized in that
    the step of embedding the at least one electronic or optoelectronic component (9) at least partially or completely into the first layer (3) comprises:
    heating the electronic or optoelectronic component (9) and pressing the electronic or optoelectronic component (9) into the upper surface (3.1) of the first layer (3).

46. The method according to item 43,
    characterized in that
    the step of embedding the at least one electronic or optoelectronic component (9) at least partially or completely into the first layer (3) comprises:
    deep drawing of at least a portion of the first layer (3), thereby generating a recess portion (21), and pressing the electronic or optoelectronic component (9) into the recess portion (21).

47. The method according to any one of the items 43 to 46,
    characterized in that
    the step of arranging the first, second and intermediate portion of the structured conductor layer (11) comprises a jetting process.

48. The method according to any of the items 43 to 47,
    characterized in that
    the step of arranging at least one electronic or optoelectronic component (9) on an upper surface (3.1) of a first layer (3) comprises:
    gluing the at least one electronic or optoelectronic component (9) on the upper surface (3.1), in particular using an adhesive (11).

49. The method according to any of the items 43 to 48,
    characterized in that
    the method further comprises:
    arranging a dielectric layer ( ) between the structured conductor layer ( ) and the first layer (3) and/or between the structured conductor layer ( ) and the top surface ( ) of the electronic or optoelectronic component ( ).

50. The method according to any of the items 43 to 49,
    characterized in that
    the method further comprises:
    arranging an integrated circuit (IC) on the structured conductor layer ( ).

51. An optoelectronic device (1), in particular an at least partially transparent pane for example of a vehicle (V), comprises:
    a carrier layer (7),
    two or more layer segments (3.1, 3.2), in particular intermediate layer segments arranged between a cover layer and the carrier layer,
    wherein at least one optoelectronic component (9) is arranged on at least one of the layer segments (3.1, 3.2),
    wherein the layer segments (3.1, 3.2) are arranged adjacent to each other on the carrier layer (7), and
    wherein adjacent layer segments (3.1, 3.2) are mechanically connected with each other.

52. The optoelectronic device according to item 51,
    characterized in that
    an electric bridging element (34) extends between two adjacent layer segments (3.1, 3.2), each of the two layer segments (3.1, 3.2) comprises a conductor layer segment (11), and the electric bridging element (34) interconnects the conductor layer segments (11) of the two layer segments (3.1, 3.2), and/or wherein, optionally, the layer segments are connected with each other such that a joint region between the layer segments (3.1, 3.2) is at least approximately invisible.
53. The optoelectronic device according to item 51 or 52, characterized in that
an electric bridging element (34) extends between any of two adjacent layer segments (3.1, 3.2) and interconnects conductor layer segments (11), which are arranged on the layer segments (3.1, 3.2).
54. The optoelectronic device according to any one of the items 51 to 53,
characterized in that
the layer segments (3.1, 3.2) are flexible and/or bendable.
55. The optoelectronic device according to any one of the items 51 to 54,
characterized in that
the layer segments (3.1, 3.2) have a quadratic or rectangular form, and optionally have a length of at least approximately 125 mm and a width of at least approximately 70 mm.
56. The optoelectronic device according to any one of the items 51 to 55,
characterized in that
the layer segments (3.1, 3.2) are at least partially transparent.
57. The optoelectronic device according to any one of the items 51 to 56,
characterized in that
the layer segments (3.1, 3.2) comprise or consist of a material, such as polyvinyl butyral or ethylene-vinyl acetate.
58. The optoelectronic device according to any one of the items 51 to 57,
characterized in that
the carrier layer (7) is at least partially transparent.
59. The optoelectronic device according to any one of the items 51 to 58,
characterized in that
the at least one optoelectronic component (9) is an LED or PLED,
wherein, preferably, the at least one optoelectronic component (9) is unpackaged.
60. The optoelectronic device according to any one of the items 52 to 59,
characterized in that
the electric bridging element (34) comprises an at least partially transparent and/or flexible tape,
wherein, optionally, the tape comprises at least one conductor path to interconnect the conductor layer segments (11) of two adjacent layer segments (3.1, 3.2).
61. The optoelectronic device according to any one of the items 51 to 60,
characterized in that
a planarization layer (33) is arranged on the layer segments (3.1, 3.2).
62. The optoelectronic device according to item 61,
characterized in that
the planarization layer (33) comprise or consist of a material such as PVB or EVA.
63. A method of manufacturing an optoelectronic device (1), in particular an at least partially transparent pane, for example of a vehicle (V), the method comprising:
arranging two or more layer segments (3.1, 3.2) adjacent to each other on a carrier layer (7),
wherein at least one optoelectronic component (9) is arranged on at least one of the layer segments (3.1, 3.2),
wherein the method further comprises at least one of the following steps:
mechanically connecting the adjacent layer segments (3.1, 3.2) with each other,
wherein, optionally, the layer segments are connected with each other such that a joint region between the layer segments (3.1, 3.2) is at least approximately invisible, and
arranging at least one electric bridging element (34), such that the bridging element ( ) extends between two of the adjacent layer segments (3.1, 3.2), each of the two layer segments (3.1, 3.2) comprises a conductor layer segment (11), and the electric bridging element (34) interconnects the conductor layer segments (11) of the two layer segments (3.1, 3.2).
64. The method according to item 63,
characterized in that
the step of mechanically connecting the adjacent layer segments (3.1, 3.2) with each other comprises the step of at least partially melting opposing edge regions (3.1.1, 3.2.1) of the adjacent layer segments (3.1, 3.2) or the complete layer segments (3.1, 3.2), in particular with a laser or a heating device, such as an autoclave or a hotplate.
65. The method according to item 63 or 64,
characterized in that
the layer segments (3.1, 3.2) are arranged adjacent to each other on the carrier layer (7), such that the adjacent layer segments (3.1, 3.2) are spaced apart from each other by a predefined distance (d), wherein, optionally, the predefined distance (d) is in a range from 0-1500 µm.
66. The method according to any one of the items 63 to 65,
characterized in that
the step of arranging the at least one electric bridging element (34) comprises an ink-jetting process.
67. A method of manufacturing an optoelectronic device (1), in particular an at least partially transparent pane, for example of a vehicle (V), the method comprising the following steps:
arranging at least one optoelectronic component (9) on an upper surface (3.1) of a first layer (3), in particular an intermediate layer arranged between a cover layer and a carrier layer,
providing a conductor layer (11.0) on the upper surface and on the at least one optoelectronic component (9), and
structuring the conductor layer (11.0) such that a resulting structured conductor layer (11) comprises electrical conductor paths for providing electricity to the at least one optoelectronic component (9) by use of the structured conductor layer (11).
68. The method according to item 67,
characterized in that
the step of structuring the conductor layer (11.0) comprises a lithographic structuring of the conductor layer (11.0).
69. The method according to item 67,
characterized in that
the step of structuring the conductor layer (11.0) comprises an additive printing of the conductor layer (11.0) on the upper surface (3.1) of the first layer (3) and on the at least one optoelectronic component (9).

70. The method according to item 67, 68 or 69,
characterized in that
the method comprises detecting the position of the at least one optoelectronic component (9), in particular using an automated optical inspection.
71. The method according to any one of the items 67 to 70,
characterized in that
the step of providing a conductor layer (11.0) comprises arranging the conductor layer (11.0) on the upper surface and/or on the at least one optoelectronic component (9), wherein, optionally, a lamination device is used for laminating the conductor layer (11.0) on the upper surface (3.1) and/or on the at least one optoelectronic component (9).
72. The method according to item 71,
characterized in that
the step of arranging the conductor layer (11.0) on the upper surface (3.1) and/or on the at least one optoelectronic component (9) comprises embedding the at least one optoelectronic component (9) at least partially into the first layer (3),
wherein, optionally, the at least one optoelectronic component (9) is pressed, at least partially, into the first layer (3) and the conductor layer (11.0) is simultaneously arranged on the upper surface (3.1) of the first layer (3) and/or on the at least one optoelectronic component (9).
73. The method according to any one of the items 67 to 72,
characterized in that
the at least one optoelectronic component (9) is embedded into the first layer (3), in particular such that a top surface (9.1) of the optoelectronic component is arranged in the plane which is defined by the upper surface (3.1) of the first layer (3).
74. The method according to item 71,
characterized in that
the step of arranging the conductor layer (11.0) on the upper surface (3.1) and/or on the at least one optoelectronic component (9) comprises:
providing a flat conductor layer (11.0) on a top surface (9.1) of the at least one optoelectronic component (9), and
deep drawing the conductor layer (11.0) to cover the at least one optoelectronic component (9) and the upper surface (3.1) of the first layer (3).
75. The method according to any one of the items 67 to 74,
characterized in that
the first layer (3) comprises or consist of an elastic material, such as PVB,
wherein, optionally, the first layer (3) is a foil of the elastic material.
76. The method according to any one of the items 67 to 75,
characterized in that
the step of arranging at least one optoelectronic component (9) on the upper surface (3.1) of the first layer (3) comprises gluing the at least one optoelectronic component (9) on the upper surface (3.1) of the first layer (3) by use of an adhesive.
77. The method according to any one of the items 67 to 76,
characterized in that
the conductor layer (11.0) comprises or consists of an electrically conductive material layer (11.01), such as copper, gold, silver,
wherein, optionally, the electrically conductive material layer includes electrically conductive nanoparticles, such as silver and/or gold and/or copper nanoparticles.
78. The method according to item 77,
characterized in that
the conductor layer (11.0) comprises in addition to the electrically conductive material layer a second electrically conductive material layer (11.02) which comprises or consist of an electrically conductive adhesive or a solder.
79. The method according to any one of the items 67 to 78,
characterized in that
the method comprises providing a conductive adhesive or a solder on at least an electric contact (18) of the optoelectronic component (9),
wherein the electric contact (18), in particular a contact pad, is arranged on a top surface (9.1) of the optoelectronic component (9).
80. The method according to any one of the items 67 to 79,
characterized in that
the method comprises mechanically and electrically interconnecting the conductor layer (11.0) with an electric contact (18) of the optoelectronic component (9), wherein the electric contact (18), in particular a contact pad, is arranged on a top surface (9.1) of the optoelectronic component (9).
81. The method according to item 80,
characterized in that
the step of mechanically and electrically interconnecting the conductor layer (11.0) with an electric contact (18) of the optoelectronic component (9) comprises punctual laser welding the conductor layer (11.0) in a region above the electric contact (18).
82. The method according to item 80,
characterized in that
the step of mechanically and electrically interconnecting the conductor layer (11.0) with an electric contact (18) of the optoelectronic component (9) comprises heating the conductor layer above a melting/reaction temperature of the conductive adhesive or solder.
83. The method according to item 77,
characterized in that
the step of structuring the conductor layer (11.0) is followed by a step of sintering, in particular photonic sintering, the structured conductor layer (11).
84. The method according to any one of the items 67 to 83,
characterized in that
the method further comprises a step of arranging a planarization layer (33) on the first layer (3) and/or the structured conductor layer (11),
wherein the planarization layer (33) comprises or consist of PVB, and
wherein, optionally, the at least one optoelectronic component (9) and/or the structured conductor layer (11) is embedded in the planarization layer (33).
85. A method of manufacturing an optoelectronic device (1), in particular an at least partially transparent pane, for example of a vehicle (V), the method comprising the following steps:
providing a conductor layer (11.0) on an upper surface (3.1) of a first layer (3), in particular an intermediate layer arranged between a cover layer and a carrier layer,
structuring the conductor layer (11.0) such that a resulting structured conductor layer (11) comprises electrical conductor paths suitable for providing electricity to at least one optoelectronic component (9), and
arranging the at least one optoelectronic component (9) on the structured conductor layer (11).

86. The method according to item 85,
characterized in that
electrical contact elements (11.5) are provided on the structured conductor layer (11) for electrically connecting contacts of the at least one optoelectronic component (9) with the structured conductor layer (11),
wherein the contact elements (11.5) are provided on the structured conductor layer such that the contact elements are aligned with the contacts of the at least one optoelectronic component (9).

87. The method according to item 86,
characterized in that
the contact elements (11.5) are provided by an application of solder paste on the structured conductor layer (11).

88. The method according to item 86 or 87,
characterized in that
the method further comprises a step of heating the contact elements (11.5) by use of photonic soldering.

89. An optoelectronic device (1), in particular an at least partially transparent pane for example of a vehicle (V), comprises:
a first layer (3), in particular an intermediate layer arranged between a cover layer and a carrier layer,
at least one optoelectronic component (9), which is at least partially or completely embedded in the first layer (3),
at least one structured conductor layer (11) arranged on an upper surface (3.1) of the first layer (3) and on the at least one optoelectronic component (9),
wherein the structured conductor layer (11) comprises electrical conductor paths for providing electricity to the at least one optoelectronic component (9).

90. The optoelectronic device according to item 89,
characterized in that
a first portion (11.1) of the conductor layer (11) is arranged on an upper surface (3.1) of the first layer (3), and a second portion (11.2) of the conductor layer (11) is arranged on a top surface (9.1) of the optoelectronic component (9) and is in contact with an electric contact (18) of the optoelectronic component (9),
wherein the electric contact (18), in particular a contact pad, is arranged on the top surface (9.1).

91. The optoelectronic device according to any one of the items 89 to 90,
characterized in that
the structured conductor layer (11) comprises residues of sintering a photostructurable nanoparticle paste.

92. An optoelectronic device (1), in particular an at least partially transparent pane for example of a vehicle (V), comprises:
a first layer (3), in particular an intermediate layer arranged between a cover layer and a carrier layer,
at least one optoelectronic component (9), arranged on the first layer (3),
at least one structured conductor layer (11) arranged on an upper surface (3.1) of the first layer (3) and on the at least one optoelectronic component (9),
wherein the structured conductor layer (11) comprises electrical conductor paths for providing electricity to the at least one optoelectronic component (9), and
wherein the structured conductor layer (11) comprises residues of sintering a photostructurable nanoparticle paste.

93. The optoelectronic device according to item 92,
characterized in that
a first portion (11.1) of the conductor layer (11) is arranged on an upper surface (3.1) of the first layer (3), and a second portion (11.2) of the conductor layer (11) is arranged on a top surface (9.1) of the optoelectronic component (9) and is in contact with an electric contact (18) of the optoelectronic component (9),
wherein the electric contact (18), in particular a contact pad, is arranged on the top surface (9.1), and
wherein an intermediate portion (11.3) of the conductor layer (11) is arranged on a side surface (9.2) of the optoelectronic component (9) and interconnects the first (11.1) and the second portion (11.2) of the conductor layer (11).

94. An optoelectronic device (1), in particular an at least partially transparent pane for example of a vehicle (V), comprises:
a first layer (3), in particular an intermediate layer arranged between a cover layer and a carrier layer,
a structured conductor layer (11) on an upper surface (3.1) of the first layer (3),
at least one optoelectronic component (9) arranged on the structured conductor layer (11.0),
wherein the structured conductor layer (11) comprises electrical conductor paths for providing electricity to the at least one optoelectronic component (9),
wherein electrical contact elements (11.5) are arranged on the structured conductor layer (11) for electrically connecting electric contacts (18) of the at least one optoelectronic component (9) with the structured conductor layer (11), and
wherein the contact elements (11.5) are aligned with the electric contacts (18) of the at least one optoelectronic component (9),
wherein the contact elements (11.5) comprise or consist of a material with a higher melting or curing temperature than a maximum service temperature of the first layer (3).

95. The optoelectronic device according to any one of the items 89 to 94,
characterized in that
a planarization layer (33) is arranged on the first layer (3) and/or the conductor layer (11),
wherein the planarization layer (33) comprises or consists of PVB, and
wherein, optionally, the at least one optoelectronic component (9) is embedded in the planarization layer (33).

96. A method of manufacturing an optoelectronic device (1), in particular an at least partially transparent pane, for example of a vehicle (V), the method comprising the following steps:
providing a carrier substrate (35) and a release layer (36) arranged on the carrier substrate (35),
providing a structured conductor layer (11) on the release layer (36) which is opposite to the carrier substrate (35),
arranging at least one optoelectronic component (9) on the structured conductor layer (11),
wherein the structured conductor layer (11) comprises electrical conductor paths for providing electricity to the at least one optoelectronic component (9),
providing a first layer (3) on the release layer (36),
wherein the first layer covers the conductor layer (11) and the at least one optoelectronic component (9) such that the at least one optoelectronic component (9) is at least partially embedded in the first layer (3), and
removing the carrier substrate (35) and the release layer (36).

97. The method according to item 96,
characterized in that
the method further comprises, after removing the carrier substrate (35) and the release layer (36), a step of providing a planarization layer (33) on the first layer (3) and/or the structured conductor layer (11) and/or the at least one optoelectronic component (9).

98. The method according to item 96 or 97,
characterized in that
the at least one optoelectronic component (9) is completely embedded in the first layer (3), in particular such that a top surface (9.1) of the optoelectronic component is arranged in a plane which is defined by an upper surface (3.1) of the first layer (3).

99. The method according to any one of the items 96 to 98,
characterized in that
the method further comprises a step of providing a stiffener (37) on the release layer (36) and/or the structured conductor layer (11).

100. The method according to item 99,
characterized in that
the stiffener (37) is provided on an edge region of the release layer (36),
wherein the edge region includes an edge (36.2) of the release layer (36).

101. The method according to item 100,
characterized in that
an outer edge (37.1) of the stiffener (37) is aligned with the edge (36.2) of the release layer (36).

102. The method according to any one of the items 99 to 101,
characterized in that
the step of providing the first layer (3) on the release layer (36) comprises at least partially embedding the stiffener (37) in the first layer (3),
wherein, optionally, the first layer (3) does not completely cover the edge region of the release layer (36).

103. The method according to any one of the items 99 to 102,
characterized in that
the stiffener (37) comprises or consists of a rigid material, such as a rigid plastic material,
wherein, optionally, the stiffener (37) is more rigid than the first layer (3).

104. The method according to any one of items 96 to 103,
characterized in that
the first layer (3) comprises or consists of an elastic material, such as PVB,
wherein, optionally, the first layer (3) is a foil made of the elastic material.

105. The method according to any one of the items 96 to 104,
characterized in that
the planarization layer (33) comprises or consists of an elastic material, such as PVB, and
wherein, optionally, the at least one structured conductor layer (11) is embedded in the planarization layer (33).

106. The method according to any one of the items 96 to 105,
characterized in that
prior to providing the first layer (3) on the release layer (36), the method further comprises a step of modifying a shape of an intermediate product (38) which comprises the carrier substrate (35) and the release layer (36), the structured conductor layer (11) on the release layer (36) and the at least one optoelectronic component (9) on the structured conductor layer (11), and optionally at least an stiffener (37) on the release layer (36).

107. The method according to item 106,
characterized in that
after the step of modifying the shape of the intermediate product (38) the first layer (3) is provided on the conductor layer (11) and the at least one optoelectronic component (9).

108. An optoelectronic device (1), in particular an at least partially transparent pane, for example of a vehicle (V), comprises:
a first layer (3),
at least one optoelectronic component (9), which is at least partially or completely embedded in the first layer (3),
at least one structured conductor layer (11) arranged on an upper surface (3.1) of the first layer (3) and on the at least one optoelectronic component (9),
wherein the structured conductor layer (11) comprises electrical conductor paths for providing electricity to the at least one optoelectronic component (9).

109. The optoelectronic device according to item 108,
characterized in that
the optoelectronic device further comprises a planarization layer (33) on the upper surface (3.1) of the first layer (3) and/or the structured conductor layer (11) and/or the at least one optoelectronic component (9).

110. The optoelectronic device according to item 108 or 109,
characterized in that
the at least one optoelectronic component (9) is completely embedded in the first layer (3), in particular such that a top surface (9.1) of the optoelectronic component is arranged in a plane which is defined by the upper surface (3.1) of the first layer (3).

111. The optoelectronic device according to any one of the items 108 to 110,
characterized in that
the optoelectronic device further comprises at least one stiffener (37) on the upper surface (3.1) of the first layer (3) and/or the structured conductor layer (11).

112. The optoelectronic device according to item 111,
characterized in that
the stiffener (37) is at least partially embedded in the first layer (3).

113. The optoelectronic device according to item 111 or 112,
characterized in that
the stiffener (37) sticks out of the first layer (3).

114. The optoelectronic device according to any one of the items 108 to 113,
characterized in that
the upper surface (3.1) is curved.

115. An optoelectronic device (1), in particular an at least partially transparent pane for example of a vehicle (V), comprising:
a layer stack (39), in particular an intermediate layer stack arranged between a cover layer and a carrier layer, having at least a top layer (39.1) which comprises at least one opening (40),
at least one electronic or optoelectronic component (9), which is arranged in the opening (40), and
at least one electrical conductor arrangement, in particular a structured conductor layer (11), for providing electricity to the at least one electronic or optoelectronic component (9).

116. The optoelectronic device according to item 115,
characterized in that
the opening (40) is a cavity or a through hole.
117. The optoelectronic device according to item 115 or 116,
characterized in that
the opening (40) is a cavity having a bottom portion (40.1) which is formed by the top layer (39.1), and the at least one electronic or optoelectronic component (9) is arranged on the bottom portion (40.1).
118. The optoelectronic device according to item 115 or 116,
characterized in that
the opening (40) is a through hole in the top layer (39.1), the layer stack (39) comprises a bottom layer (39.2) which is arranged below the top layer (39.1), and the bottom layer (39.2) carries the at least one electronic or optoelectronic component (9).
119. The optoelectronic device according to any one of the items 115 to 118,
characterized in that
the top layer (39.1) is at least partially transparent.
120. The optoelectronic device according to any one of the items 118 to 119,
characterized in that
the bottom layer (39.2) is at least partially transparent.
121. The optoelectronic device according to any one of the items 115 to 120,
characterized in that
the at least one electronic or optoelectronic component (9) is completely arranged in the opening (40), in particular, such that a top surface (9.1) of the electronic or optoelectronic component (9) is arranged in a plane that extends through an upper surface (39.1.1) of the top layer (39.1).
122. The optoelectronic device according to any one of the items 115 to 120,
characterized in that
the at least one electric or optoelectronic component (9) is partially arranged in the opening (40), wherein a top surface (9.1) of the electronic or optoelectronic component (9) protrudes an upper surface (39.1.1) of top layer (39.1) by a height (H),
wherein, preferably, the height (H) is equal to or smaller than half of the thickness (t) of the electronic or optoelectronic component (9).
123. The optoelectronic device according to any one of the items 115 to 122,
characterized in that
the top layer (39.1) comprises or consists of at least one of the following materials:
PET, PEN, PVB, EVA and a photoresist, and/or
a bottom layer comprises or consists of at least one of the following materials:
PET, PEN, PVB and EVA.
124. A method of manufacturing an optoelectronic device, in particular an at least partially transparent pane (1), for example of a vehicle (V), the method comprising the following steps:
providing a layer stack (39) having at least a top layer (39.1) which comprises at least one opening (40),
arranging at least one electronic or optoelectronic component (9) in the opening (40), and
providing, in particular on an upper surface (39.1.1) of the top layer (39.1), at least one electrical conductor arrangement, in particular a structured conductor layer (11), for providing electricity to the at least one electronic or optoelectronic component (9).
125. The method according to item 124,
characterized in that
the opening (40) is a cavity having a bottom portion (40.1) which is formed by the top layer (39.1), and the at least one electronic or optoelectronic component (9) is arranged in the cavity such that it resides on the bottom portion (40.1).
126. The method according to item 124,
characterized in that
the opening (40) is a through hole in the top layer (39.1), the layer stack (39) comprises a bottom layer (39.2) below the top layer (39.1), and the at least one electronic or optoelectronic component (9) is arranged in the trough hole such that it resides on bottom layer (39.2).
127. The method according to any one of the items 124 to 126,
characterized in that
the step of arranging the at least one electronic or optoelectronic component (9) in the opening comprises a step of using an adhesive (22) to fix the at least one electronic or optoelectronic component (9) in the opening (40).
128. The method according to any one of the items 124 to 126,
characterized in that
the step of arranging the at least one electronic or optoelectronic component (9) in the opening comprises temporarily heating the layer stack (39), in particular in the vicinity of the opening (40), to stick the at least one electronic or optoelectronic component (9) to the layer stack (39).
129. The method according to any one of the items 124 to 128,
characterized in that
the step of providing the layer stack (39) comprises providing an initial layer stack (39.0) with an unstructured top layer (39.0.1) and structuring the top layer to obtain the at least one opening (40) in the top layer (39.1).
130. An optoelectronic device (1), having a layer stack (39) with a plurality of pixels (90), each pixel of the plurality of pixels comprising:
at least one optoelectronic light source (9), which is embedded in a first layer (3) of the layer stack (39) and which comprises a first reflective layer (42) on its upper surface (9.1) and optionally a second reflective layer (43) on its bottom surface, wherein the upper surface (9.1) faces towards a top surface (39.1) of the layer stack (39) and wherein the bottom surface faces away from the top surface (9.1),
a first pixel area (90.1) on the top surface of the layer stack (39.3), and
a structured light scattering arrangement (44) for scattering light from the optoelectronic light source (9) to homogeneously illuminate the first pixel area (90.1).
131. The optoelectronic device according to item 130,
characterized in that
the structured light scattering arrangement (44) is arranged in the layer stack (39), preferably above the first layer (3), between the first pixel area (90.1) and the optoelectronic light source (9).
132. The optoelectronic device according to item 130,
characterized in that
the structured light scattering arrangement (44) is embedded in the first layer (3).

133. The optoelectronic device according to any one of the items 130 to 132,
characterized in that
the layer stack (39) further comprises a second layer (46) and a third layer (47), the first layer (3) being arranged between the second layer (46) and the third layer (47).

134. The optoelectronic device according to any one of the items 130 to 133,
characterized in that
the first pixel area (90.1) comprises, in a view perpendicular to the first pixel area (90.1), the outer contour of a circle, square, rectangle or polygon.

135. The optoelectronic device according to any one of the items 130 to 134,
characterized in that
the optoelectronic light source (9) is, in a view perpendicular to the first pixel area (90.1), arranged behind the first pixel area (90.1) and centred with regard to a central axis (45) of the first pixel area (90.1).

136. The optoelectronic device according to any one of the items 130 to 135,
characterized in that
the structured light scattering arrangement (44) comprises at least a first light scattering element (44.1) and at least a second light scattering element (44.2), wherein the second light scattering element (44.2) is in a radial direction further away from the at least one optoelectronic light source (9) than the first light scattering element (44.1).

137. The optoelectronic device according to item 136,
characterized in that
each of the at least first light scattering element (44.1) and second light scattering element (44.2) has a defined geometrical form, which is, preferably, the same for the at least first light scattering element (44.1) and second light scattering element (44.2), wherein, preferably, each of the at least first light scattering element (44.1) and second light scattering element (44.2) has a defined particle concentration of scattering particles within its defined geometrical form.

138. The optoelectronic device according to item 136 or 137,
characterized in that
each of the at least first light scattering element (44.1) and second light scattering element (44.2) forms a ring like structure around the at least one optoelectronic light source (9), wherein, preferably, the ring like structure has, seen in a top view, a circular, quadratic, rectangular, or polygonal form and/or, wherein, preferably, the ring like structure has a circular, quadratic, rectangular, or polygonal form in a cross sectional plane which comprises a central axis of the first pixel area.

139. The optoelectronic device according to item 137 or 138,
characterized in that
a cross sectional area of the first light scattering element (44.1) is smaller than a cross sectional area of the second light scattering element (44.2), wherein the cross sectional areas are in the same cross sectional plane which comprises a central axis (45) of the first pixel area.

140. The optoelectronic device according to any one of the items 136 to 139,
characterized in that
a particle concentration of scattering particles in the first light scattering element (44.1) is lower than a particle concentration of scattering particles in the second light scattering element (44.2).

141. The optoelectronic device according to any one of the items 130 to 140,
characterized in that
the optoelectronic light source (9), the first reflective layer (42) and optionally the second reflective layer (43) form an optoelectronic subassembly (9.0),
wherein the optoelectronic subassembly (9.0) is embedded in the first layer (3) such that a top surface of the optoelectronic subassembly (9.0.1) is arranged in the same plane as a top surface of the first layer (3.1) and/or a bottom surface of the optoelectronic subassembly (9.0.2) is arranged in the same plane as a bottom surface of the first layer (3.3).

142. The optoelectronic device according to any one of the items 130 to 141,
characterized in that
the structured light scattering arrangement (44) comprises an electro wetting device, which is arranged between the first layer (3) and the first pixel area (90.1).

143. The optoelectronic device according to any one of the items 130 to 142,
characterized in that
the structured light scattering arrangement (44) comprises a first cavity (51) which extends between the first layer (3) and the first pixel area (90.1) over the full length and width of the first pixel area (90.1), wherein, preferably, the first cavity (51) is formed by spacers (52) that separate the first layer (3) from one or more further layers of the layer stack (53).

144. The optoelectronic device according to item 143,
characterized in that
the optoelectronic device (1) comprises a first fluid pump (54) to selectively pump a first fluid (55) into the first cavity (51) or to evacuate the first cavity (51), wherein the first fluid (55) comprises light scattering particles.

145. The optoelectronic device according to item 143 or 144,
characterized in that
the structured light scattering arrangement (44) further comprises a set of interconnected fluid channels (57), which extend in a layer of the layer stack below the first pixel areas of the plurality of pixels along the length and width directions of the first pixel areas (90.1) and, when seen in a top view, such that the fluid channels (57) are arranged behind a grid-like structure of boundary regions that separate neighbouring first pixel areas (90.1) from each other, wherein the optoelectronic device (1) further comprises a second fluid pump to selectively pump a second fluid (58) into the channels (57) or to evacuate the channels (57), wherein the second fluid (58) comprises light absorbing particles, in particular black particles.

146. An optoelectronic device (1), having a layer stack (39) with a plurality of pixels (90), each pixel of the plurality of pixels comprising:
at least one optoelectronic light source (9), which is embedded in a first layer (3) of the layer stack (39) and which comprises a first reflective layer (42) on its upper surface (9.1) and a second reflective layer (43) on its bottom surface, the upper surface (9.1) faces towards a top surface of the layer stack (39.3) and the bottom surface is facing away from the top surface (39.3),
a first pixel area (90.1) on the top surface of the layer stack (39.3),
a light scattering arrangement (44) for scattering light from the optoelectronic light source (9) to homogeneously illuminate the first pixel area (90.1), and the light scattering arrangement (44) forming a first portion (3.4) of the first layer (3) which circumferentially surrounds the optoelectronic light source (9).
147. The optoelectronic device according to item 146, characterized in that
an outer surface of the first portion (3.4), which circumferentially surrounds the first portion (3.4), when seeing in a view perpendicular to the first pixel area (90.1), is aligned with outer edges of the first pixel area (90.1).
148. The optoelectronic device according to item 146 or 147, characterized in that
a second portion (3.5) of the first layer (3) circumferentially surrounds the first portion (3.4) of the first layer (3), and a refractive index of the first portion (3.4) is different to a refractive index of the second portion (3.5).
149. The optoelectronic device according to any one of the items 146 to 148, characterized in that
the layer stack (39) further comprises a light guiding layer (59) arranged on the first layer (3),
wherein the first layer (3) is arranged between the first pixel area (90.1) and the light guiding layer (59), and
wherein a refractive index of the light guiding layer (59) is higher than a refractive index of any other layer of the layer stack (39).
150. The optoelectronic device according to item 149, characterized in that
the layer stack (39) further comprises a scattering layer (60) arranged on the first layer (3), opposite to the light guiding layer (59),
wherein the scattering layer (60) comprises light scattering particles to homogeneously illuminate the first pixel area (90.1),
wherein, preferably, the first layer (3) and the scattering layer (60) can form a single layer.
151. An optoelectronic device (1), having a layer stack (39) with a plurality of pixels (90), each pixel of the plurality of pixels comprising:
at least one optoelectronic light source (9), which is embedded in a first layer (3) of the layer stack (39) and which comprises a first reflective layer (42) on its upper surface (9.1) and optionally a second reflective layer (43) on its bottom surface, the upper surface (9.1) faces towards a top surface of the layer stack (39.3) and the bottom surface is facing away from the top surface (39.3),
a first pixel area (90.1) on the top surface of the layer stack (39.3), and
a light guiding layer (59) arranged on the first layer (3),
wherein the first layer (3) is arranged between the first pixel area (90.1) and the light guiding layer (59), and
wherein a refractive index of the light guiding layer (59) is higher than a refractive index of any other layer of the layer stack (39).
152. The optoelectronic device according to item 151, characterized in that
the layer stack (39) further comprises a scattering layer (60) arranged above the first layer (3), opposite to the light guiding layer (59),
wherein the scattering layer (60) comprises light scattering particles to homogeneously illuminate the first pixel area (90.1).
153. The optoelectronic device according to item 151, characterized in that
the layer stack (39) further comprises a scattering layer (60) arranged on the light guiding layer (59),
wherein the scattering layer (60) comprises light scattering particles to homogeneously illuminate a second pixel area (90.2) opposite to the first pixel area (90.1).
154. An optoelectronic device (1), having a layer stack (39) with a plurality of pixels (90), each pixel of the plurality of pixels comprising:
at least one optoelectronic light source (9), which is embedded in a first layer (3) of the layer stack (39),
a first pixel area (90.1) on a top surface of the layer stack (39.3),
a light guiding layer (59) arranged on the first layer (3),
wherein a refractive index of the light guiding layer (59) is higher than a refractive index of any other layer of the layer stack (39), and
a third reflective layer (61) for reflecting light from the optoelectronic light source (9) to homogeneously illuminate the first pixel area (90.1),
the third reflective layer (61) forming a
cavity in the first layer (3) in which the optoelectronic light source (9) is located, and the first layer having a curved surface (3.2) that is facing the optoelectronic light source (9) and the curved surface is formed such that light which is emitted by the optoelectronic light source (9), in substance in a radial direction, is reflected towards the first pixel area (90.1), in particular such that the first pixel area (90.1) is illuminated homogenously.
155. An optoelectronic device (1), comprising:
a plurality of optoelectronic light sources (9) being arranged on a first layer (3), in particular an intermediate layer being arranged between a cover layer and a carrier layer,
wherein the first layer (3) comprises or consists of an at least partially transparent material,
wherein each optoelectronic light source (9) of the plurality of optoelectronic light sources (9) comprises an individual light converter (91) for converting light emitted by the associated light source into converted light, and
wherein the light converter (91) of each optoelectronic light source (9) is arranged on the first layer (3) and/or the associated optoelectronic light source (9).
156. The optoelectronic device according to item 155, characterized in that
each of the optoelectronic light sources (9) is a small LED with edge lengths of less than 200 µm, in particular in the range from 150 µm to 40 µm.
157. The optoelectronic device according to item 155 or 156, characterized in that
the light converters (91) of different light sources (9) are separated from each other.
158. The optoelectronic device according to any one of the items 155 to 157, characterized in that
the optoelectronic light sources (9) are distributed over a first surface area of the first layer (3),
wherein the first surface area is larger, in particular by a factor of at least approximately 30, than the sum of the cross sectional areas of the optoelectronic light sources (9).
159. The optoelectronic device according to any one of the items 155 to 158, characterized in that
each light converter (91) comprises conversion particles with a diameter of at least approximately 1 µm to 30 µm.

160. The optoelectronic device according to any one of the items 155 to 159,
characterized in that
each light converter (91) comprises a droplet form covering the associated optoelectronic light source (9).

161. The optoelectronic device according to any one of the items 155 to 159,
characterized in that
each light converter (91) is arranged between the first layer (3) and the associated optoelectronic light source (9).

162. The optoelectronic device according to item 161,
characterized in that
each light converter (91) comprises an adhesive being configured to fix the associated optoelectronic light source (9) to the first substrate (3).

163. The optoelectronic device according to any one of the items 155 to 159,
characterized in that
each light converter (91) is arranged on the first layer (3), opposite to the associated optoelectronic light source (9), and faces a light emitting surface of the associated optoelectronic light source (9).

164. The optoelectronic device according to any one of the items 155 to 163,
characterized in that
a light-blocker (92) extends in a circumferential direction around each light converter (91).

165. The optoelectronic device according to any one of the items 155 to 164,
characterized in that
each light converter (91) is formed as platelet being arranged, particularly glued, on the first layer (3) and faces a light emitting surface of the associated optoelectronic light source (9).

166. The optoelectronic device according to item 165,
characterized in that
each platelet comprises conversion particles arranged within a matrix material such as for example silicone, glass or polysiloxane.

167. The optoelectronic device according to any one of the items 155 to 166,
characterized in that
each light converter (91) and optionally the associated optoelectronic light source (9) is embedded into the first layer (3).

168. The optoelectronic device according to any one of the items 155 to 167,
characterized in that
the optoelectronic device (1) further comprises a set of light sources (9) without a light converter (91).

169. The optoelectronic device according to any one of the items 155 to 168,
characterized in that
the light converters (91) include at least a first set of light converters and a second set of light converters, and the second set of light converters is configured to convert light to a different wavelength than the first set of light converters.

170. An optoelectronic device (1), comprising:
at least one optoelectronic light source (9) being arranged on a first layer (3) between a cover layer (5) and the first layer (3),
wherein each of the first layer (3) and the cover layer (5) comprises or consists of an at least partially transparent material, and
wherein the optoelectronic device is a wind deflector for a vehicle (V).

171. The optoelectronic device according to item 170,
characterized in that
the first layer (3) comprise or consist of an elastic plastic such as for example PET, PC, or PEN.

172. The optoelectronic device according to item 170 or 171,
characterized in that
the cover layer (5) comprise or consist of an elastic plastic, particularly an elastic foil, such as for example PVC, PVB, or EVA.

173. The optoelectronic device according to any one of the items 170 to 172,
characterized in that
the first layer (3) and the cover layer (5) are free of glass.

174. The optoelectronic device according to item 173,
characterized in that
the optoelectronic device (1) comprises one or more further layers arranged above the cover layer (5) and/or below the first layer (3), and all of the further layers are free of glass.

175. The optoelectronic device according to any one of the items 170 to 174,
characterized in that
the at least one optoelectronic light source (9) is a LED, in particular a small LED, the LED having edge lengths of less than 200 μm, in particular in the range from 150 μm to 40 μm.

176. The optoelectronic device according to any one of the items 170 to 175,
characterized in that
the at least one optoelectronic light source ( ) comprises a plurality of optoelectronic light sources ( ) which are arranged such as to form a symbol or an indicator.

177. The optoelectronic device according to item 176,
characterized in that
in operation of the optoelectronic device the symbol or indicator is visible for a user of the optoelectronic device.

178. The optoelectronic device according to any one of the items 170 to 177,
characterized in that
a light blocker is arranged on either the first layer or the cover layer and faces the at least one optoelectronic light source ( ).

179. The optoelectronic device according to item 178,
characterized in that
the light blocker is arranged to block the emission of light through the first layer or through the cover layer.

180. The optoelectronic device according to any one of the items 170 to 179,
characterized in that
the vehicle (V) is a motorcycle, a quad, a water vessel, an open top race car, or any other 2- or 3-wheeler.

181. A vehicle (V), comprising:
an optoelectronic device (1) according to any one of the items 170 to 180,
the optoelectronic device being a wind deflector of the vehicle,
and the at least one optoelectronic light source (9) of the optoelectronic device being arranged to be visible for a driver of the vehicle or from the outside.

182. The vehicle according to item 181,
characterized in that
the at least one optoelectronic light source (9) comprises a first set of light sources, which are arranged such that, in operation of the optoelectronic device (1), the first set of light sources is visible for the driver.

183. The vehicle according to item 182, characterized in that
the first set of light sources is configured to indicate information to the driver, wherein, preferably, the first set of light sources forms a symbol or an indicator.

184. The vehicle according to item 181, 182, or 183, characterized in that
the at least one optoelectronic light source (9) comprises a second set of light sources, which are arranged such that, in operation of the optoelectronic device, the second set of light sources is visible from the front and/or from the sides of the vehicle.

185. An optoelectronic device (1), comprising:
a layer stack (39), which includes a carrier layer (7), a cover layer (5), and a first layer (3), in particular an intermediate layer, arranged between the cover layer (5) and the carrier layer (7),
at least one electronic or optoelectronic element, in particular an optoelectronic light source (9) which is arranged on the first layer (3),
wherein at least one layer of the layer stack (39) and preferably all layers of the layer stack are at least partially transparent, and
wherein the layer stack comprises at least one layer which comprises particles (96) with a high thermal conductivity and/or at least one thermally conductive layer (93) which is arranged between two adjacent layers of the layer stack (39).

186. The optoelectronic device according to item 185, characterized in that
the at least one thermally conductive layer (93) comprises a thermally conductive mesh, with the mesh having knots and interconnects between the knots, wherein, optionally, at least the majority of the interconnects are not interrupted.

187. The optoelectronic device according to item 186, characterized in that
the mesh has an irregular pattern.

188. The optoelectronic device according to any one of the items 185 to 187, characterized in that
the at least one thermally conductive layer (93) comprises an electric line (94.1) which is electrically connected to a contact pad of the electronic or optoelectronic element, in particular the optoelectronic light source (9), the width of the electric line (94.1) is at least half of the width of the electronic or optoelectronic element.

189. The optoelectronic device according to any one of the items 185 to 188, characterized in that
the at least one thermally conductive layer (93) comprises a plurality of electric lines (93.1), which are electrically connected to a same contact pad of the electronic or optoelectronic element, in particular the optoelectronic light source (9), wherein the plurality of electric lines (94.1) extend in parallel to each other.

190. The optoelectronic device according to item 188 or 189, characterized in that
at least one electric line (94.1) comprises one or more blind conduction paths (94.3).

191. The optoelectronic device according to any one of the items 185 to 190, characterized in that
the at least one thermally conductive layer (93) comprises one or more electrically conductive lines for transporting heat away from the electronic or optoelectronic element, in particular the optoelectronic light source, but which are electrically disconnected from the electronic or optoelectronic element.

192. The optoelectronic device according to any one of the items 185 to 191, characterized in that
the at least one thermally conductive layer (93) comprises a coating, wherein, optionally, the coating comprises or consists of palladium or molybdenum.

193. The optoelectronic device according to any one of the items 185 to 192, characterized in that
the at least one thermally conductive layer (93) is arranged between the first layer (3) and the at least one electronic or optoelectronic element, in particular the optoelectronic light source (9), or
the at least one thermally conductive layer (93) is arranged on the first layer (3) on the opposite side of the at least one electronic or optoelectronic element, or a first thermally conductive layer (93.1) is arranged between the first layer (3) and the at least one electronic or optoelectronic element at the same side as the at least one electronic or optoelectronic element, and a second thermally conductive layer (93.2) is arranged on the first layer (3) on the opposite side of the at least one electronic or optoelectronic element.

194. The optoelectronic device according to any one of the items 185 to 193, characterized in that
the layer stack (39) comprises a first auxiliary layer (95.1) arranged between the cover layer (5) and the first layer (3) and/or a second auxiliary layer (95.2) arranged between the carrier layer (7) and the first layer (3).

195. The optoelectronic device according to item 194, characterized in that
the at least one thermally conductive layer (93) is arranged between the first auxiliary layer (95.1) and the cover layer (5), or
the at least one thermally conductive layer (93) is arranged between the second auxiliary layer (95.2) and the carrier layer (7), or
a first thermally conductive layer (93.1) is arranged between the first auxiliary layer (95.1) and the cover layer (5) and a second thermally conductive layer (93.2) is arranged between the second auxiliary layer (95.2) and the carrier layer (7).

196. The optoelectronic device according to item 194 or 195, characterized in that
the particles (96) with a high thermal conductivity are arranged in the first auxiliary layer (95.1) and/or the second auxiliary layer (95.2).

197. The optoelectronic device according to any one of the items 185 to 196, characterized in that
at least one of the layers of the layer stack (39) is tinted.

198. The optoelectronic device according to any one of the items 185 to 197, characterized in that
a reflective layer (97) is arranged between two layers of the layer stack (39), wherein the reflective layer (97) is configured to reflect light in the ultraviolet and/or infrared spectrum (U) but is permeable to light in the visible spectrum (V) and, preferably, the reflective layer (97) is arranged on the first layer (3) and between the first layer (3) and the at least one electronic or optoelectronic element, in particular the optoelectronic light source (9).

199. An optoelectronic device (1), comprising:
a plurality of optoelectronic light sources (9) being arranged on a first layer (3), in particular between a cover layer and the first layer (3),
a second layer (98) above the plurality of optoelectronic light sources (9), the second layer (98) comprises a plurality of light scattering structures (99),
wherein each light scattering structure (99) is associated with an optoelectronic light source of the plurality of optoelectronic light sources (9) and individually designed, in particular by use of focused light, in particular laser light, in dependence on an operational parameter of the associated optoelectronic light source.

200. The optoelectronic device according to item 199, characterized in that
each light scattering structure (99) is arranged in the second layer (98) above the associated optoelectronic light source such that the light scattering structure (99) scatters light emitted by the associated optoelectronic light source.

201. The optoelectronic device according to item 199 or 200, characterized in that
each light scattering structure (99) is individually designed such that light within a defined range of the operational parameter is provided by the optoelectronic device (1), wherein, optionally, the defined range is within 50% of the brightness of the darkest optoelectronic light source (9.0).

202. The optoelectronic device according to any one of the items 199 to 201, characterized in that
the operational parameter is brightness of the associated optoelectronic light source.

203. The optoelectronic device according to any one of the items 199 to 202, characterized in that
at least one optoelectronic light source is not associated with a light scattering structure (99), wherein, optionally, the optoelectronic light source is the darkest optoelectronic light source (9.0) of the plurality of optoelectronic light sources (9).

204. The optoelectronic device according to any one of the items 199 to 203, characterized in that
at least one and preferably all optoelectronic light sources (9) comprise a light converter (91), preferably arranged between the optoelectronic light sources (9) and the second layer (98).

205. The optoelectronic device according to any one of the items 199 to 204, characterized in that
the operational parameter is a colour value of the light emitted by an optoelectronic light source (9).

206. The optoelectronic device according to item 205, characterized in that
each light scattering structure (99), which is associated with a light source that provides a particular colour, such as for example red, green or blue, is individually designed such that the colour value is within a predefined range with regard to the colour value of the light provided by a selected one of the optoelectronic light sources (9).

207. The optoelectronic device according to any one of the items 199 to 206, characterized in that
different light scattering structures (99) scatter light differently.

208. The optoelectronic device according to any one of the items 199 to 207, characterized in that
at least one and preferably all layers of the optoelectronic device (1) comprise or consist of an at least partially transparent material.

209. The optoelectronic device according to any one of the items 199 to 208, characterized in that
the first layer (3) is arranged between a cover layer and a carrier layer, and the second layer (98) corresponds to the cover layer.

210. A set of optoelectronic devices comprising at least two optoelectronic devices (1) according to any one of the items 199 to 209,
wherein at least some of the light scattering structures (99) of one of the optoelectronic devices are designed or positioned differently than the light scattering structures (99) of the other optoelectronic device.

211. Method of manufacturing an optoelectronic device (1), comprising the steps:
providing a plurality of optoelectronic light sources (9) being arranged on a first layer (3),
producing a plurality of light scattering structures (99) in a second layer (98) above the plurality of optoelectronic light sources (9), wherein each light scattering structure (99) is associated with an optoelectronic light source,
wherein the step of producing a light scattering structure (99) includes individually producing, in particular by use of laser light, the light scattering structure in the second layer (98) in dependence on an operational parameter of the associated optoelectronic light source.

212. The method of manufacturing an optoelectronic device according to item 211, characterized in that
before producing the plurality of light scattering structures (99), the method further comprises a step of determining a value of the operational parameter for each optoelectronic light source, and identifying an optoelectronic light source having a value of the operational parameter that fulfils a predefined criterion.

213. The method of manufacturing an optoelectronic device according to item 212, characterized in that
producing for an optoelectronic light source, which is not the optoelectronic light source having the value of the operational parameter that fulfils the predefined criterion, an associated light scattering structure which is configured to scatter light from the associated optoelectronic light source such that the value of the operational parameter of this optoelectronic light source fulfils the predefined criterion.

214. The method of manufacturing an optoelectronic device according to item 212 or 213, characterized in that
the operational parameter is brightness and the predefined criterion requires that the optoelectronic light source which fulfils the criterion is the darkest optoelectronic light source (9.0) of the plurality of optoelectronic light sources (9).

215. The method of manufacturing an optoelectronic device according to any one of the items 212 to 214,
characterized in that the operational parameter is colour value and the predefined criterion requires that each light scattering structure (99), which is associated with a light source that provides a particular colour, such as for example red, green or blue, is individually produced such that its colour value is within a predefined range with regard to the colour value of the light provided by a selected one of the optoelectronic light sources (9).

216. The method of manufacturing an optoelectronic device according to any one of the items 211 to 215,
characterized in that
using a laser (L) to provide the light scattering structures (99) sequentially one after the other, or using two or more lasers to provide two or more light scattering structures in parallel.

The description with the aid of the exemplary embodiments does not restrict the various embodiments shown to these. Rather, the disclosure depicts several aspects that can be combined with one another. The various items shown above also illustrate this.

The invention thus encompasses any features and any combination of features, in particular including any combination of features in the items and claims, even if this feature or this combination is not explicitly specified in the exemplary embodiments.

The invention claimed is:

1. An optoelectronic device, comprising:
a layer stack, which includes a carrier layer, a cover layer, and a first layer, in particular an intermediate layer, arranged between the cover layer and the carrier layer;
at least one electronic or optoelectronic element, in particular an optoelectronic light source which is arranged on the first layer;
wherein at least one layer of the layer stack, in particular all layers of the layer stack, are at least partially transparent;
wherein the layer stack comprises at least one layer which comprises particles with a high thermal conductivity and/or at least one thermally conductive layer which is arranged between two adjacent layers of the layer stack; and
wherein the at least one thermally conductive layer comprises a thermally conductive mesh, with the mesh having knots and interconnects between the knots, wherein at least the majority of the interconnects are not interrupted.

2. The optoelectronic device according to claim 1, wherein the mesh has an irregular pattern.

3. The optoelectronic device according to claim 1, wherein the at least one thermally conductive layer comprises one or more electrically conductive lines for transporting heat away from the electronic or optoelectronic element, in particular the optoelectronic light source, but which are electrically disconnected from the electronic or optoelectronic element.

4. The optoelectronic device according to claim 1, wherein the at least one thermally conductive layer comprises a coating, wherein, the coating comprises or consists of palladium or molybdenum.

5. The optoelectronic device according to claim 1,
wherein the at least one thermally conductive layer is arranged between the first layer and the at least one electronic or optoelectronic element, in particular the optoelectronic light source; or
wherein the at least one thermally conductive layer is arranged on the first layer on the opposite side of the at least one electronic or optoelectronic element; or
wherein a first thermally conductive layer is arranged between the first layer and the at least one electronic or optoelectronic element at the same side as the at least one electronic or optoelectronic element, and a second thermally conductive layer is arranged on the first layer on the opposite side of the at least one electronic or optoelectronic element.

6. The optoelectronic device according to claim 1, wherein the layer stack comprises a first auxiliary layer arranged between the cover layer and the first layer and/or a second auxiliary layer arranged between the carrier layer and the first layer.

7. The optoelectronic device according to claim 6,
wherein the at least one thermally conductive layer is arranged between the first auxiliary layer and the cover layer; or
wherein the at least one thermally conductive layer is arranged between the second auxiliary layer and the carrier layer; or
wherein a first thermally conductive layer is arranged between the first auxiliary layer and the cover layer and a second thermally conductive layer is arranged between the second auxiliary layer and the carrier layer.

8. The optoelectronic device according to claim 6, wherein the particles with a high thermal conductivity are arranged in the first auxiliary layer and/or the second auxiliary layer.

9. The optoelectronic device according to claim 1, wherein at least one of the layers of the layer stack is tinted.

10. The optoelectronic device according to claim 1, wherein a reflective layer is arranged between two layers of the layer stack, wherein the reflective layer is configured to reflect light in the ultraviolet and/or infrared spectrum but is permeable to light in the visible spectrum, and the reflective layer is arranged on the first layer and between the first layer and the at least one electronic or optoelectronic element, in particular the optoelectronic light source.

11. An optoelectronic device, comprising:
a layer stack, which includes a carrier layer, a cover layer, and a first layer, in particular an intermediate layer, arranged between the cover layer and the carrier layer;
at least one electronic or optoelectronic element, in particular an optoelectronic light source which is arranged on the first layer;
wherein at least one layer of the layer stack, in particular all layers of the layer stack, are at least partially transparent;
wherein the layer stack comprises at least one layer which comprises particles with a high thermal conductivity and/or at least one thermally conductive layer which is arranged between two adjacent layers of the layer stack; and
wherein the at least one thermally conductive layer comprises an electric line which is electrically connected to a contact pad of the electronic or optoelectronic element, in particular the optoelectronic light source, the width of the electric line is at least half of the width of the electronic or optoelectronic element.

12. The optoelectronic device according to claim 11, wherein the at least one thermally conductive layer comprises one or more electrically conductive lines for transporting heat away from the electronic or optoelectronic element, in particular the optoelectronic light source, but which are electrically disconnected from the electronic or optoelectronic element.

13. The optoelectronic device according to claim 11, wherein the at least one thermally conductive layer comprises a coating, wherein, the coating comprises or consists of palladium or molybdenum.

14. The optoelectronic device according to claim 11,
wherein the at least one thermally conductive layer is arranged between the first layer and the at least one electronic or optoelectronic element, in particular the optoelectronic light source; or
wherein the at least one thermally conductive layer is arranged on the first layer on the opposite side of the at least one electronic or optoelectronic element; or
wherein a first thermally conductive layer is arranged between the first layer and the at least one electronic or optoelectronic element at the same side as the at least one electronic or optoelectronic element, and a second thermally conductive layer is arranged on the first layer on the opposite side of the at least one electronic or optoelectronic element.

15. The optoelectronic device according to claim 11, wherein the layer stack comprises a first auxiliary layer arranged between the cover layer and the first layer and/or a second auxiliary layer arranged between the carrier layer and the first layer.

16. The optoelectronic device according to claim 15,
wherein the at least one thermally conductive layer is arranged between the first auxiliary layer and the cover layer; or
wherein the at least one thermally conductive layer is arranged between the second auxiliary layer and the carrier layer; or
wherein a first thermally conductive layer is arranged between the first auxiliary layer and the cover layer and a second thermally conductive layer is arranged between the second auxiliary layer and the carrier layer.

17. The optoelectronic device according to claim 15, wherein the particles with a high thermal conductivity are arranged in the first auxiliary layer and/or the second auxiliary layer.

18. The optoelectronic device according to claim 11, wherein at least one of the layers of the layer stack is tinted.

19. The optoelectronic device according to claim 11, wherein a reflective layer is arranged between two layers of the layer stack, wherein the reflective layer is configured to reflect light in the ultraviolet and/or infrared spectrum but is permeable to light in the visible spectrum, and the reflective layer is arranged on the first layer and between the first layer and the at least one electronic or optoelectronic element, in particular the optoelectronic light source.

20. An optoelectronic device, comprising:
a layer stack, which includes a carrier layer, a cover layer, and a first layer, in particular an intermediate layer, arranged between the cover layer and the carrier layer;
at least one electronic or optoelectronic element, in particular an optoelectronic light source which is arranged on the first layer;
wherein at least one layer of the layer stack, in particular all layers of the layer stack, are at least partially transparent;
wherein the layer stack comprises at least one layer which comprises particles with a high thermal conductivity and/or at least one thermally conductive layer which is arranged between two adjacent layers of the layer stack; and
wherein the at least one thermally conductive layer comprises a plurality of electric lines, which are electrically connected to a same contact pad of the electronic or optoelectronic element, in particular the optoelectronic light source, wherein the plurality of electric lines extend in parallel to each other.

21. The optoelectronic device according to claim 20, wherein at least one electric line comprises one or more blind conduction paths.

22. The optoelectronic device according to claim 20, wherein the at least one thermally conductive layer comprises one or more electrically conductive lines for transporting heat away from the electronic or optoelectronic element, in particular the optoelectronic light source, but which are electrically disconnected from the electronic or optoelectronic element.

23. The optoelectronic device according to claim 20, wherein the at least one thermally conductive layer comprises a coating, wherein, the coating comprises or consists of palladium or molybdenum.

24. The optoelectronic device according to claim 20,
wherein the at least one thermally conductive layer is arranged between the first layer and the at least one electronic or optoelectronic element, in particular the optoelectronic light source; or
wherein the at least one thermally conductive layer is arranged on the first layer on the opposite side of the at least one electronic or optoelectronic element; or
wherein a first thermally conductive layer is arranged between the first layer and the at least one electronic or optoelectronic element at the same side as the at least one electronic or optoelectronic element, and a second thermally conductive layer is arranged on the first layer on the opposite side of the at least one electronic or optoelectronic element.

25. The optoelectronic device according to claim 20, wherein the layer stack comprises a first auxiliary layer arranged between the cover layer and the first layer and/or a second auxiliary layer arranged between the carrier layer and the first layer.

26. The optoelectronic device according to claim 25,
wherein the at least one thermally conductive layer is arranged between the first auxiliary layer and the cover layer; or
wherein the at least one thermally conductive layer is arranged between the second auxiliary layer and the carrier layer; or
wherein a first thermally conductive layer is arranged between the first auxiliary layer and the cover layer and a second thermally conductive layer is arranged between the second auxiliary layer and the carrier layer.

27. The optoelectronic device according to claim 25, wherein the particles with a high thermal conductivity are arranged in the first auxiliary layer and/or the second auxiliary layer.

28. The optoelectronic device according to claim 20, wherein at least one of the layers of the layer stack is tinted.

29. The optoelectronic device according to claim 20, wherein a reflective layer is arranged between two layers of the layer stack, wherein the reflective layer is configured to reflect light in the ultraviolet and/or infrared spectrum but is permeable to light in the visible spectrum, and the reflective layer is arranged on the first layer and between the first layer and the at least one electronic or optoelectronic element, in particular the optoelectronic light source.

30. An optoelectronic device, comprising:
a layer stack, which includes a carrier layer, a cover layer, and a first layer, in particular an intermediate layer, arranged between the cover layer and the carrier layer;
at least one electronic or optoelectronic element, in particular an optoelectronic light source which is arranged on the first layer;
wherein at least one layer of the layer stack, in particular all layers of the layer stack, are at least partially transparent;
wherein the layer stack comprises at least one layer which comprises particles with a high thermal conductivity and/or at least one thermally conductive layer which is arranged between two adjacent layers of the layer stack; and
wherein the at least one thermally conductive layer comprises one or more electrically conductive lines for transporting heat away from the electronic or optoelectronic element, in particular the optoelectronic light source, but which are electrically disconnected from the electronic or optoelectronic element.

31. The optoelectronic device according to claim 30, wherein the at least one thermally conductive layer comprises a coating, wherein, the coating comprises or consists of palladium or molybdenum.

32. The optoelectronic device according to claim 30,
wherein the at least one thermally conductive layer is arranged between the first layer and the at least one electronic or optoelectronic element, in particular the optoelectronic light source; or
wherein the at least one thermally conductive layer is arranged on the first layer on the opposite side of the at least one electronic or optoelectronic element; or
wherein a first thermally conductive layer is arranged between the first layer and the at least one electronic or optoelectronic element at the same side as the at least one electronic or optoelectronic element, and a second thermally conductive layer is arranged on the first layer on the opposite side of the at least one electronic or optoelectronic element.

33. The optoelectronic device according to claim 30, wherein the layer stack comprises a first auxiliary layer arranged between the cover layer and the first layer and/or a second auxiliary layer arranged between the carrier layer and the first layer.

34. The optoelectronic device according to claim 33,
wherein the at least one thermally conductive layer is arranged between the first auxiliary layer and the cover layer; or
wherein the at least one thermally conductive layer is arranged between the second auxiliary layer and the carrier layer; or
wherein a first thermally conductive layer is arranged between the first auxiliary layer and the cover layer and a second thermally conductive layer is arranged between the second auxiliary layer and the carrier layer.

35. The optoelectronic device according to claim 33, wherein the particles with a high thermal conductivity are arranged in the first auxiliary layer and/or the second auxiliary layer.

36. The optoelectronic device according to claim 30, wherein at least one of the layers of the layer stack is tinted.

37. The optoelectronic device according to claim 30, wherein a reflective layer is arranged between two layers of the layer stack, wherein the reflective layer is configured to reflect light in the ultraviolet and/or infrared spectrum but is permeable to light in the visible spectrum, and the reflective layer is arranged on the first layer and between the first layer and the at least one electronic or optoelectronic element, in particular the optoelectronic light source.

38. An optoelectronic device, comprising:
a layer stack, which includes a carrier layer, a cover layer, and a first layer, in particular an intermediate layer, arranged between the cover layer and the carrier layer;
at least one electronic or optoelectronic element, in particular an optoelectronic light source which is arranged on the first layer;
wherein at least one layer of the layer stack, in particular all layers of the layer stack, are at least partially transparent;
wherein the layer stack comprises at least one layer which comprises particles with a high thermal conductivity and/or at least one thermally conductive layer which is arranged between two adjacent layers of the layer stack;
wherein the layer stack comprises a first auxiliary layer arranged between the cover layer and the first layer and/or a second auxiliary layer arranged between the carrier layer and the first layer; and
wherein:
the at least one thermally conductive layer is arranged between the first auxiliary layer and the cover layer; or
the at least one thermally conductive layer is arranged between the second auxiliary layer and the carrier layer; or
a first thermally conductive layer is arranged between the first auxiliary layer and the cover layer and a second thermally conductive layer is arranged between the second auxiliary layer and the carrier layer.

39. The optoelectronic device according to claim 38, wherein at least one of the layers of the layer stack is tinted.

40. The optoelectronic device according to claim 38, wherein a reflective layer is arranged between two layers of the layer stack, wherein the reflective layer is configured to reflect light in the ultraviolet and/or infrared spectrum but is permeable to light in the visible spectrum, and the reflective layer is arranged on the first layer and between the first layer and the at least one electronic or optoelectronic element, in particular the optoelectronic light source.

41. An optoelectronic device, comprising:
a layer stack, which includes a carrier layer, a cover layer, and a first layer, in particular an intermediate layer, arranged between the cover layer and the carrier layer;
at least one electronic or optoelectronic element, in particular an optoelectronic light source which is arranged on the first layer;
wherein at least one layer of the layer stack, in particular all layers of the layer stack, are at least partially transparent;
wherein the layer stack comprises at least one layer which comprises particles with a high thermal conductivity and/or at least one thermally conductive layer which is arranged between two adjacent layers of the layer stack;
wherein the layer stack comprises a first auxiliary layer arranged between the cover layer and the first layer and/or a second auxiliary layer arranged between the carrier layer and the first layer; and
wherein the particles with a high thermal conductivity are arranged in the first auxiliary layer and/or the second auxiliary layer.

42. The optoelectronic device according to claim 41, wherein at least one of the layers of the layer stack is tinted.

43. The optoelectronic device according to claim 41, wherein a reflective layer is arranged between two layers of the layer stack, wherein the reflective layer is configured to reflect light in the ultraviolet and/or infrared spectrum but is permeable to light in the visible spectrum, and the reflective layer is arranged on the first layer and between the first layer and the at least one electronic or optoelectronic element, in particular the optoelectronic light source.

* * * * *